(12) United States Patent
Ohba

(10) Patent No.: US 8,415,202 B2
(45) Date of Patent: Apr. 9, 2013

(54) METHOD OF MANUFACTURING SEMICONDUCTOR DEVICE

(75) Inventor: Takayuki Ohba, Kanagawa (JP)

(73) Assignee: The University of Tokyo, Tokyo (JP)

( * ) Notice: Subject to any disclaimer, the term of this patent is extended or adjusted under 35 U.S.C. 154(b) by 120 days.

(21) Appl. No.: 13/050,050

(22) Filed: Mar. 17, 2011

(65) Prior Publication Data

US 2011/0165730 A1    Jul. 7, 2011

Related U.S. Application Data

(63) Continuation of application No. PCT/JP2009/066099, filed on Sep. 15, 2009.

(30) Foreign Application Priority Data

Sep. 18, 2008   (JP) .................................. 2008-240015

(51) Int. Cl.
    *H01L 21/00*    (2006.01)
(52) U.S. Cl. ........ 438/109; 438/107; 438/637; 257/723; 257/E25.006
(58) Field of Classification Search .................. 257/723, 257/E25.006; 438/107, 109, 637
    See application file for complete search history.

(56) References Cited

U.S. PATENT DOCUMENTS

| | | | |
|---|---|---|---|
| 7,999,632 B2 * | 8/2011 | Iwamoto | ........................ 333/133 |
| 2003/0082847 A1 | 5/2003 | Turner et al. | |
| 2004/0253794 A1 | 12/2004 | Faris | |
| 2005/0087747 A1 | 4/2005 | Yamada et al. | |
| 2006/0006517 A1 | 1/2006 | Lee et al. | |
| 2007/0045836 A1 * | 3/2007 | Kwon et al. | ................... 257/734 |

FOREIGN PATENT DOCUMENTS

| | | | |
|---|---|---|---|
| JP | 2007-220726 | * | 8/2007 |
| JP | 2008-153499 | | 7/2008 |
| JP | 2010-278279 | | 12/2010 |

OTHER PUBLICATIONS

Singapore Written Opinion dated Jan. 20, 2012.

* cited by examiner

*Primary Examiner* — Jarrett Stark
*Assistant Examiner* — Nicholas Tobergte
(74) *Attorney, Agent, or Firm* — IPUSA, PLLC

(57) ABSTRACT

A semiconductor device manufacturing method of stacking semiconductor chips in layers over a semiconductor substrate having, close to its main surface, semiconductor chips, connecting semiconductor chips in different layers to enable signal transmission, and singularizing the layered semiconductor chips into pieces. The method includes steps of forming an insulating layer on the main surface of the semiconductor substrate; stacking the semiconductor chips over the semiconductor chips of the semiconductor substrate in such a manner as to interpose the insulating layer between them and an opposite surface of each disposed semiconductor chip opposes the insulating layer, the opposite surface being opposite to the main surface; forming, in each of the disposed semiconductor chips, a via hole penetrating from the main to the opposite surface; and forming a connection which enables signal transmission between the disposed semiconductor chips and the corresponding semiconductor chips of the semiconductor substrate via the via holes.

20 Claims, 88 Drawing Sheets

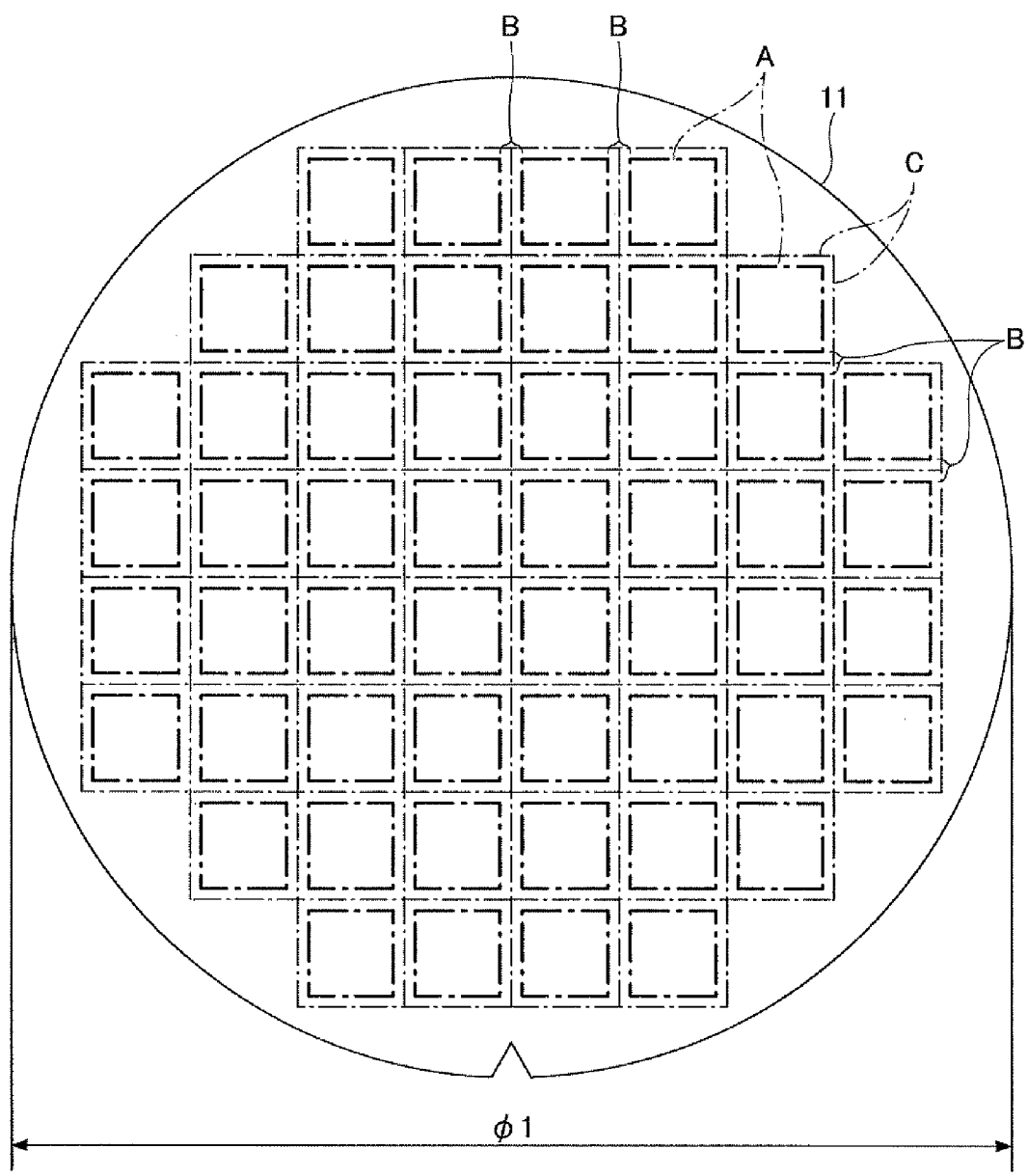

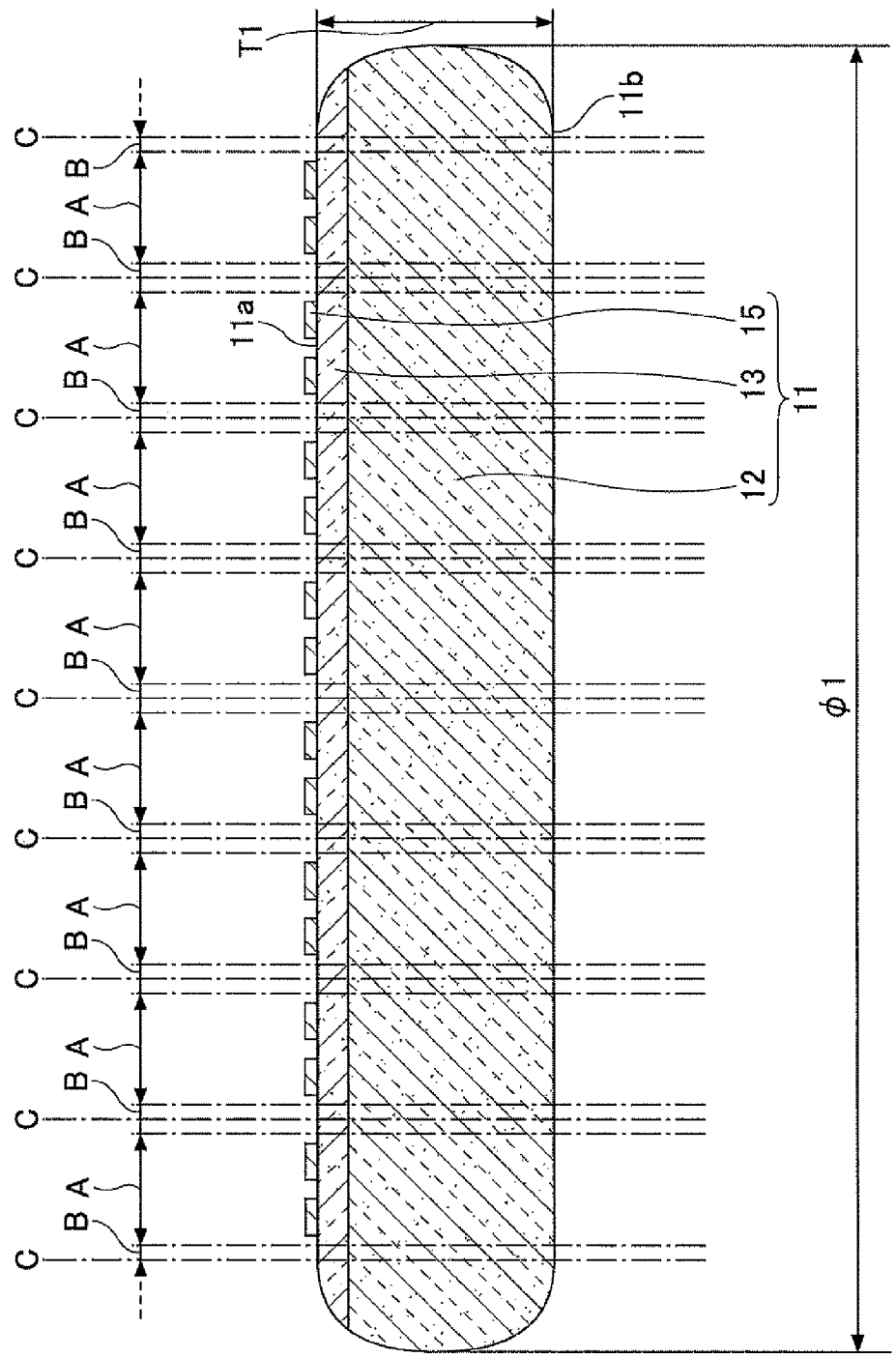

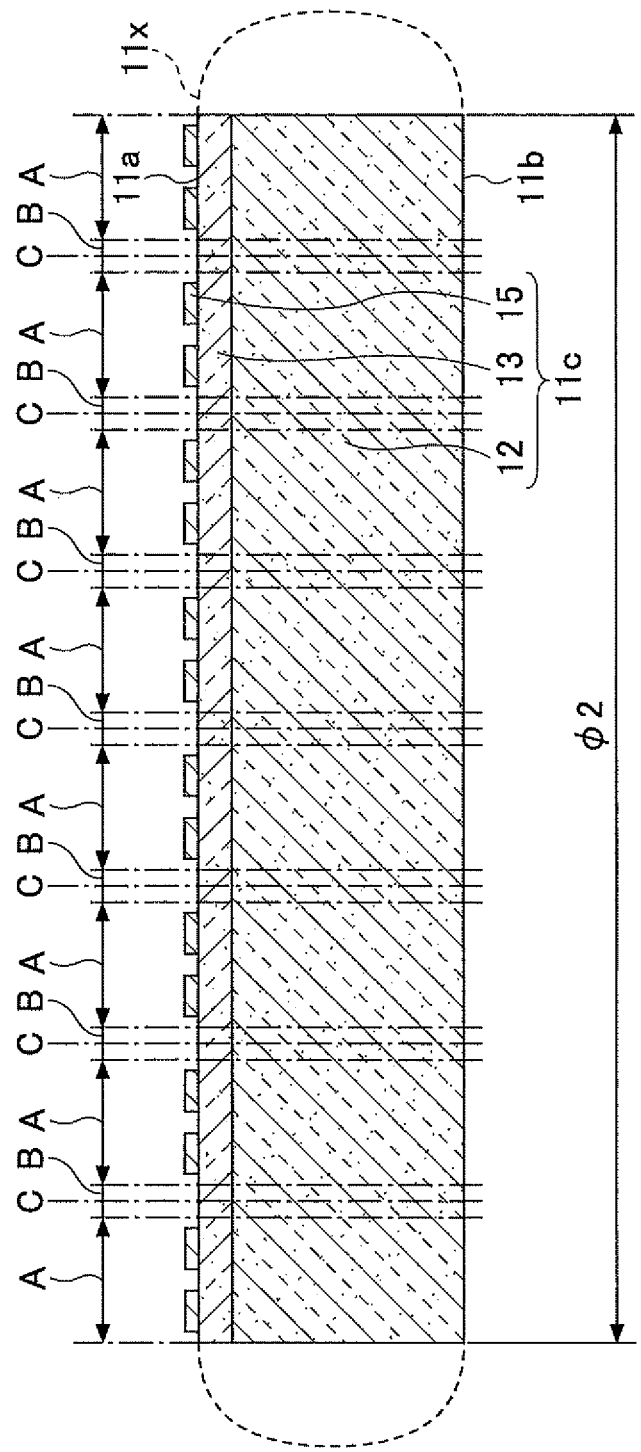

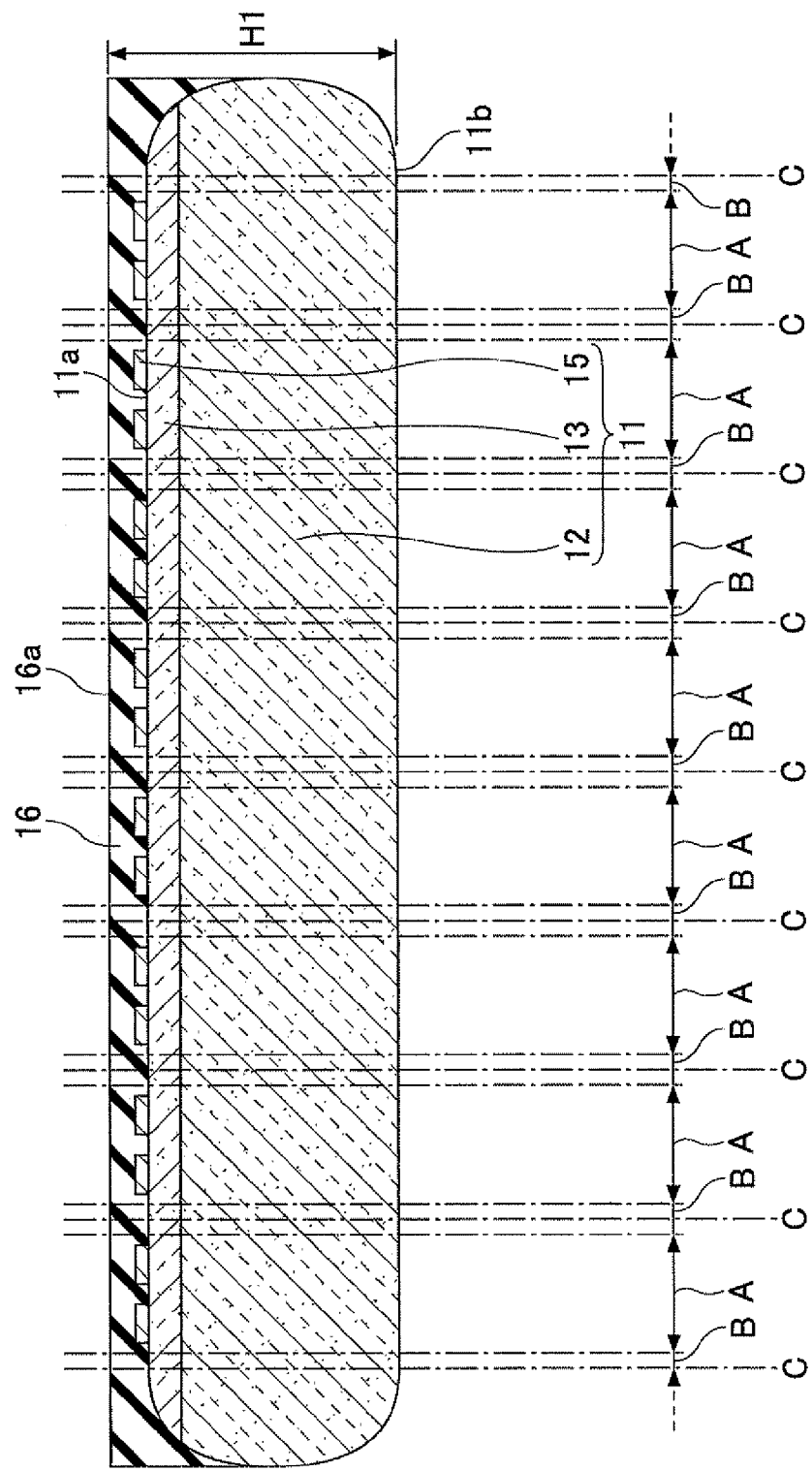

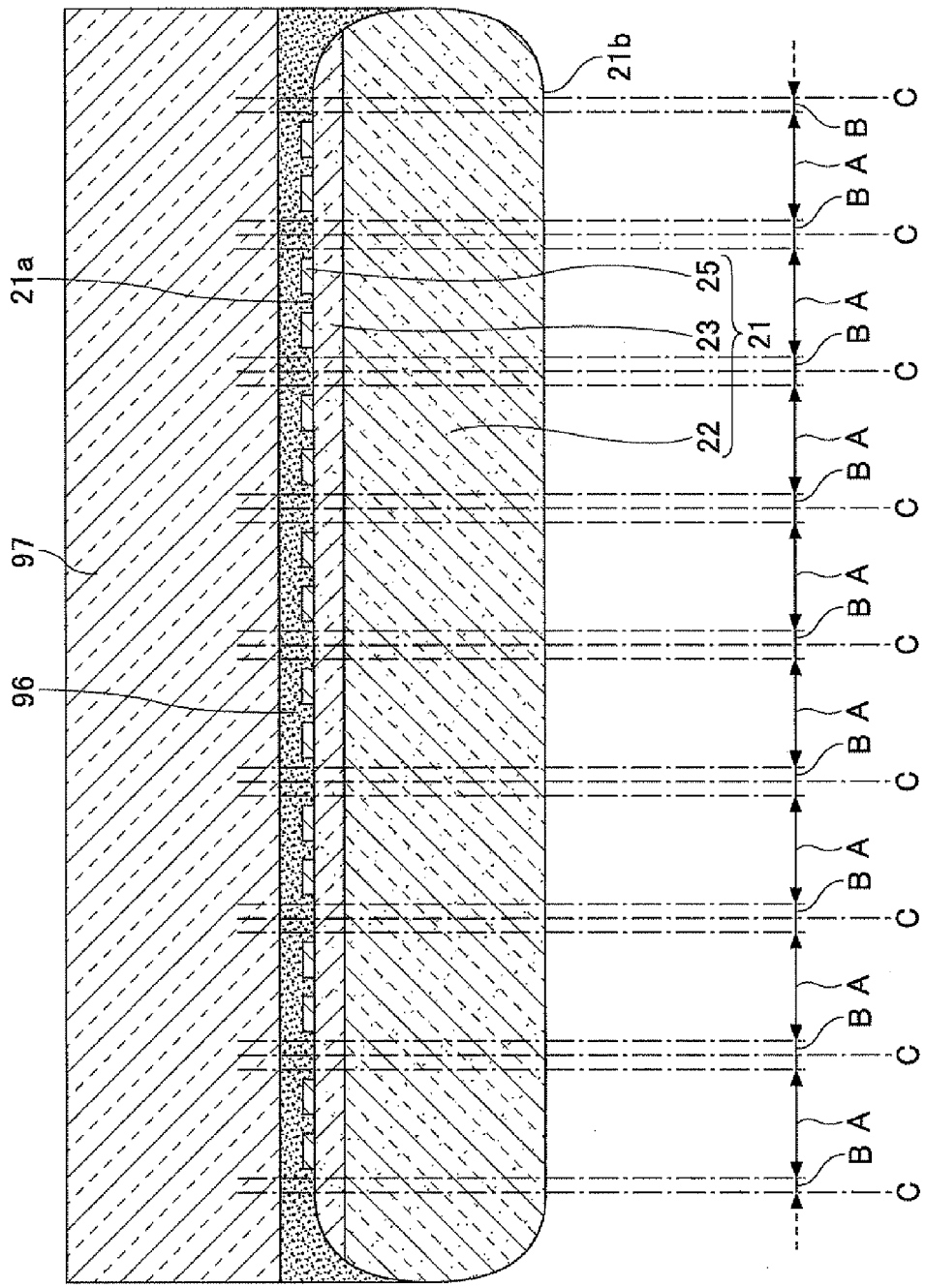

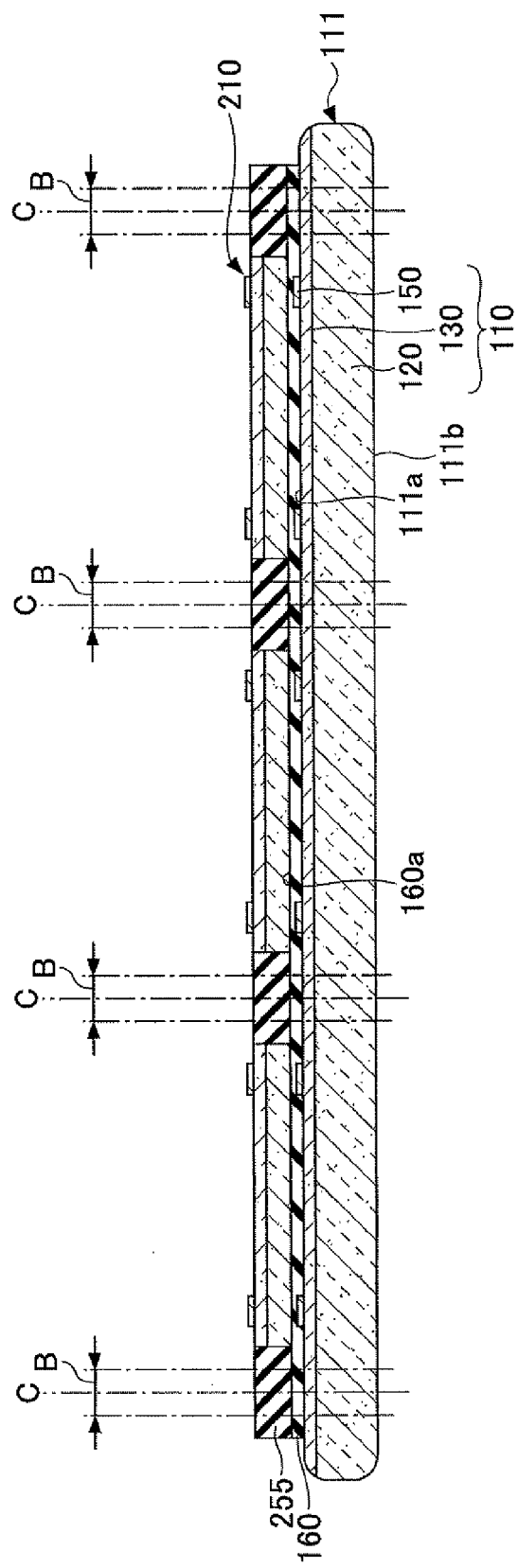

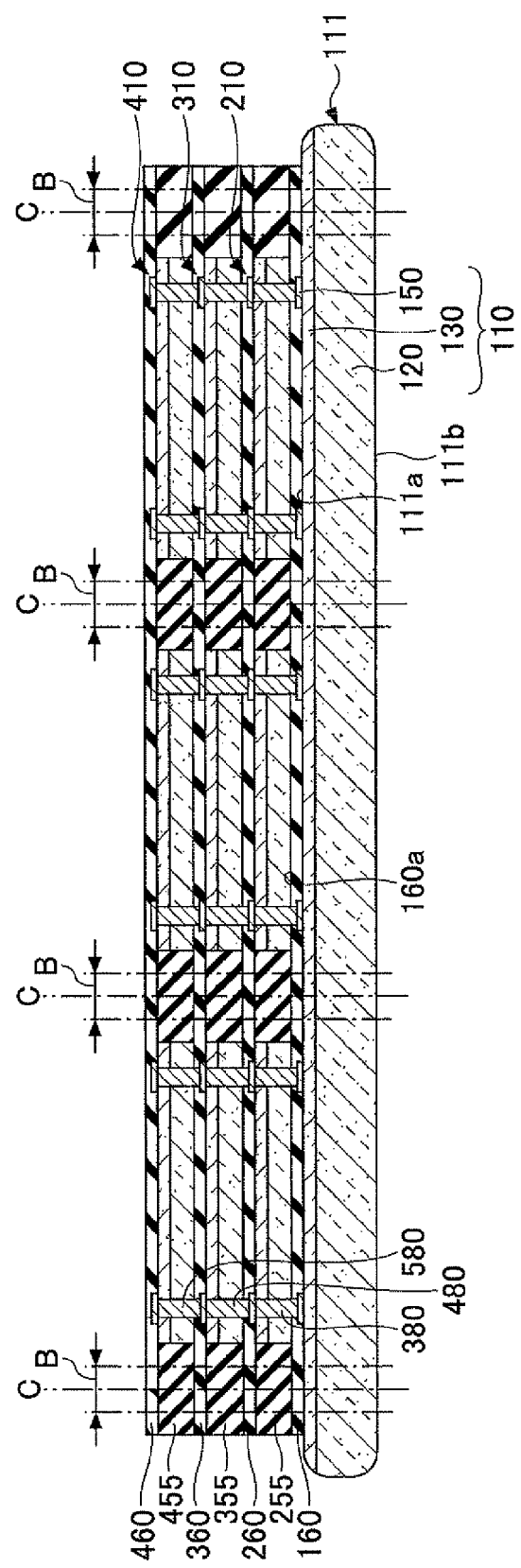

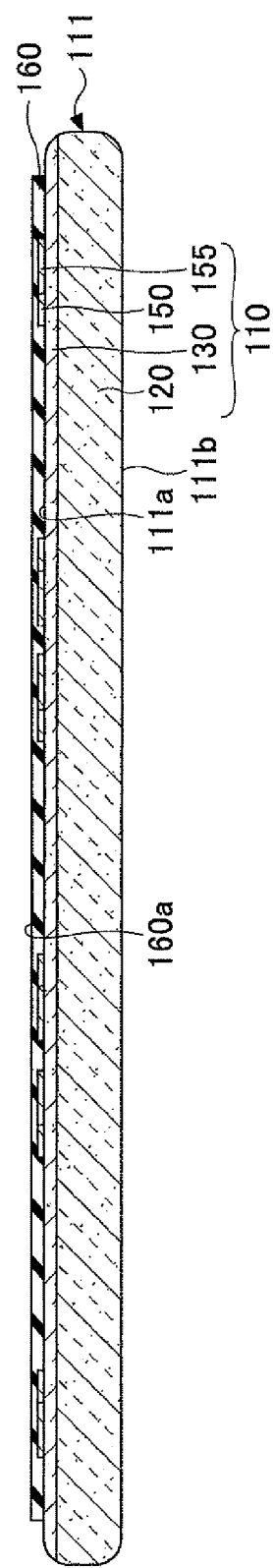

METHOD OF MANUFACTURING SEMICONDUCTOR DEVICE

CROSS-REFERENCE TO RELATED APPLICATION

This application is a U.S. continuation application filed under 35 USC 111(a) claiming benefit under 35 USC 120 and 365(c) of PCT application JP09/066,099, filed Sep. 15, 2009, which claims priority to Application Ser. No. 2008-240015, filed in Japan on Sep. 18, 2008. The foregoing applications are hereby incorporated herein by reference.

BACKGROUND OF THE INVENTION

1. Field of the Invention

The present invention is directed to a semiconductor device manufacturing method, and in particular to a semiconductor device manufacturing method for disposing plural semiconductor substrates having semiconductor chips one above the other, connecting semiconductor chips, each of which constitutes a different semiconductor substrate, in such a manner as to enable signal transmission, and subsequently singularizing the semiconductor chips into individual pieces.

The present invention is also directed to a semiconductor device manufacturing method for disposing in one or more layers singularized semiconductor chips on a semiconductor substrate including semiconductor chips, connecting semiconductor chips in different layers in such a manner as to enable signal transmission, and subsequently singularizing the layered semiconductor chips into individual pieces.

2. Description of the Related Art

A reduction in size, thickness and weight of semiconductor application products for use in various mobile apparatuses, such as digital cameras and portable telephones, has progressed at a rapid pace in recent years. In accordance with the trend, there are continuing demands for size reduction and density increase of semiconductor devices installed in the semiconductor application products. To meet such demands, for example, methods of manufacturing semiconductor devices having a wafer-on-wafer (hereinafter, referred to as "WOW") configuration have been proposed. In the WOW configuration, plural semiconductor substrates (wafers) having semiconductor chips are disposed one above the other and bonded in this wafer state (see Patent Document 1, for example).

Furthermore, so-called chip-on-wafer (referred to as "COW") technology has also been proposed, in which semiconductor chips are directly disposed on other wafer-state semiconductor chips (see Patent Document 2, for example).

The following, first, gives a brief description of a conventionally proposed method of manufacturing a semiconductor device having the WOW configuration with reference to drawings. FIGS. 1A to 1G illustrate a conventional process flow for manufacturing a WOW configuration semiconductor device.

First, in a process shown in FIG. 1A, a semiconductor substrate 110 is prepared. The semiconductor substrate 110 includes a substrate body 120, a semiconductor integrated circuit 130 and via holes 140 which are filled with metal. The semiconductor integrated circuit 130 is formed on the substrate body 120, and the via holes 140 filled with metal are formed in the substrate body 120 and the semiconductor integrated circuit 130. When the semiconductor substrate 110 is prepared, the via holes 140 may be formed in the substrate body 120 prior to the formation of the semiconductor integrated circuit 130, or the semiconductor integrated circuit 130 may be formed on the substrate body 120 prior to the formation of the via holes 140. Note that since the substrate body 120 is reduced in thickness in a process to be described below, the via holes 140 do not have to penetrate the substrate body 120 at this point.

Next in a process shown in FIG. 1B, a support 300 is bonded to the semiconductor substrate 110 on the semiconductor integrated circuit 130 side. A glass substrate, for example, may be used for the support 300. Subsequently, in a process shown in FIG. 10, the substrate body 120 is reduced in thickness. The thickness reduction is achieved by, for example, polishing a surface of the substrate body 120, on which surface the semiconductor integrated circuit 130 is not formed. The semiconductor substrate 110 and the substrate body 120 after the thickness reduction are referred to as the semiconductor substrate 110a and the substrate body 120a, respectively. The support 300 has a function of supporting the semiconductor substrate 110a having reduced rigidity after the thickness reduction. Then, bumps (not shown) are formed on the via holes 140 exposed from the surface on which the thickness reduction has been performed. Note that the bumps (not shown) may be formed via electrode pads (not shown).

Next in a process shown in FIG. 10, a semiconductor substrate 210 is prepared. The semiconductor substrate 210 includes a substrate body 220, a semiconductor integrated circuit 230 and via holes 240 which are filled with metal. The semiconductor integrated circuit 230 is formed on the substrate body 220, and the via holes 240 filled with metal are formed in the substrate body 220 and the semiconductor integrated circuit 230. Bumps (not shown) are formed on the via holes 240 exposed from the surface of the semiconductor substrate 210 on the semiconductor integrated circuit 230 side. Note that the bumps (not shown) may be formed via electrode pads (not shown). Then, the semiconductor substrate 210 is bonded to the semiconductor substrate 110a in such a manner that the semiconductor integrated circuit 230 of the semiconductor substrate 210 opposes the substrate body 120a of the semiconductor substrate 110a. Note that the via holes 240 are formed in advance at positions corresponding to the via holes 140, and each set of the corresponding via holes 240 and 140 are electrically connected via a bump.

Next in a process shown in FIG. 1E, the substrate body 220 is reduced in thickness, in the same manner as in the process of FIG. 10. The semiconductor substrate 210 and the substrate body 220 after the thickness reduction are referred to as the semiconductor substrate 210a and the substrate body 220a, respectively. Then, bumps (not shown) are formed on the via holes 240 exposed from the surface on which the thickness reduction has been performed. Note that the bumps (not shown) may be formed via electrode pads (not shown).

Next in a process shown in FIG. 1F, by repeating the same processes of FIGS. 1D and 1E, semiconductor substrates 310a and 410a are disposed one above the other at the bottom of the substrate body 220a of the semiconductor substrate 210a. Then in a process shown in FIG. 1G, the support 300 of FIG. 1F is removed. Herewith, a semiconductor device 100 is completed. In this manner, the WOW-configuration semiconductor device 100 is manufactured in which the semiconductor substrates 110a, 210a, 310a and 410a with reduced thicknesses are bonded to one another in the semiconductor substrate (wafer) state.

FIGS. 2A to 2C illustrate another conventional process flow for manufacturing a WOW configuration semiconductor device. In FIGS. 2A to 2C, the same reference numerals are given to the components which are common in FIGS. 1A to 1G, and their explanations may be omitted. First, in a process shown in FIG. 2A, semiconductor substrates 510 and 610 are prepared. The semiconductor substrate 510 includes a substrate body 520 and a semiconductor integrated circuit 530. The semiconductor integrated circuit 530 is formed on the substrate body 520. The semiconductor substrate 610 includes a substrate body 620 and a semiconductor integrated circuit 630. The semiconductor integrated circuit 630 is formed on the substrate body 620. Then, the semiconductor substrate 610 is bonded to the semiconductor substrate 510 in such a manner that the semiconductor integrated circuit 630 of the semiconductor substrate 610 opposes the semiconductor integrated circuit 530 of the semiconductor substrate 510.

Next in a process shown in FIG. 2B, the substrate body 620 is reduced in thickness. The thickness reduction is achieved by, for example, polishing a surface of the substrate body 620, on which surface the semiconductor integrated circuit 630 is not formed. The semiconductor substrate 610 and the substrate body 620 after the thickness reduction are referred to as the semiconductor substrate 610a and the substrate body 620a, respectively. Subsequently, in a process shown in FIG. 2C, via holes 640 filled with metal are formed in such a manner to penetrate the substrate body 620a and connect the semiconductor integrated circuit 530 and the semiconductor integrated circuit 630. In this manner, a WOW-configuration semiconductor device 500 is manufactured in which the semiconductor substrate 510 and the semiconductor substrate 610a with a reduced thickness are bonded to one another in the semiconductor substrate (wafer) state.

Patent Document 1: Japanese Laid-open Patent Application Publication No. 2008-153499

Patent Document 2: Japanese Laid-open Patent Application Publication No. 2010-278279

However, the semiconductor device manufacturing method shown in FIGS. 1A to 1G requires, when two semiconductor substrates are connected, a process of forming bumps on the via holes exposed from both semiconductor substrates, thus leaving the problems of low productivity and an increase in the cost of manufacturing the semiconductor device.

According to the semiconductor device manufacturing method shown in FIGS. 2A to 2C, since the semiconductor substrates are bonded in such a manner that the surfaces on which the semiconductor integrated circuits have been formed oppose each other, three or more semiconductor substrates cannot be disposed one above the other by simply repeating the same processes. That is, a special process is required to dispose three or more semiconductor substrates one above the other, which results in low productivity and an increase in the cost of manufacturing the semiconductor device.

Also, according to either of the semiconductor device manufacturing methods shown in FIGS. 1A to 1G and FIGS. 2A to 2C, in the case of forming deep via holes, it takes a long time to perform the hole-formation of the via holes and the metal filling process and also the number of materials required for the processes increases, which leads to an increase in the cost of manufacturing the semiconductor device.

Furthermore, according to either of the semiconductor device manufacturing methods shown in FIGS. 1A to 1G and FIGS. 2A to 2C, in the case of forming the via holes by dry etching or the like, the depths of the via holes change according to the size and density of the via holes, which leads to the variation in the diameter of the end portions of the via holes. As a result, the diameter of the via holes exposed when the semiconductor substrate is reduced to a desired thickness varies, which in turn results in the variation in the resistance of the electrical connections, leaving the problem of decreased reliability of the semiconductor device.

As for conventional COW technology, the following methods have been used: a method of burying connecting holes (TSVs) having a large aspect ratio and forming bumps or metal protrusions to connect semiconductor chips to each other; and a method of stacking together semiconductor chips with their device-side surfaces (i.e., surfaces on each of which a semiconductor integrated circuit is formed) face-to-face, performing thickness reduction and connecting the semiconductor chips by connecting holes (TSVs).

The former method requires, when the semiconductor chips are connected, a process of forming bumps or metal protrusions on via holes exposed from the semiconductor chips, thus leaving the problems of low productivity and an increase in the cost of manufacturing the semiconductor device. According to the latter method, since the semiconductor chips are connected to one another with their device-side surfaces opposing each other, it is necessary to have a pre-formed wiring design and there is therefore little flexibility in the connection wiring. In addition, three or more semiconductor chips cannot be disposed one above the other by simply repeating the same processes. That is, a special process is required to dispose three or more semiconductor chips one above the other, which results in low productivity and an increase in the cost of manufacturing the semiconductor device.

Also, according to either of the methods above, in the case of forming deep via holes, it takes a long time to perform the hole-formation of the via holes and the metal layer forming process and also the number of materials required for the processes increases, which leads to an increase in the cost of manufacturing the semiconductor device.

Furthermore, according to either of the methods above, in the case of forming the via holes by dry etching or the like, the depths of the via holes change according to the size and density of the via holes, which leads to the variation in the diameter of the end portions of the via holes. As a result, the diameter of the via holes exposed when the semiconductor substrate is reduced to a desired thickness varies, which in turn results in the variation in the resistance of the electrical connections, leaving the problem of decreased reliability of the semiconductor device.

SUMMARY OF THE INVENTION

In view of the above problems, the present invention aims at providing a reliable semiconductor device manufacturing method with high productivity, capable of reducing the manufacturing costs.

One aspect of the present invention provides a semiconductor device manufacturing method of disposing semiconductor chips one above the other over a first semiconductor substrate having, close to its main surface, plural semiconductor chips, each of which has a semiconductor integrated circuit, the disposed semiconductor chips and the semiconductor chips of the first semiconductor substrate together forming layers of semiconductor chips, connecting semiconductor chips in different layers to each other in such a manner as to enable signal transmission, and subsequently singularizing the layered semiconductor chips into individual pieces. The semiconductor device manufacturing method includes a first step of forming a first insulating layer on the main surface of the first semiconductor substrate; a second step of disposing the semiconductor chips, each of which has a semiconductor integrated circuit on its main surface, over the corresponding semiconductor chips of the first semiconductor substrate in such a manner that the first insulating layer is interposed between the disposed semiconductor chips and the semiconductor chips of the first semiconductor substrate and an opposite surface of each of the disposed semiconductor chips opposes the first insulating layer, the opposite surface being opposite to the main surface of the semiconductor chip; a third step of forming, in each of the disposed semiconductor chips, a via hole which penetrates from the main surface to the opposite surface of the disposed semiconductor chip; and a fourth step of forming a first connection part which enables the signal transmission between the disposed semiconductor chip and a corresponding one of the semiconductor chips of the first semiconductor substrate via the via hole.

BRIEF DESCRIPTION OF THE DRAWINGS

FIG. 4A illustrates a first process of a manufacturing process flow of the semiconductor device according to the first embodiment of the present invention;

FIG. 4B illustrates a second process of the manufacturing process flow of the semiconductor device according to the first embodiment of the present invention;

FIG. 4C illustrates a third process of the manufacturing process flow of the semiconductor device according to the first embodiment of the present invention;

FIG. 5A illustrates a first process of a manufacturing process flow of a semiconductor device according to a modification of the first embodiment of the present invention;

FIG. 5B illustrates a second process of the manufacturing process flow of the semiconductor device according to the modification of the first embodiment of the present invention;

FIG. 15H illustrates an eighth process of the manufacturing process flow of the semiconductor device according to the seventh embodiment of the present invention;

FIG. 15V illustrates a twenty-second process of the manufacturing process flow of the semiconductor device according to the seventh embodiment of the present invention;

FIG. 19A illustrates a first process of a manufacturing process flow of the semiconductor device according to the eighth embodiment of the present invention;

FIG. 24D illustrates a fourth process of the manufacturing process flow of the semiconductor device according to the tenth embodiment of the present invention;

FIG. 24E illustrates a fifth process of the manufacturing process flow of the semiconductor device according to the tenth embodiment of the present invention;

FIG. 24F illustrates a sixth process of the manufacturing process flow of the semiconductor device according to the tenth embodiment of the present invention;

FIG. 25 is a cross-sectional view illustrating a semiconductor device according to an eleventh embodiment of the present invention;

FIG. 26A illustrates a first process of a manufacturing process flow of the semiconductor device according to the eleventh embodiment of the present invention;

FIG. 26B illustrates a second process of the manufacturing process flow of the semiconductor device according to the eleventh embodiment of the present invention;

FIG. 26C illustrates a third process of the manufacturing process flow of the semiconductor device according to the eleventh embodiment of the present invention;

FIG. 26D illustrates a fourth process of the manufacturing process flow of the semiconductor device according to the eleventh embodiment of the present invention;

FIG. 26E illustrates a fifth process of the manufacturing process flow of the semiconductor device according to the eleventh embodiment of the present invention;

FIG. 26F illustrates a sixth process of the manufacturing process flow of the semiconductor device according to the eleventh embodiment of the present invention;

FIG. 26G illustrates a seventh process of the manufacturing process flow of the semiconductor device according to the eleventh embodiment of the present invention;

FIG. 26H illustrates an eighth process of the manufacturing process flow of the semiconductor device according to the eleventh embodiment of the present invention; and FIG. 27 is a cross-sectional view illustrating a semiconductor device according to a twelfth embodiment of the present invention.

DETAILED DESCRIPTION OF THE PREFERRED EMBODIMENT

Figure 1A:
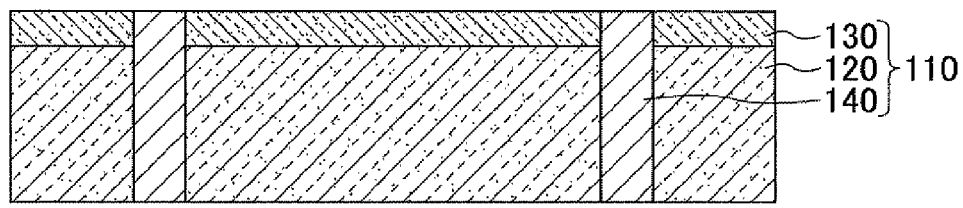
FIG. 1A illustrates a first process of a manufacturing process flow of a conventional WOW-configuration semiconductor device.
Figure 1B:
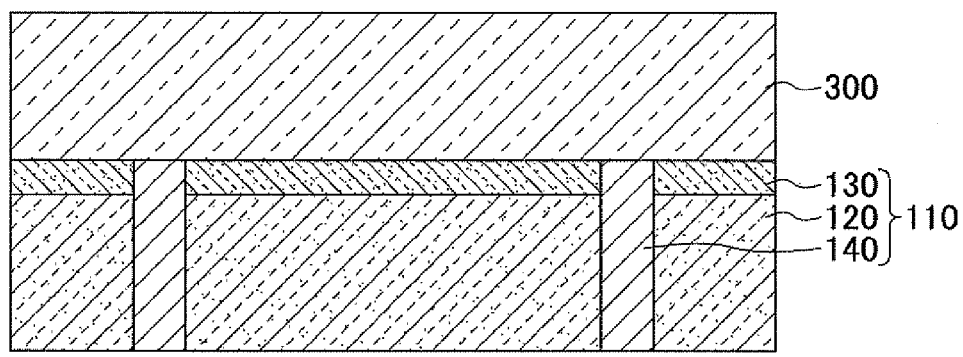
FIG. 1B illustrates a second process of the manufacturing process flow of the conventional WOW-configuration semiconductor device.
Figure 1C:
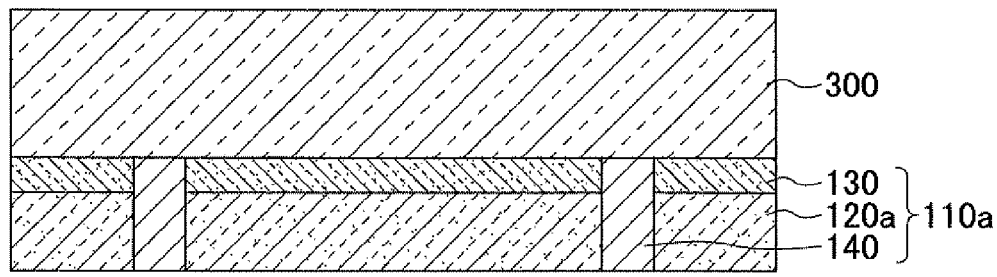
FIG. 1C illustrates a third process of the manufacturing process flow of the conventional WOW-configuration semiconductor device.
Figure 1D:
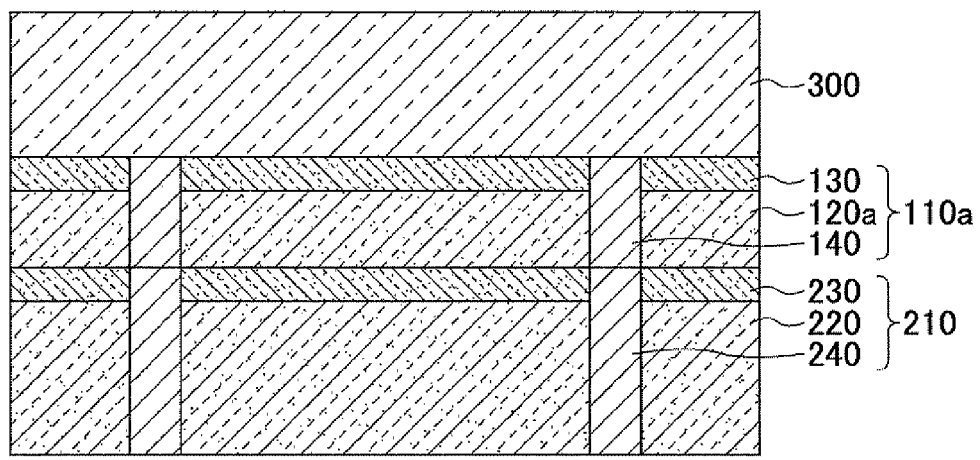
FIG. 1D illustrates a fourth process of the manufacturing process flow of the conventional WOW-configuration semiconductor device.
Figure 1E:
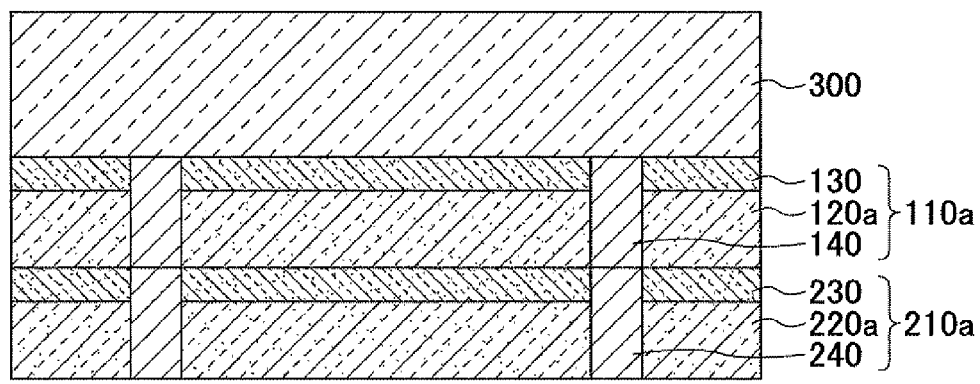
FIG. 1E illustrates a fifth process of the manufacturing process flow of the conventional WOW-configuration semiconductor device.
Figure 1F:
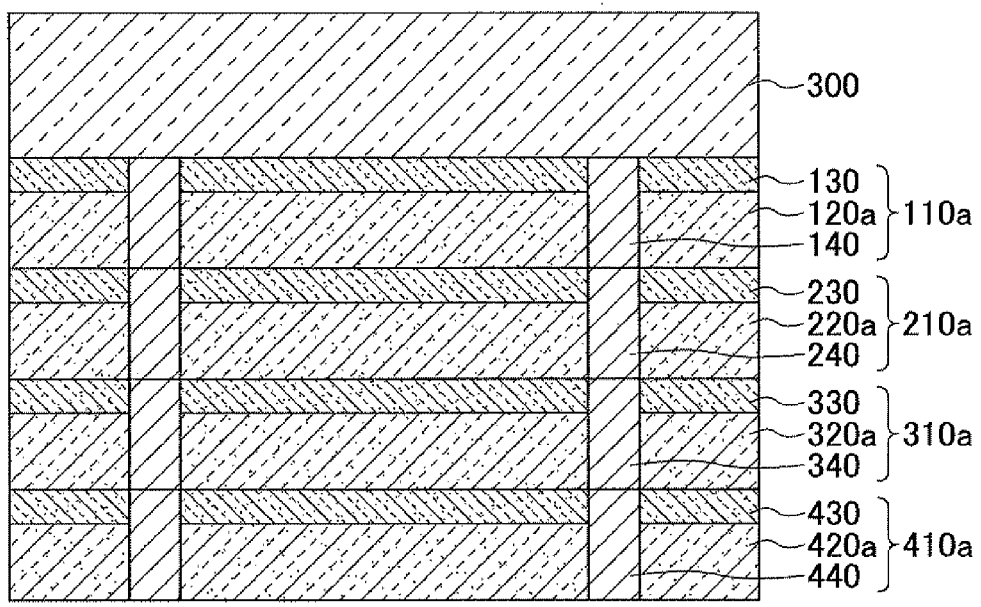
FIG. 1F illustrates a sixth process of the manufacturing process flow of the conventional WOW-configuration semiconductor device.
Figure 1G:
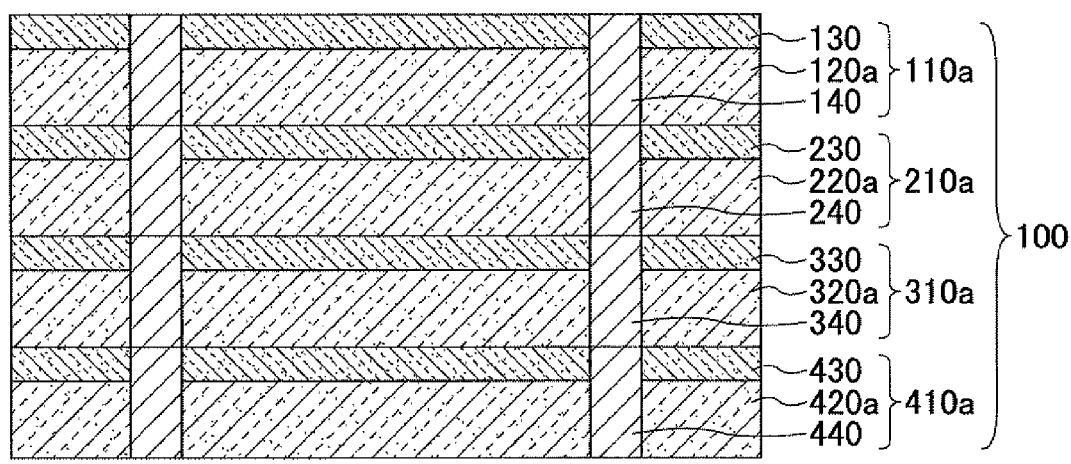
FIG. 1G illustrates a seventh process of the manufacturing process flow of the conventional WOW-configuration semiconductor device.
Figure 2A:
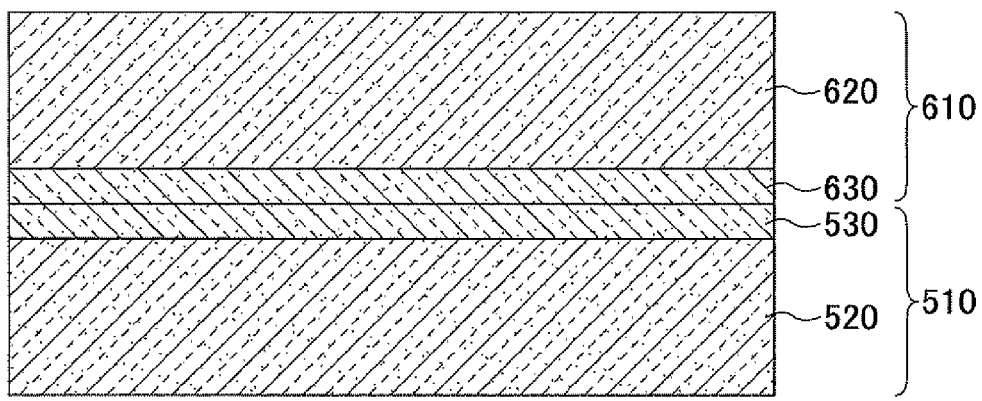
FIG. 2A illustrates a first process of another manufacturing process of a conventional WOW-configuration semiconductor device.
Figure 2B:
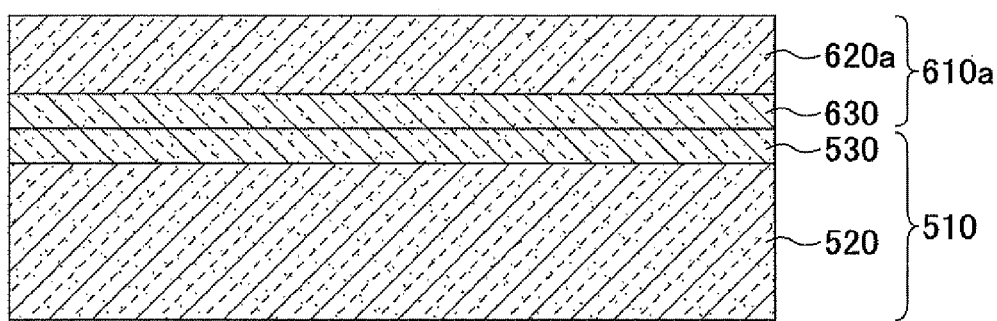
FIG. 2B illustrates a second process of the other manufacturing process of the conventional WOW-configuration semiconductor device.
Figure 2C:
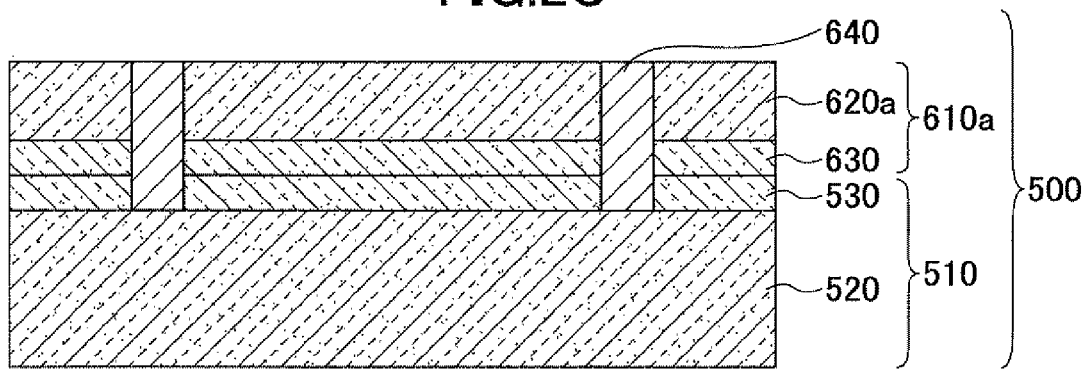
FIG. 2C illustrates a third process of the other manufacturing process of the conventional WOW-configuration semiconductor device.

Embodiments that describe the best mode for carrying out the present invention are explained next with reference to the drawings. Note that in the drawings, identical reference numerals represent the same component, and repeated explanation may be omitted.

First Embodiment

Configuration of Semiconductor Device According to First Embodiment

Figure 3:
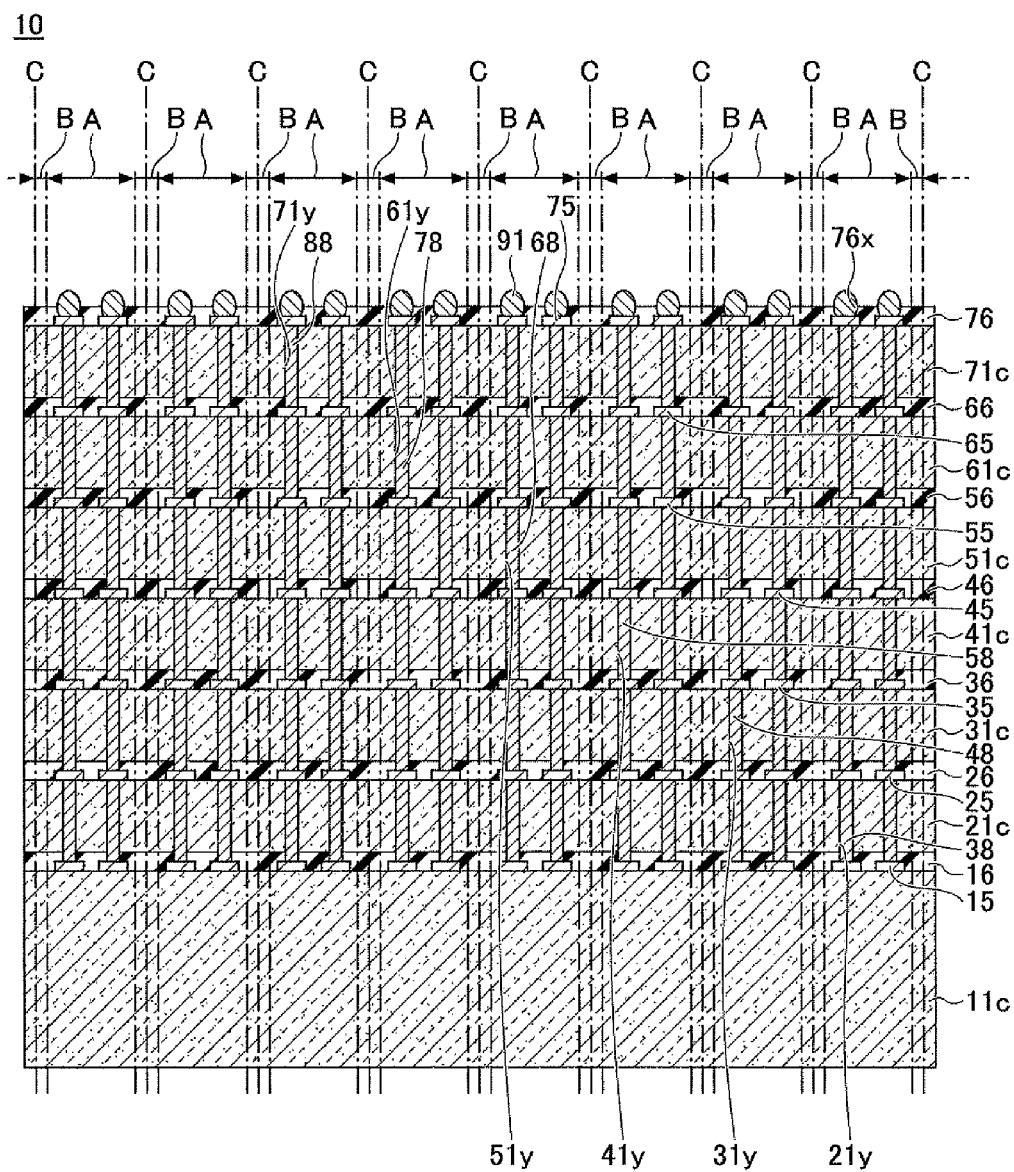
FIG. 3 is a cross-sectional view illustrating a semiconductor device according to a first embodiment of the present invention.

First is described the configuration of a semiconductor device according to a first embodiment of the present invention. FIG. 3 is a cross-sectional view illustrating a semiconductor device according to the first embodiment of the present invention. With reference to FIG. 3, a semiconductor device 10 according to the first embodiment of the present invention has a configuration in which semiconductor substrates 11c, 21c, 31c, 41c, 51c, 61c and 71c are disposed one above the other. The semiconductor device 10 is, for example, a CMOS LSI, a memory device, a sensor device or a MEMS.

The semiconductor substrates 11c-71c constituting the semiconductor device 10 are, for example, silicon wafers. In the case where the semiconductor substrate 11c-71c are silicon wafers, the semiconductor device 10 is a so-called WOW-configuration semiconductor device in which plural semiconductor substrates (wafers) are bonded to one another in the semiconductor substrate (wafer) state.

The semiconductor substrates 11c-71c include plural regions A in which semiconductor chips are formed (hereinafter, referred to as the "semiconductor chip formation regions A") and a scribing region B for separating the plural semiconductor chip formation regions A. The reference symbol C indicates a position at which, on the semiconductor device 10, cutting is performed using a dicing blade or the like (hereinafter, the "cutting position C"). The semiconductor device 10 is cut into individual pieces at the cutting positions C using a dicing blade or the like to thereby form final products.

Each semiconductor chip formation region A of the semiconductor substrates 11c-71c includes, respectively, a substrate body 12-72 (not shown), a semiconductor integrated circuit 13-73 (not shown) and electrode pads 15-75. The substrate bodies 12-72 (not shown) are made, for example, of silicon. Each of the semiconductor integrated circuits 13-73 (not shown) has a configuration in which a diffusion layer (not shown), an insulating layer (not shown), via holes (not shown), a wiring layer (not shown) and the like are formed in silicon, for example, and is formed on one surface of the corresponding substrate body 12-72 (not shown). In the following description, the surface of each of the semiconductor substrates 11c-71c, on which surface the semiconductor integrated circuit 13-73 (not shown) is provided may be referred to as the "main surface".

The electrode pads 15-75 are disposed on the corresponding semiconductor integrated circuits 13-73 (not shown), respectively, via the insulating layer (not shown). The electrode pads 15-75 are electrically connected to the corresponding wiring layer (not shown) provided in the semiconductor integrated circuit 13-73 (not shown). As each of the electrode pads 15-75, a laminated body or the like may be used, in which an Au layer is disposed on a Ti layer, for example. Or, the following may also be used as the electrode pad 15-75: a laminated body in which an Au layer is disposed on a Ni layer; a laminated body in which a Pd layer and an Au layer are sequentially disposed on a Ni layer; a laminated body in which a Cu layer or an Al layer is disposed on a layer of a high melting point metal, such as Co, Ta, Ti and TiN, in place of Ni; or a damascene interconnect structure.

The semiconductor substrates 11c and 21c are bonded to one another via a resin layer 16, and the electrode pads 15 of the semiconductor substrate 11c and the electrode pads 25 of the semiconductor substrate 21c are electrically connected to each other via metal layers 38 formed in via holes 21y. The semiconductor substrates 21c and 31c are bonded to one another via a resin layer 26, and the electrode pads 25 of the semiconductor substrate 21c and the electrode pads 35 of the semiconductor substrate 31c are electrically connected to each other via metal layers 48 formed in via holes 31y. Note that each via hole is a connecting hole provided to connect semiconductor substrates (not limited to adjacent semiconductor substrates), and connects the semiconductor substrates to enable signal transmission between them when a metal layer, an optical waveguide or the like is formed inside the via hole. The metal layer, the optical waveguide or the like formed inside the via hole may be referred to as the "connection part".

The semiconductor substrates 31c and 41c are bonded to one another via a resin layer 36, and the electrode pads 35 of the semiconductor substrate 31c and the electrode pads 45 of the semiconductor substrate 41c are electrically connected to each other via metal layers 58 formed in via holes 41y. The semiconductor substrates 41c and 51c are bonded to one another via a resin layer 46, and the electrode pads 45 of the semiconductor substrate 41c and the electrode pads 55 of the semiconductor substrate 51c are electrically connected to each other via metal layers 68 formed in via holes 51y.

The semiconductor substrates 51c and 61c are bonded to one another via a resin layer 56, and the electrode pads 55 of the semiconductor substrate 51c and the electrode pads 65 of the semiconductor substrate 61c are electrically connected to each other via metal layers 78 formed in via holes 61y. The semiconductor substrates 61c and 71c are bonded to one another via a resin layer 66, and the electrode pads 65 of the semiconductor substrate 61c and the electrode pads 75 of the semiconductor substrate 71c are electrically connected to each other via metal layers 88 formed in via holes 71y.

In the semiconductor substrate 71c, a solder mask layer 76 having openings 76x is formed, and external connection terminals 91 are formed inside the openings 76x. The external connection terminals 91 are provided to electrically connect the semiconductor device 10 and a wiring substrate or the like provided outside the semiconductor device 10, and are connected to the electrode pads 75. As the external connection terminals 91, solder balls, Au bumps, a conductive paste or the like may be used. In the case when solder balls are used as the external connection terminals 91, an alloy containing Pb, an alloy of Sn and Cu, an alloy of Sn and Ag, an alloy of Sn, Ag and Cu or the like may be used as a material of the external connection terminals 91.

Processes for Manufacturing Semiconductor Device According to First Embodiment

Next is described a manufacturing process flow of the semiconductor device according to the first embodiment of the present invention. FIGS. 4A to 4T illustrate the manufacturing process flow of the semiconductor device according to the first embodiment of the present invention. In FIGS. 4A to 4T, the same reference numerals are given to the components which are common to the semiconductor device 10 shown in FIG. 3, and their explanations may be omitted.

First, a semiconductor substrate 11 shown in FIGS. 4A and 4B is prepared. FIG. 4A is a plan view and FIG. 4B is a cross-sectional view. With reference to FIGS. 4A and 4B, the semiconductor substrate 11 includes the substrate body 12, the semiconductor integrated circuit 13 and the electrode pads 15. Note that, in FIG. 4A, the electrode pads 15 are not shown. In FIG. 4B, the reference numeral 11a denotes one surface of the semiconductor substrate 11 (the surface on which the electrode pads 15 are formed, i.e., the main surface), and the reference numeral 11b denotes the other surface of the semiconductor substrate 11 (i.e., the surface opposite to the main surface).

The substrate body 12 is made, for example, of silicon. The semiconductor integrated circuit 13 has, for example, a configuration in which a diffusion layer (not shown), an insulating layer (not shown), via holes (not shown), a wiring layer (not shown) and the like are formed in silicon. The electrode pads 15 are formed on the semiconductor integrated circuit 13 via the insulating layer (not shown). As each of the electrode pads 15, a laminated body or the like may be used, in which an Au layer is disposed on a Ti layer, for example. Or, the following may also be used as the electrode pad 15: a laminated body in which an Au layer is disposed on a Ni layer; a laminated body in which a Pd layer and an Au layer are sequentially disposed on a Ni layer; a laminated body in which a Cu layer or an Al layer is disposed on a layer of a high melting point metal, such as Co, Ta, Ti and TiN, in place of Ni; or a damascene interconnect structure.

The semiconductor substrate 11 includes plural semiconductor chip formation regions A and a scribing region B for separating the plural semiconductor chip formation regions A. The reference symbol. C indicates a position at which, on the semiconductor substrate 11, cutting is performed using a dicing blade or the like (hereinafter, referred to as the "cutting position C"). A diameter φ1 of the semiconductor substrate 11 is, for example, 6 inches (about 150 mm), 8 inches (about 200 mm) or 12 inches (about 300 mm). A thickness T1 of the semiconductor substrate 11 is, for example, 0.625 mm (when φ1=6 inches), 0.725 mm (when φ1=8 inches) and 0.775 mm (when φ1=12 inches). In the present embodiment, the following description is given with an example in which an 8-inch-diameter (about 200 mm in diameter) silicon wafer is used as the semiconductor substrate 11.

Subsequently, in a process shown in FIG. 4C, a fringe portion 11x of the semiconductor substrate 11 shown in FIGS. 4A and 4B is removed. The semiconductor substrate 11 after the fringe portion 11x is removed is referred to as the semiconductor substrate 11c. The removal of the fringe portion 11x is performed by grinding with a grinder or the like in such a manner that the semiconductor substrate 11c after the removal of the fringe portion 11x has, for example, a circular shape in a planar view. In this operation, dry polishing, wet etching or the like may also be used in combination.

The dry polishing here is a processing method in which a surface is ground down (polished) using abrasive cloth formed by hardening fibers containing silica, for example. The wet etching is a processing method in which etching is performed by supplying fluoro-nitric acid or the like while the semiconductor substrate 11 is rotated using a spinner, for example. In the case where the semiconductor substrate 11c after the removal of the fringe portion 11x has a circular shape in a planar view, a diameter φ2 of the semiconductor substrate 11c having a circular shape in a planar view is, for example, 193.0±0.1 mm. That is, the semiconductor substrate 11 whose diameter φ1 is 8 inches (about 200 mm) is reduced in diameter to form the semiconductor substrate 11c with the diameter φ2 of 193.0±0.1 mm.

Figure 4D:
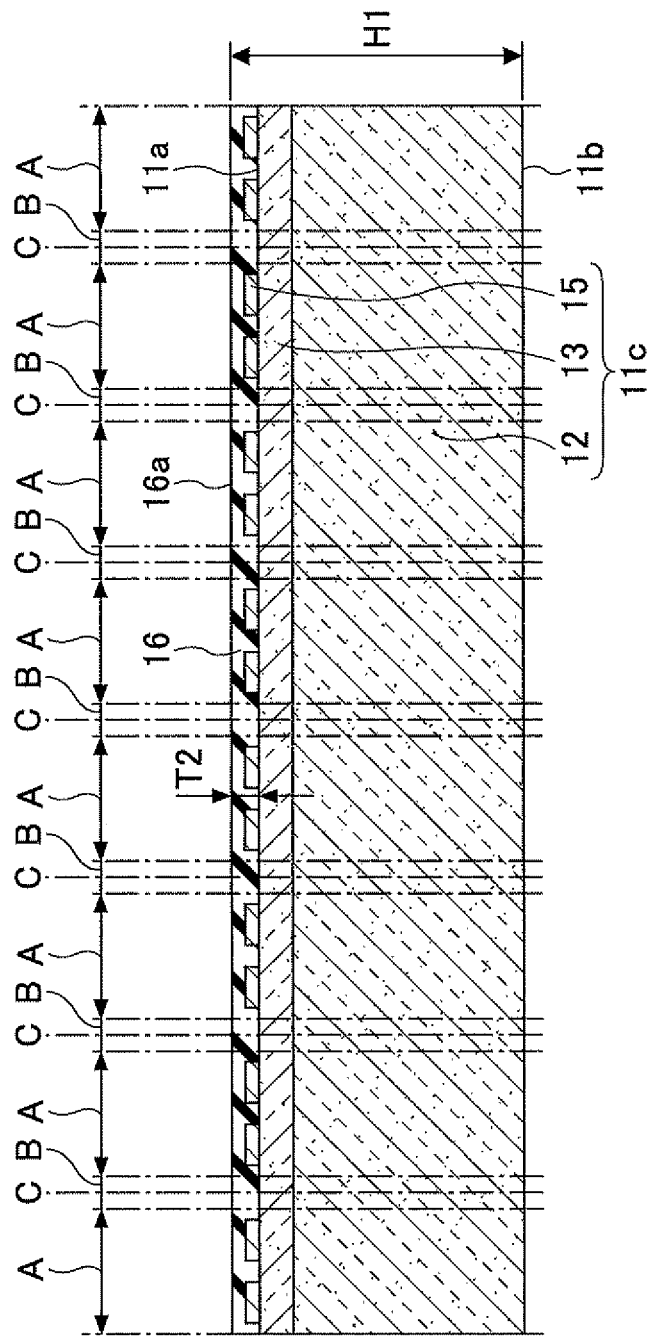
FIG. 4D illustrates a fourth process of the manufacturing process flow of the semiconductor device according to the first embodiment of the present invention.

Next in a process shown in FIG. 4D, the resin layer 16 is formed on the surface 11a of the semiconductor substrate 11c. A resin mainly composed of, for example, benzocyclobutene (BCB) may be used as a material of the resin layer 16. Alternatively, an epoxide-based resin, an acrylic-based resin, a polyimide-based resin or the like may be used as a material of the resin layer 16. A thickness T2 of the resin layer 16 is, for example, about 5 μm. The resin layer 16 may be formed by applying a resin mainly composed of, for example, benzocyclobutene (BCB) to the surface 11a of the semiconductor substrate 11c using, for example, a spin-coating technique. Subsequently, the resin layer 16 is prebaked at 140° C., for example, to be semi-hardened. The semi-hardened resin layer 16 has adhesiveness. Note that the resin layer 16 may be formed by a vapor-phase growth method or by attaching a film resin, instead of using spin-coating technique.

In the process shown in FIG. 4D, it is preferable that, when the surface 11b of the semiconductor substrate 11c is used as a reference plane, a surface 16a of the resin layer 16 be parallel to the reference plane. If the surface 16a of the resin layer 16 is not parallel to the reference plane, for example, the via holes 21y are formed at an angle in a process shown in FIG. 4I to be described below, and the metal layers 38 or the like are formed in the slanted via holes 21y. This may result in the problem of decreased reliability of the connection between adjacent semiconductor substrates. Note that being parallel in this case means that the variation in a height H1 of the surface 16a of the resin layer 16 with respect to the reference plane is 1 μm or less. Accordingly, it is preferable to have a process of checking the variation in the height H1 after the formation of the resin layer 16. In the case where the variation in the height H1 is more than 1 μm, it is preferable to have a process of adjusting the surface 16a of the resin layer 16 to make the variation in the height H1 within 1 μm. The surface 16a of the resin layer 16 may be processed (ground) by, for example, a CMP method.

When n semiconductor substrates have already been disposed one above the other and a resin layer is then formed on the topmost (the $n^{th}$ layer) semiconductor substrate, the back surface of the lowermost semiconductor substrate (the surface on which no devices are formed) is used as a reference plane. In this case, it is preferable that the top surface of the resin layer be parallel to the reference plane. Note that being parallel in this case means that the variation in the height of the top surface of the resin layer with respect to the reference plane is (1×n) μm or less. That is, as described above, in the case when a resin layer is formed on a single semiconductor substrate, the variation in the height of the top surface of the resin layer with respect to the reference plane is preferably 1×1=1 μm or less, and in the case when a resin layer is formed on semiconductor substrates of, for example, ten layers, the variation in the height of the top surface of the resin layer with respect to the reference plane (the back surface of the lowermost semiconductor substrate) is preferably 1×10=10 μm or less.

Figure 4E:
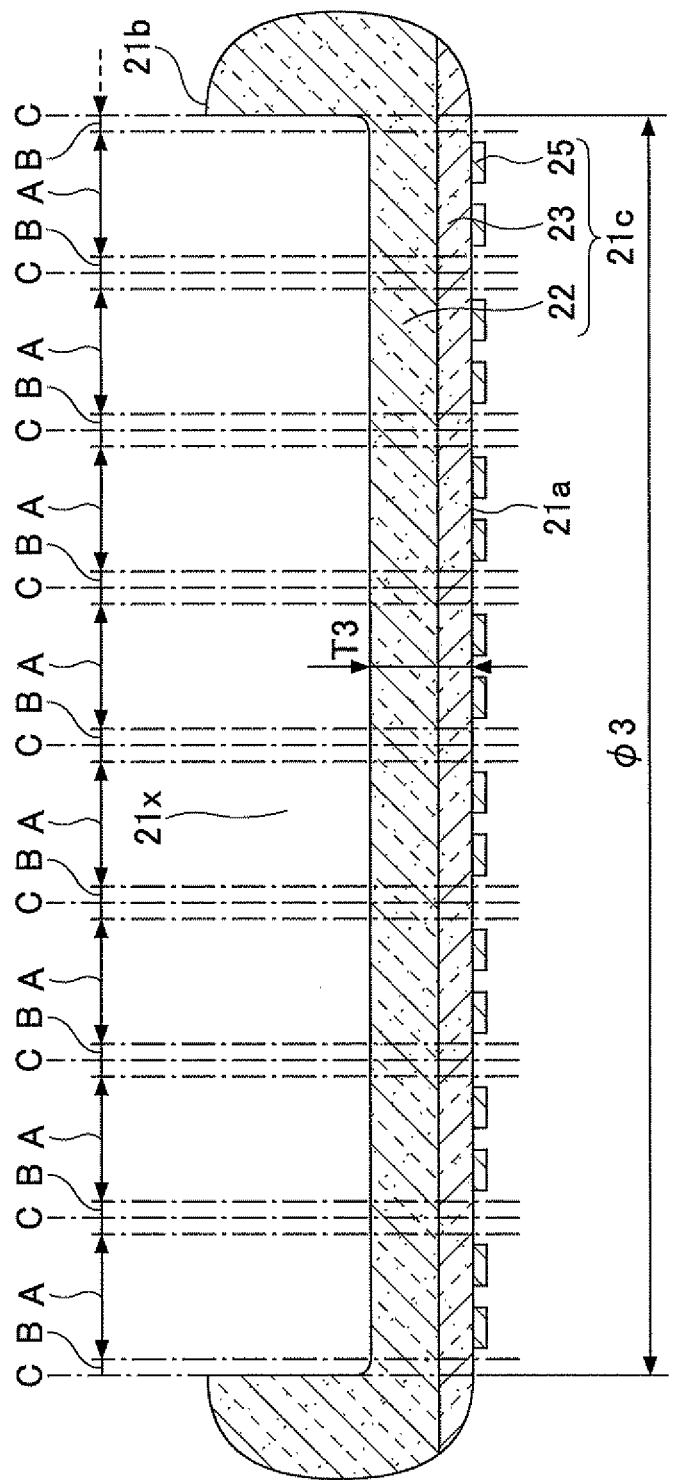
FIG. 4E illustrates a fifth process of the manufacturing process flow of the semiconductor device according to the first embodiment of the present invention.

Next in a process shown in FIG. 4E, a semiconductor substrate 21, which has a configuration the same as that of the semiconductor substrate 11 of FIGS. 4A and 4B, is prepared. In FIG. 4E, the reference numeral 21a denotes one surface of the semiconductor substrate 21 (the surface on which the electrode pads 25 are formed, i.e., the main surface), and the reference numeral 21b denotes the other surface of the semiconductor substrate 21 (i.e., the surface opposite to the main surface). The semiconductor substrate 21 includes a substrate body 22, a semiconductor integrated circuit 23 and the electrode pads 25. Details about the semiconductor substrate 21 are the same as those of the semiconductor substrate 11, and the explanation is therefore omitted.

Subsequently, a depression 21x is formed on the surface 21b side of the prepared semiconductor substrate 21. The semiconductor substrate 21 after the formation of the depression 21x is referred to as the semiconductor substrate 21c. The depression 21x is formed, for example, in such a manner as to reduce the thickness of the central portion and its vicinity (an area including the plural semiconductor chip formation regions A) while leaving the fringe portion of the semiconductor substrate 21 (an area excluding the plural semiconductor chip formation regions A). The depression 21x is formed, for example, by grinding the surface 21b of the semiconductor substrate 21 using a grinder or the like. In this operation, dry polishing, wet etching or the like may also be used in combination.

The depression 21x has, for example, a circular shape in a planar view; however, it may have a shape other than circular. In the case where the depression 21x has a circular shape in a planar view, a diameter φ3 of the depression 21x having a circular shape in a planar view is, for example, 195.2±0.1 mm. A thickness T3 of the area with a reduced thickness in the semiconductor substrate 21c is in the range of about 1 μm to about 100 μm, for example; however, in terms of strength, the thickness T3 is preferably in the range of about 10 μm to about 50 μm. This is because setting the thickness T3 of the area with a reduced thickness to about 10 μm to about 50 μm reduces breakage due to mechanical vibrations or the like and stress exerted on the semiconductor chips. Note that the lateral side of the depression 21x does not necessarily have to be perpendicular to the bottom surface of the depression 21x.

The reason for the thickness T3 of the area with a reduced thickness in the semiconductor substrate 21c being 1 μm or more is as follows. It is considered that, in order to prevent a defect or contamination having occurred on the back surface of the semiconductor substrate 21c (the surface on which no devices are formed) from spreading to devices, such as transistors, in the semiconductor integrated circuit 23, the thickness T3 of the area with a reduced thickness in the semiconductor substrate 21c needs to be at least five times or more the depth of element isolation (not shown) in the devices. Here, the depth of element isolation (not shown) in the devices in the semiconductor integrated circuit 23 is in the range of about 200 nm to about 500 nm. Accordingly, the thickness T3 of the area with a reduced thickness in the semiconductor substrate 21c needs to be at least 1 μm, which is five times the minimum value of the depth of element isolation, 200 nm.

Thus, by forming the depression 21x in such a manner as to reduce the thickness of the central portion and its vicinity (the area including the plural semiconductor chip formation regions A) while leaving the fringe portion of the semiconductor substrate 21 (the area excluding the plural semiconductor chip formation regions A), the semiconductor substrate 21c after the formation of the depression 21x maintains sufficient rigidity. Accordingly, the method for manufacturing the semiconductor device according to the first embodiment of the present invention does not need to employ a support having a function of supporting the semiconductor substrate 21c, as described in the section of Background Art, and the semiconductor substrate 21c with a reduced thickness can be treated in the same manner as the semiconductor substrate 21 before the thickness reduction. This eliminates the need for the processes of bonding and removing the support to/from the semiconductor substrate, which processes are not usual wafer processes of a semiconductor device. As a result, it is possible to improve the productivity.

Figure 4F:
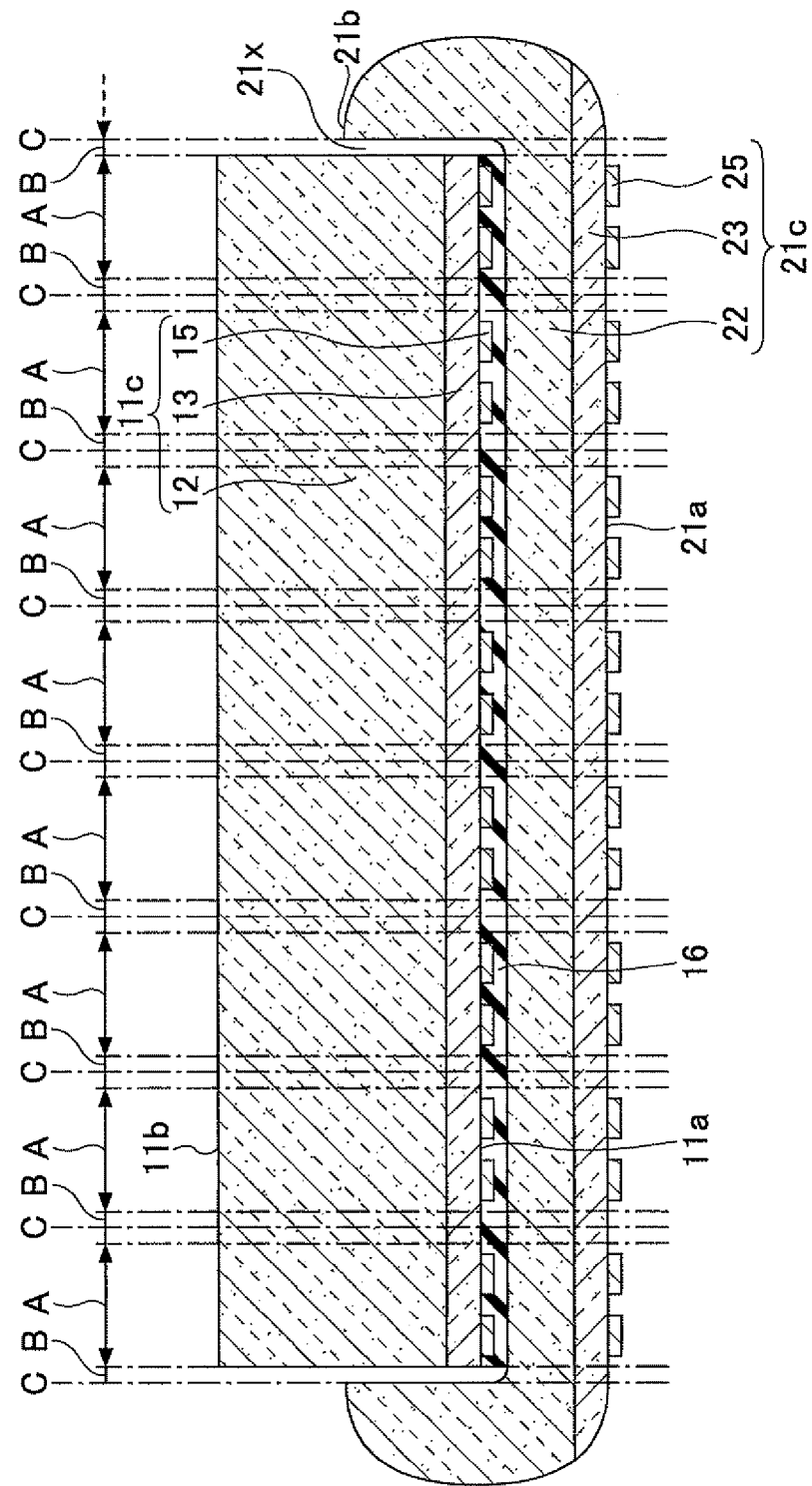
FIG. 4F illustrates a sixth process of the manufacturing process flow of the semiconductor device according to the first embodiment of the present invention.

Next in a process shown in FIG. 4F, the semiconductor substrate 11c is bonded to the depression 21x of the semiconductor substrate 21c. First, the semiconductor substrate 11c is disposed in such a manner that the resin layer 16 formed on the surface 11a of the semiconductor substrate 11c comes in contact with the bottom surface of the depression 21x of the semiconductor substrate 21c. Alignment marks for enabling highly accurate positioning are provided in advance in, for example, the scribing regions B of the semiconductor substrates 11c and 21c. The positioning of the semiconductor substrate 11c may be achieved by a well-recognized method using the alignment marks as a reference. The alignment accuracy is, for example, 2 μm or less.

Note that a certain amount of gap is formed between the lateral side of the depression 21x of the semiconductor substrate 21c and the lateral side of the semiconductor substrate 11c. In the case where both the depression 21x of the semiconductor substrate 21c and the semiconductor substrate 11c have, for example, a circular shape in a planar view, the gap in the shape of a circular ring is formed. Subsequently, while the structure shown in FIG. 4F is being heated at, for example, 250° C., the semiconductor substrate 11c is pressed from the surface 11b side to thereby cause the resin layer 16 formed on the surface 11a of the semiconductor substrate 11c to be press-bonded to the bottom surface of the depression 21x of the semiconductor substrate 21c. Herewith, the resin layer 16 becomes hardened, and the semiconductor substrate 11c is bonded in the depression 21x to the semiconductor substrate 21c. The heating operation may be performed at 300° C.; however, the temperature is preferably 200° C. or less. If the operation is performed at the temperature as high as 300° C., stress occurs due to a difference in the thermal expansion, which can cause separation and/or breakage of the semiconductor substrates. Such separation and breakage becomes more likely as the number of laminated layers increases.

Figure 4G:
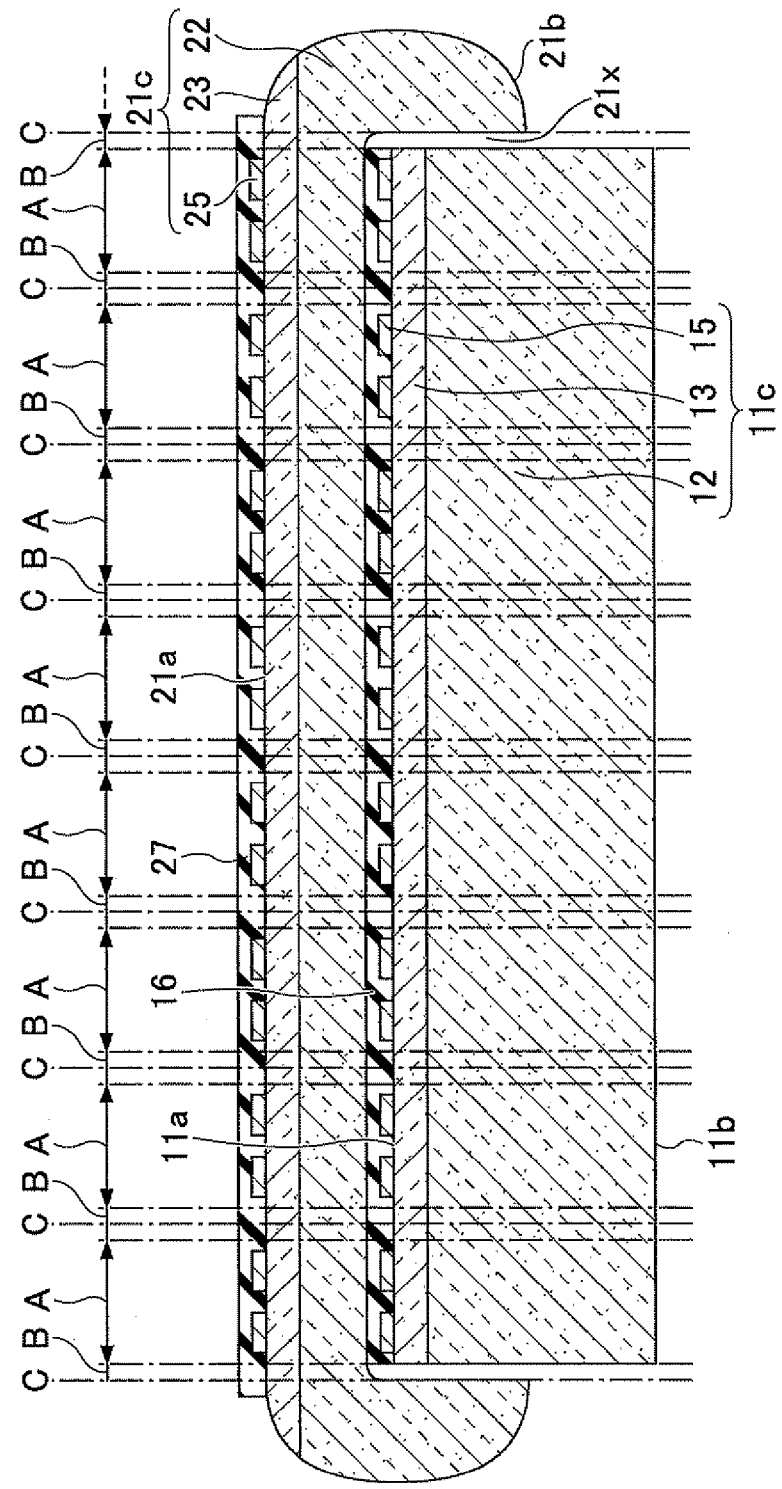
FIG. 4G illustrates a seventh process of the manufacturing process flow of the semiconductor device according to the first embodiment of the present invention.

Next in a process shown in FIG. 4G, a photosensitive resist film 27 is formed in such a manner as to cover the surface 21a of the semiconductor substrate 21c. The resist film 27 is formed, for example, by applying a liquid resist to the surface 21a of the semiconductor substrate 21c. The thickness of the resist film 27 is 10 μm, for example.

Figure 4H:
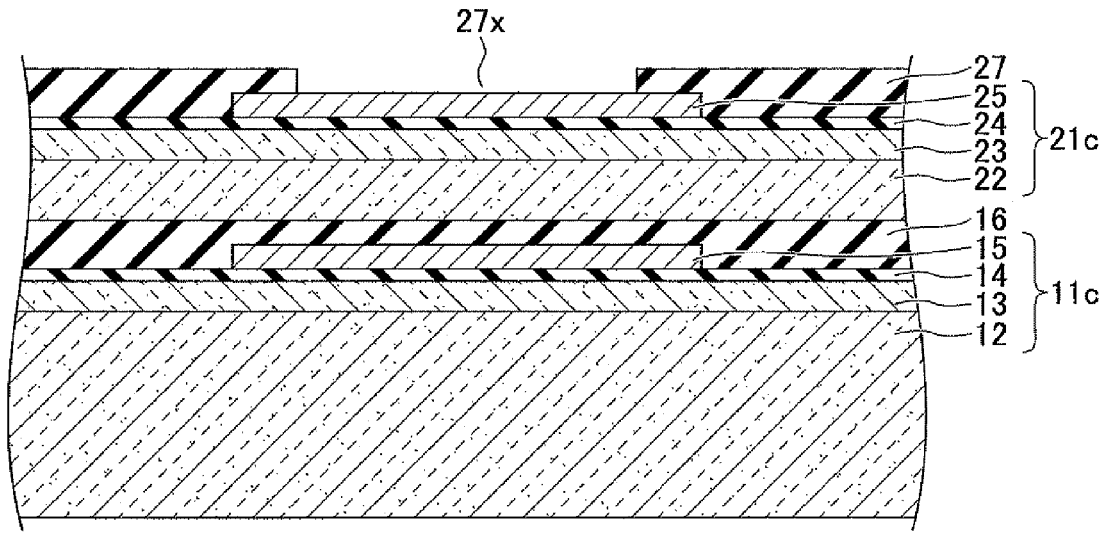
FIG. 4H illustrates an eighth process of the manufacturing process flow of the semiconductor device according to the first embodiment of the present invention.

Next in a process shown in FIG. 4H, the resist film 27 of FIG. 4G is exposed via a predetermined mask, and the exposed resist film 27 is subsequently developed, thereby forming an opening 27x in the resist film 27. Note that for convenience of explanation, FIGS. 4H to 4S show enlarged views of a part of the structure shown in FIG. 4G (i.e., the electrode pads 15 and 25 and their vicinity). The reference numerals 14 and 24 of FIG. 4H denote insulating layers provided on the semiconductor integrated circuits 13 and 23, respectively, which insulating layers are not shown in FIGS. 4A to 4G. The insulating layers 14 and 24 are made of, for example, $Si_3N_4$ or $SiO_2$. The thickness of each of the insulating layers 14 and 24 is in the range of, for example, 0.1 μm to 2.0 μm so as to achieve electrical insulation between the semiconductor integrated circuits 13 and 23.

Figure 4I:
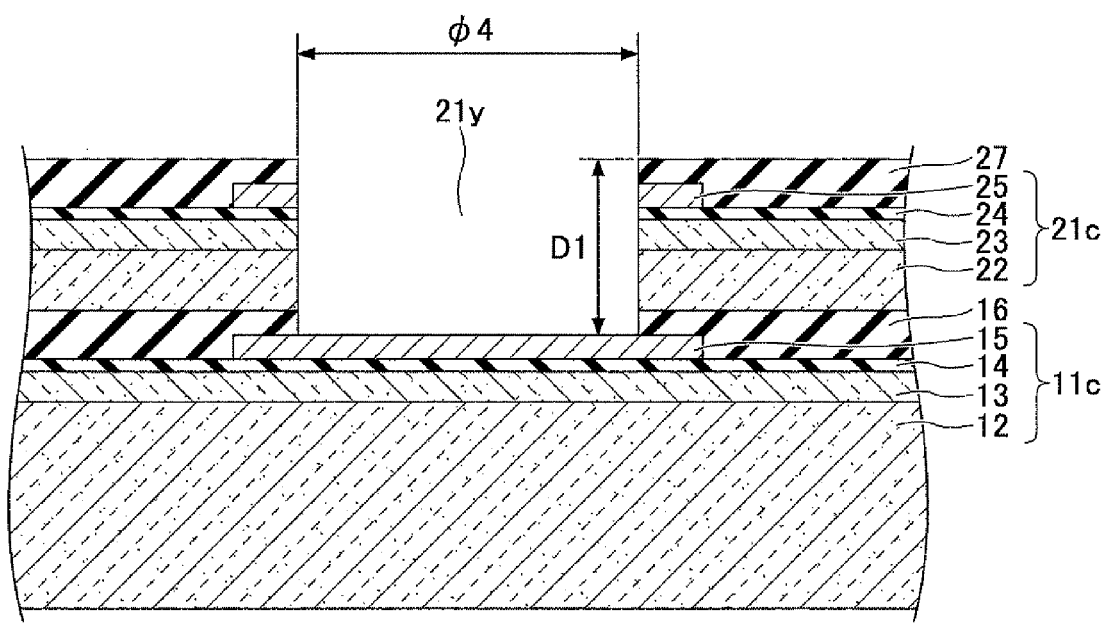
FIG. 4I illustrates a ninth process of the manufacturing process flow of the semiconductor device according to the first embodiment of the present invention.

Next in a process shown in FIG. 4I, the via hole 21y is formed in the semiconductor substrate 21c. The via hole 21y is formed in such a manner to penetrate the resin layer 16 and a part of the semiconductor substrate 21c (the substrate body 22, the semiconductor integrated circuit 23, the insulating layer 24 and the electrode pad 25) corresponding to the opening 27x so that the electrode pad 15 of the semiconductor substrate 11c is exposed. The via hole 21y is formed by, for example, dry etching. The via hole 21y has, for example, a circular shape in a planar view, and has a diameter φ4 of, for example, 1 μm to 30 μm. Note however that the diameter φ4 of the via hole 21y is preferably set to a value which allows the via hole 21y to have an aspect ratio (=depth D1/diameter φ4) between 0.5 and 5 inclusive. This is because by setting the diameter φ4 of the via hole 21y to a value which allows the via hole 21y to have an aspect ratio (=depth D1/diameter φ4) between 0.5 and 5 inclusive, it is possible to achieve, for example, an improvement in the etching speed (throughput) for forming the via hole 21y and an improvement of the ease of forming the metal layer 38 in the via hole 21y.

Figure 4J:
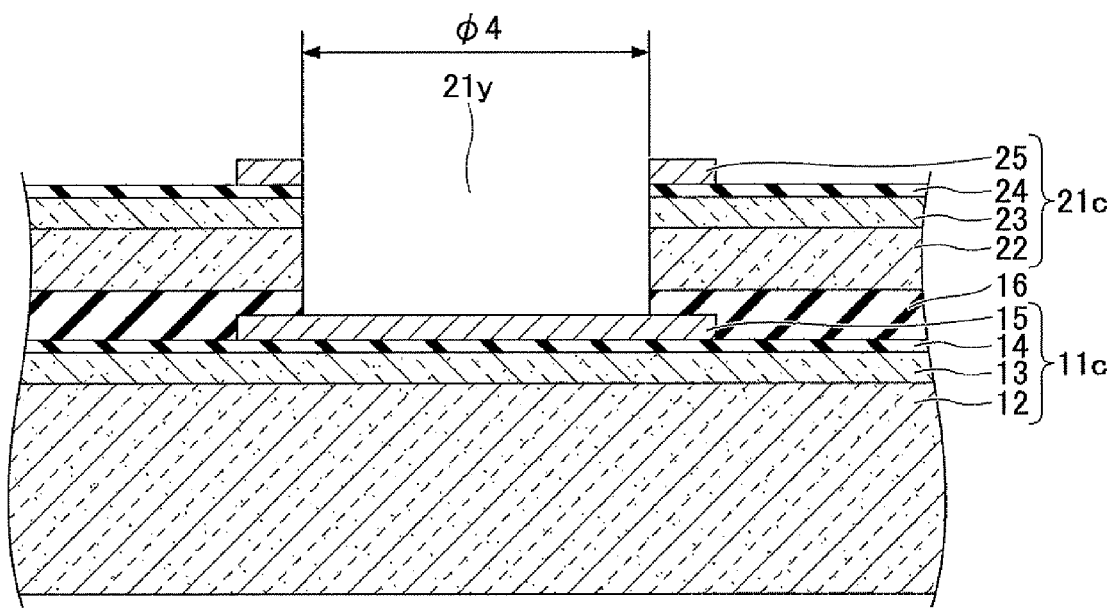
FIG. 4J illustrates a tenth process of the manufacturing process flow of the semiconductor device according to the first embodiment of the present invention.
Figure 4K:
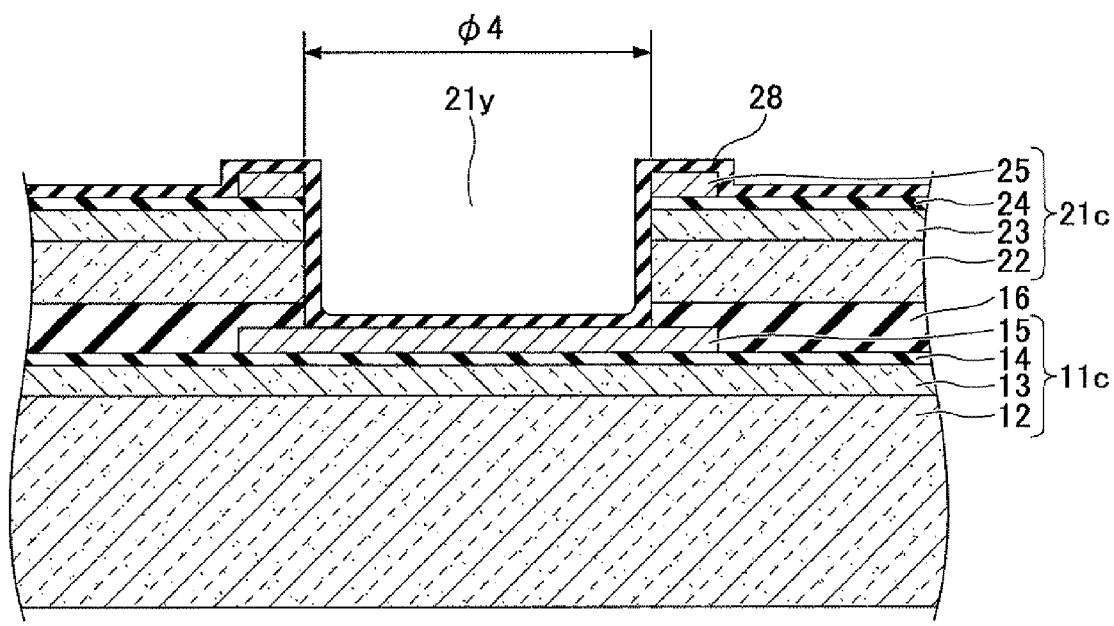
FIG. 4K illustrates an eleventh process of the manufacturing process flow of the semiconductor device according to the first embodiment of the present invention.

Next in a process shown in FIG. 4J, the resist film 27 of FIG. 4I is removed. Then, in a process shown in FIG. 4K, an insulating layer 28 is formed in such a manner as to cover the top surface of the insulting layer 24, the top surface and lateral side of the electrode pad 25, the wall surface of the via hole 21y and the top surface of the electrode pad 15 exposed at the bottom of the via hole 21y. The insulating layer 28 is formed by, for example, plasma CVD. The insulating layer 28 is made of, for example, $Si_3N_4$ or $SiO_2$. The thickness of the insulating layer 28 is in the range of 0.1 μm to 2.0 μm, for example.

Figure 4L:
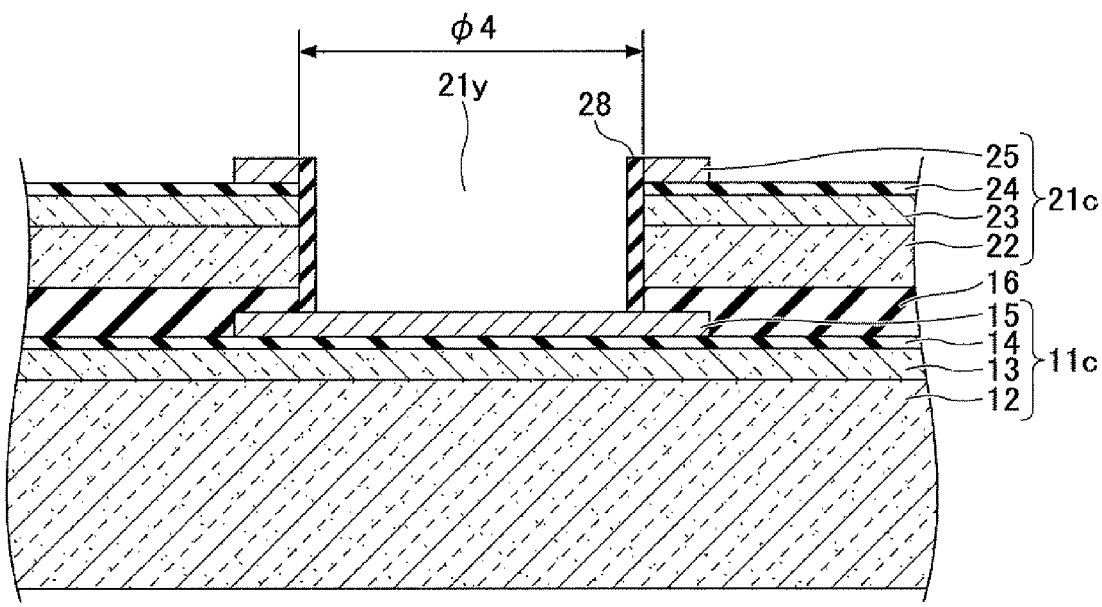
FIG. 4L illustrates a twelfth process of the manufacturing process flow of the semiconductor device according to the first embodiment of the present invention.

Next in a process shown in FIG. 4L, the insulating layer 28 is removed, except for that formed on the wall surface of the via hole 21y. The removal of the insulating layer 28 is performed by, for example, RIE (Reactive Ion Etching). In this process, only predetermined parts of the insulating layer 28 are removed without using a photomask, and the process is referred to as a self-alignment process. By the self-alignment process, the positions of the via hole 21y and the electrode pad 25 are determined with accuracy. In addition, by using a design in which no electrode pad is present in some part, etching is performed in the section with no electrode pad and is continued to the electrode pad of a different semiconductor substrate in the underlying section, to thereby form a via hole having a different depth.

Figure 4M:
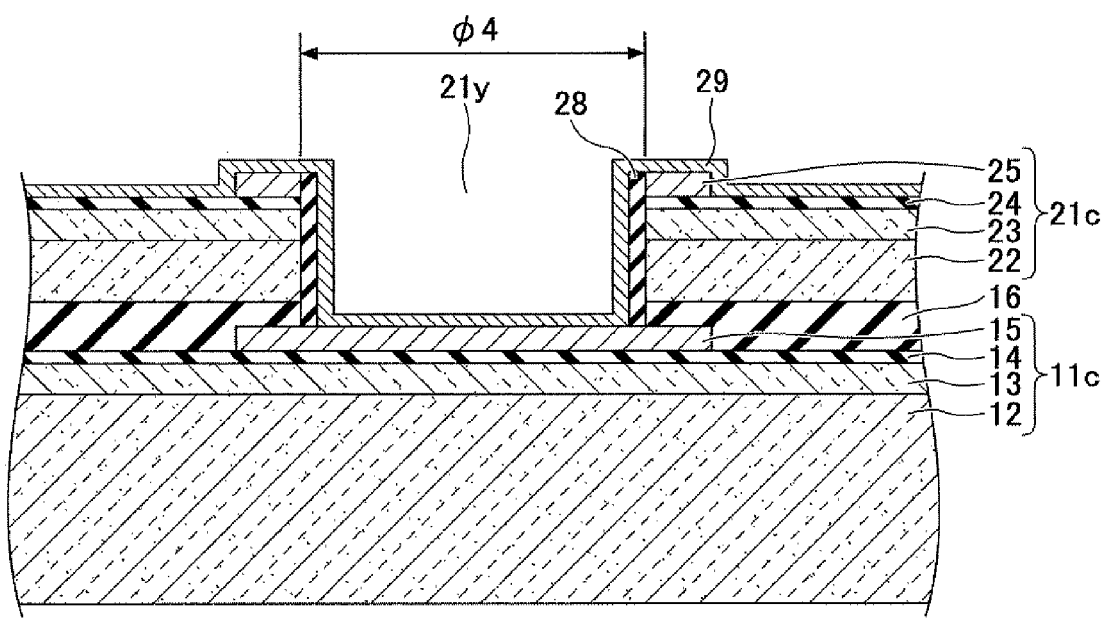
FIG. 4M illustrates a thirteenth process of the manufacturing process flow of the semiconductor device according to the first embodiment of the present invention.

Next in a process shown in FIG. 4M, a metal layer 29 is formed in such a manner as to cover the top surface of the insulating layer 24, the top surface and lateral side of the electrode pad 25, the top surface of the insulating layer 28 and the top surface of the electrode pad 15 exposed at the bottom of the via hole 21y. The metal layer 29 is formed by, for example, electroless plating, or may be formed by sputtering, CVD or the like. As the metal layer 29, a laminated body in which a Cu layer is disposed on a Ti layer, or a laminated body in which a Cu layer is disposed on a Ta layer, for example, may be used. In addition, a conductor which satisfies the design criteria can be used as the buried material, and W, Al, doped polysilicon, a carbon material such as a carbon nanotube, or a conductive polymer may be used in place of Cu. In the case where the electrical insulation of the insulating layer is sufficient, a combination with a buried wiring using no barrier metal layer may be chosen.

Figure 4N:
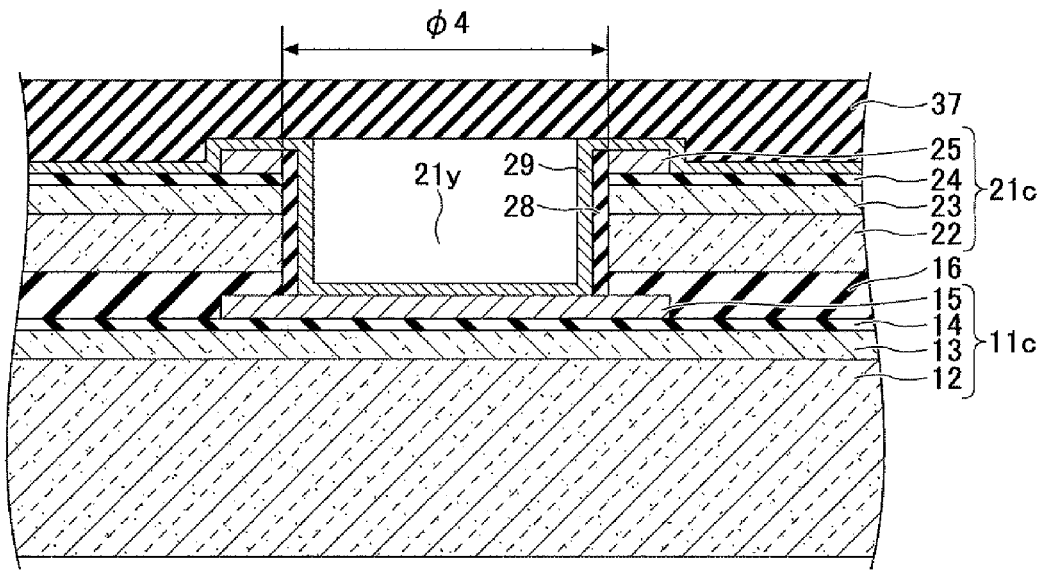
FIG. 4N illustrates a fourteenth process of the manufacturing process flow of the semiconductor device according to the first embodiment of the present invention.

Next in a process shown in FIG. 4N, a photosensitive resist film 37 is formed in such a manner as to cover the top surface of the metal layer 29 except for the inside of the via hole 21y. The resist film 37 is formed, for example, by applying a dry film resist to the top surface of the metal layer 29. The thickness of the resist film 37 is 10 μm, for example. Then, in a process shown in FIG. 4O, the resist film 37 of FIG. 4N is exposed via a predetermined mask, and the exposed resist film 37 is subsequently developed, thereby forming an opening 37x in the resist film 37. The opening 37x has, for example, a circular shape in a planar view, and has a diameter φ5 of, for example, 1 μm to 30 μm.

Figure 4O:
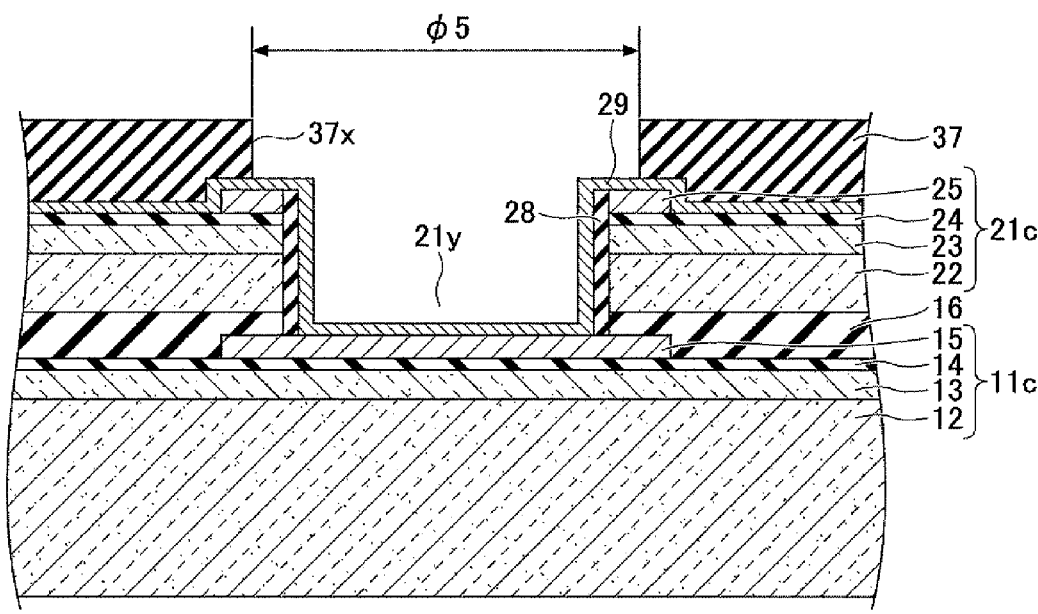
FIG. 4O illustrates a fifteenth process of the manufacturing process flow of the semiconductor device according to the first embodiment of the present invention.
Figure 4P:
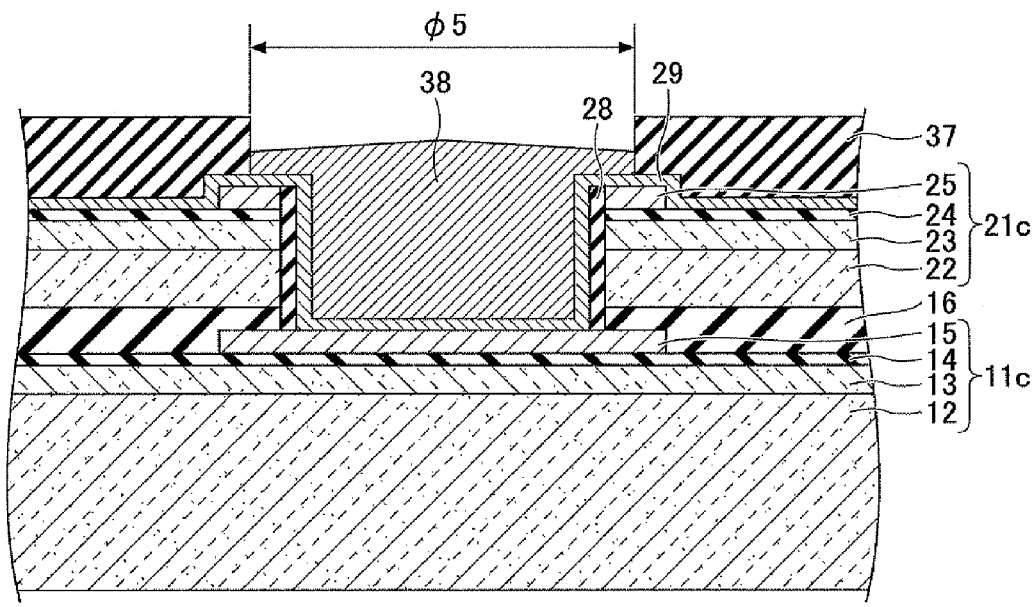
FIG. 4P illustrates a sixteenth process of the manufacturing process flow of the semiconductor device according to the first embodiment of the present invention.
Figure 4Q:
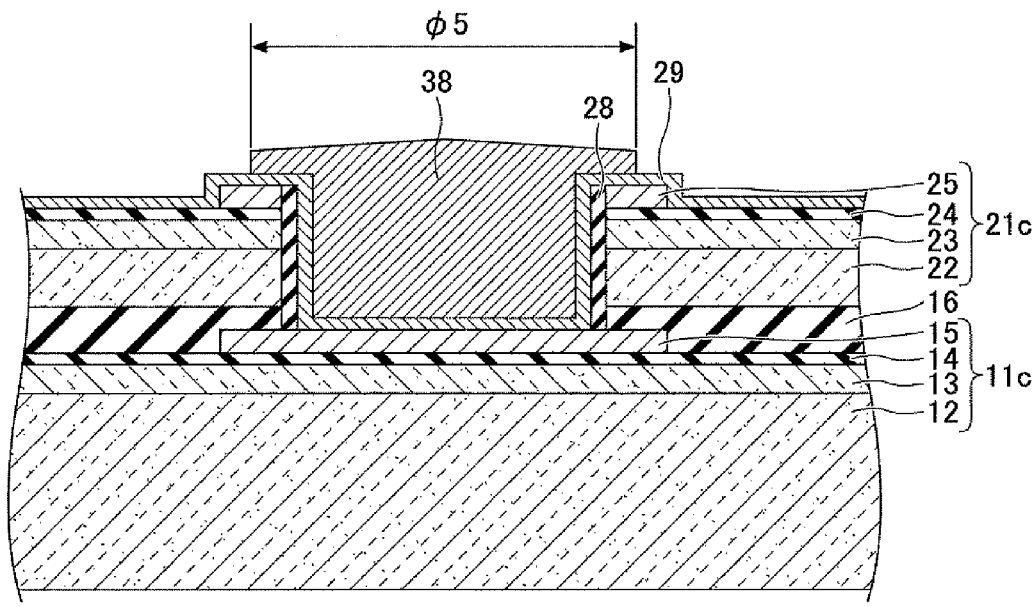
FIG. 4Q illustrates a seventeenth process of the manufacturing process flow of the semiconductor device according to the first embodiment of the present invention.

Next in a process shown in FIG. 4P, the metal layer 38 is formed inside the via hole 21y and on a part of the opening 37x shown in FIG. 4O. With use of electrolytic plating, in which the metal layer 29 is used as a feeder layer, the metal layer 38 is formed, for example, by growing a plating film by precipitation in such a manner as to fill the inside of the via hole 21y and the part of the opening 37x shown in FIG. 4O. The plating film forming the metal layer 38 is, for example, a Cu plating film. Next in a process shown in FIG. 4Q, the resist film 37 of FIG. 4P is removed.

Figure 4R:
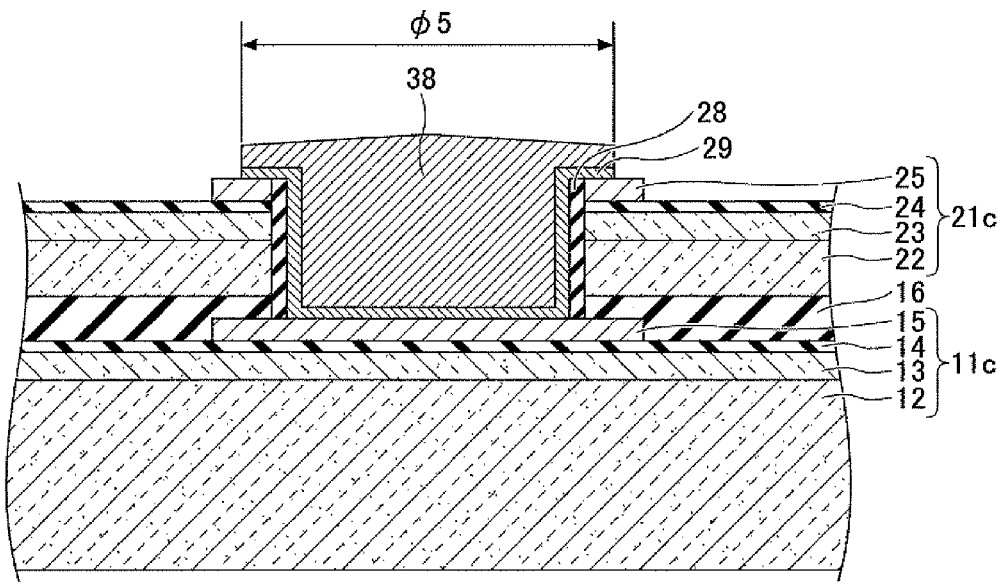
FIG. 4R illustrates an eighteenth process of the manufacturing process flow of the semiconductor device according to the first embodiment of the present invention.
Figure 4S:
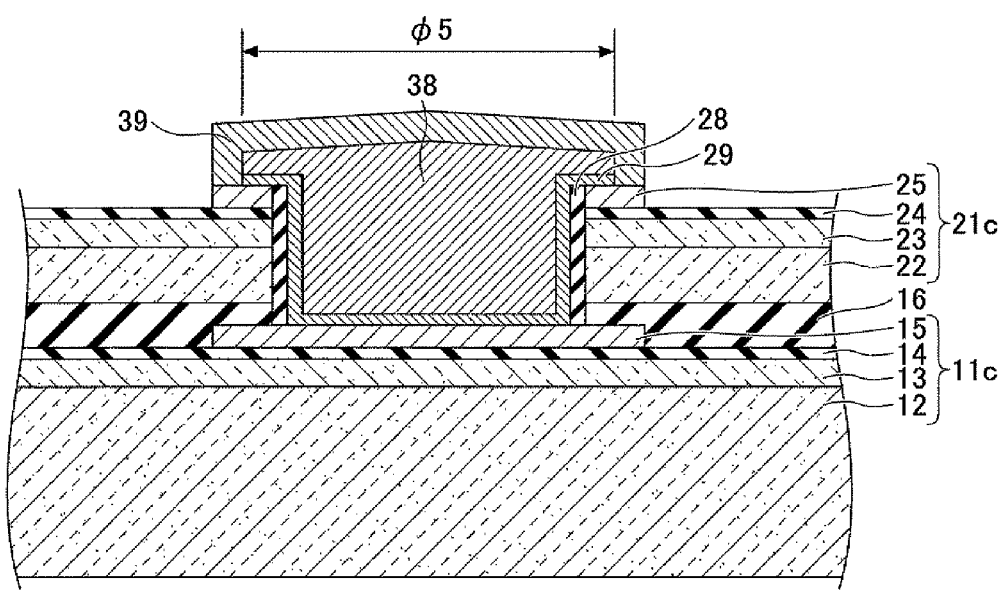
FIG. 4S illustrates a nineteenth process of the manufacturing process flow of the semiconductor device according to the first embodiment of the present invention.
Figure 4T:
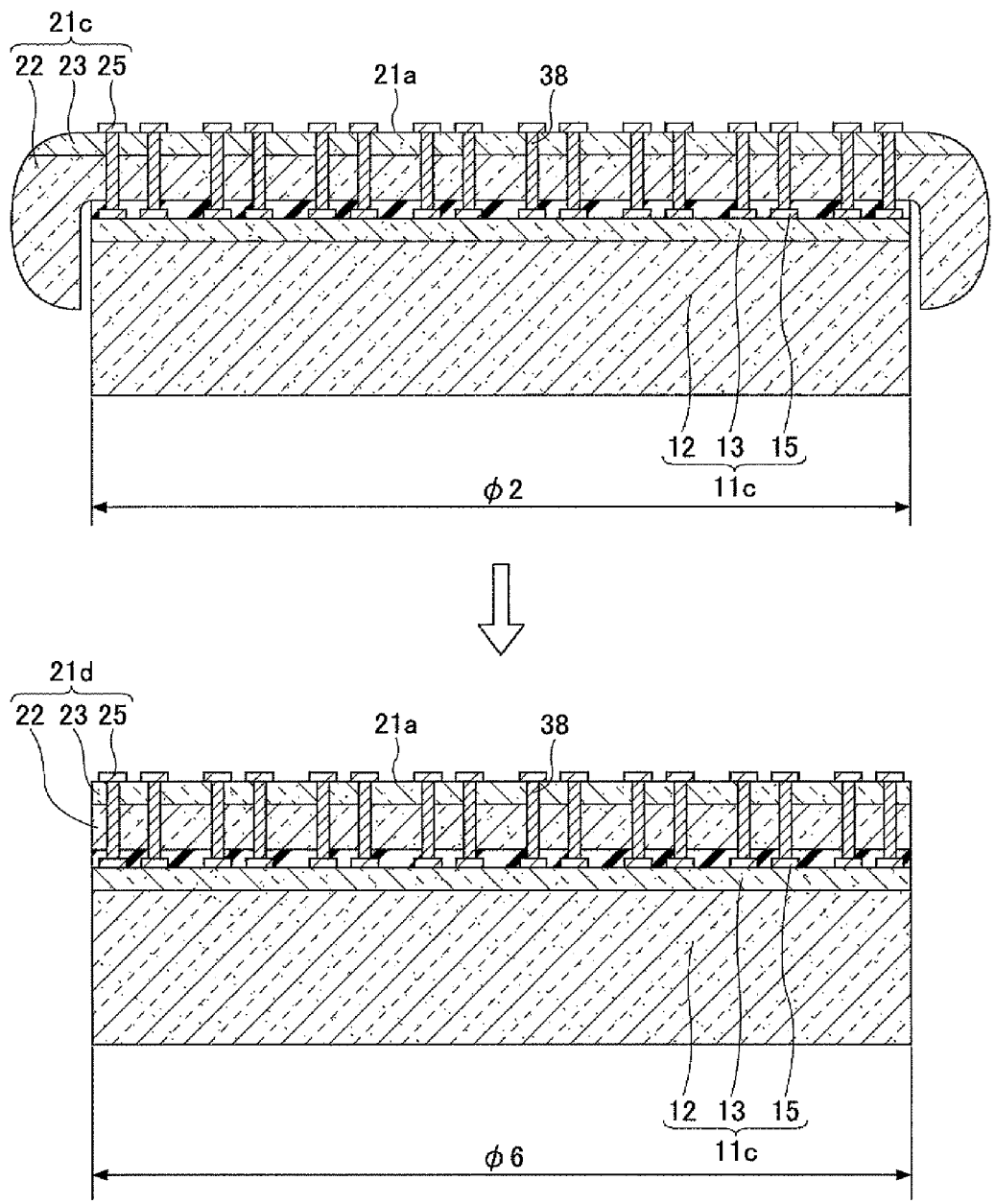
FIG. 4T illustrates a twentieth process of the manufacturing process flow of the semiconductor device according to the first embodiment of the present invention.

Next in a process shown in FIG. 4R, a part of the metal layer 29 which is not covered by the metal layer 38 is removed. The metal layer 29 may be removed by, for example, wet etching. Next in a process shown in FIG. 4S, a metal layer 39 is formed in such a manner as to cover the electrode pad 25 and the metal layer 38. The metal layer 39 is formed, for example, by forming, on the insulating layer 24, a resist film having an opening for the electrode pad 25 and the metal layer 38. Subsequently, with use of electrolytic plating, in which the electrode pad 25 and the metal layer 38 are used as feeder layers, a plating film is grown by precipitation in such a manner as to fill the opening, and the resist film is then removed to thereby form the metal layer 39. As the metal layer 39, the following may be used: a laminated body in which an Au layer is disposed on a Ti layer, for example; a laminated body in which a Pd layer and an Au layer are sequentially disposed on a Ni layer; a laminated body in which a Cu layer or an Al layer is disposed on a layer of a high melting point metal, such as Co, Ta, Ti and TiN, in place of Ni; or a damascene interconnect structure.

Next in a process shown in FIG. 4T, a fringe portion of the semiconductor substrate 21c is removed. The semiconductor substrate 21c after the removal of the fringe portion is referred to as a semiconductor substrate 21d. The removal of the fringe portion of the semiconductor substrate 21c is performed by grinding with a grinder or the like in such a manner that the semiconductor substrate 21d after the removal of the fringe portion has, for example, a circular shape in a planar view. In this operation, dry polishing, wet etching or the like may also be used in combination. In the case where the semiconductor substrate 21d after the removal of the fringe portion has a circular shape in a planar view, a diameter φ6 of the semiconductor substrate 21d having a circular shape in a planar view is, for example, 193.0±0.1 mm, as in the case of the diameter φ2 of the semiconductor substrate 11c having a circular shape in a planar view.

Next, after a resin layer 26 is formed on the surface 21a of the semiconductor substrate 21d, the semiconductor substrate 31 is prepared, which has a configuration the same as that of the semiconductor substrate 11 of FIGS. 4A and 4B. Then, the processes of FIGS. 4E to 4T are repeated. The same processes are repeated for semiconductor substrates 41 to 71. Lastly, the external connection terminals 91 are formed by a well-recognized method. When the external connection terminals 91 are formed, a Ni layer, for example, is formed as the metal layer 39. Then, the solder mask layer 76 having the openings 76x which expose the Ni layer is formed, and the external connection terminals 91 are formed on the Ni layer exposed inside the openings 76x.

The external connection terminals 91 are provided to electrically connect the semiconductor device 10 and a wiring substrate or the like provided outside the semiconductor device 10. As the external connection terminals 91, solder balls, Au bumps, a conductive paste or the like may be used. In the case when solder balls are used as the external connection terminals 91, an alloy containing Pb, an alloy of Sn and Cu, an alloy of Sn and Ag, an alloy of Sn, Ag and Cu or the like may be used as a material of the external connection terminals 91.

In this manner, the semiconductor device 10 of FIG. 3 is manufactured. The semiconductor device 10 is cut into individual pieces at the cutting positions C using a dicing blade or the like to thereby form final products.

According to the first embodiment of the present invention, a first semiconductor substrate is prepared, in which only the fringe portion is removed (reduction in the diameter) without thickness reduction. Also, a second semiconductor substrate is prepared, in which a depression is formed in such a manner as to reduce the thickness of the central portion and its vicinity while leaving the fringe portion. Then, the depression of the second substrate is bonded to the first semiconductor substrate, and via holes are formed in such a manner as to penetrate the second semiconductor substrate with a reduced thickness, and electrode pads of each semiconductor chip of the first and second semiconductor substrates are electrically connected to each other via metal layers formed in the via holes. Then, the fringe portion of the second semiconductor substrate is removed. Furthermore, in the same manner with the second semiconductor, a third semiconductor substrate is prepared, in which a depression is formed to reduce the thickness of the central portion and its vicinity while leaving the fringe portion. Then, the depression of the third substrate is bonded to the second semiconductor substrate, and via holes are formed in such a manner as to penetrate the third semiconductor substrate with a reduced thickness, and electrode pads of each semiconductor chip of the second and third semiconductor substrates are electrically connected to each other via metal layers formed in the via holes. Then, the fringe portion of the third semiconductor substrate is removed.

By repeating such processes, it is possible to dispose plural semiconductor substrates one above the other and connect semiconductor chips, each of which constitutes a different semiconductor substrate, in such a manner as to enable signal transmission. This process flow eliminates the need for the processes of bonding and removing a support to/from the semiconductor substrate, which processes are not usual wafer process of a semiconductor device, and it is therefore possible to provide a semiconductor device manufacturing method with high productivity, capable of reducing the manufacturing costs. Note that in the case when the diameter of the prepared first semiconductor substrate is smaller than the diameter of the bottom surface of the depression in the second semiconductor, the vertical wiring system according to the present invention is applicable without the removal of the fringe portion of the first semiconductor substrate.

In addition, according to the first embodiment of the present invention, a process of forming a bump on each via hole when the semiconductor substrates are bonded to one another is not necessary, and it is therefore possible to provide a semiconductor device manufacturing method with high productivity, capable of reducing the manufacturing costs.

In addition, according to the first embodiment of the present invention, semiconductor substrates are bonded to one another in such a manner that a surface of one of the semiconductor substrates, on which surface a semiconductor integrated circuit is formed, opposes a surface of the other semiconductor substrate, on which surface a semiconductor integrated circuit is not formed. Accordingly, by simply repeating the same processes, three or more semiconductor substrates can be disposed one above the other, and it is therefore possible to provide a semiconductor device manufacturing method with high productivity, capable of reducing the manufacturing costs.

In addition, according to the first embodiment of the present invention, the via holes are formed, within the semiconductor substrate, only in a part having a reduced thickness. This eliminates the need for creating deep via holes, and therefore causes neither an increase in the time required for the hole-formation of the via holes and the metal layer forming process nor an increase in the number of materials required for these processes, which results in preventing an increase in the cost of manufacturing the semiconductor device.

In addition, according to the first embodiment of the present invention, since the via holes are formed after the thickness of the semiconductor substrate is reduced to a great extent, it is possible to reduce the variation in the diameter of the end portions of the via holes even when the size or density of the via holes are changed. As a result, the variation in the resistance of the electrical connections is reduced, and thus, the reliability of the semiconductor device is improved.

Modification of First Embodiment

The first embodiment describes an example in which, by forming the depression 21x in such a manner as to reduce the thickness of the central portion and its vicinity (the area including the plural semiconductor chip formation regions A) while leaving the fringe portion of the semiconductor substrate 21 (the area excluding the plural semiconductor chip formation regions A), the semiconductor substrate 21c after the formation of the depression 21x maintains sufficient rigidity. However, the thickness reduction may be performed on the entire surface 21b of the semiconductor substrate 21 without the formation of the depression 21x. In this case, the following manufacturing processes can be adopted.

FIGS. 5A to 5D illustrate a manufacturing process flow of a semiconductor device according to a modification of the first embodiment of the present invention. In FIGS. 5A to 5D, the same reference numerals are given to the components which are common to the semiconductor device 10 shown in FIG. 3, and their explanations may be omitted.

First, the semiconductor substrate 11 shown in FIGS. 4A and 4B is prepared. Next in a process shown in FIG. 5A, the resin layer 16 is formed on the surface 11a of the semiconductor substrate 11 without removing the fringe portion 11x of the semiconductor substrate 11. At this point, in the same manner as in the process of FIG. 4D, it is preferable that, when the surface 11b of the semiconductor substrate 11c is used as a reference plane, the variation in the height H1 of the surface 16a of the resin layer 16 with respect to the reference plane is preferably 1 μm or less. Accordingly, it is preferable to have a process of checking the variation in the height H1 after the formation of the resin layer 16. In the case where the variation in the height H1 is more than 1 μm, it is preferable to have a process of adjusting the surface 16a of the resin layer 16 to make the variation in the height H1 within 1 μm. The surface 16a of the resin layer 16 may be processed by, for example, a CMP method.

When n semiconductor substrates have already been disposed one above the other and a resin layer is then formed on the topmost (the $n^{th}$ layer) semiconductor substrate, the back surface of the bottom semiconductor substrate (the surface on which no devices are formed) is used as a reference plane. In this case, it is preferable that the top surface of the resin layer be parallel to the reference plane. Note that being parallel in this case means that the variation in the height of the top surface of the resin layer with respect to the reference plane is (1×n) μm or less. That is, as described above, in the case when a resin layer is formed on a single semiconductor substrate, the variation in the height of the top surface of the resin layer with respect to the reference plane is preferably 1×1=1 μm or less, and in the case when a resin layer is formed on semiconductor substrates of, for example, ten layers, the variation in the height of the top surface of the resin layer with respect to the reference plane is preferably 1×10=10 μm or less.

Next in a process shown in FIG. 5B, the semiconductor substrate 21 is prepared, which has a configuration the same as that of the semiconductor substrate 11 of FIGS. 4A and 4B. Then, an adhesion layer 96 is formed on the surface 21a of the semiconductor substrate 21, and a support 97 is bonded (temporarily bonded) to the adhesion layer 96. As the support 97, it is preferable to use a substrate which transmits light when alignment is performed, and a silica glass substrate, for example, may be used. As the adhesion layer 96, an adhesive agent may be used which turns soft at a heating temperature used in a process of FIG. 5D (i.e., an adhesive agent which becomes soft at about 200° C. or less) to be described below. The adhesion layer 96 is formed on the surface 21a of the semiconductor substrate 21 by spin-coating, for example. The adhesion layer 96 may be formed on the surface 21a of the semiconductor substrate 21 by attaching a film-type adhesive instead of by spin-coating.

Figure 5C:
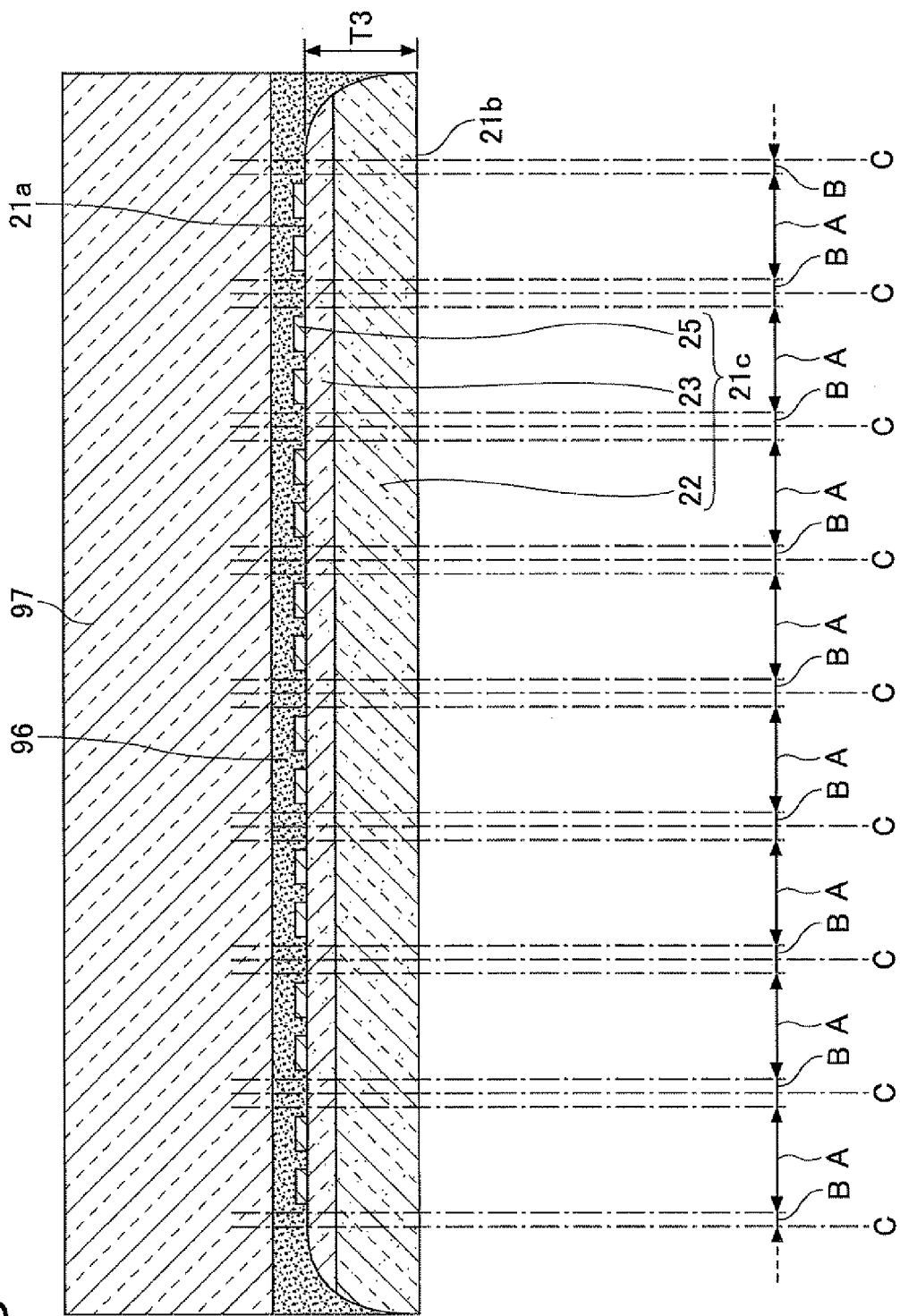
FIG. 5C illustrates a third process of the manufacturing process flow of the semiconductor device according to the modification of the first embodiment of the present invention.

Next in a process shown in FIG. 5C, thickness reduction is performed on the entire surface 21b of the semiconductor substrate 21. The semiconductor substrate 21 after the thickness reduction is referred to as the semiconductor substrate 21c. The thickness reduction is achieved, for example, by grinding the surface 21b of the semiconductor substrate 21 using a grinder or the like. In this operation, dry polishing, wet etching or the like may also be used in combination. The thickness T3 of the semiconductor substrate 21c with a reduced thickness is in the range of about 1 μm to about 100 μm, for example; however, in terms of strength, the thickness T3 is preferably in the range of about 10 μm to about 50 μm. This is because setting the thickness T3 of the area with a reduced thickness to about 10 μm to about 50 μm reduces breakage due to mechanical vibrations or the like and stress exerted on the semiconductor chips. The support 97 has a function of supporting the semiconductor substrate 21c having reduced rigidity after the thickness reduction. The reason why the thickness T3 of the semiconductor substrate 21c with a reduced thickness has to be 1 μm or more is as described above.

Figure 5D:
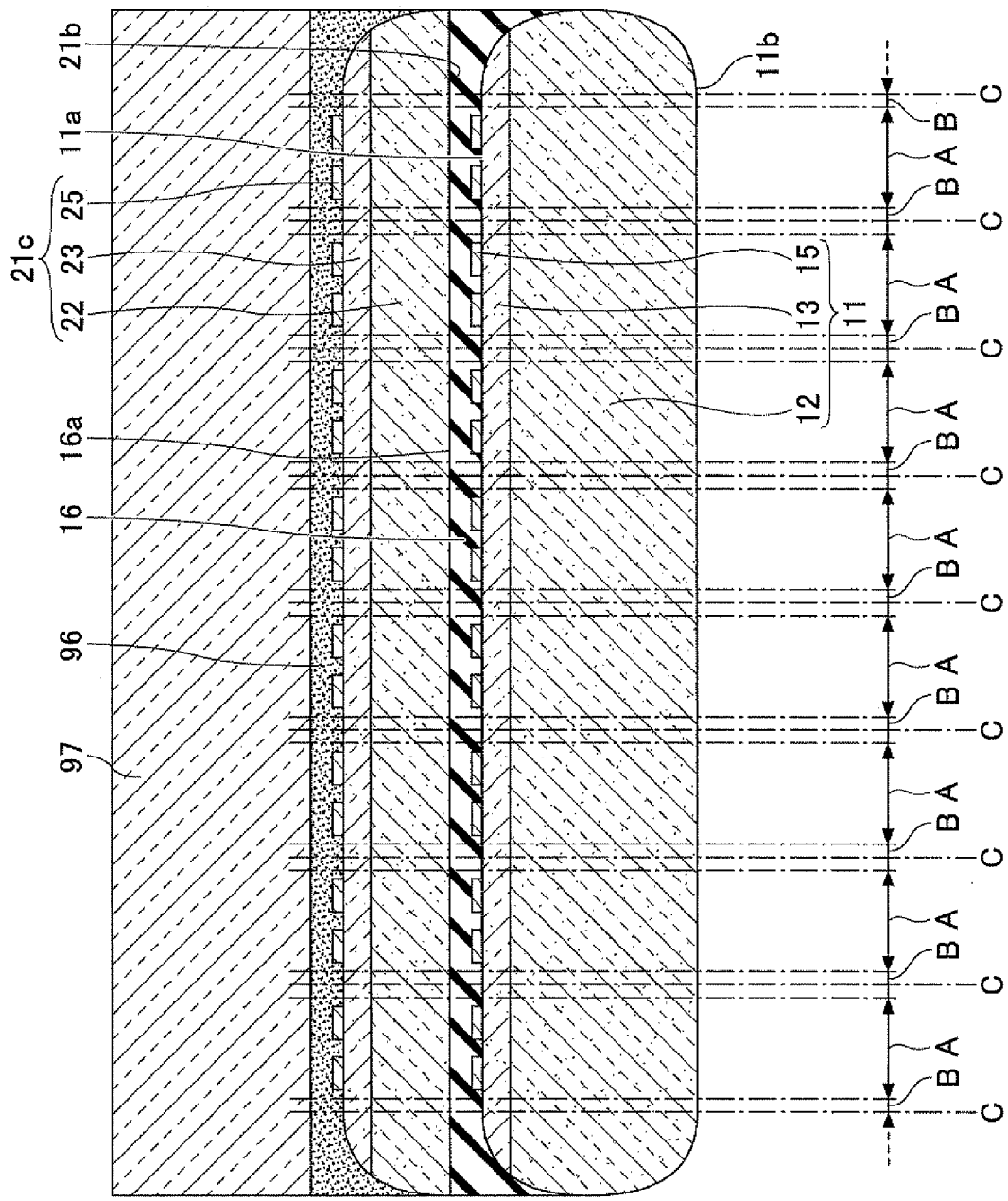
FIG. 5D illustrates a fourth process of the manufacturing process flow of the semiconductor device according to the modification of the first embodiment of the present invention.

Next in a process shown in FIG. 5D, the semiconductor substrate 21c having the support 97 is disposed on the semiconductor substrate 11 in such a manner that the surface 16a of the resin layer 16 which has been formed on the surface 11a of the semiconductor substrate 11 comes in contact with the surface 21b of the semiconductor substrate 21c. Alignment marks for enabling highly accurate positioning are provided in advance in, for example, the scribing regions B of the semiconductor substrates 11 and 21c. The positioning of the semiconductor substrate 21c having the support 97 onto the semiconductor substrate 11 may be achieved by a well-recognized method using the alignment marks as a reference. The alignment accuracy is, for example, 2 μm or less. Subsequently, while being heated at, for example, 250° C., the structure shown in FIG. 5D is pressed from the support 97 side to thereby cause the surface 16a of the resin layer 16 formed on the surface 11a of the semiconductor substrate 11 to be press-bonded to the surface 21b of the semiconductor substrate 21c. Herewith, the resin layer 16 becomes hardened, and the semiconductor substrate 11 is bonded to the surface 21b of the semiconductor substrate 21c. The heating operation may be performed at 300° C.; however, the temperature is preferably 200° C. or less. If the operation is performed at the temperature as high as 300° C., stress occurs due to a difference in the thermal expansion, which can cause separation and/or breakage of the semiconductor substrates. Such separation and breakage becomes more likely as the number of laminated layers increases. Note that since the adhesion layer 96 is made of an adhesive agent which turns soft at a heating temperature used in the process of FIG. 5D (i.e., an adhesive agent which becomes soft at about 200° C. or less), the support 97 is readily removed after the semiconductor substrates 11 and 21c are bonded to each other.

Next, the photosensitive resist film 27 is formed in such a manner as to cover the surface 21a of the semiconductor substrate 21c in the same manner as in the process of FIG. 4G of the first embodiment. The resist film 27 is formed, for example, by applying a liquid resist to the surface 21a of the semiconductor substrate 21c. The thickness of the resist film 27 is 10 μm, for example. Subsequently, processes the same as those of FIGS. 4H to 4T according to the first embodiment are performed.

Next, after the resin layer 26 is formed on the surface 21a of the semiconductor substrate 21d, the semiconductor substrate 31 is prepared, which has a configuration the same as that of the semiconductor substrate 11 of FIGS. 4A and 4B. Then, the above-described processes and the processes of FIGS. 4H to 4T are repeated. The same processes are repeated for the semiconductor substrates 41 to 71. Lastly, the external connection terminals 91 are formed by a well-recognized method. When the external connection terminals 91 are formed, a Ni layer, for example, is formed as the metal layer 39. Then, the solder mask layer 76 having the openings 76x which expose the Ni layer is formed, and the external connection terminals 91 are formed in the openings 76x where the Ni layer is exposed, to thereby manufacture a semiconductor device equivalent to the semiconductor device 10 of FIG. 3. Note however that in the manufactured semiconductor device, the fringe portion of each of the semiconductor substrates disposed one above the other is not removed. The manufactured semiconductor device is cut into individual pieces at the cutting positions C using a dicing blade or the like to thereby form final products.

According to the modification of the first embodiment of the present invention, a first semiconductor substrate, on which thickness reduction is not performed, is prepared. Also, a second semiconductor, on which thickness reduction has been performed, is prepared. Then, the second substrate is bonded to the first semiconductor substrate, and via holes are formed in such a manner as to penetrate the second semiconductor substrate with a reduced thickness, and electrode pads of each semiconductor chip of the first and second semiconductor substrates are electrically connected to each other via metal layers formed in the via holes. Furthermore, a third semiconductor substrate with a reduced thickness is prepared. Then, the third substrate is bonded to the second semiconductor substrate, and via holes are formed in such a manner as to penetrate the third semiconductor substrate with a reduced thickness, and electrode pads of each semiconductor chip of the second and third semiconductor substrates are electrically connected to each other via metal layers formed in the via holes.

By repeating such processes, it is possible to dispose plural semiconductor substrates one above the other and connect semiconductor chips, each of which constitutes a different semiconductor substrate, in such a manner as to enable signal transmission. This process flow eliminates the need for the process of forming a bump on each via hole when the semiconductor substrates are bonded to one another, and it is therefore possible to provide a semiconductor device manufacturing method with high productivity, capable of reducing the manufacturing costs.

In addition, according to the modification of the first embodiment of the present invention, semiconductor substrates are bonded to one another in such a manner that a surface of one of the semiconductor substrates, on which surface a semiconductor integrated circuit is formed, opposes a surface of the other semiconductor substrate, on which surface a semiconductor integrated circuit is not formed. Accordingly, by simply repeating the same processes, three or more semiconductor substrates can be disposed one above the other, and it is therefore possible to provide a semiconductor device manufacturing method with high productivity, capable of reducing the manufacturing costs.

In addition, according to the modification of the first embodiment of the present invention, the via holes are formed, within the semiconductor substrate, only in a part having a reduced thickness. This eliminates the need for creating deep via holes, and therefore causes neither an increase in the time required for the hole-formation of the via holes and the metal layer forming process nor an increase in the number of materials required for these processes, which results in preventing an increase in the cost of manufacturing the semiconductor device.

In addition, according to the modification of the first embodiment of the present invention, since the via holes are formed after the thickness of the semiconductor substrate is reduced to a great extent, it is possible to reduce the variation in the diameter of the end portions of the via holes even when the size or density of the via holes are changed. As a result, the variation in the resistance of the electrical connections is reduced, and thus, the reliability of the semiconductor device is improved.

Second Embodiment

Configuration of Semiconductor Device According to Second Embodiment

Figure 6:
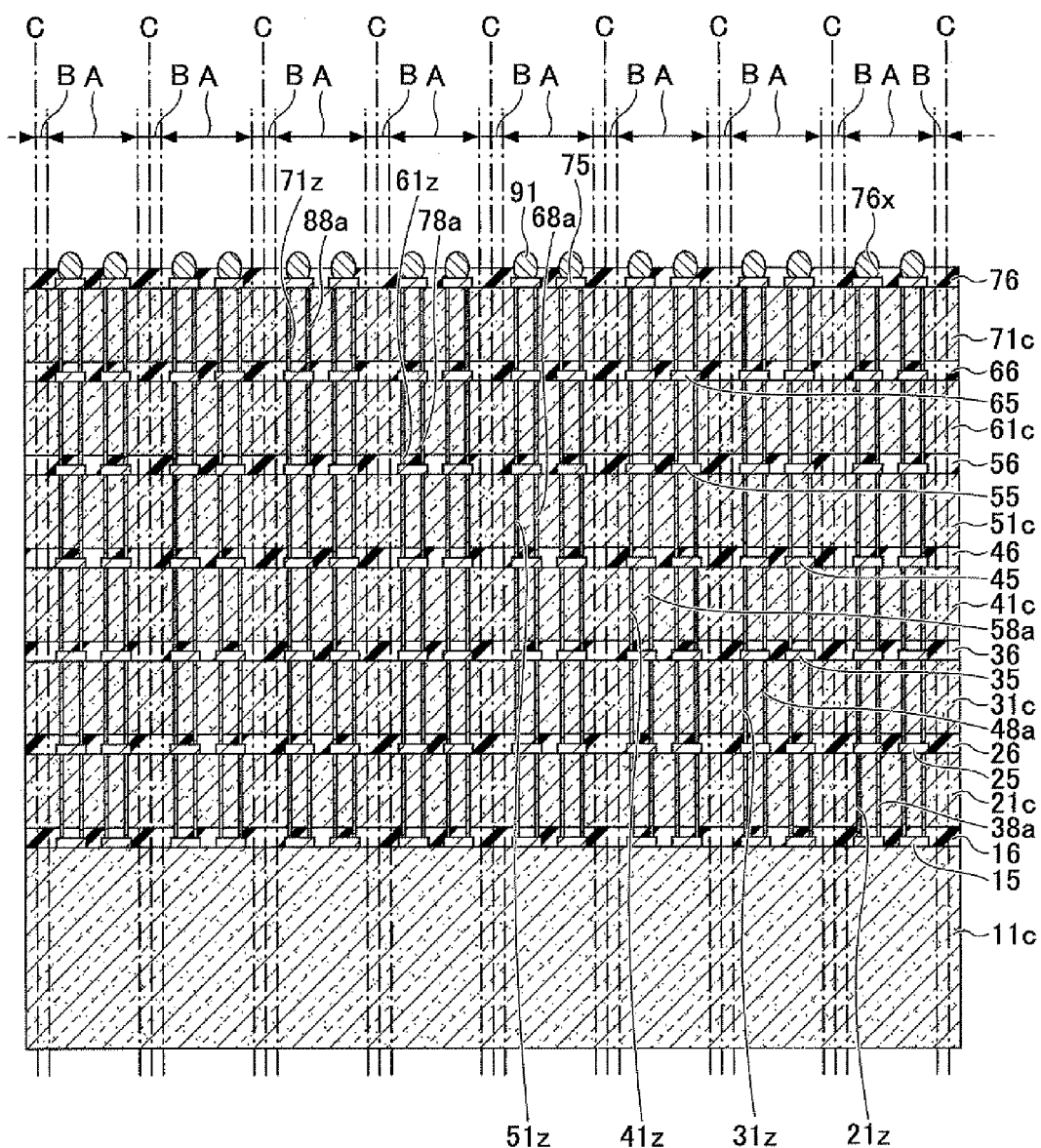
FIG. 6 is a cross-sectional view illustrating a semiconductor device according to a second embodiment of the present invention.

First is described the configuration of a semiconductor device according to a second embodiment of the present invention. FIG. 6 is a cross-sectional view illustrating a semiconductor device according to the second embodiment of the present invention. In FIG. 6, the same reference numerals are given to the components which are common to those in FIG. 3, and their explanations may be omitted. A semiconductor device 10A according to the second embodiment of the present invention has the same configuration as that of the semiconductor device 10 according to the first embodiment of the present invention, except that the number of via holes and metal layers connecting metal pads of adjacent semiconductor substrates is four, instead of one in the first embodiment.

In FIG. 6, the reference numerals 21z to 71z denote via holes, and the reference numerals 38a to 88a denote metal layers formed in the via holes 21z to 71z. Four via holes and four metal layers are provided for each metal pad in each semiconductor substrate.

Thus, by providing plural via holes and metal layers for each metal pad, it is possible to improve the reliability of the connection between metal pads. In addition, if a metal pad is not provided for a semiconductor substrate disposed immediately below, via holes and metal layers can be provided for a semiconductor substrate at one or more layers below. In this system, the same electrical signal or a different electrical signal can be connected to a desired semiconductor substrate. In addition, since each via hole has a smaller diameter, it is possible to reduce the time required for the process of providing the via holes and metal layers. Note that the number of via holes and metal layers provided for each metal pad may be two, three, five or more.

Processes for Manufacturing Semiconductor Device According to Second Embodiment

Next is described a manufacturing process flow of the semiconductor device according to the second embodiment of the present invention. FIGS. 7A to 7F illustrate the manufacturing process flow of the semiconductor device according to the second embodiment of the present invention. In FIGS. 7A to 7F, the same reference numerals are given to the components which are common to the semiconductor device 10A shown in FIG. 6, and their explanations may be omitted. Also, manufacturing processes similar to those of the semiconductor device according to the first embodiment of the present invention may be omitted.

Figure 7A:
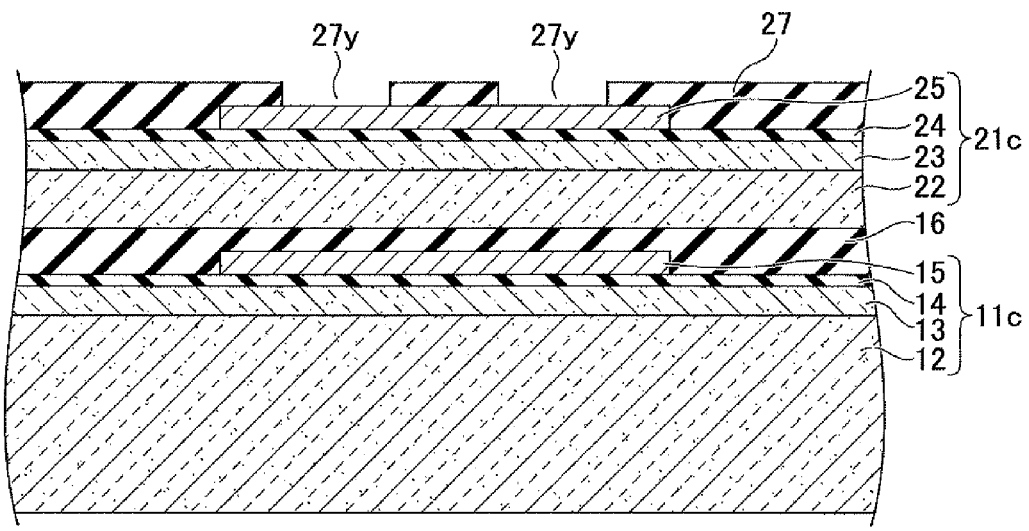
FIG. 7A illustrates a first process of a manufacturing process flow of the semiconductor device according to the second embodiment of the present invention.
Figure 7B:
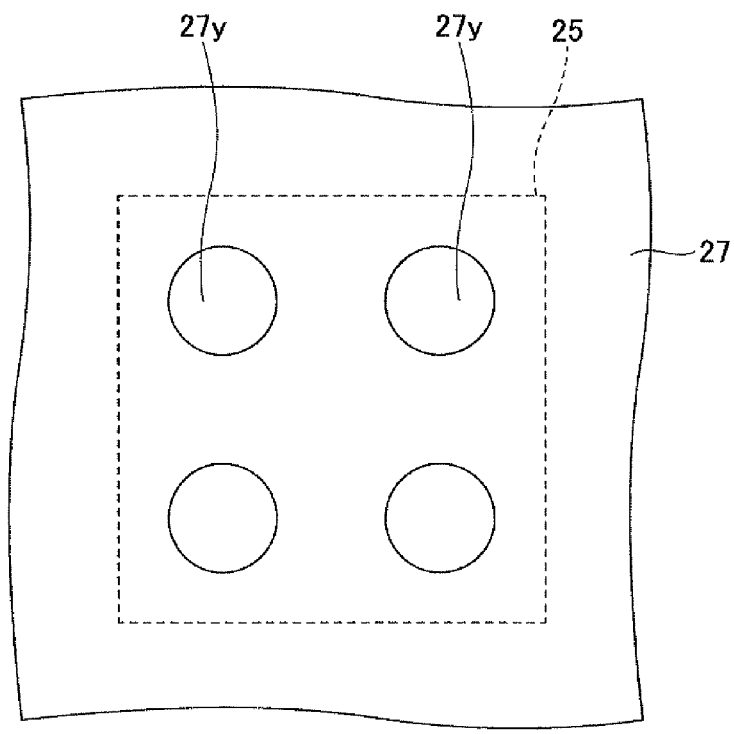
FIG. 7B illustrates a second process of the manufacturing process flow of the semiconductor device according to the second embodiment of the present invention.

First, processes the same as those of FIGS. 4A to 4G are performed. Next in a process shown in FIGS. 7A and 7B, the resist film 27 of FIG. 4G is exposed via a predetermined mask, and the exposed resist film 27 is subsequently developed, thereby forming openings 27y in the resist film 27. FIG. 7A is a cross-sectional view, and FIG. 7B is a plan view. Note that for convenience of explanation, FIGS. 7A to 7F show enlarged views of a part of the structure shown in FIG. 4G (i.e., the electrode pads 15 and 25 and their vicinity).

Figure 7C:
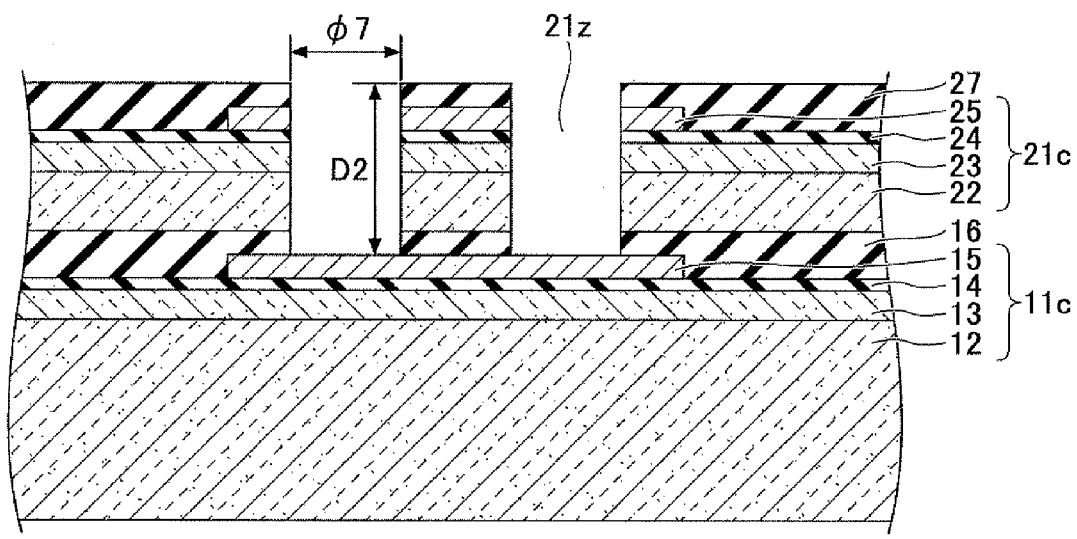
FIG. 7C illustrates a third process of the manufacturing process flow of the semiconductor device according to the second embodiment of the present invention.

Next in a process shown in FIG. 7C, the via holes 21z are formed in the semiconductor substrate 21c. The via holes 21z are formed in such a manner to penetrate the resin layer 16 and parts of the semiconductor substrate 21c (the substrate body 22, the semiconductor integrated circuit 23, the insulating layer 24 and the electrode pad 25) corresponding to the openings 27y so that the electrode pad 15 of the semiconductor substrate 11c is exposed. The via holes 21z are formed by, for example, dry etching. Each of the via holes 21z has, for example, a circular shape in a planar view, and has a diameter φ7 of, for example, 1 μm to 10 μm. Note however that the diameter φ7 of each of the via holes 21z is preferably set to a value which allows the via hole 21z to have an aspect ratio depth D2/diameter φ7) between 0.5 and 5 inclusive. This is because by setting the diameter φ7 of the via hole 21z to a value which allows the via hole 21z to have an aspect ratio (=depth D2/diameter φ7) between 0.5 and 5 inclusive, it is possible to achieve, for example, an improvement in the etching speed (throughput) for forming the via hole 21z and an improvement of the ease of forming the metal layer 38a in the via hole 21z.

Figure 7D:
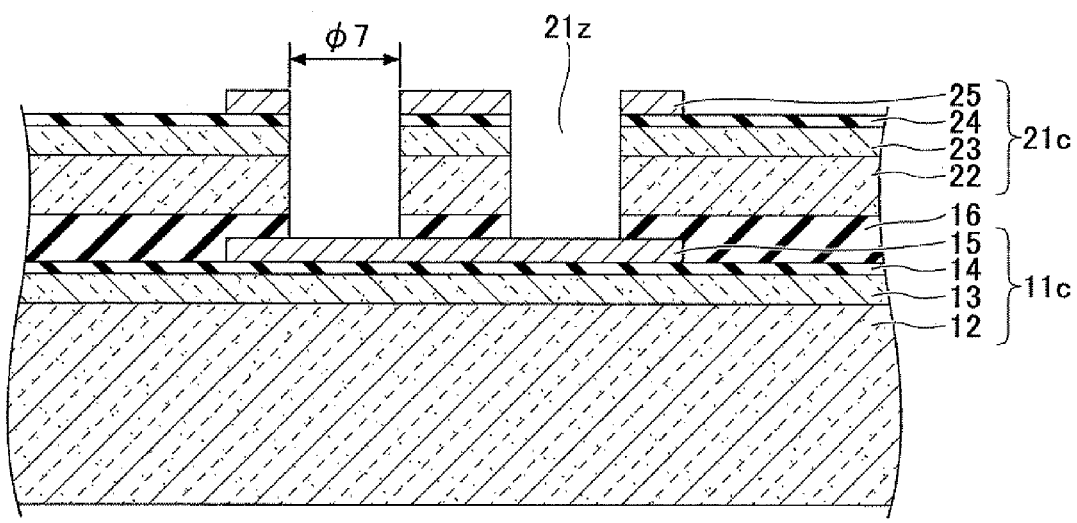
FIG. 7D illustrates a fourth process of the manufacturing process flow of the semiconductor device according to the second embodiment of the present invention.
Figure 7E:
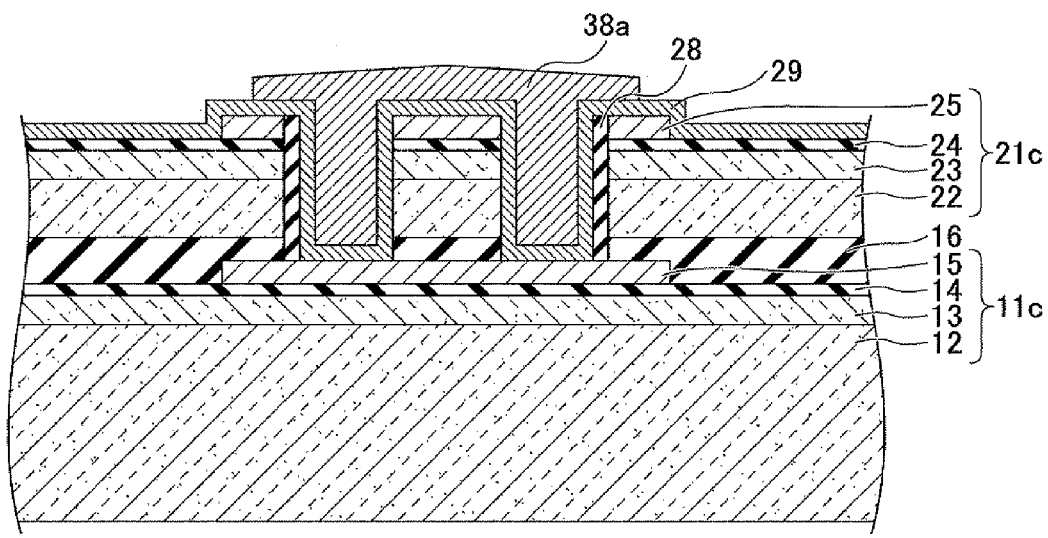
FIG. 7E illustrates a fifth process of the manufacturing process flow of the semiconductor device according to the second embodiment of the present invention.
Figure 7F:
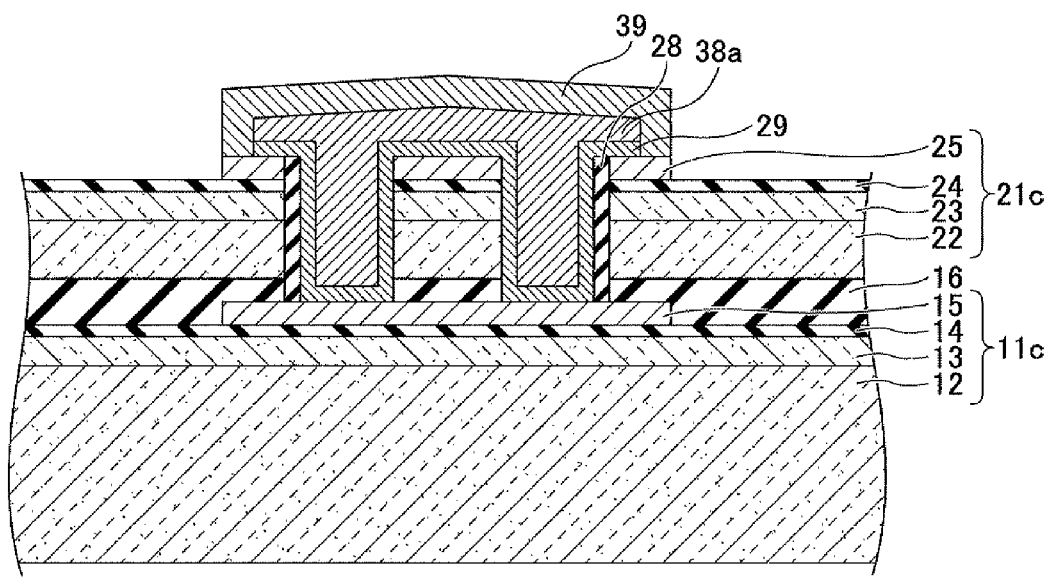
FIG. 7F illustrates a sixth process of the manufacturing process flow of the semiconductor device according to the second embodiment of the present invention.

Next in a process shown in FIG. 7D, the resist film 27 of FIG. 7C is removed. Then, processes the same as those of FIGS. 4K to 4Q are performed, to thereby form the metal layers 38a in the via holes 21z as shown in FIG. 7E. Next, a part of the metal layer 29 which is not covered by the metal layers 38a is removed by, for example, wet etching, and then the metal layer 39 is formed in such a manner as to cover the electrode pad 25 and the metal layers 38a, as shown in FIG. 7F. The metal layer 39 is formed, for example, by forming, on the insulating layer 24, a resist film having an opening for the electrode pad 25 and the metal layers 38a. Subsequently, with use of electrolytic plating, in which the electrode pad 25 and the metal layers 38a are used as feeder layers, a plating film is grown by precipitation in such a manner as to fill the opening, and the resist film is then removed to thereby form the metal layer 39.

Subsequently, by repeating processes the same as those of the first embodiment, the semiconductor device 10A of FIG. 6 is manufactured. The semiconductor device 10A is cut into individual pieces at the cutting positions C using a dicing blade or the like to thereby form final products.

According to the second embodiment of the present invention, the same effect as in the first embodiment can be achieved. In addition, since each via hole has a smaller diameter, it is possible to reduce the time required for the process of providing the via holes and metal layers. Also, by providing plural via holes and metal layers for each metal pad, it is possible to improve the reliability of the connection between metal pads.

Third Embodiment

Configuration of Semiconductor Device According to Third Embodiment

Figure 8:
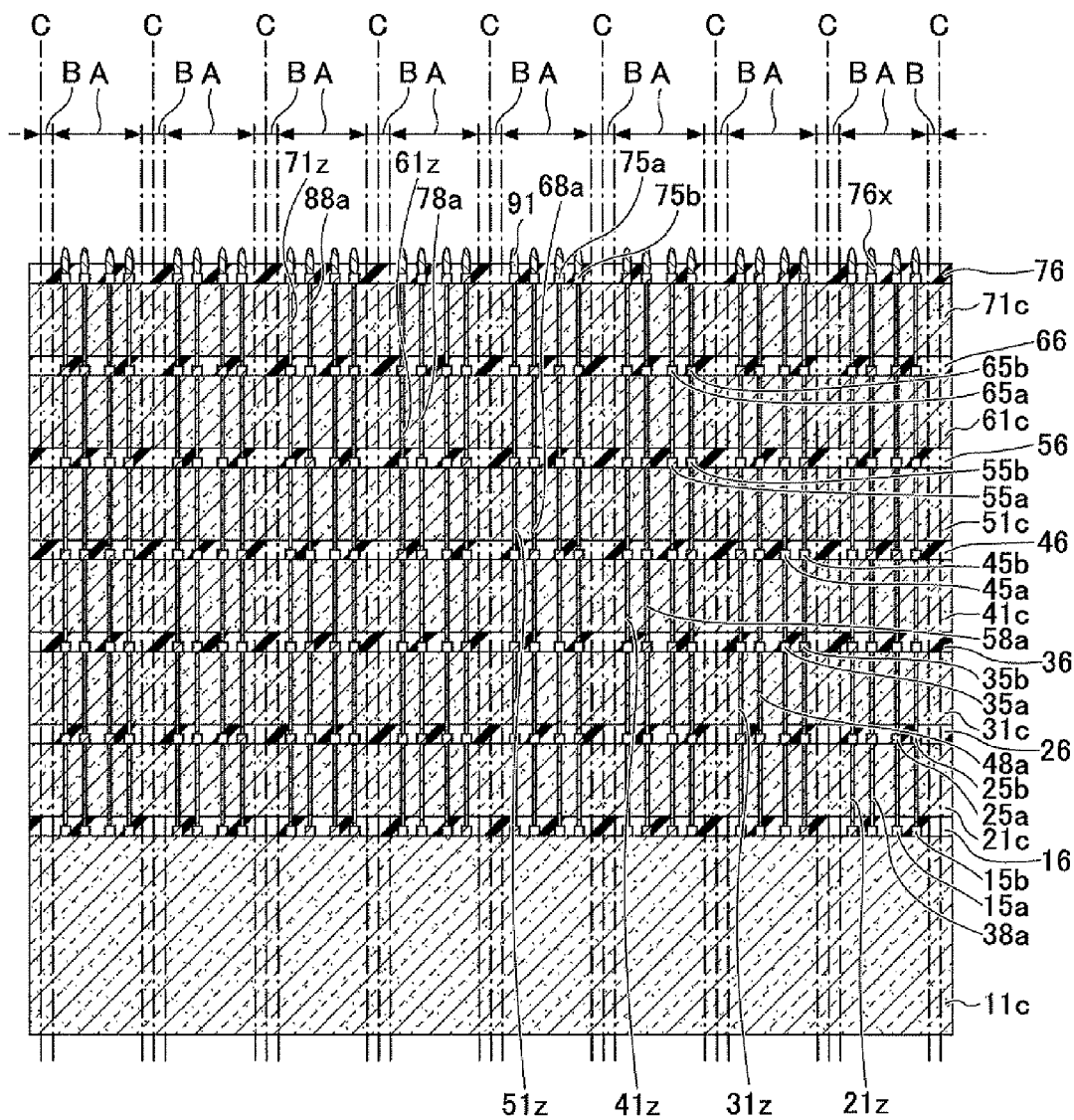
FIG. 8 is a cross-sectional view illustrating a semiconductor device according to a third embodiment of the present invention.

First is described the configuration of a semiconductor device according to a third embodiment of the present invention. FIG. 8 is a cross-sectional view illustrating a semiconductor device according to the third embodiment of the present invention. In FIG. 8, the same reference numerals are given to the components which are common to those in FIG. 6, and their explanations may be omitted. A semiconductor device 10B according to the third embodiment of the present invention has the same configuration as that of the semiconductor device 10A according to the second embodiment of the present invention, except that one metal pad is provided for each via hole and metal layer, instead of providing one metal pad for four via holes and four metal layers in the semiconductor device 10A according to the second embodiment of the present invention.

In FIG. 8, the reference numerals 15a, 15b-75a and 75b denote metal pads. One metal pad is provided for each set of a via hole and metal layer.

Thus, by providing one metal pad for each set of a via hole and metal layer, it is possible to improve the reliability of the connection between metal pads, as in the case of the second embodiment, when the same signal is assigned to adjacent metal pads. In addition, in the case where different signals are respectively assigned to adjacent metal pads, it is possible to improve the flexibility of the wiring design.

Processes For Manufacturing Semiconductor Device According to Third Embodiment

Next is described a manufacturing process flow of the semiconductor device according to the third embodiment of the present invention. FIGS. 9A to 9F illustrate the manufacturing process flow of the semiconductor device according to the third embodiment of the present invention. In FIGS. 9A to 9F, the same reference numerals are given to the components which are common to the semiconductor device 10B shown in FIG. 8, and their explanations may be omitted. Also, manufacturing processes similar to those of the semiconductor devices according to the first and second embodiments of the present invention may be omitted.

Figure 9A:
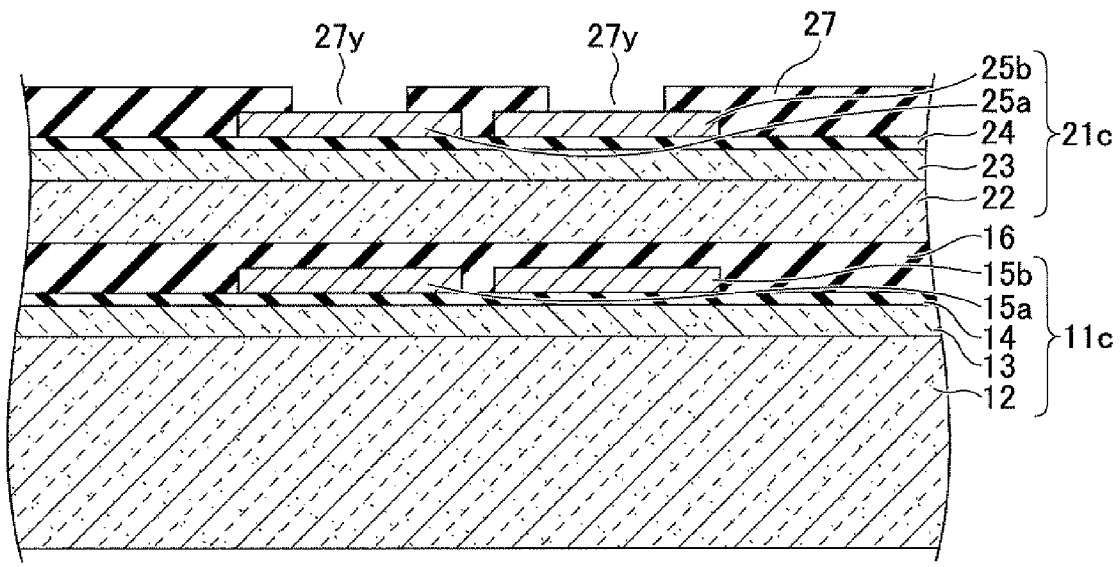
FIG. 9A illustrates a first process of a manufacturing process flow of the semiconductor device according to the third embodiment of the present invention.
Figure 9B:
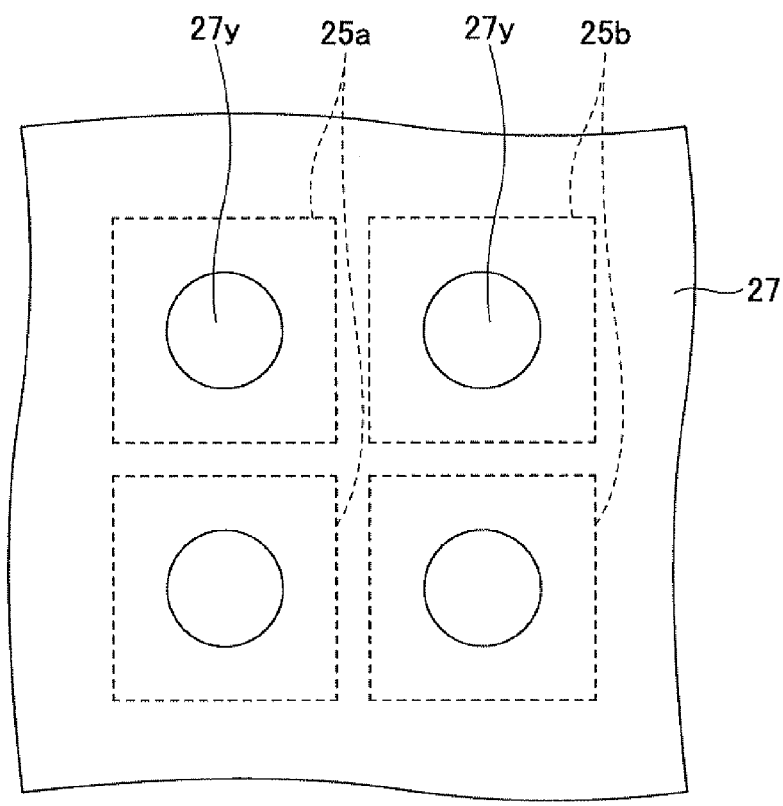
FIG. 9B illustrates a second process of the manufacturing process flow of the semiconductor device according to the third embodiment of the present invention.

First, processes the same as those of FIGS. 4A to 4G are performed. Next in a process shown in FIGS. 9A and 9B, the resist film 27 of FIG. 4G is exposed via a predetermined mask, and the exposed resist film 27 is subsequently developed, thereby forming openings 27y in the resist film 27. FIG. 9A is a cross-sectional view, and FIG. 9B is a plan view. Note that for convenience of explanation, FIGS. 9A to 9F show enlarged views of a part of the structure shown in FIG. 4G (i.e., the electrode pads 15 and 25 and their vicinity).

Figure 9C:
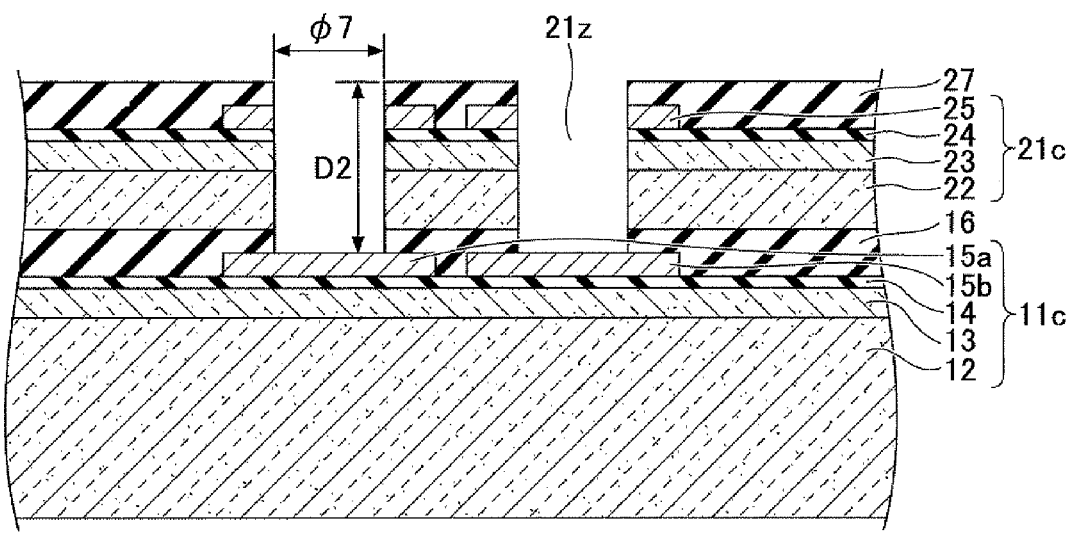
FIG. 9C illustrates a third process of the manufacturing process flow of the semiconductor device according to the third embodiment of the present invention.

Next in a process shown in FIG. 9C, the via holes 21z are formed in the semiconductor substrate 21c. The via holes 21z are formed in such a manner to penetrate the resin layer 16 and parts of the semiconductor substrate 21c (the substrate body 22, the semiconductor integrated circuit 23, the insulating layer 24 and the electrode pad 25) corresponding to the openings 27y so that electrode pads 15a and 15b of the semiconductor substrate 11c are exposed. The via holes 21z are formed by, for example, dry etching. Each of the via holes 21z has, for example, a circular shape in a planar view, and has the diameter φ7 of, for example, 1 μm to 10 μm. Note however that the diameter φ7 of each of the via holes 21z is preferably set to a value which allows the via hole 21z to have an aspect ratio (=depth D2/diameter φ7) between 0.5 and 5 inclusive. This is because by setting the diameter φ7 of the via hole 21z to a value which allows the via hole 21z to have an aspect ratio (=depth D2/diameter φ7) between 0.5 and 5 inclusive, it is possible to achieve, for example, an improvement in the etching speed (throughput) for forming the via hole 21z and an improvement of the ease of filling the metal layer 38b in the via hole 21z.

Figure 9D:
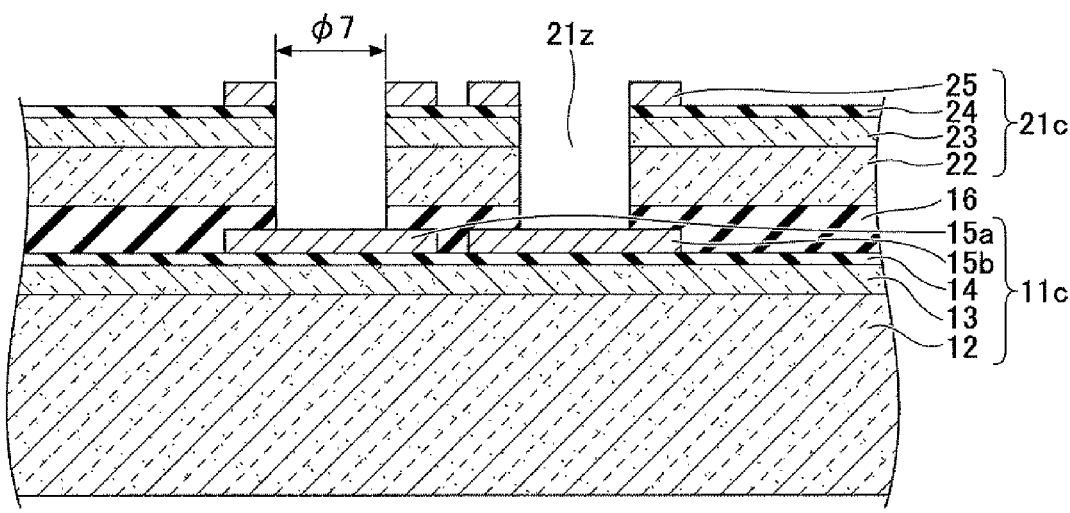
FIG. 9D illustrates a fourth process of the manufacturing process flow of the semiconductor device according to the third embodiment of the present invention.
Figure 9E:
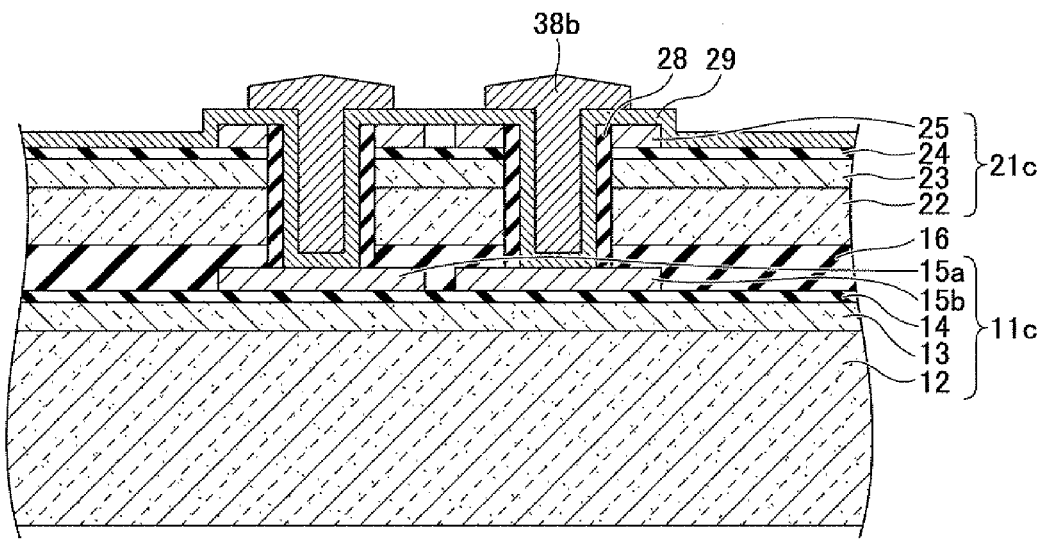
FIG. 9E illustrates a fifth process of the manufacturing process flow of the semiconductor device according to the third embodiment of the present invention.
Figure 9F:
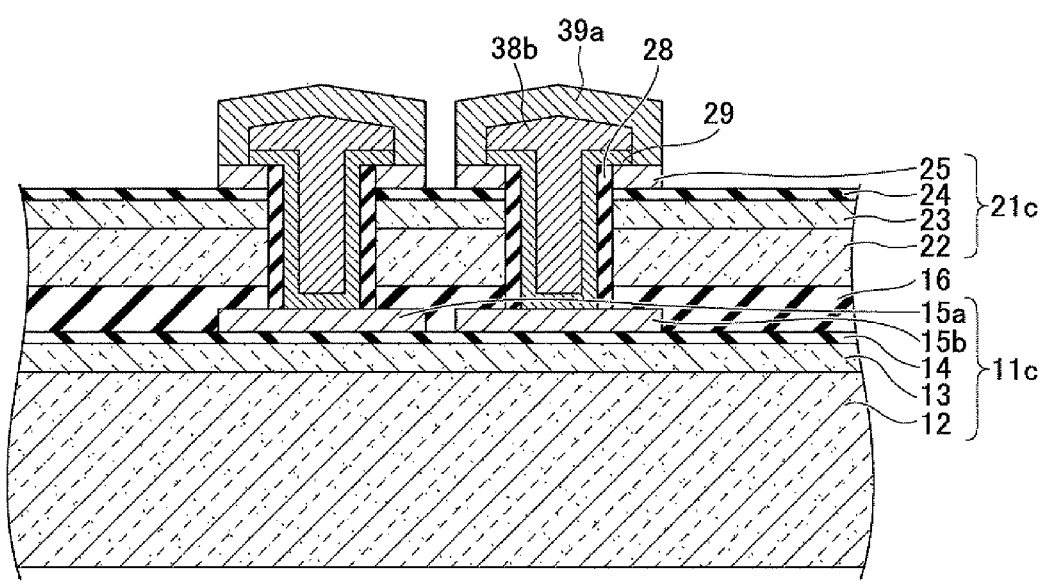
FIG. 9F illustrates a sixth process of the manufacturing process flow of the semiconductor device according to the third embodiment of the present invention.

Next in a process shown in FIG. 9D, the resist film 27 of FIG. 9C is removed. Then, processes the same as those of FIGS. 4K to 4Q are performed, to thereby form the metal layers 38b in the via holes 21z as shown in FIG. 9E. Next, parts of the metal layer 29 which are not covered by the metal layers 38b are removed by, for example, wet etching, and then metal layers 39a are formed in such a manner as to cover the electrode pads 25 and the metal layers 38b, as shown in FIG. 9F. The metal layers 39a are formed, for example, by forming, on the insulating layer 24, a resist film having openings for the electrode pads 25 and the metal layers 38b. Subsequently, with use of electrolytic plating, in which the electrode pads 25 and the metal layers 38b are used as feeder layers, a plating film is grown by precipitation in such a manner as to fill the openings, the resist film is then removed to thereby form the metal layers 39a.

Subsequently, by repeating processes the same as those of the first embodiment, the semiconductor device 10B of FIG. 8 is manufactured. The semiconductor device 10B is cut into individual pieces at the cutting positions C using a dicing blade or the like to thereby form final products.

According to the third embodiment of the present invention, the same effect as in the first embodiment can be achieved. In addition, in the case when the same signal is assigned to adjacent metal pads, it is possible to improve the reliability of the connection between metal pads. On the other hand, in the case where different signals are respectively assigned to adjacent metal pads, it is possible to improve the flexibility of the wiring design.

Fourth Embodiment

Configuration of Semiconductor Device According to Fourth Embodiment

Figure 10:
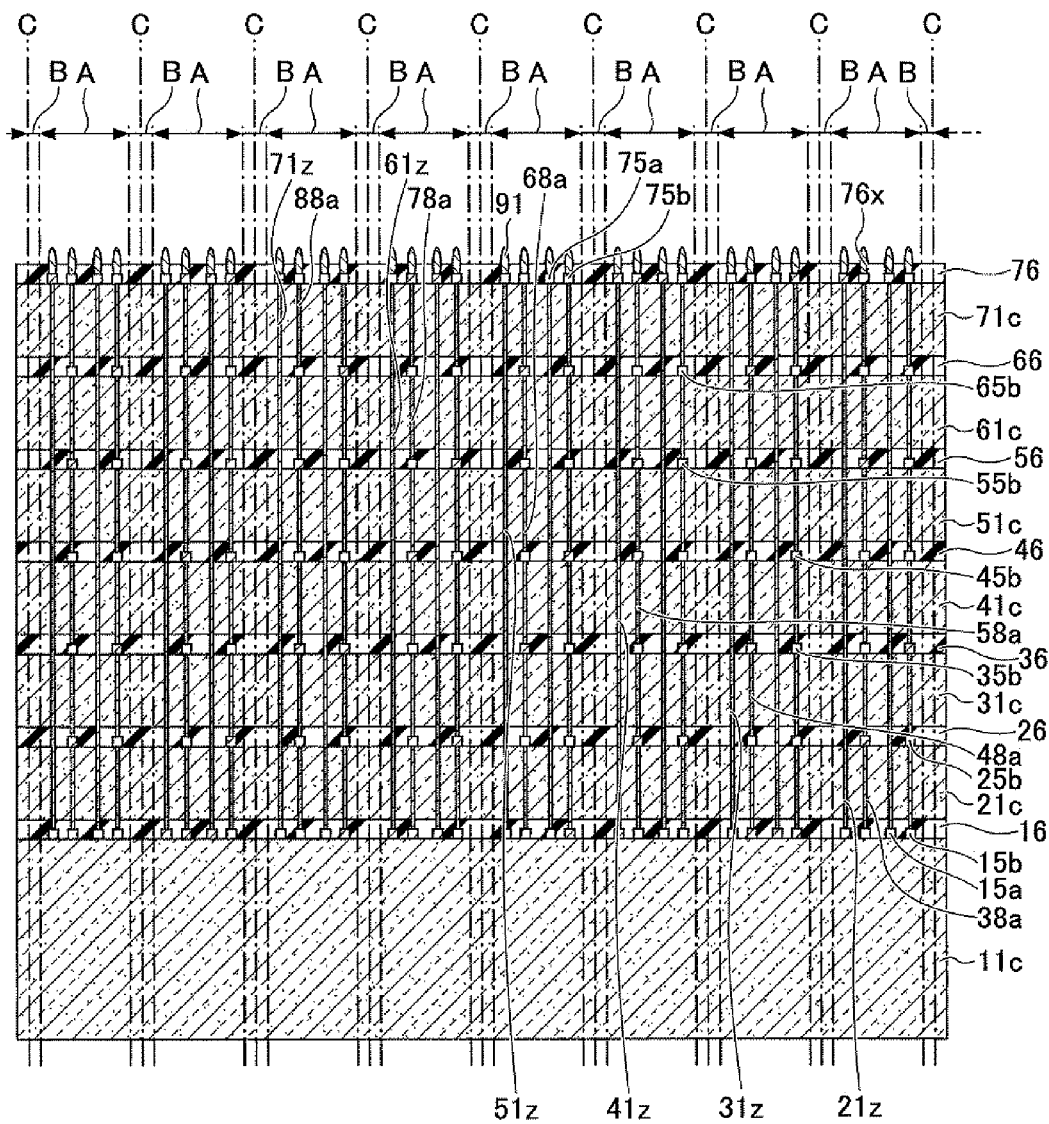
FIG. 10 is a cross-sectional view illustrating a semiconductor device according to a fourth embodiment of the present invention.

First is described the configuration of a semiconductor device according to a fourth embodiment of the present invention. FIG. 10 is a cross-sectional view illustrating a semiconductor device according to the fourth embodiment of the present invention. In FIG. 10, the same reference numerals are given to the components which are common to those in FIG. 8, and their explanations may be omitted. A semiconductor device 10C according to the fourth embodiment of the present invention has the same configuration as that of the semiconductor device 10B according to the third embodiment of the present invention, except that some of the via holes are not provided with a metal pad, and that semiconductor substrates on which metal pads are provided are directly connected to each other by via holes and metal layers, whereas all positions corresponding to via holes in every semiconductor substrate are provided with a metal pad in the semiconductor device 10B according to the third embodiment of the present invention.

Thus, by providing metal pads for only some of the semiconductor substrates, semiconductor substrates not adjacent to each other can be directly connected by via holes and metal layers, which results in an increase in the flexibility of the wiring design.

Processes for Manufacturing Semiconductor Device According to Fourth Embodiment

Next is described a manufacturing process flow of the semiconductor device according to the fourth embodiment of the present invention. FIGS. 11A to 11H illustrate the manufacturing process flow of the semiconductor device according to the fourth embodiment of the present invention. In FIGS. 11A to 11H, the same reference numerals are given to the components which are common to the semiconductor device 10C shown in FIG. 10, and their explanations may be omitted. Also, manufacturing processes similar to those of the semiconductor devices according to the first to third embodiments of the present invention may be omitted.

Figure 11A:
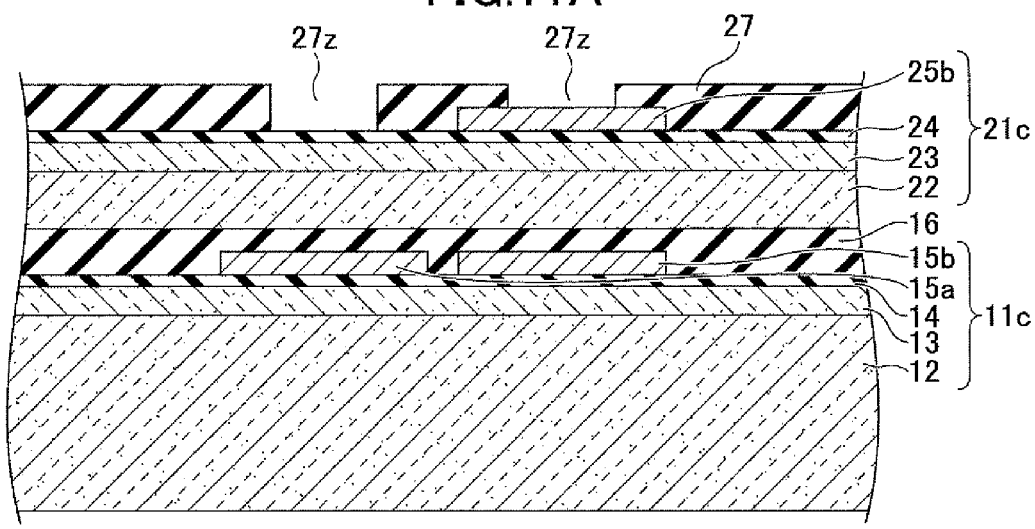
FIG. 11A illustrates a first process of a manufacturing process flow of the semiconductor device according to the fourth embodiment of the present invention.
Figure 11B:
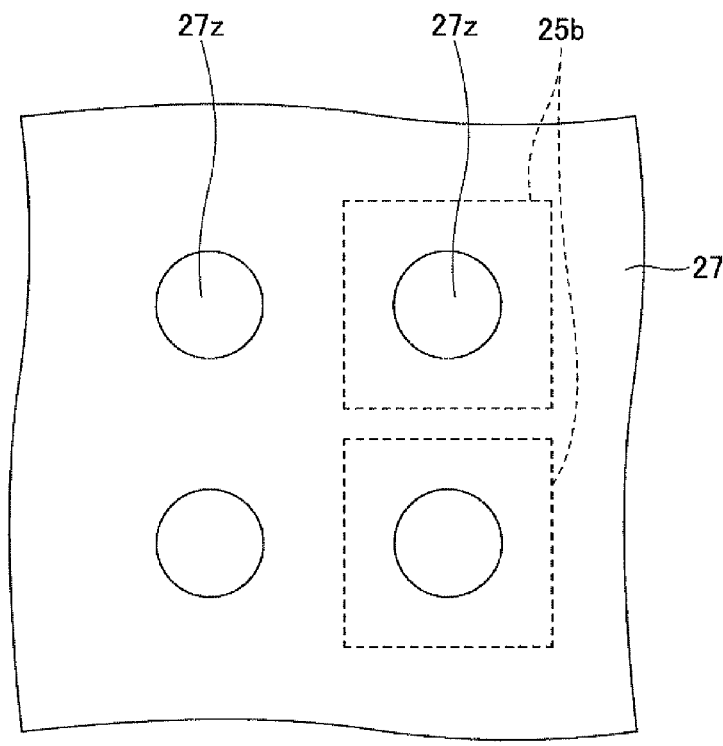
FIG. 11B illustrates a second process of the manufacturing process flow of the semiconductor device according to the fourth embodiment of the present invention.

First, processes the same as those of FIGS. 4A to 4G are performed. Next in a process shown in FIGS. 11A and 11B, the resist film 27 of FIG. 4G is exposed via a predetermined mask, and the exposed resist film 27 is subsequently developed, thereby forming openings 27z in the resist film 27. FIG. 11A is a cross-sectional view, and FIG. 11B is a plan view. Note that for convenience of explanation, FIGS. 11A to 11H show enlarged views of a part of the structure shown in FIG. 4G (i.e., the electrode pads 15 and 25 and their vicinity).

Figure 11C:
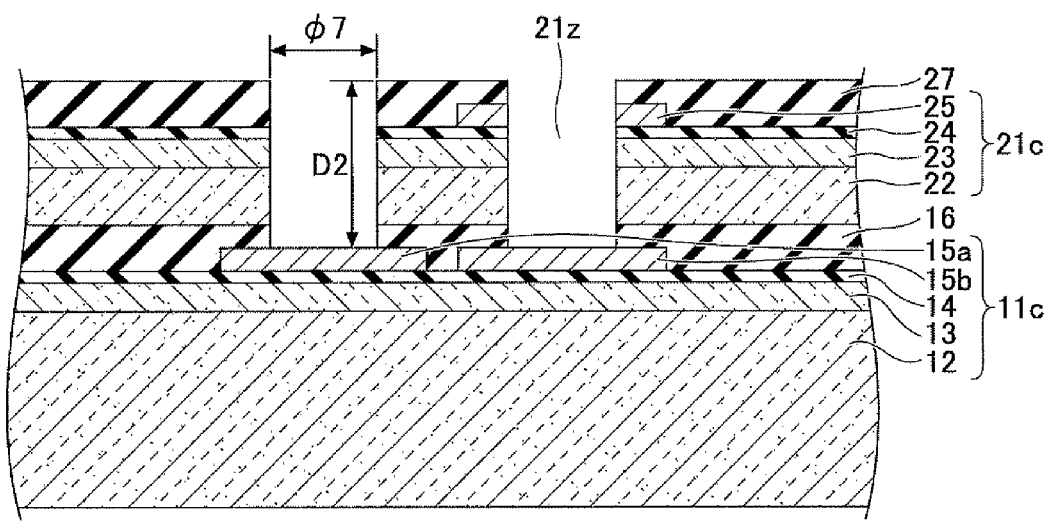
FIG. 11C illustrates a third process of the manufacturing process flow of the semiconductor device according to the fourth embodiment of the present invention.

Next in a process shown in FIG. 11C, the via holes 21z are formed in the semiconductor substrate 21c. The via holes 21z are formed in such a manner to penetrate the resin layer 16 and parts of the semiconductor substrate 21c (the substrate body 22, the semiconductor integrated circuit 23, the insulating layer 24 and the electrode pad 25) corresponding to the openings 27z so that electrode pads 15a and 15b of the semiconductor substrate 11c are exposed. The via holes 21z are formed by, for example, dry etching. Each of the via holes 21z has, for example, a circular shape in a planar view, and has the diameter $\phi 7$ of, for example, 1 µm to 10 µm. Note however that the diameter $\phi 7$ of each of the via holes 21z is preferably set to a value which allows the via hole 21z to have an aspect ratio (=depth D2/diameter $\phi 7$) between 0.5 and 5 inclusive. This is because by setting the diameter $\phi 7$ of the via hole 21z to a value which allows the via hole 21z to have an aspect ratio (=depth D2/diameter $\phi 7$) between 0.5 and 5 inclusive, it is possible to achieve, for example, an improvement in the etching speed (throughput) for forming the via hole 21z and an improvement of the ease of forming the metal layer 38b in the via hole 21z.

Figure 11D:
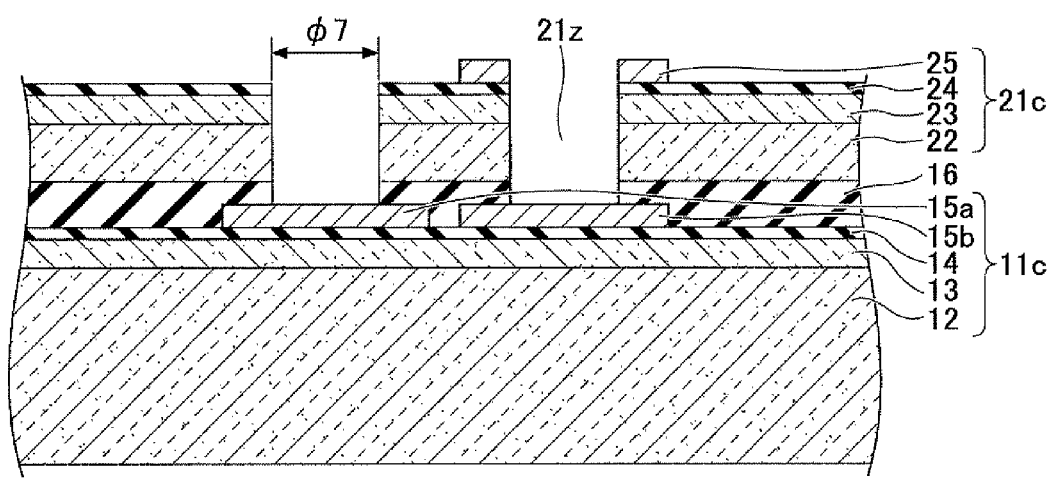
FIG. 11D illustrates a fourth process of the manufacturing process flow of the semiconductor device according to the fourth embodiment of the present invention.
Figure 11E:
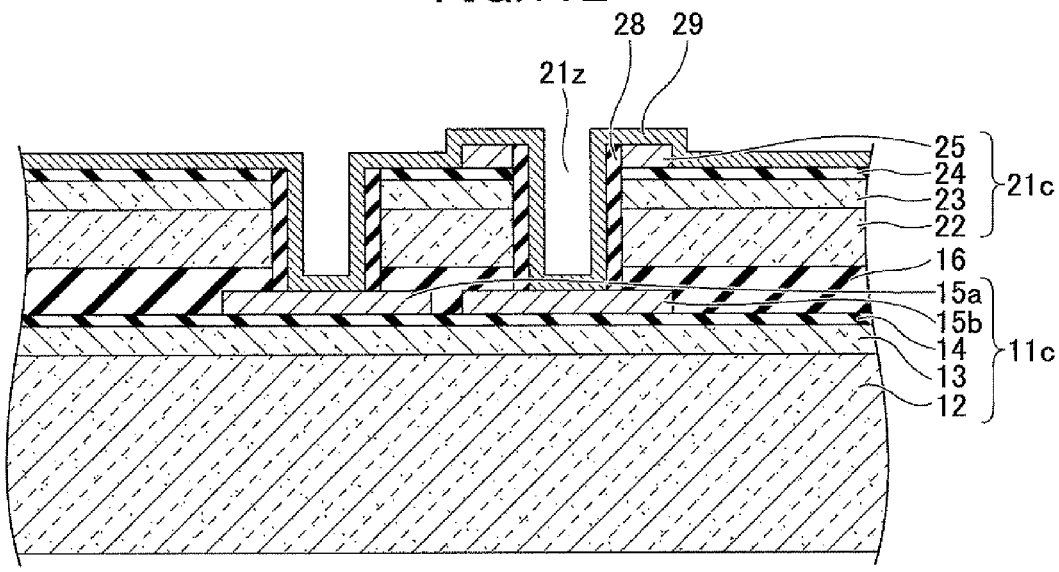
FIG. 11E illustrates a fifth process of the manufacturing process flow of the semiconductor device according to the fourth embodiment of the present invention.

Next in a process shown in FIG. 11D, the resist film 27 of FIG. 11C is removed. Then, after processes the same as those of FIGS. 4K to 4L are performed, the metal layer 29 is formed in such a manner as to cover the top surface of the insulating layer 24, the top surface and lateral side of the electrode pad 25, the top surface of the insulating layer 28 and the top surfaces of the electrode pads 15a and 15b exposed at the bottom of the via holes 21z. The metal layer 29 is formed by, for example, electroless plating, or may be formed by sputtering, CVD or the like. As the metal layer 29, a laminated body in which a Cu layer is disposed on a Ti layer, or a laminated body in which a Cu layer is disposed on a Ta layer, for example, may be used. In addition, a conductor which satisfies the design criteria can be used as the buried material, and W, Al, doped polysilicon, a carbon material such as a carbon nanotube, or a conductive polymer may be used in place of Cu. In the case where the electrical insulation of the insulating layer is sufficient, a combination with a buried wiring using no barrier metal layer may be chosen.

Figure 11F:
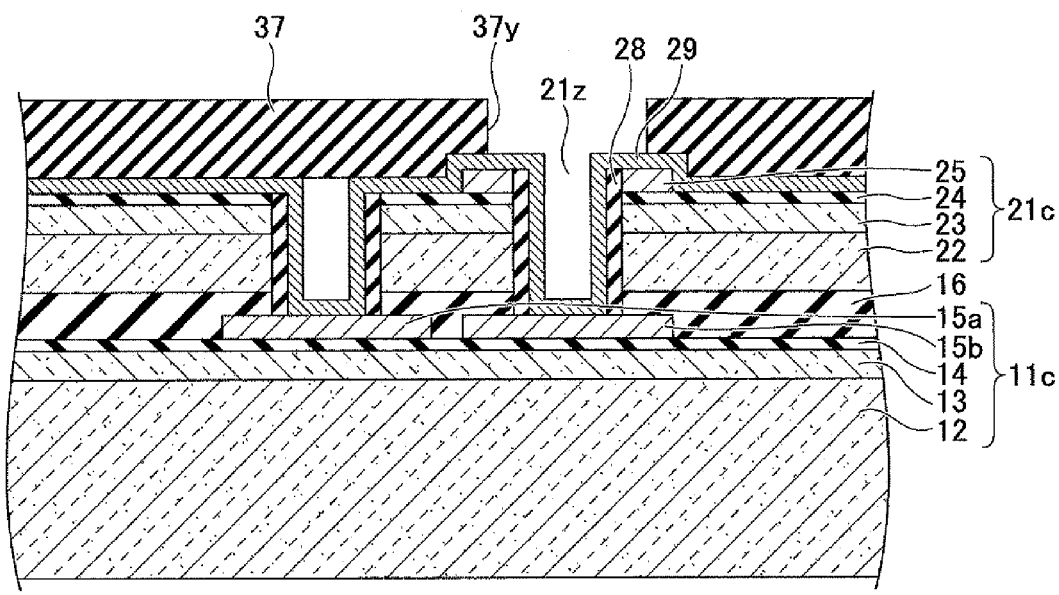
FIG. 11F illustrates a sixth process of the manufacturing process flow of the semiconductor device according to the fourth embodiment of the present invention.

Next in a process shown in FIG. 11F, the photosensitive resist film 37 is formed in such a manner as to cover the top surface of the metal layer 29 except for the inside of the via holes 21z. The resist film 37 is formed, for example, by applying a dry film resist to the top surface of the metal layer 29. The thickness of the resist film 37 is 10 µm, for example. Then, the resist film 37 is exposed via a predetermined mask and subsequently developed, thereby forming an opening 37y in the resist film 37. The opening 37y is formed only on a via hole 21z corresponding to a section at which the electrode pad 25 has been formed.

Figure 11G:
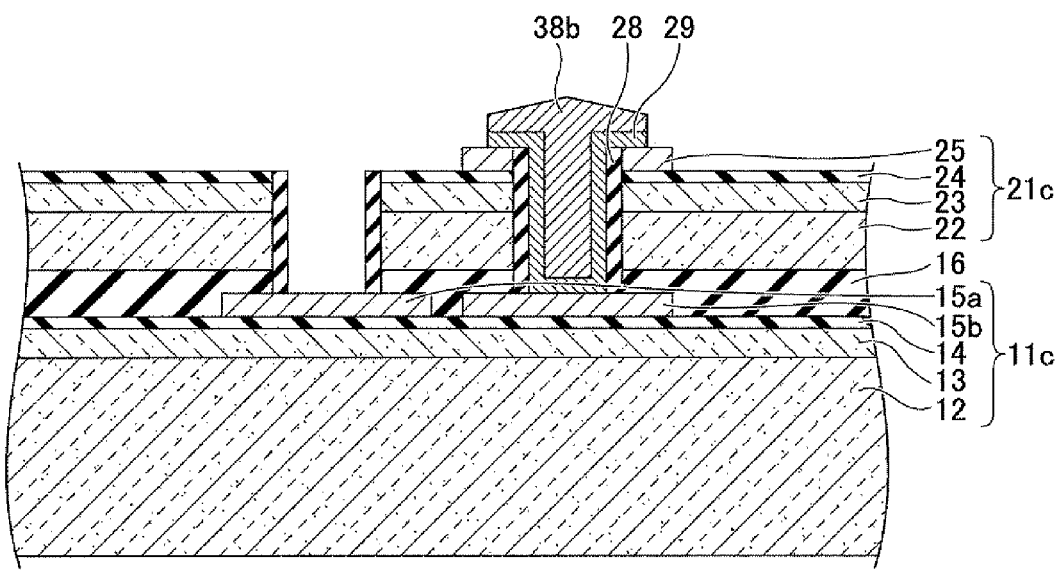
FIG. 11G illustrates a seventh process of the manufacturing process flow of the semiconductor device according to the fourth embodiment of the present invention.
Figure 11H:
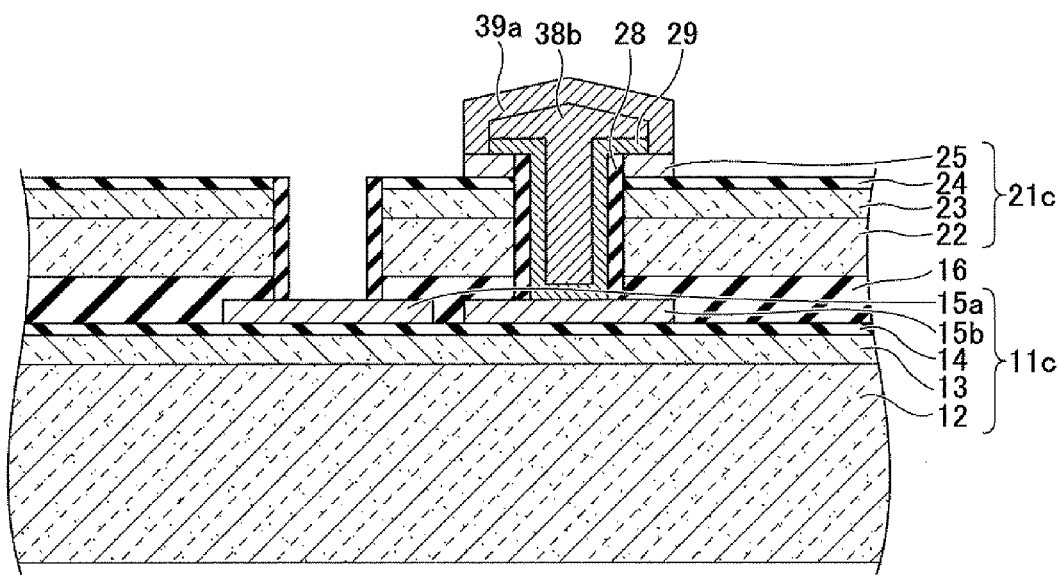
FIG. 11H illustrates an eighth process of the manufacturing process flow of the semiconductor device according to the fourth embodiment of the present invention.

Next, in the same manner as in the processes of FIGS. 4P to 4R, a part of the metal layer 29 which is not covered by the metal layer 38b is removed as shown in FIG. 11G. Next in a process shown in FIG. 11H, the metal layer 39a is formed in such a manner as to cover the electrode pad 25 and the metal layer 38b. The metal layer 39a is formed, for example, by forming, on the insulating layer 24, a resist film having an opening for the electrode pad 25 and the metal layer 38b. Subsequently, with use of electrolytic plating, in which the electrode pad 25 and the metal layer 38b are used as feeder layers, a plating film is grown by precipitation in such a manner as to fill the opening, and the resist film is then removed to thereby form the metal layer 39a.

Subsequently, by repeating processes the same as those of the first embodiment, the semiconductor device 10C of FIG. 10 is manufactured. Note that via holes with no metal-layer filling are filled with a metal layer in the same manner as in the first embodiment after a semiconductor substrate having electrode pads is disposed thereon. The semiconductor device 10C is cut into individual pieces at the cutting positions C using a dicing blade or the like to thereby form final products.

Note that positions to be and not to be provided with a metal pad can be decided arbitrarily, and it is not limited to the case illustrated in FIG. 10.

According to the fourth embodiment of the present invention, the same effect as in the first embodiment can be achieved. In addition, by not providing metal pads for some of the via holes in all the semiconductor substrates, semiconductor substrates not adjacent to each other can be directly connected by via holes and metal layers, which results in the flexibility of the wiring design.

Fifth Embodiment

The first to fourth embodiments illustrate and describe methods of manufacturing a semiconductor device for disposing plural semiconductor substrates having semiconductor chips one above the other and connecting semiconductor chips, each of which constitutes a different semiconductor substrate, in such a manner as to enable signal transmission. However, not all the substrates to be disposed one above the other have to be a semiconductor substrate having semiconductor chips, and a structure layer having no semiconductor chips may also be included. Accordingly, a fifth embodiment of the present invention illustrates and describes a method of manufacturing a semiconductor device including a structure layer having no semiconductor chips. Here, the structure layer means a set of layers having no semiconductor chips, which set includes a silicon substrate, a metal layer, an insulating layer and the like.

Configuration of Semiconductor Device According to Fifth Embodiment

Figure 12:
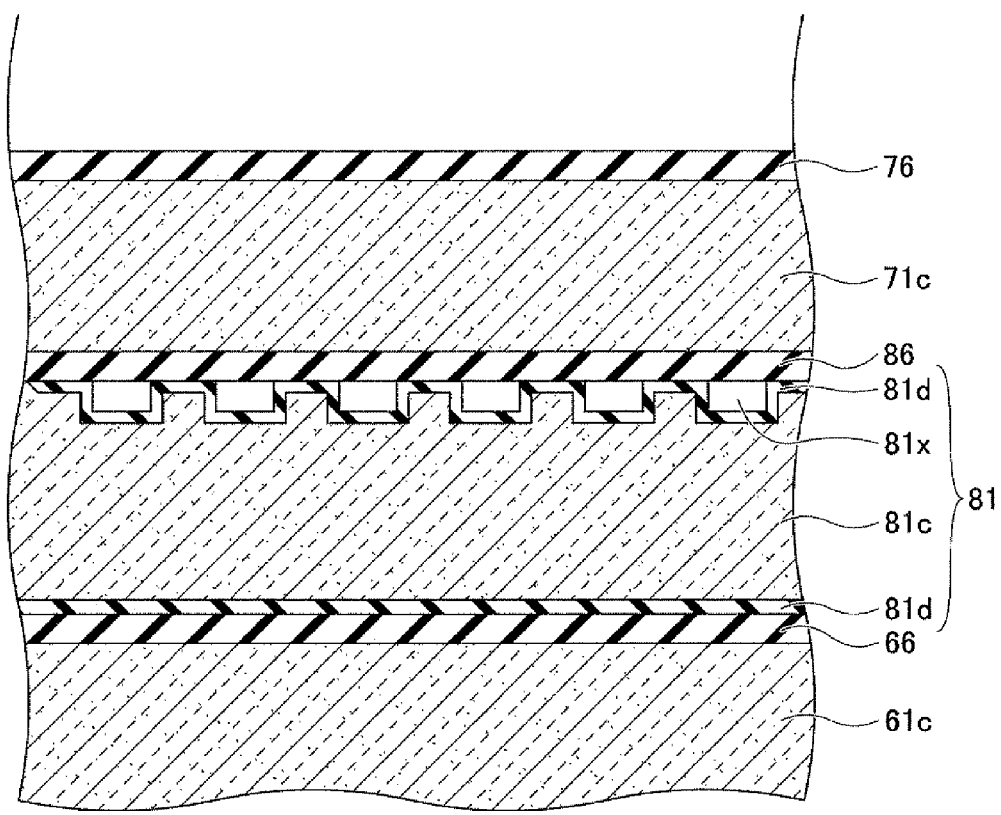
FIG. 12 is a cross-sectional view illustrating a semiconductor device according to a fifth embodiment of the present invention.

First is described the configuration of a semiconductor device according to the fifth embodiment of the present invention. FIG. 12 is a cross-sectional view illustrating the semiconductor device according to the fifth embodiment of the present invention. In FIG. 12, the same reference numerals are given to the components which are common to those in FIG. 3, and their explanations may be omitted. A semiconductor device 10D according to the fifth embodiment of the present invention has the same configuration as that of the semiconductor device 10 of FIG. 3 according to the first embodiment of the present invention, except that a structure layer 81 and a resin layer 86 are provided between the resin layer 66 and the semiconductor substrate 71c of the semiconductor device 10.

In the semiconductor device 10D of FIG. 12, the structure layer 81 is disposed on the semiconductor substrate 61c via the resin layer 66, and the semiconductor substrate 71c is disposed on the structure layer 81 via the resin layer 86. The structure layer 81 is provided with, for example, via holes (not shown) and metal layers (not shown) for electrically connecting the semiconductor substrates 61c and 71. The resin layer 86 may be made of the same material as that of the resin layer 16 or the like.

The structure layer 81 includes a silicon substrate 81c having no semiconductor chips, an insulating film 81d and grooves 81x. The grooves 81x are provided, in the silicon substrate 81c, on the semiconductor substrate 71c side, and the insulating film 81d made, for example, of $Si_3N_4$ or $SiO_2$ is formed on the surface of the silicon substrate 81c including the grooves 81x. The silicon substrate 81c is insulated from the adjacent semiconductor substrate 71c by the insulating film 81d. In the grooves 81x, a cooling medium, such as water and ethanol, is supplied, and the grooves 81x function as refrigerant flow paths. The shape and positions of the grooves 81x may be determined arbitrarily.

Thus, substrates to be disposed in the semiconductor device are not limited to semiconductor substrates having semiconductor chips, and a structure layer with no semiconductor chips may also be included. By including, for example, a silicon substrate having refrigerant flow paths in the structure layer to be disposed in the semiconductor device, it is possible to cause the semiconductor device to have a cooling function for transferring heat generated by semiconductor substrates. It is especially effective if the structure layer having a cooling function is provided adjacent to a semiconductor substrate including a device generating a large amount of heat, such as a CPU. Note that the semiconductor device may include plural structure layers having no semiconductor chips.

Processes for Manufacturing Semiconductor Device According to Fifth Embodiment

Next is described a manufacturing process flow of the semiconductor device according to the fifth embodiment of the present invention.

First, the structure layer 81 is prepared. Specifically, the silicon substrate 81c is processed to have a predetermined outer diameter, and the grooves 81x are formed on one surface of the silicon substrate 81c. The grooves 81x are formed by, for example, DRIE (Deep Reactive Ion Etching). Then, the insulating film 81d is formed on the surface of the silicon substrate 81c, on which surface the grooves 81x have been formed. The insulating film 81d is formed by, for example, plasma CVD. According to these processes, the structure layer 81 is completed.

Next, in processes the same as those of FIGS. 4A to 4T, the semiconductor substrates 11c-61c, the resin layer 66, the structure layer 81, the resin layer 86 and the semiconductor substrate 71c are sequentially disposed one above the other, and then via holes, metal layers and the like are formed, to thereby complete the semiconductor device 10D.

Thus, the above illustrates and describes the method of manufacturing the semiconductor device having a structure layer which includes a silicon substrate having no semiconductor chips; however, the structure layer may include, in addition to the silicon substrate having no semiconductor chips, a metal layer made of Cu or the like and an insulating layer made of an epoxy resin, or may have a structure having a MEMS device. Examples of such a MEMS device include pressure sensors and acceleration sensors.

According to the fifth embodiment of the present invention, the same effect as in the first embodiment can be achieved. In addition, by providing the structure layer having no semiconductor chips in the semiconductor device, it is possible to achieve, for example, a cooling function for transferring heat generated by semiconductor substrates.

Sixth Embodiment

The first to fourth embodiments illustrate and describe methods of manufacturing a semiconductor device (WOW) for disposing plural semiconductor substrates having semiconductor chips one above the other and connecting semiconductor chips, each of which constitutes a different semiconductor substrate, in such a manner as to enable signal transmission. The fifth embodiment illustrates and describes a method of manufacturing a semiconductor device including a structure layer having no semiconductor chips. Next, a sixth embodiment illustrates and describes the entire manufacturing process flow of a semiconductor device, including WOW processes and widely-recognized semiconductor device manufacturing processes (so-called FEOL and BEOL).

Figure 13:
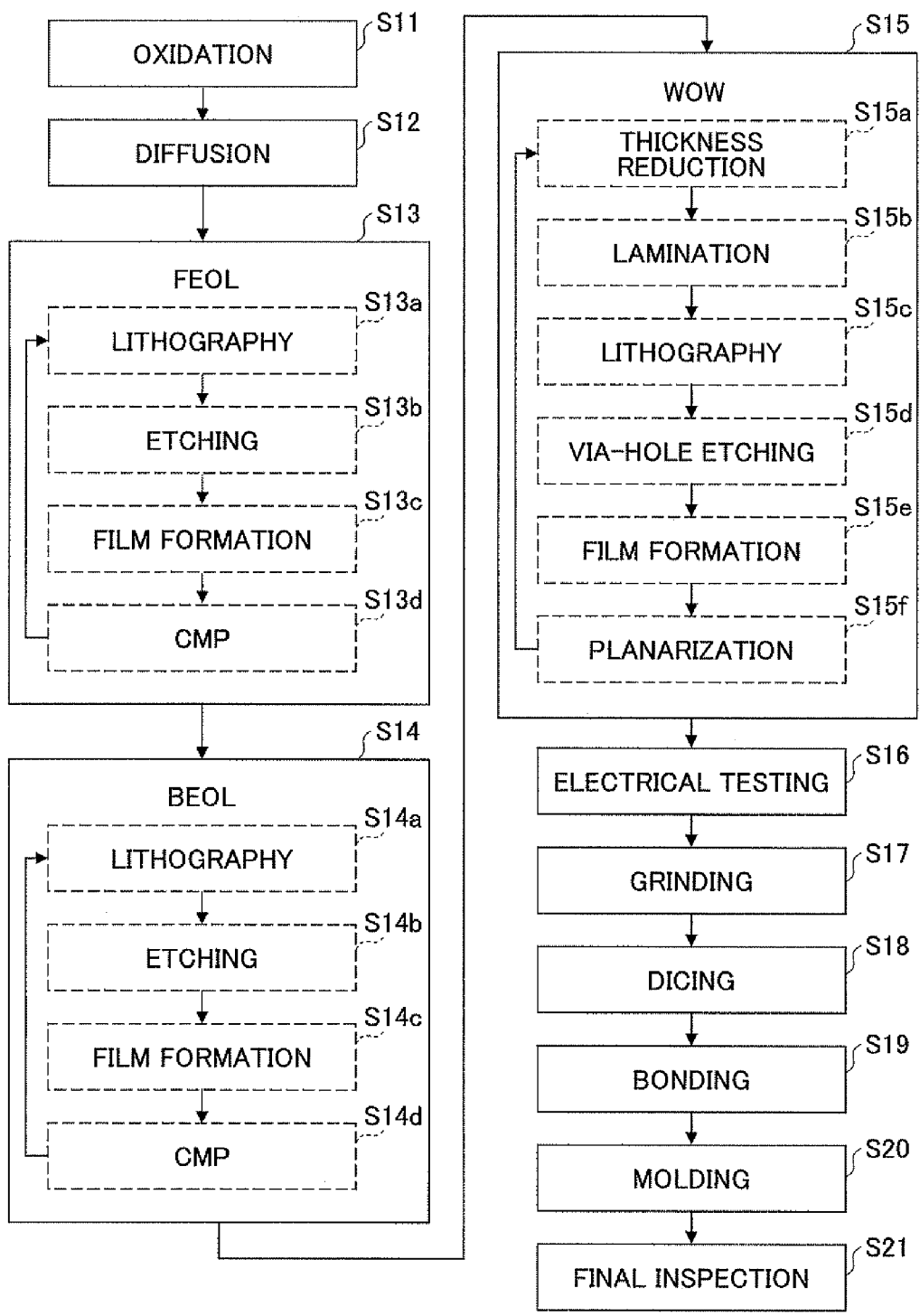
FIG. 13 is a flowchart showing an example of an entire manufacturing process flow of a semiconductor device, including WOW processes and widely-recognized semiconductor device manufacturing processes.

FIG. 13 is a flowchart showing an example of the entire manufacturing process flow of a semiconductor device, including WOW processes and widely-recognized semiconductor device manufacturing processes. With reference to FIG. 13, first in a process of "oxidation" (S11), an oxide film is formed on the surface of a semiconductor substrate. Next in a process of "diffusion" (S12), a dopant (impurity) is introduced into the semiconductor substrate to form a semiconductor region. Next in a process of "FEOL (Front End Of Line)" (S13), devices, such as transistors or the like, are formed by repeating a lithography process (S13a), an etching process (S13b), a film formation process (S13c) and a CMP process (S13d) as many times as required.

Specifically, in the lithography process (S13a), a photoresist (photo-sensitive material) is applied to the semiconductor substrate, and a device/circuit pattern drawn on a photomask is transferred onto the semiconductor substrate by an exposure device. In the etching process (S13b), unnecessary parts of the oxide film, metal film and the like are removed by physical or chemical etching. In the film formation process (S13c), an oxide film, a metal film and the like constituting devices, such as transistors, are formed by sputtering, CVD or the like. In the CMP process (S13d), the surface of the semiconductor substrate is polished.

Next in a process of "BEOL (Back End Of Line)" (S14), the devices, such as transistors or the like, formed on the semiconductor substrate are wired using Cu or the like to complete a circuit by repeating a lithography process (S14a), an etching process (S14b), a film formation process (S14c) and a CMP process (S14d) as many times as required. The lithography process (S14a), the etching process (S14b), the film formation process (S14c) and the CMP process (S14d) are as described above. Herewith, the semiconductor substrate having semiconductor chips is completed.

Next in a process of "WOW (wafer-on-wafer)" (S15), a thickness reduction process (S15a), a lamination process (S15b), a lithography process (S15c), a via hole etching process (S15d), a film formation process (S15e) and a planarization process (S15f) are repeated as many times as required. Herewith, plural semiconductor substrates having semiconductor chips are disposed one above the other and semiconductor chips, each of which constitutes a different semiconductor substrate, are connected in such a manner as to enable signal transmission.

Specifically, in the thickness reduction process (S15a), the semiconductor substrate is reduced in thickness, as shown in FIGS. 4E and 5C. In the lamination process (S15b), the semiconductor substrate having a reduced thickness and a semiconductor substrate on which no thickness reduction is performed are disposed one above the other, as shown in FIGS. 4F and 5D. In the lithography process (S15c), the via hole etching process (S15d), the film formation process (S15e) and the planarization process (S15f), semiconductor chips, each of which constitutes a different semiconductor substrate, are connected to each other in such a manner as to enable signal transmission, as shown in FIGS. 4H-4S, for example.

Next in a process of "electrical testing" (S16), electrical testing of the laminated semiconductor substrates is performed. Next in a process of "grinding" (S17), the laminated semiconductor substrates are polished to adjust the thickness. Next in a process of "dicing" (S18), the laminated semiconductor substrates are cut to form plural laminated semiconductor chips. Next in a process of "bonding" (S19), the laminated semiconductor chip is fixed onto a lead frame, and the electrode pads of the semiconductor chip and the lead frame are electrically connected to each other by a bonding wire. Next in a process of "molding" (S20), the laminated semiconductor chip fixed onto the lead frame is sealed with a resin. Next in a process of "final inspection" (S21), a pre-shipment inspection (inspections on electrical properties, appearance and the like) of the laminated semiconductor chip which is made into a final product form in the process of S20. In this manner, all processes are completed.

In FIG. 13, the processes S11-S14 are well-recognized processes for handling semiconductor substrates before singularization (dicing). The WOW process of S15 according to the present invention, following S14, is also a process for handling the semiconductor substrates before singularization (dicing). That is, while maintaining the semiconductor substrates in the pre-dicing state, it is possible to form the semiconductor substrates into a three-dimensional structure (i.e., dispose plural semiconductor substrates having semiconductor chips one above the other) and connect semiconductor chips, each of which constitutes a different semiconductor substrate, in such a manner as to enable signal transmission. Compared to a conventional manufacturing process flow in which semiconductor substrates are cut into semiconductor chips (dicing) after the process of "BEOL (Back End Of Line)" and the diced semiconductor chips are then formed into a three-dimensional structure, the WOW configuration allows immediate transition from the process of "BEOL (Back End Of Line)" to the process of the three-dimensional structure formation using the pre-dicing semiconductor substrates. This simplifies the manufacturing process flow of semiconductor devices and also reduces the investment in mass production facilities.

In addition, the WOW process does not have a theoretical limit for the number of semiconductor substrate layers to be stacked one over the other. That is, an integration degree according to the number of semiconductor substrate layers being stacked can be obtained. For example, if a semiconductor device is formed by stacking ten semiconductor substrates in the WOW configuration, a memory device formed of the semiconductor device with, for example, 32 GB per semiconductor chip has capacity of 320 GB, and about 1000 pieces of three-dimensional chips can be obtained. If, in a logic device, a CPU core unit and a cache unit are separately formed in different semiconductor substrates and disposed one above the other using the WOW process, multi-core architectures, such as 16-core, 32-core, 64-core . . . , can be achieved. If a massively multi-core architecture having 32 cores can be realized, the CPU core itself can be handled redundantly, which allows organization of a three-dimensional logic device having no effective defects.

Furthermore, in the WOW process, the wiring distance corresponds to the thickness of the semiconductor substrate, and devices can be therefore connected to each other in the range of about 20 μm even including the thickness of the device layers. This contributes to significant shortening of the wiring length, considering that the long wiring of usual circuits is in the range of several hundred micrometers to several tens of millimeters. Accordingly, the application of the WOW process to signal wiring enables high-speed information transfer with a large bus bandwidth per unit via hole.

Thus far the preferred embodiments of the present invention have been described in detail; however, it should be understood that the present invention is not limited to the above-described particular embodiments and various changes and modification may be made to the particular embodiments without departing from the scope of the present invention.

For example, in each of the embodiments above, the description is given with an example of using semiconductor substrates (silicon wafers) having a circular shape in a planar view; however, the shape of the semiconductor substrates is not limited to a circular shape, and may be a panel shape, such as a rectangular shape in a planar view.

In addition, the material of the substrates on which the semiconductor integrated circuits are formed is not limited to silicon, and may be germanium or sapphire, for example.

In addition, in each of the embodiments above, the description is given with an example of connecting semiconductor chips, which constitute layered semiconductor substrates, to each other by an electrical signal via metal layers formed in via holes; however, the connection between the semiconductor chips constituting the layered semiconductor substrates does not have to be made by an electrical signal, and may be made by a light signal. In this case, optical waveguides may be formed in the via holes in place of the metal layers.

In addition, in each of the embodiments above, the description is given with an example of forming the via holes after the formation of the electrode pads on the semiconductor substrates; however, the electrode pads may be formed after the formation of the via holes. Furthermore, a process (damascene process) of grinding the top surfaces of the metal layers formed in the via holes by CMP (Chemical Mechanical Polishing) or the like may be provided.

In addition, in each of the embodiments above, the description is given with an example of forming the depression in the semiconductor substrate in such a manner as to reduce the thickness of the central portion and its vicinity while leaving the fringe portion. The formation of the depression is made so that the semiconductor substrate with a reduced thickness maintains sufficient rigidity. Accordingly, as long as the semiconductor substrate maintains sufficient rigidity, the depression is not limited to a particular shape. For example, parts excluding the lattice sections may be reduced in thickness (i.e., plural depressions are formed).

In addition, the different connection configurations of the electrode pads and the via holes described in the above embodiments may be provided together in a single semiconductor device.

In addition, modification the same as that of the first embodiment may be applied to the second to fifth embodiments above.

Seventh Embodiment

Configuration of Semiconductor Device According to Seventh Embodiment

Figure 14:
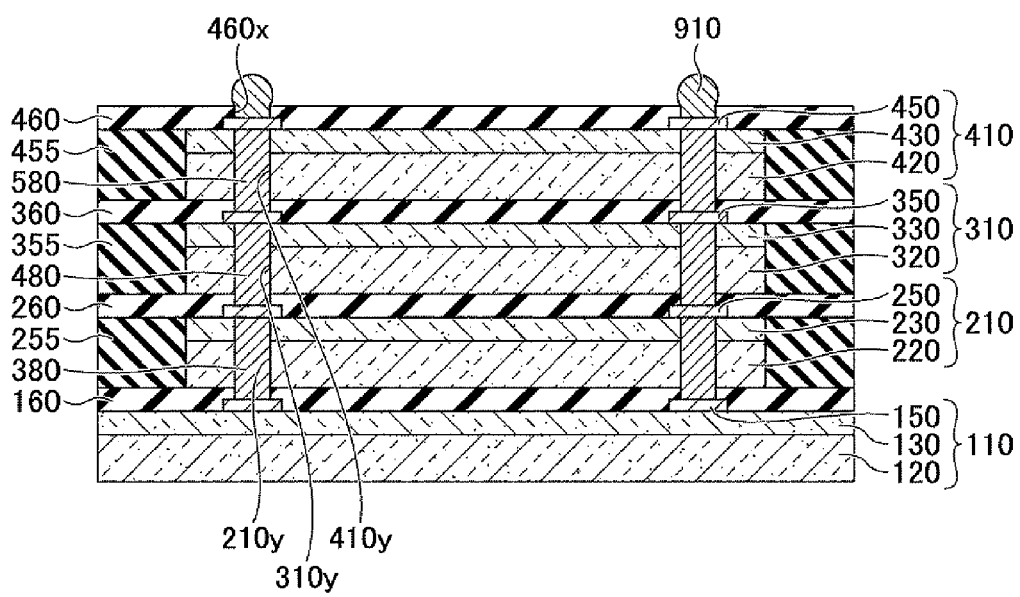
FIG. 14 is a cross-sectional view illustrating a semiconductor device according to a seventh embodiment of the present invention.

First is described the configuration of a semiconductor device according to a seventh embodiment of the present invention. FIG. 14 is a cross-sectional view illustrating the semiconductor device according to the seventh embodiment of the present invention. With reference to FIG. 14, a semiconductor device 100 according to the seventh embodiment has a configuration in which semiconductor chips 110, 210, 310 and 410 are disposed one above the other. The lateral sides of the semiconductor chips 210-410 are sealed by resin layers 255-455, respectively, which are sealing insulating layers.

The semiconductor chips 110-410 include substrate bodies 120-420, semiconductor integrated circuits 130-430 and electrode pads 150-450, respectively. The substrate bodies 120-420 are made of, for example, silicon. Each of the semiconductor integrated circuits 130-430 has a configuration in which a diffusion layer (not shown), an insulating layer (not shown), via holes (not shown), a wiring layer (not shown) and the like are formed in silicon, for example, and is formed on one surface of the corresponding substrate body 120-420. In the following description, the surface of each of the semiconductor chips 110-410, on which surface the semiconductor integrated circuit 130-430 is provided may be referred to as the "main surface" or "device-side surface".

The electrode pads 150-450 are disposed on the corresponding semiconductor integrated circuits 130-430, respectively, via the insulating layer (not shown). The electrode pads 150-450 are electrically connected to the corresponding wiring layer (not shown) provided in the semiconductor integrated circuit 130-430. As each of the electrode pads 150-450, a laminated body or the like may be used, in which an Au layer is disposed on a Ti layer, for example. Or, the following may also be used as the electrode pads 150-450: a laminated body in which an Au layer is disposed on a Ni layer; a laminated body in which a Pd layer and an Au layer are sequentially disposed on a Ni layer; a laminated body in which a Cu layer or an Al layer is disposed on a layer of a high melting point metal, such as Co, Ta, Ti and TiN, in place of Ni; or a damascene interconnect structure.

The semiconductor chips 110 and 210 are bonded to one another via a resin layer 160 which is an insulating layer, and the electrode pads 150 of the semiconductor chip 110 and the corresponding electrode pads 250 of the semiconductor chip 210 are electrically connected to each other via metal layers 380 formed in via holes 210$y$. The semiconductor chips 210 and 310 are bonded to one another via a resin layer 260 which is an insulating layer, and the electrode pads 250 of the semiconductor chip 210 and the corresponding electrode pads 350 of the semiconductor chip 310 are electrically connected to each other via metal layers 480 formed in via holes 310$y$. The semiconductor chips 310 and 410 are bonded to one another via a resin layer 360 which is an insulating layer, and the electrode pads 350 of the semiconductor chip 310 and the corresponding electrode pads 450 of the semiconductor chip 410 are electrically connected to each other via metal layers 580 formed in via holes 410$y$.

Note that the via holes are connecting holes provided to connect semiconductor chips (not limited to vertically adjacent semiconductor chips), and connect the semiconductor chips to enable signal transmission between them when a metal layer, an optical waveguide or the like is formed inside the via hole. The metal layer, the optical waveguide or the like formed inside the via hole may be referred to as the "connection part".

On the main surface of the semiconductor chip 410, a solder mask layer 460 which is an insulating layer and has openings 460$x$ is formed, and external connection terminals 910 are formed on the electrode pads 450 exposed inside the openings 460$x$. The external connection terminals 910 are provided to electrically connect the semiconductor device 100 and a wiring substrate or the like provided outside the semiconductor device 100, and are electrically connected to the corresponding electrode pads 450. As the external connection terminals 910, solder balls, Au bumps, a conductive paste or the like may be used. In the case when solder balls are used as the external connection terminals 910, an alloy containing Pb, an alloy of Sn and Cu, an alloy of Sn and Ag, an alloy of Sn, Ag and Cu or the like may be used as a material of the external connection terminals 910.

Figure 15A:
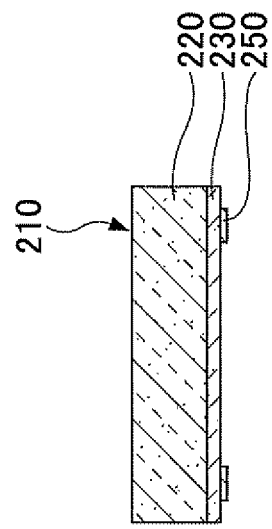
FIG. 15A illustrates a first process of a manufacturing process flow of the semiconductor device according to the seventh embodiment of the present invention.
Figure 15A:
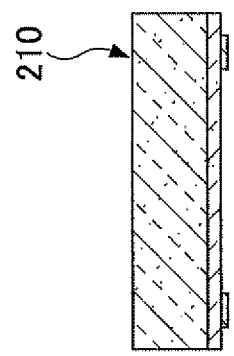
Figure 15A:
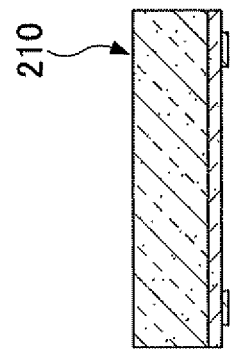

Processes for Manufacturing Semiconductor Device According to Seventh Embodiment Next is described a manufacturing process flow of the semiconductor device according to the seventh embodiment of the present invention. FIGS. 15A to 15X illustrate the manufacturing process flow of the semiconductor device according to the seventh embodiment of the present invention.

First in a process shown in FIG. 15A, plural singularized semiconductor chips 210 are prepared by dicing a semiconductor wafer. Each of the semiconductor chips 210 has not been reduced in thickness and has a thickness of, for example, about 600 to 800 µm.

Figure 15B:
FIG. 15B illustrates a second process of the manufacturing process flow of the semiconductor device according to the seventh embodiment of the present invention.

Next in a process shown in FIG. 15B, a support 970 is prepared, and an adhesion layer 960 is formed on one surface of the support 970. As the support 970, it is preferable to use a substrate which transmits light when alignment is performed, and a silica glass substrate, for example, may be used. As the adhesion layer 960, for example, an adhesive agent may be used which turns soft at a heating temperature used in a process of FIG. 15G (i.e., an adhesive agent which becomes soft at about 200° C. or less) to be described below. The adhesion layer 960 is formed on the one surface of the support 970 by spin-coating, for example. The adhesion layer 960 may be formed on the surface of the support 970 by attaching a film-type adhesive instead of by spin-coating.

Figure 15C:
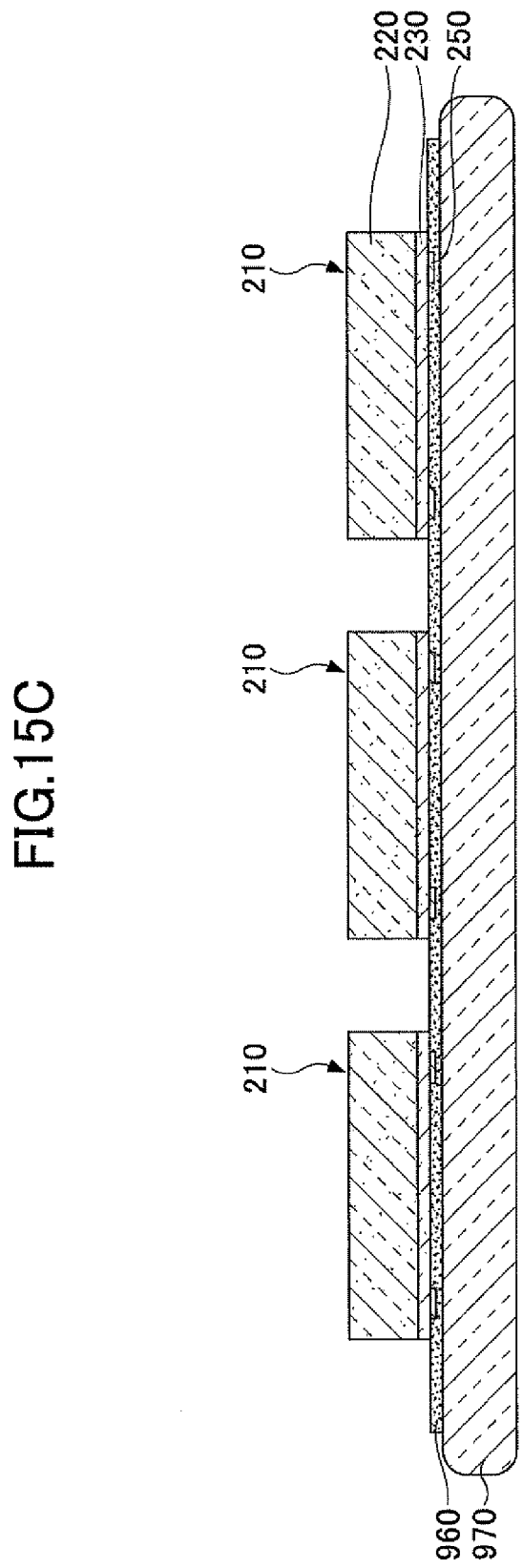
FIG. 15C illustrates a third process of the manufacturing process flow of the semiconductor device according to the seventh embodiment of the present invention.

Next in a process shown in FIG. 15C, each of the semiconductor chips 210 is bonded (temporarily bonded) face down on the one surface of the support 970 via the adhesion layer 960. The semiconductor chips 210 are respectively bonded to positions corresponding to a device layout of a semiconductor substrate 111, which is disposed in layers with the semiconductor chips 210 in a process shown in FIG. 15G to be described below.

Figure 15D:
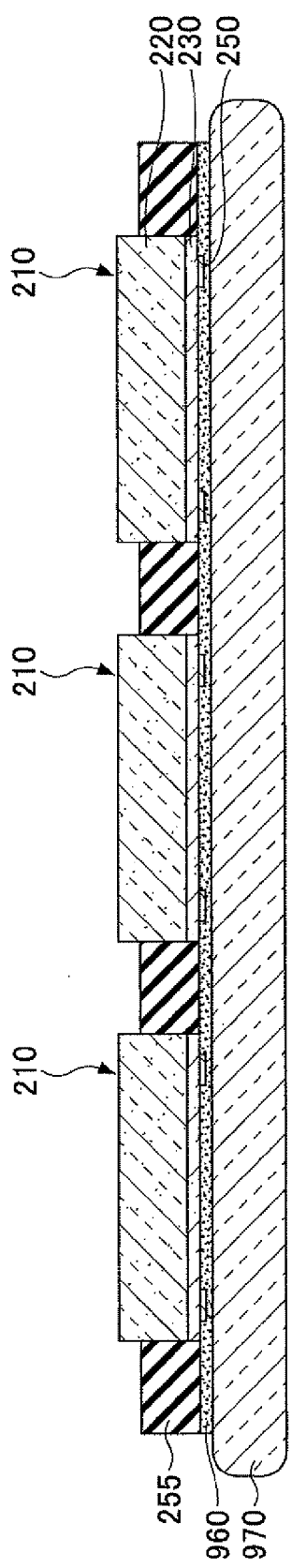
FIG. 15D illustrates a fourth process of the manufacturing process flow of the semiconductor device according to the seventh embodiment of the present invention.

Next in a process shown in FIG. 15D, a resin layer 255 is formed on the adhesion layer 960 in such a manner as to seal at least a part of the lateral side of each semiconductor chip 210. Note that in this process, it is sufficient if the sealing is provided on the lateral side of each semiconductor chip 210 to the level allowing the resin layer 255 to seal the lateral side completely after each semiconductor chip 210 is reduced in thickness in a process shown in FIG. 15E to be described below. Note however that, the lateral side and back surface (i.e., the surface on which no devices are formed) of each semiconductor chip 210 may be sealed by the resin layer 255. In this case, in the process shown in FIG. 15E to be described below, the resin layer 255 sealing the back surface and a part of the lateral side of each semiconductor chip 210 is removed when the thickness reduction is performed on the semiconductor chip 210.

A thermosetting insulating resin mainly composed of, for example, benzocyclobutene (BCB) may be used as a material of the resin layer 255. Alternatively, the following may also be used as a material of the resin layer 255, for example: a thermosetting insulating resin mainly composed of an epoxide-based resin, an acrylic-based resin or a polyimide-based resin; and an insulating composite material to which micro fine solid powder of, for example, silica is added. The resin layer 255 may be formed by applying the thermosetting insulating resin mainly composed of, for example, benzocyclobutene (BCB) to the adhesion layer 960 using, for example, spin-coating technique and, then, applying heat at a predetermined curing temperature to thereby harden the thermosetting insulating resin. Note that, in this case, after the application of the thermosetting insulating resin, a squeegee process may also be incorporated. Note that the resin layer 255 may be formed by a vapor-phase growth method or by attaching a film resin, instead of using spin-coating technique.

Figure 18:
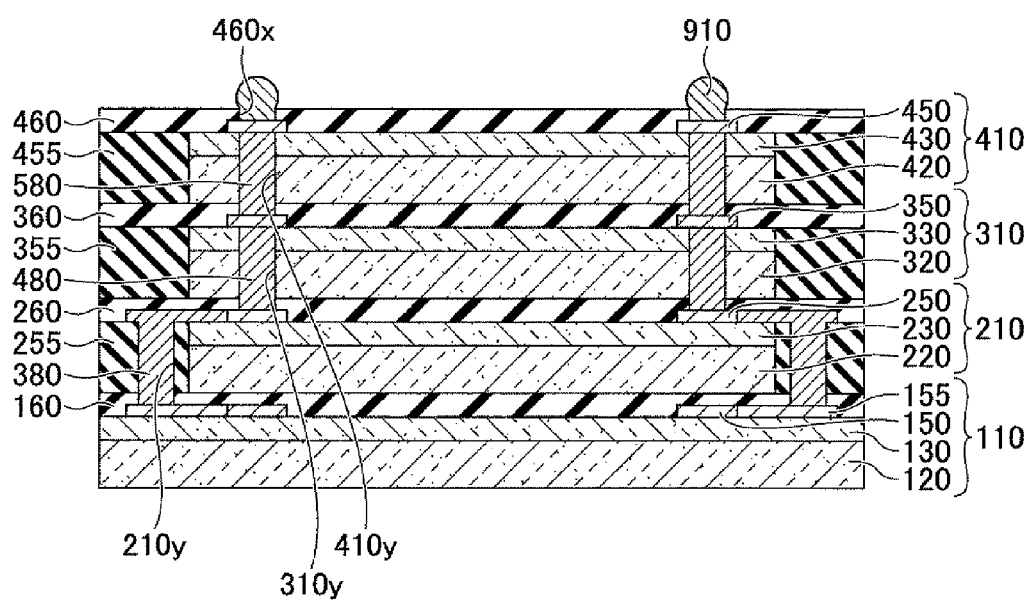
FIG. 18 is a first cross-sectional view illustrating a semiconductor device according to an eighth embodiment of the present invention.

Note that the resin layer 255 has, for example, the following functions of providing a flat enough surface to enable lithography at a time when rewiring is performed; being a fabrication material at a time when via holes penetrating the resin layer 255, as shown in FIG. 18 to be described below, are formed; protecting the semiconductor chips 210 from being damaged by a dicer at a time of the singularization process; and securing resistance to humidity.

Figure 15E:
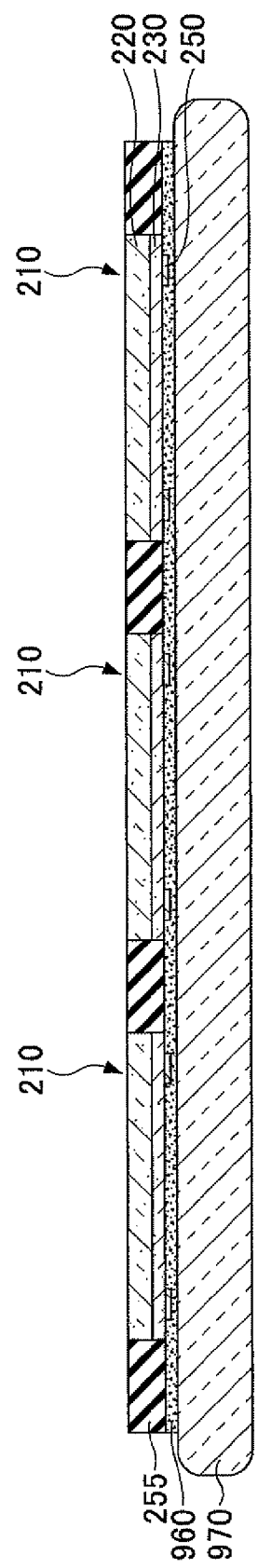
FIG. 15E illustrates a fifth process of the manufacturing process flow of the semiconductor device according to the seventh embodiment of the present invention.

Next in a process shown in FIG. 15E, unnecessary parts of the resin layer 255 and a part of the substrate body of each semiconductor chip 210 on the back surface side are ground by a grinder or the like to thereby reduce the thickness of each semiconductor chip 210. Herewith, each semiconductor chip 210 has a reduced thickness and the lateral side of each semiconductor chip 210 after the thickness reduction is sealed by the resin layer 255. In this operation, dry polishing, wet etching or the like may also be used in combination. The thickness of each semiconductor chip 210 after the thickness reduction is, for example, in the range of about 1 µm to 100 µm.

The reason for the thickness of each semiconductor chip 210 after the thickness reduction being 1 µm or more is as follows. It is considered that, in order to prevent a defect or contamination having occurred on the back surface of the semiconductor chip 210 from spreading to devices, such as transistors, in the semiconductor integrated circuit 230, the thickness of the semiconductor chip 210 after the thickness reduction needs to be at least five times or more the depth of element isolation (not shown) in the devices. Here, the depth of element isolation (not shown) in the devices in the semiconductor integrated circuit 230 is in the range of about 200 nm to about 500 nm. Accordingly, the thickness of each semiconductor chip 210 after the thickness reduction needs to be at least 1 µm, which is five times the minimum value of the depth of element isolation, 200 nm.

Figure 15F:
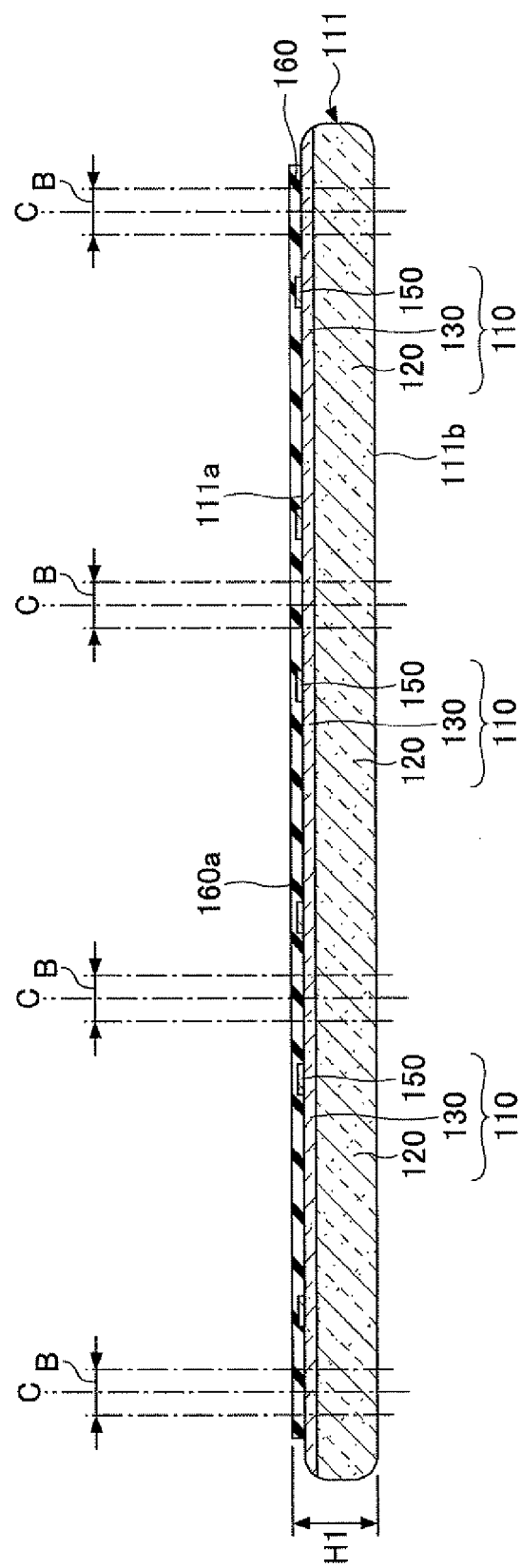
FIG. 15F illustrates a sixth process of the manufacturing process flow of the semiconductor device according to the seventh embodiment of the present invention.

Next in a process shown in FIG. 15F, the semiconductor substrate 111 is prepared, and the resin layer 160 is formed on a main surface 111a of the semiconductor substrate 111. The semiconductor substrate 111 includes plural semiconductor chips 110 and a scribing region B for separating the plural semiconductor chips 110. The reference symbol C indicates a position at which, on the semiconductor substrate 111, cutting is performed using a dicing blade or the like (hereinafter, referred to as the "cutting position C"). The diameter of the semiconductor substrate 111 is, for example, 6 inches (about 150 mm), inches (about 200 mm) or 12 inches (about 300 mm). The thickness of the semiconductor substrate 111 is, for example, 0.625 mm (in the case of 6 inches in diameter), 0.725 mm (in the case of 8 inches in diameter) and 0.775 mm (in the case of 12 inches in diameter).

As described above, each semiconductor chip 110 includes the substrate body 120, the semiconductor integrated circuit 130 and the electrode pads 150. Note that at this point, each semiconductor chip 110 has yet to be reduced in thickness. Since the materials and the formation methods of the resin layer 160 can be the same as those of the resin layer 255 described above, their explanations are omitted.

In the process shown in FIG. 15F, it is preferable that, when a back surface 111b (a surface on which no devices are formed) of the semiconductor substrate 111 is used as a reference plane, a surface 160a (a surface not in contact with the main surface 111a of the semiconductor substrate 111) of the resin layer 160 be parallel to the reference plane. If the surface 160a of the resin layer 160 is not parallel to the reference plane, for example, the via holes 210y are formed at an angle in a process shown in FIG. 15K to be described below, and the metal layers 380 or the like are formed in the slanted via holes 210y. This may result in the problem of decreased reliability of the connection between semiconductor chips disposed one above the other. Note that being parallel in this case means that the variation in a height H1 of the surface 160a of the resin layer 160 with respect to the reference plane is 1 μm or less. Accordingly, it is preferable to have a process of checking the variation in the height H1 after the formation of the resin layer 160. In the case where the variation in the height H1 is more than 1 μm, it is preferable to have a process of adjusting the surface 160a of the resin layer 160 to make the variation in the height H1 within 1 μm. The surface 160a of the resin layer 160 may be processed (ground) by, for example, a CMP method.

When (n−1) semiconductor chips have already been disposed one above the other on the lowermost semiconductor substrate (the first layer) and a resin layer is then formed on the topmost (the $n^{th}$ layer) semiconductor chip, the back surface (the surface on which no devices are formed) of the lowermost semiconductor substrate is used as a reference plane. In this case, it is preferable that the top surface of the resin layer be parallel to the reference plane. Note that being parallel in this case means that the variation in the height of the top surface of the resin layer with respect to the reference plane is (1×n) μm or less. That is, as described above, in the case when a resin layer is formed on a single semiconductor substrate, the variation in the height of the top surface of the resin layer with respect to the reference plane is preferably 1×1=1 μm or less, and in the case when a resin layer is formed on nine semiconductor chips, for example, the variation in the height of the top surface of the resin layer with respect to the reference plane (the back surface of the lowermost semiconductor substrate) is preferably 1×10=10 μm or less.

Figure 15G:
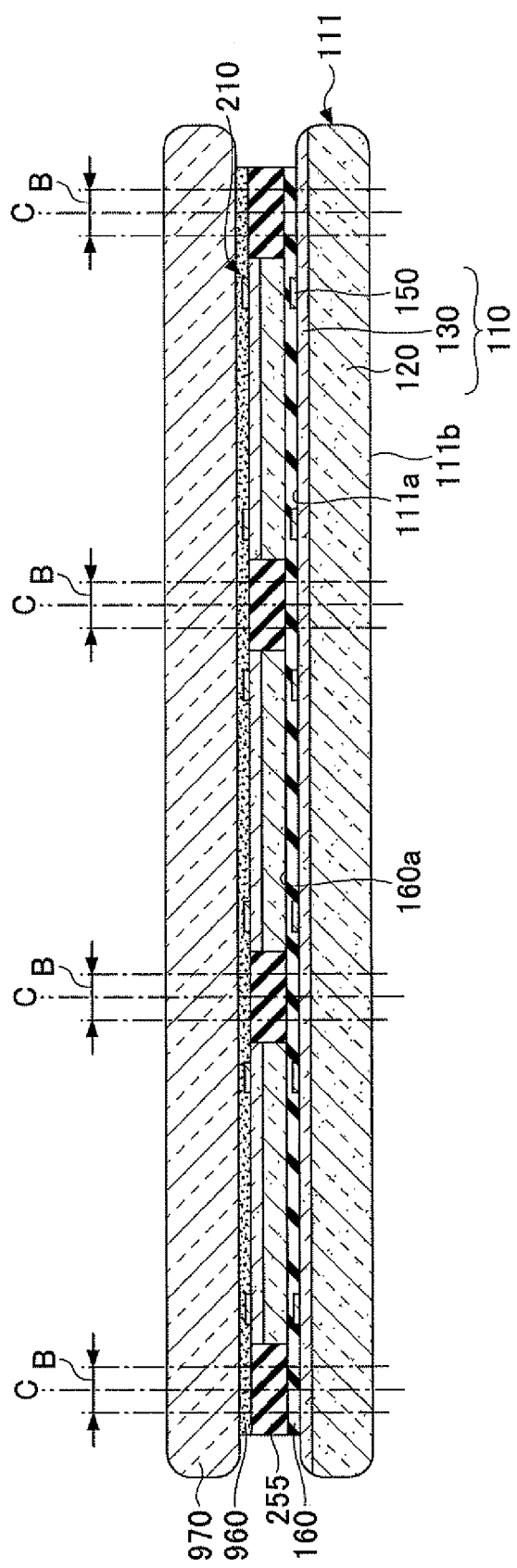
FIG. 15G illustrates a seventh process of the manufacturing process flow of the semiconductor device according to the seventh embodiment of the present invention.

Next in a process shown in FIG. 15G, the structure of FIG. 15E is vertically flipped and bonded to the main surface 111a of the semiconductor substrate 111 via the resin layer 160. Specifically, first, the structure of FIG. 15E is disposed in such a manner that the back surface of each semiconductor chip 210 comes in contact with the resin layer 160 formed on the main surface 111a of the semiconductor substrate 111. Alignment marks for enabling highly accurate positioning are provided in advance for each semiconductor chip 210 and the semiconductor substrate 111. The positioning of the structure of FIG. 15E with respect to the semiconductor substrate 111 may be achieved by a well-recognized method using the alignment marks as a reference. The alignment accuracy is, for example, 2 μm or less.

Subsequently, while being heated at, for example, 250° C., the structure shown in FIG. 15E is pressed from the support 970 side to thereby cause the back surfaces of the semiconductor chips 210 of the structure and the surface 160a of the resin layer 160 to be press-bonded to each other. Herewith, the resin layer 160 becomes hardened, and the structure of FIG. 15E is bonded to the main surface 111a of the semiconductor substrate 111. The heating operation may be performed at 300° C. or more; however, the temperature is preferably 200° C. or less. If the operation is performed at the temperature as high as 300° C., stress occurs due to a difference in the thermal expansion, which can cause separation and/or breakage of the semiconductor substrates. Such separation and breakage becomes more likely as the number of laminated layers increases.

Next in a process shown in FIG. 15H, the adhesion layer 960 and the support 970 shown in FIG. 15G are removed. Note that since the adhesion layer 960 is made of an adhesion agent which turns soft at a heating temperature used in the process of FIG. 15G (i.e., an adhesive agent which becomes soft at about 200° C. or less), the support 970 is readily removed after the structure of FIG. 15E is bonded to the main surface 111a side of the semiconductor substrate 111 by hardening the resin layer 160. That is, the processes of FIGS. 15G and 15H are a series of processes.

Figure 15I:
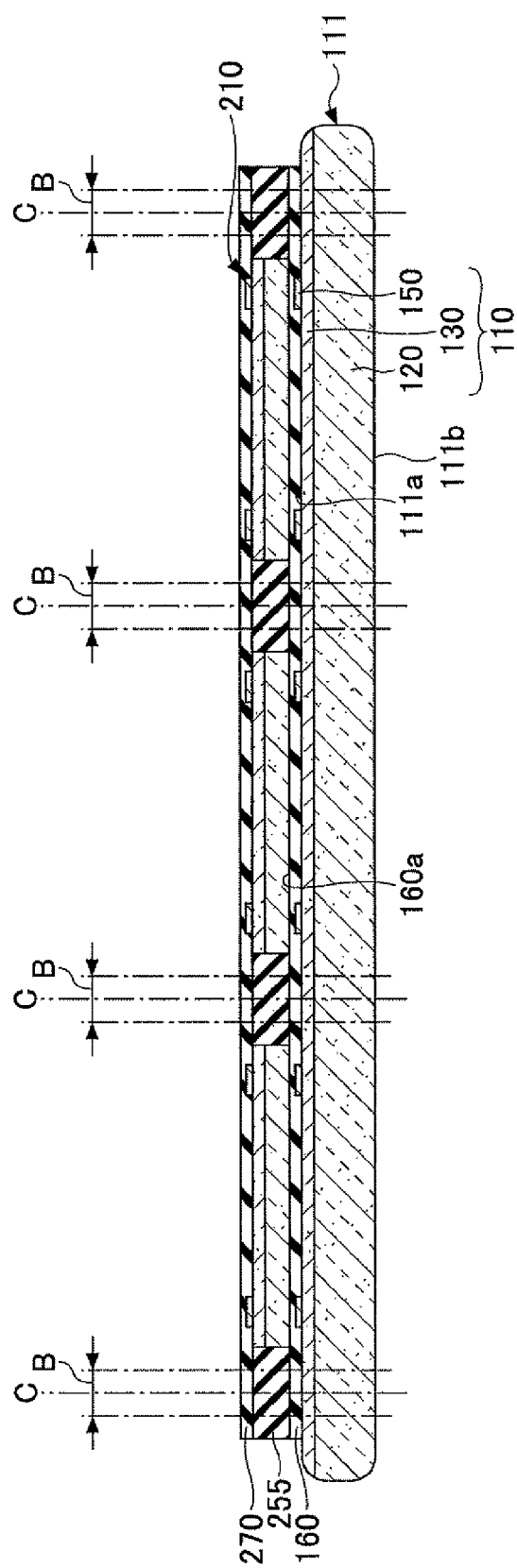
FIG. 15I illustrates a ninth process of the manufacturing process flow of the semiconductor device according to the seventh embodiment of the present invention.

Next in a process shown in FIG. 15I, a photosensitive resist film 270 is formed in such a manner as to cover the main surfaces of the semiconductor chips 210 and the top surface of the resin layer 255. The resist film 270 is formed, for example, by applying a liquid resist to the main surfaces of the semiconductor chips 210 and the top surface of the resin layer 255. The thickness of the resist film 270 is about 10 μm, for example.

Figure 15J:
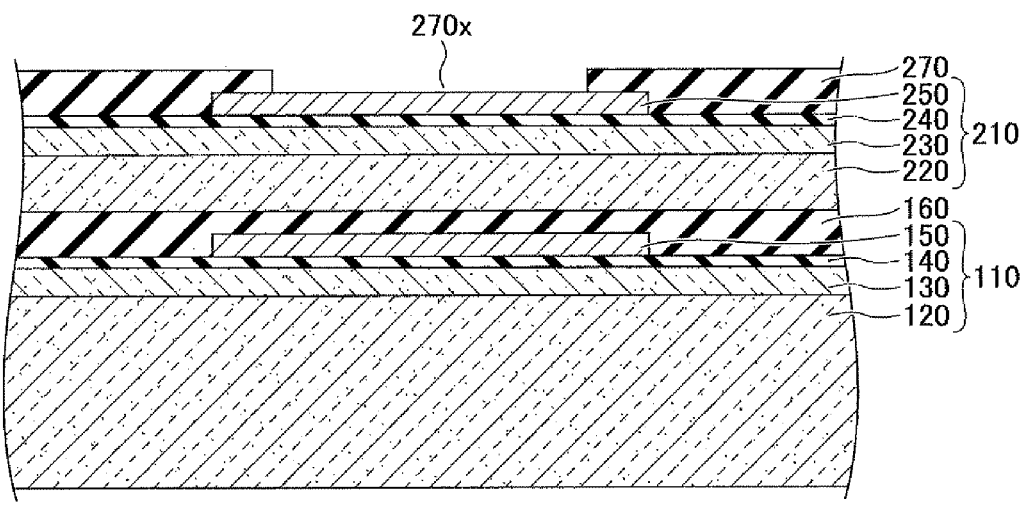
FIG. 15J illustrates a tenth process of the manufacturing process flow of the semiconductor device according to the seventh embodiment of the present invention.

Next in a process shown in FIG. 15J, the resist film 270 of FIG. 15I is exposed via a predetermined mask, and the exposed resist film 270 is subsequently developed, thereby forming an opening 270x in the resist film 270. Note that for convenience of explanation, FIGS. 15J to 15U show enlarged views of a part of the structure shown in FIG. 15I (i.e., the electrode pads 150 and 250 and their vicinity). The reference numerals 140 and 240 of FIG. 15J denote insulating layers provided on the semiconductor integrated circuits 130 and 230, respectively, which insulating layers are not shown in FIGS. 15A to 15I. The insulating layers 140 and 240 are made of, for example, $Si_3N_4$ or $SiO_2$. The thickness of each of the insulating layers 140 and 240 is in the range of, for example, about 0.1 μm to 2.0 μm so as to achieve electrical insulation between the semiconductor integrated circuits 130 and 230.

Figure 15K:
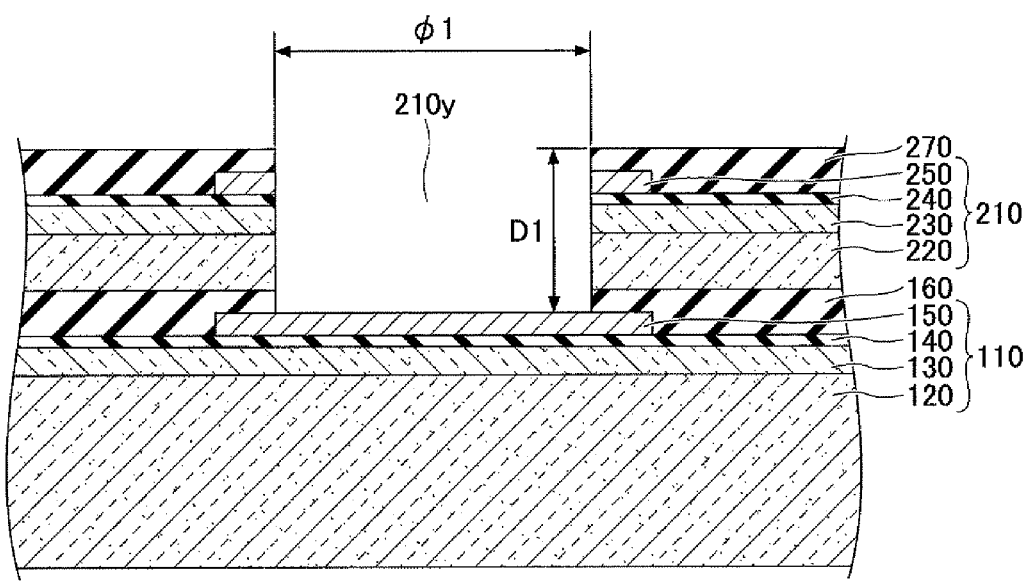
FIG. 15K illustrates an eleventh process of the manufacturing process flow of the semiconductor device according to the seventh embodiment of the present invention.

Next in a process shown in FIG. 15K, a via hole 210y is formed in each semiconductor chip 210. The via hole 210y is formed in such a manner as to penetrate the resin layer 160 and a part of the semiconductor chip 210 (the substrate body 220, the semiconductor integrated circuit 230, the insulating layer 240 and the electrode pad 250) corresponding to the opening 270x so that the electrode pad 150 of the corresponding semiconductor chip 110 in the substrate 111 is exposed. The via hole 210y is formed by, for example, dry etching. The via hole 210y has, for example, a circular shape in a planar view, and has a diameter ϕ1 of, for example, about 1 μm to 30 μm. Note however that the diameter ϕ1 of the via hole 210y is preferably set to a value which allows the via hole 210y to have an aspect ratio (=depth D1/diameter ϕ1) between 0.5 and 5 inclusive. This is because by setting the diameter ϕ1 of the via hole 210y to a value which allows the via hole 210y to have an aspect ratio (=depth D1/diameter ϕ1) between 0.5 and 5 inclusive, it is possible to achieve, for example, an improvement in the etching speed (throughput) for forming the via hole 210y and an improvement of the ease of forming, in the via hole 210y, the metal layer 380 to be described below.

Figure 15L:
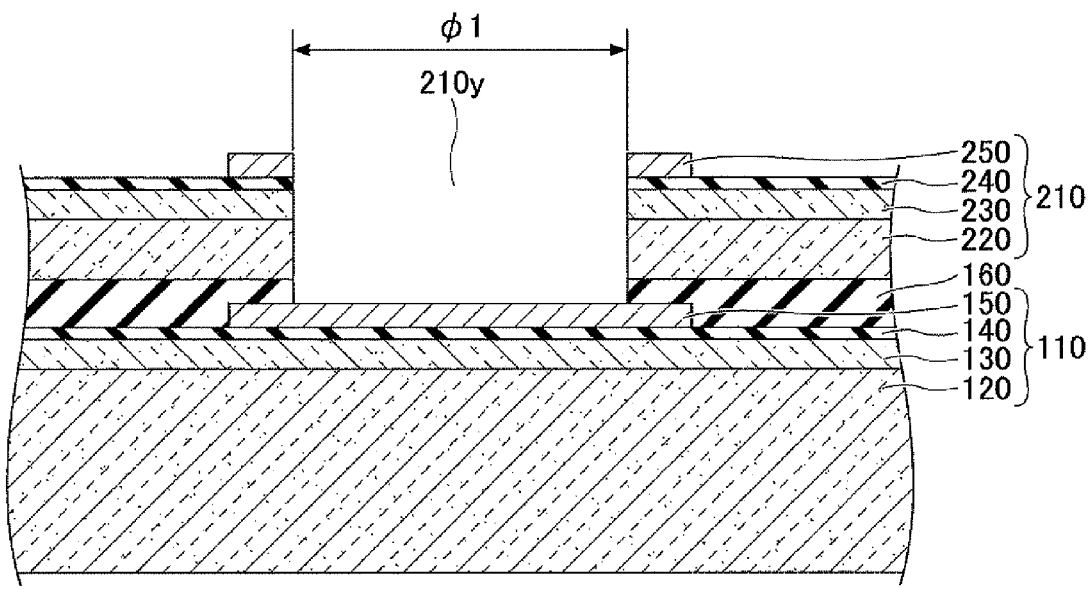
FIG. 15L illustrates a twelfth process of the manufacturing process flow of the semiconductor device according to the seventh embodiment of the present invention.
Figure 15M:
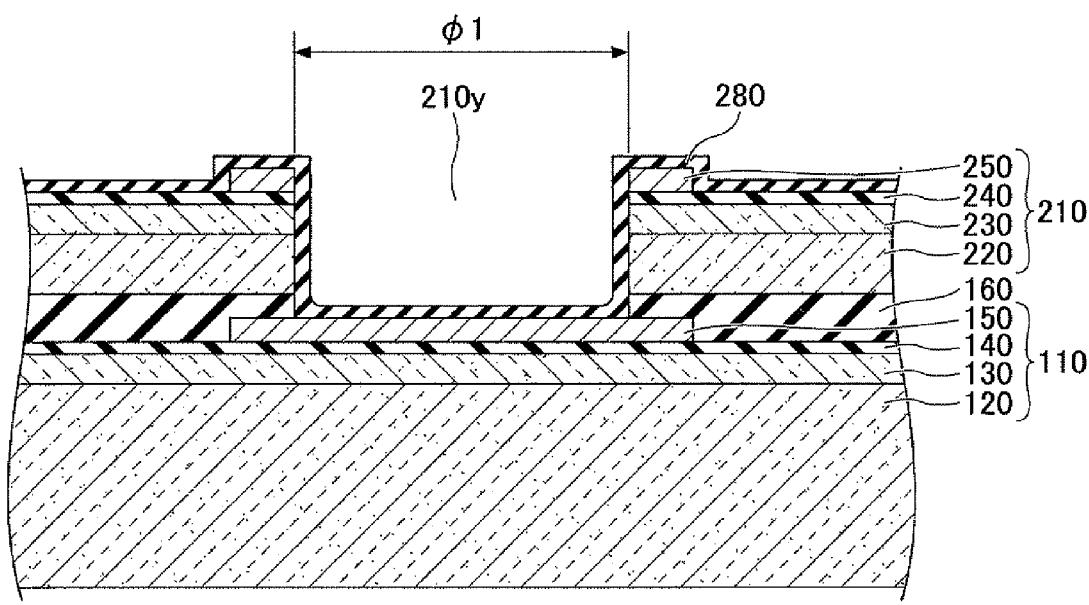
FIG. 15M illustrates a thirteenth process of the manufacturing process flow of the semiconductor device according to the seventh embodiment of the present invention.

Next in a process shown in FIG. 15L, the resist film 270 of FIG. 15K is removed. Then, in a process shown in FIG. 15M, an insulating layer 280 is formed in such a manner as to cover the top surface of the insulting layer 240, the top surface and lateral side of the electrode pad 250, the wall surface of the via hole 210y and the top surface of the electrode pad 150 exposed at the bottom of the via hole 210y. The insulating layer 280 is formed by, for example, plasma CVD. The insulating layer 280 is made of, for example, $Si_3N_4$ or $SiO_2$. The thickness of the insulating layer 280 is in the range of 0.1 μm to 2.0 μm, for example.

Figure 15N:
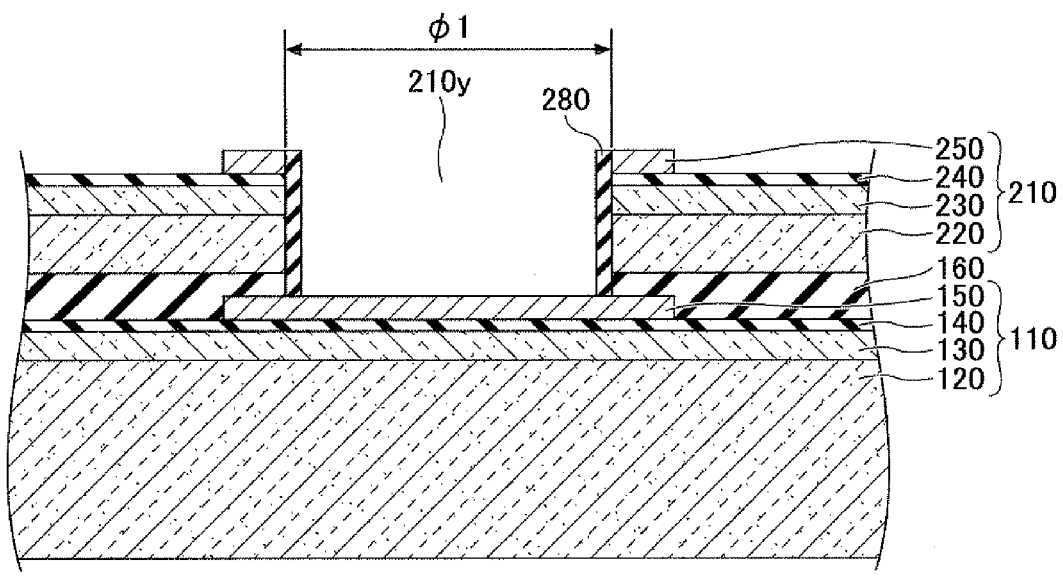
FIG. 15N illustrates a fourteenth process of the manufacturing process flow of the semiconductor device according to the seventh embodiment of the present invention.

Next in a process shown in FIG. 15N, the insulating layer 280 is removed, except for that formed on the wall surface of the via hole 210y. The removal of the insulating layer 280 is performed by, for example, RIE (Reactive Ion Etching). In this process, only predetermined parts of the insulating layer 280 are removed without using a photomask, and the process is referred to as a self-alignment process. By the self-alignment process, the positions of the via hole 210y and the electrode pad 250 are determined with accuracy. In addition, by using a design in which no electrode pad is present in some part, etching is performed in the section with no electrode pad and is continued to the electrode pad of a different semiconductor chip in the underlying section, to thereby form a via hole having a different depth.

Figure 15O:
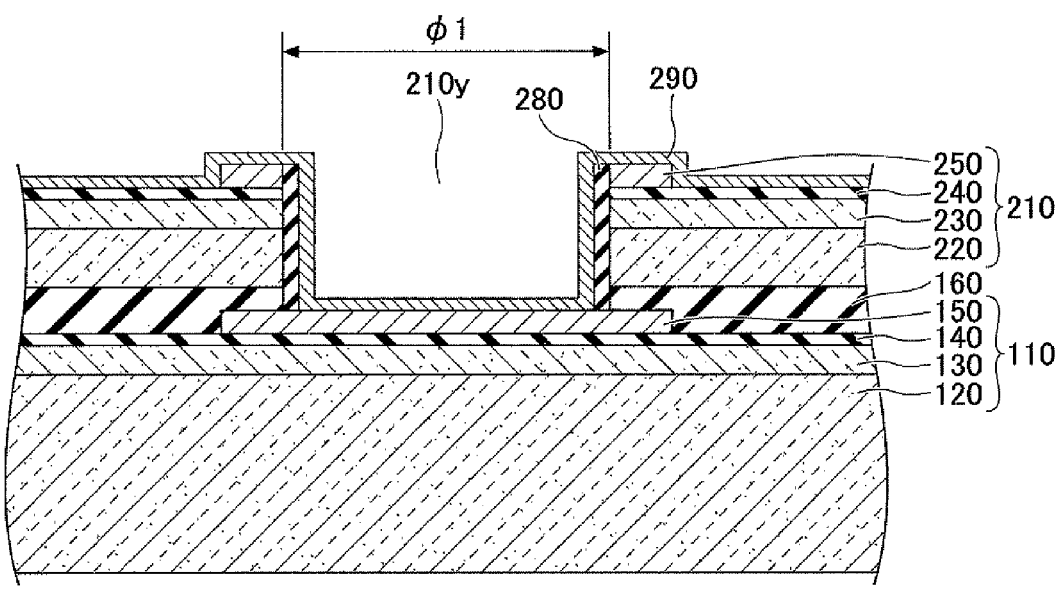
FIG. 15O illustrates a fifteenth process of the manufacturing process flow of the semiconductor device according to the seventh embodiment of the present invention.

Next in a process shown in FIG. 15O, a metal layer 290 is formed in such a manner as to cover the top surface of the insulating layer 240, the top surface and lateral side of the electrode pad 250, the top surface of the insulating layer 280 and the top surface of the electrode pad 150 exposed at the bottom of the via hole 210y. The metal layer 290 is formed by, for example, electroless plating, or may be formed by sputtering, CVD or the like. As the metal layer 290, a laminated body in which a Cu layer is disposed on a Ti layer, or a laminated body in which a Cu layer is disposed on a Ta layer, for example, may be used. In addition, a conductor which satisfies the design criteria can be used as the buried material, and W, Al, doped polysilicon, a carbon material such as a carbon nanotube, or a conductive polymer may be used in place of Cu. In the case where the electrical insulation of the insulating layer is sufficient, a combination with a buried wiring using no barrier metal layer may be chosen.

Figure 15P:
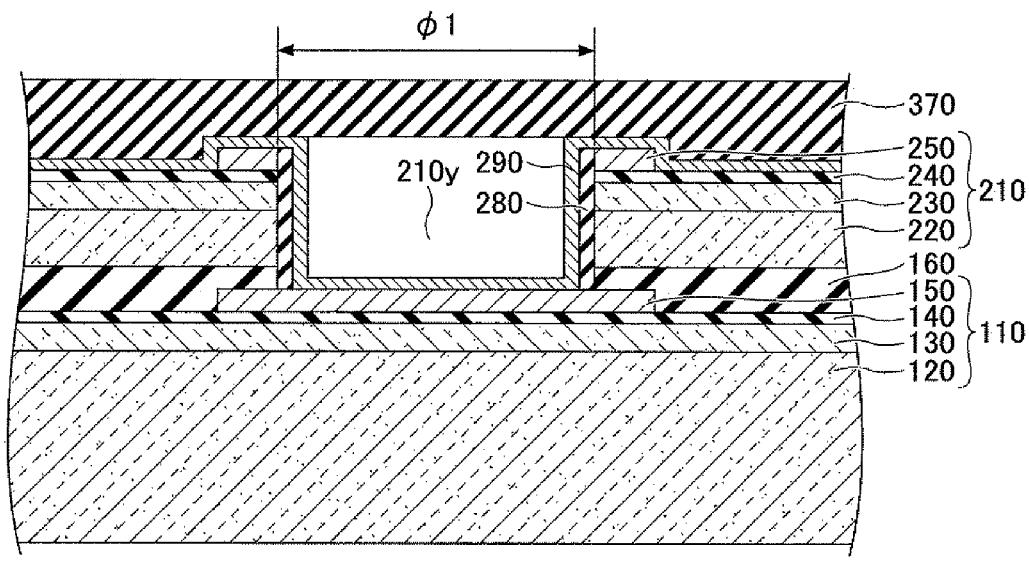
FIG. 15P illustrates a sixteenth process of the manufacturing process flow of the semiconductor device according to the seventh embodiment of the present invention.

Next in a process shown in FIG. 15P, a photosensitive resist film 370 is formed in such a manner as to cover the top surface of the metal layer 290 except for the inside of the via hole 210y. The resist film 370 is formed, for example, by applying a dry film resist to the top surface of the metal layer 290. The thickness of the resist film 370 is 10 μm, for example. Then, in a process shown in FIG. 15Q, the resist film 370 of FIG. 15P is exposed via a predetermined mask, and the exposed resist film 370 is subsequently developed, thereby forming an opening 370x in the resist film 370. The opening 370x is formed in such a manner as to expose the via hole 210y and a part of the top surface of the metal layer 290 around the opening 370x. The opening 370x has, for example, a circular shape in a planar view, and has a diameter φ2 of, for example, 1 μm to 30 μm.

Figure 15Q:
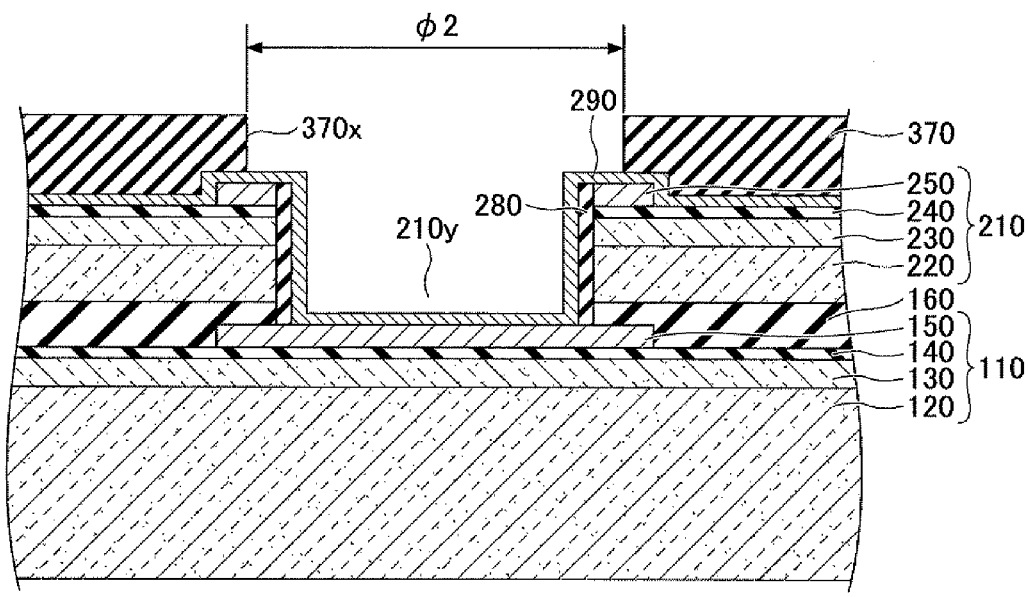
FIG. 15Q illustrates a seventeenth process of the manufacturing process flow of the semiconductor device according to the seventh embodiment of the present invention.
Figure 15R:
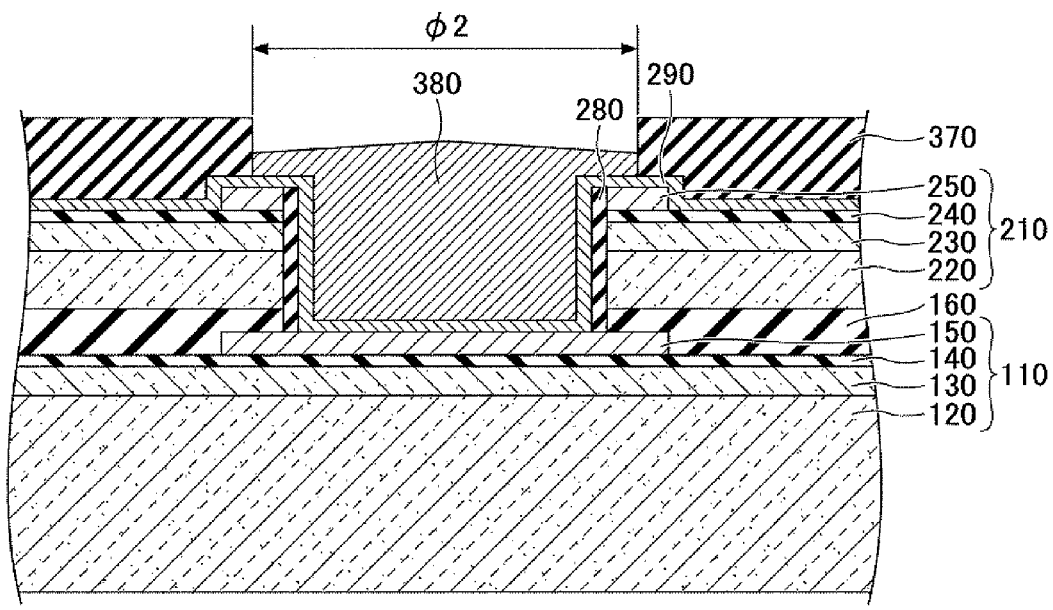
FIG. 15R illustrates an eighteenth process of the manufacturing process flow of the semiconductor device according to the seventh embodiment of the present invention.
Figure 15S:
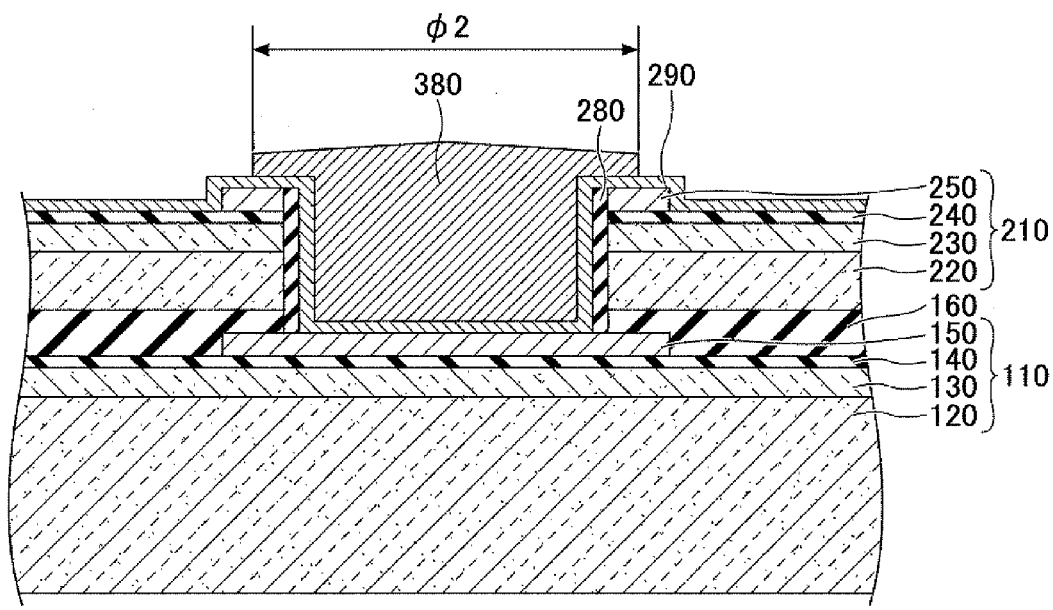
FIG. 15S illustrates a nineteenth process of the manufacturing process flow of the semiconductor device according to the seventh embodiment of the present invention.

Next in a process shown in FIG. 15R, the metal layer 380 is formed inside the via hole 210y and on a part of the opening 370x shown in FIG. 15Q. With use of electrolytic plating, in which the metal layer 290 is used as a feeder layer, the metal layer 380 is formed, for example, by growing a plating film by precipitation in such a manner as to fill the inside of the via hole 210y and the part of the opening 370x shown in FIG. 15Q. The plating film forming the metal layer 380 is, for example, a Cu plating film. Next in a process shown in FIG. 15S, the resist film 370 of FIG. 15R is removed.

Figure 15T:
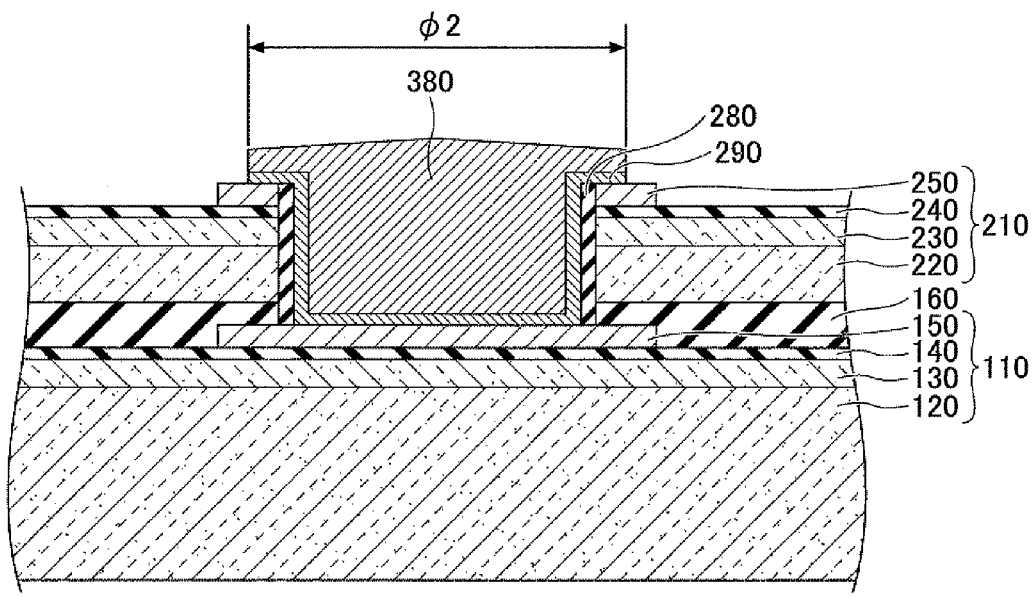
FIG. 15T illustrates a twentieth process of the manufacturing process flow of the semiconductor device according to the seventh embodiment of the present invention.
Figure 15U:
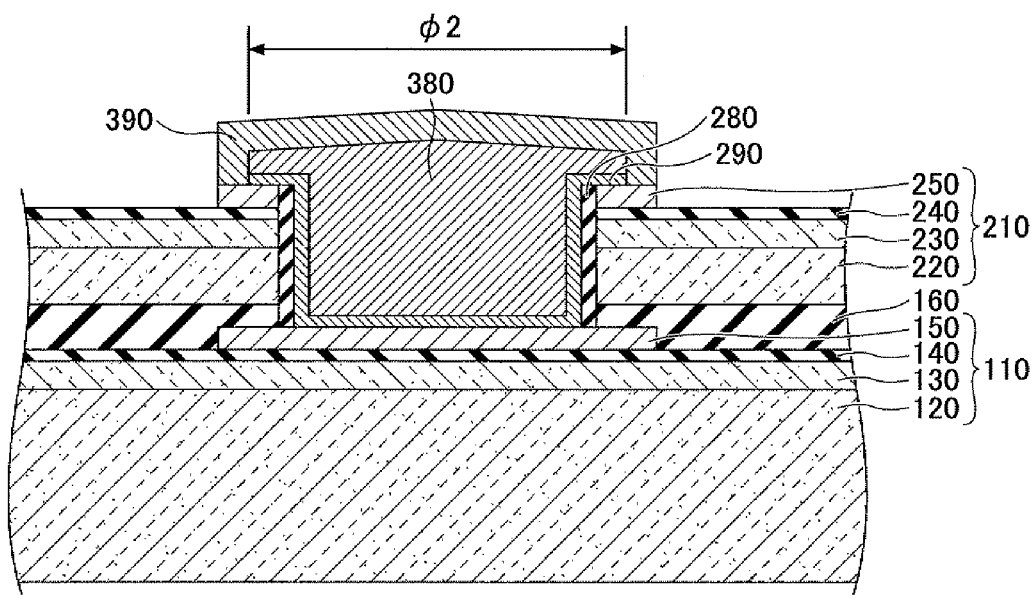
FIG. 15U illustrates a twenty-first process of the manufacturing process flow of the semiconductor device according to the seventh embodiment of the present invention.

Next in a process shown in FIG. 15T, a part of the metal layer 290 which is not covered by the metal layer 380 is removed. The metal layer 290 may be removed by, for example, wet etching. Next in a process shown in FIG. 15U, a metal layer 390 is formed in such a manner as to cover the electrode pad 250 and the metal layer 380. The metal layer 390 is formed, for example, by forming, on the insulating layer 240, a resist film having an opening for the electrode pad 250 and the metal layer 380. Subsequently, with use of electrolytic plating, in which the electrode pad 250 and the metal layer 380 are used as feeder layers, a plating film is grown by precipitation in such a manner as to fill the opening, and the resist film is then removed to thereby form the metal layer 390. As the metal layer 390, the following may be used: a laminated body in which an Au layer is disposed on a Ti layer, for example; a laminated body in which a Pd layer and an Au layer are sequentially disposed on a Ni layer; a laminated body in which a Cu layer or an Al layer is disposed on a layer of a high melting point metal, such as Co, Ta, Ti and TiN, in place of Ni; or a damascene interconnect structure.

Next in a process shown in FIG. 15V, the processes of FIGS. 15I to 15U are repeated and thereby the semiconductor chips 310 and 410 are sequentially disposed above the semiconductor chip 210. In this case, three semiconductor chips 210, 310 and 410 are stacked on top of the semiconductor substrate 111; however, the number of the semiconductor chips stacked on top of the semiconductor substrate 111 may be one, two, four or more. In addition, the semiconductor chips stacked on top of one another may have the same function or different functions.

Figure 15W:
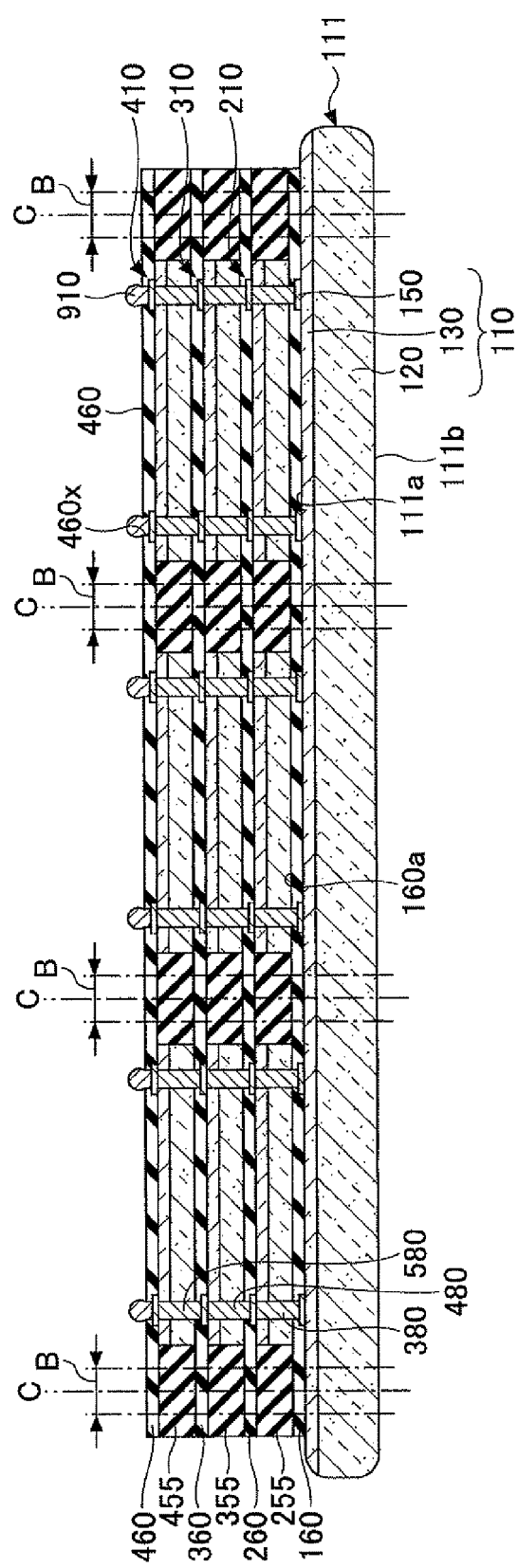
FIG. 15W illustrates a twenty-third process of the manufacturing process flow of the semiconductor device according to the seventh embodiment of the present invention.
Figure 15X:
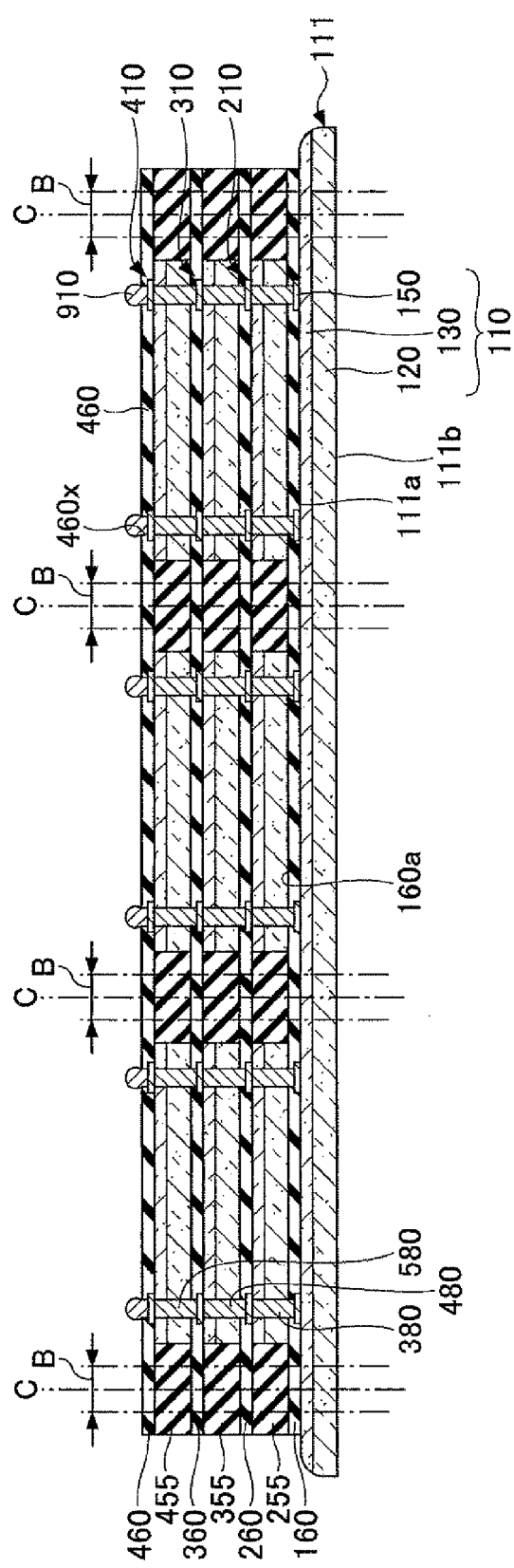
FIG. 15X illustrates a twenty-fourth process of the manufacturing process flow of the semiconductor device according to the seventh embodiment of the present invention.

Next in a process shown in FIG. 15W, the external connection terminals 910 are formed by a well-recognized method. When the external connection terminals 910 are formed, a Ni layer, for example, is formed as the metal layer 390. Then, the openings 460x which expose the Ni layer is formed in the solder mask layer 460, and then the external connection terminals 910 are formed on the Ni layer exposed inside the openings 460x. The external connection terminals 910 are provided to electrically connect the semiconductor device 100 and a wiring substrate or the like provided outside the semiconductor device 100. As the external connection terminals 910, solder balls, Au bumps, a conductive paste or the like may be used. In the case when solder balls are used as the external connection terminals 910, an alloy containing Pb, an alloy of Sn and Cu, an alloy of Sn and Ag, an alloy of Sn, Ag and Cu or the like may be used as a material of the external connection terminals 910.

Next in a process shown in FIG. 15X, the back surface of the semiconductor substrate 111 is ground by a grinder or the like to thereby reduce the thickness of the semiconductor substrate 111. In this operation, dry polishing, wet etching or the like may also be used in combination. The thickness of the semiconductor substrate 111 after the thickness reduction is in the range of about 1 μm to about 100 μm, for example.

Next, after the process of FIG. 15X is performed, the structure shown in FIG. 15X is cut into individual pieces at the cutting positions C using a dicing blade or the like to thereby manufacture the semiconductor device 100 of FIG. 14.

Thus, according to the seventh embodiment, a semiconductor substrate having, on its main surface side, plural semiconductor chips each including a semiconductor integrated circuit is prepared, and an insulating layer is formed on the main surface of the prepared semiconductor substrate. Then, singularized semiconductor chips each having a semiconductor integrated circuit on its main surface side are disposed over the semiconductor chips of the semiconductor substrate via the insulating layer in such a manner that the back surfaces of the singularized semiconductor chips oppose the insulating layer. Subsequently, via holes penetrating the singularized semiconductor chips are formed, and electrode pads of the singularized semiconductor chips and corresponding electrode pads of the semiconductor chips of the semiconductor substrate are electrically connected to each other via metal layers formed in the via holes.

By repeating such processes, it is possible to dispose plural semiconductor chips one above the other over the semiconductor substrate in such a manner as to enable signal transmission between semiconductor chips in different layers. This eliminates the need for the process of forming a bump on each via hole when the semiconductor chips are bonded to one another, and it is therefore possible to provide a semiconductor device manufacturing method with high productivity, capable of reducing the manufacturing costs.

In addition, according to the seventh embodiment of the present invention, semiconductor chips are bonded to one another in such a manner that a surface of one of the semiconductor chips, on which surface a semiconductor integrated circuit is formed, opposes a surface of another semiconductor chip, on which surface a semiconductor integrated circuit is not formed. Accordingly, by simply repeating the same processes, two or more semiconductor chips can be disposed one above the other over a semiconductor substrate, and it is therefore possible to provide a semiconductor device manufacturing method with high productivity, capable of reducing the manufacturing costs.

In addition, according to the seventh embodiment of the present invention, the via holes are formed in the semiconductor chip having a reduced thickness. This eliminates the need for creating deep via holes, and therefore causes neither an increase in the time required for the hole-formation of the via holes and the metal layer forming process nor an increase in the number of materials required for these processes, which results in preventing an increase in the cost of manufacturing the semiconductor device.

In addition, according to the seventh embodiment of the present invention, since the via holes are formed after the thickness of the semiconductor chip is reduced to a great extent, it is possible to reduce the variation in the diameter of the end portions of the via holes even when the size or density of the via holes is changed. As a result, the variation in the resistance of the electrical connections is reduced, and thus, the reliability of the semiconductor device is improved.

In addition, according to the seventh embodiment of the present invention, since singularized semiconductor chips are disposed one above the other over a semiconductor substrate, it is possible to readily dispose semiconductor chips having different device sizes one above the other.

First Modification of Seventh Embodiment

A first modification of the seventh embodiment describes an example in which plural semiconductor chips whose thicknesses are reduced in advance are mounted on a semiconductor substrate without using a support, and the main surface and the lateral side of each semiconductor chip are sealed by a resin layer. Also, the present modification describes an example in which electrodes of semiconductor chips disposed one above the other are electrically connected by a method different from that described in the seventh embodiment. Note that in the first modification of the seventh embodiment, the explanations of components which are common to those of the seventh embodiment described above are omitted.

FIGS. 16A to 16J illustrate processes of a manufacturing process flow of a semiconductor device according to the first modification of the seventh embodiment.

First in a process shown in FIG. 16A, the plural singularized semiconductor chips 210 are prepared by grinding the back surface of a semiconductor wafer using a grinder or the like to thereby reduce the thickness of the semiconductor wafer and subsequently dicing the semiconductor wafer. Each of the semiconductor chips 210 has a thickness of, for example, about 1 μm to 100 μm.

Figure 16A:
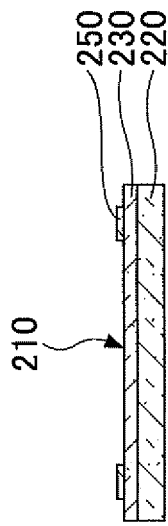
FIG. 16A illustrates a first process of a manufacturing process flow of a semiconductor device according to a first modification of the seventh embodiment of the present invention.
Figure 16A:
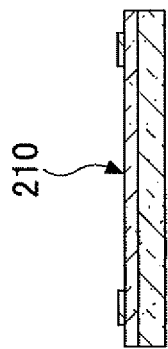
Figure 16A:
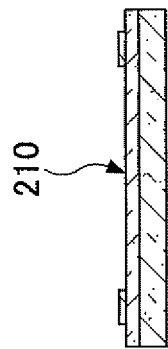
Figure 16B:
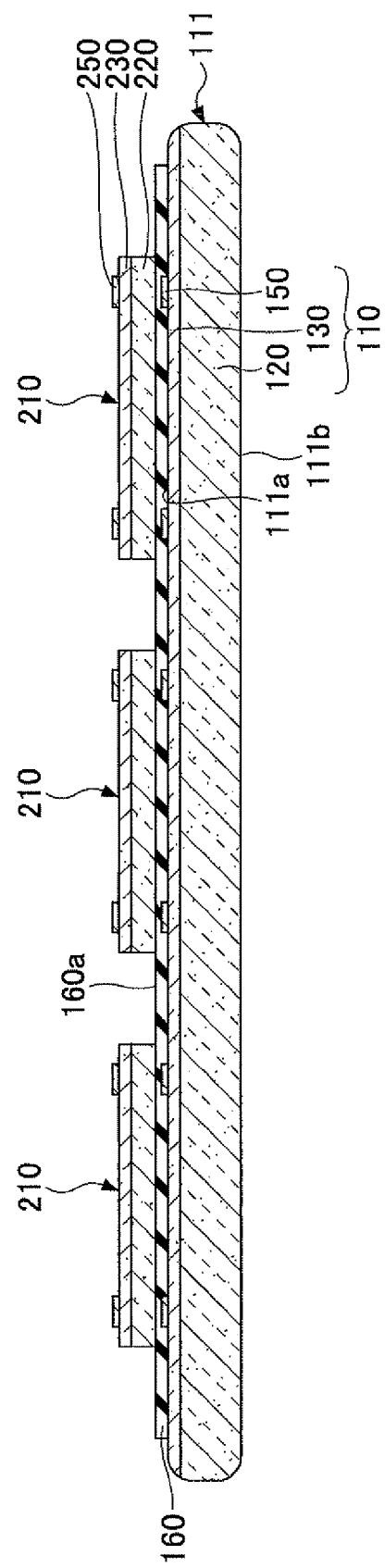
FIG. 16B illustrates a second process of the manufacturing process flow of the semiconductor device according to the first modification of the seventh embodiment of the present invention.

Next in a process shown in FIG. 16B, the semiconductor substrate 111 having the resin layer 160 formed on its main surface 111a side is prepared, in the same manner as in the process of FIG. 15F. Then, the semiconductor chips 210 are bonded to the main surface 111a of the semiconductor substrate 111 via the resin layer 160. Specifically, first, the semiconductor chips 210 are aligned in the same manner as in the process of FIG. 15G so that the back surface of each semiconductor chip 210 comes in contact with the resin layer 160 formed on the main surface 111a of the semiconductor substrate 111. Next in the same manner as in the process of FIG. 15G, heat and pressure are applied so that the back surfaces of the semiconductor chips 210 and the surface 160a of the resin layer 160 are press-bonded to each other. Herewith, the resin layer 160 becomes hardened, and the semiconductor chips 210 are bonded to the main surface 111a side of the semiconductor substrate 111.

Figure 16C:
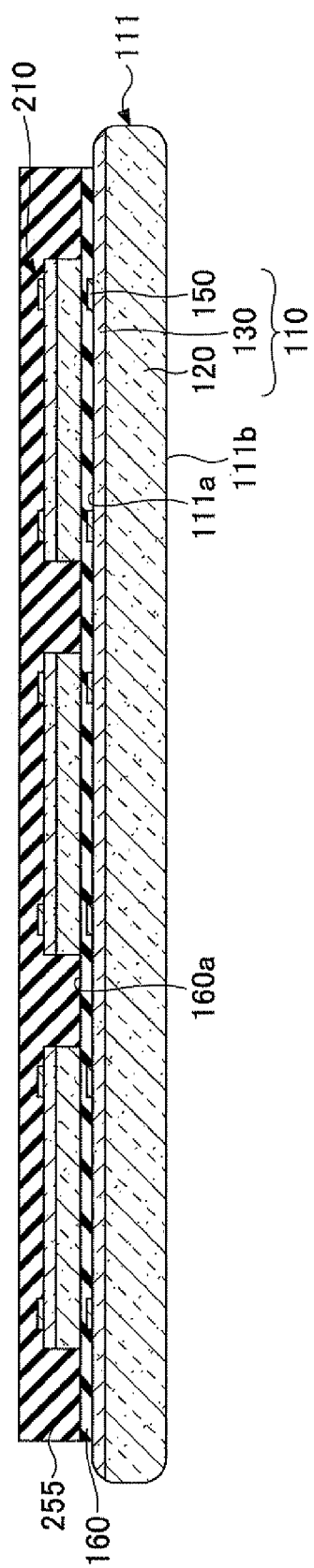
FIG. 16C illustrates a third process of the manufacturing process flow of the semiconductor device according to the first modification of the seventh embodiment of the present invention.

Next in a process shown in FIG. 16C, the resin layer 255 is formed on the surface 160a of the resin layer 160 in such a manner as to seal the main surface and lateral side of each semiconductor chip 210 in the same manner as in the process of FIG. 15D. Next in a process shown in FIG. 16D, the photosensitive resist film 270 is formed in such a manner as to cover the top surface of the resin layer 255. The resist film 270 is formed, for example, by applying a liquid resist to the top surface of the resin layer 255. The thickness of the resist film 270 is about 10 μm, for example.

Figure 16D:
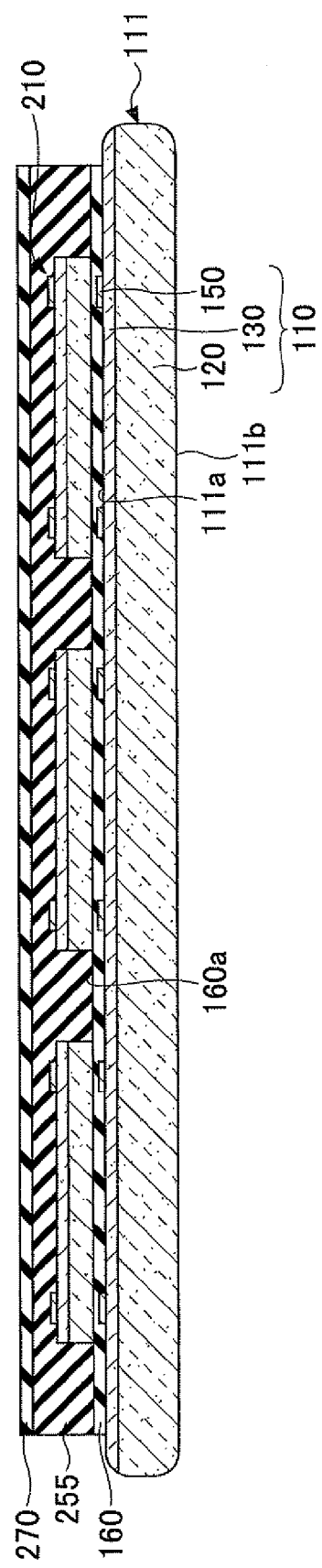
FIG. 16D illustrates a fourth process of the manufacturing process flow of the semiconductor device according to the first modification of the seventh embodiment of the present invention.
Figure 16E:
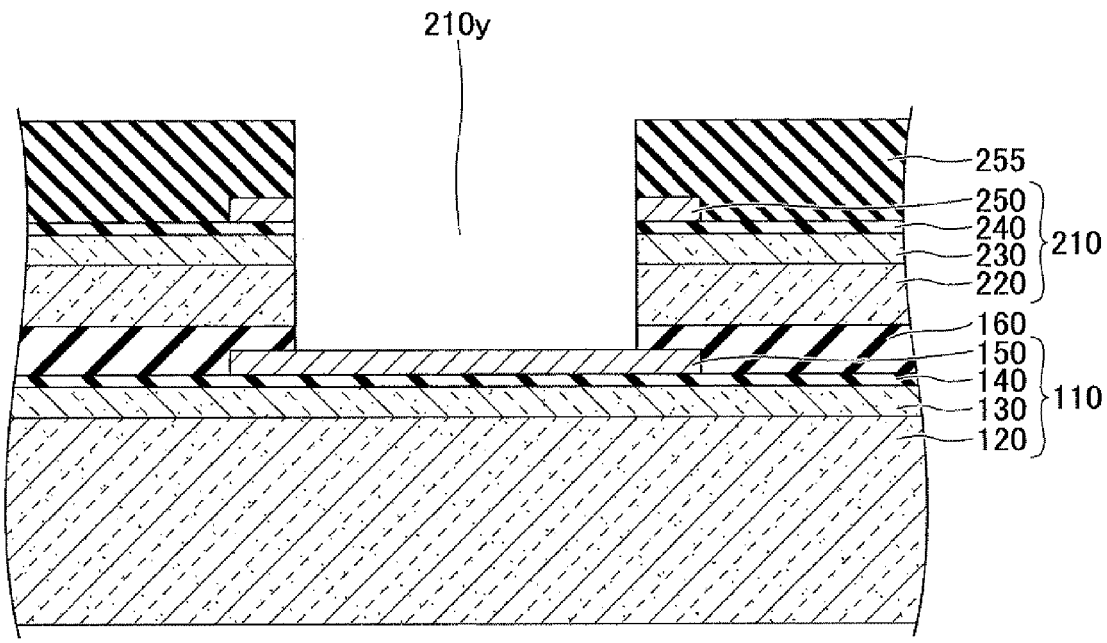
FIG. 16E illustrates a fifth process of the manufacturing process flow of the semiconductor device according to the first modification of the seventh embodiment of the present invention.

Next in a process shown in FIG. 16E, an opening is formed in the resist film 270 of FIG. 16D in the same manner as in the process of FIG. 15J, and the via hole 210y is formed in each semiconductor chip 210 in the same manner as in the process of FIG. 15K. Subsequently, the resist film 270 is removed in the same manner as in the process of FIG. 15L. Note that for convenience of explanation, FIGS. 16E to 16J show enlarged views of a part of the structure shown in FIG. 16D (i.e., the electrode pads 150 and 250 and their vicinity). The reference numerals 140 and 240 of FIG. 16E denote insulating layers provided on the semiconductor integrated circuits 130 and 230, respectively, which insulating layers are not shown in FIGS. 16A to 16D.

Figure 16F:
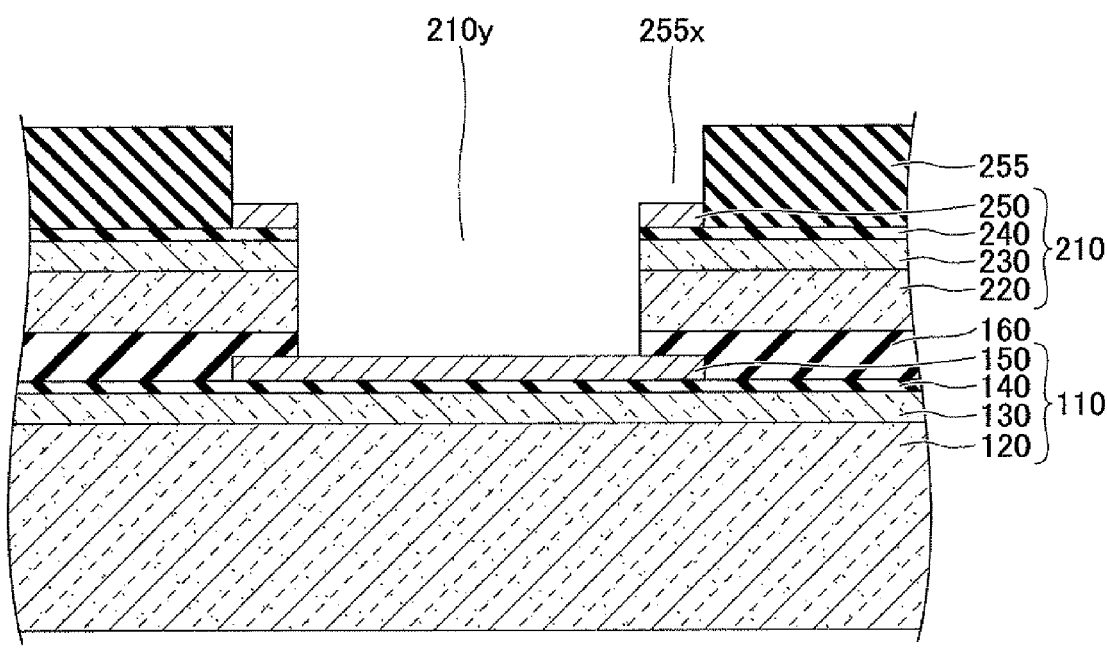
FIG. 16F illustrates a sixth process of the manufacturing process flow of the semiconductor device according to the first modification of the seventh embodiment of the present invention.
Figure 16G:
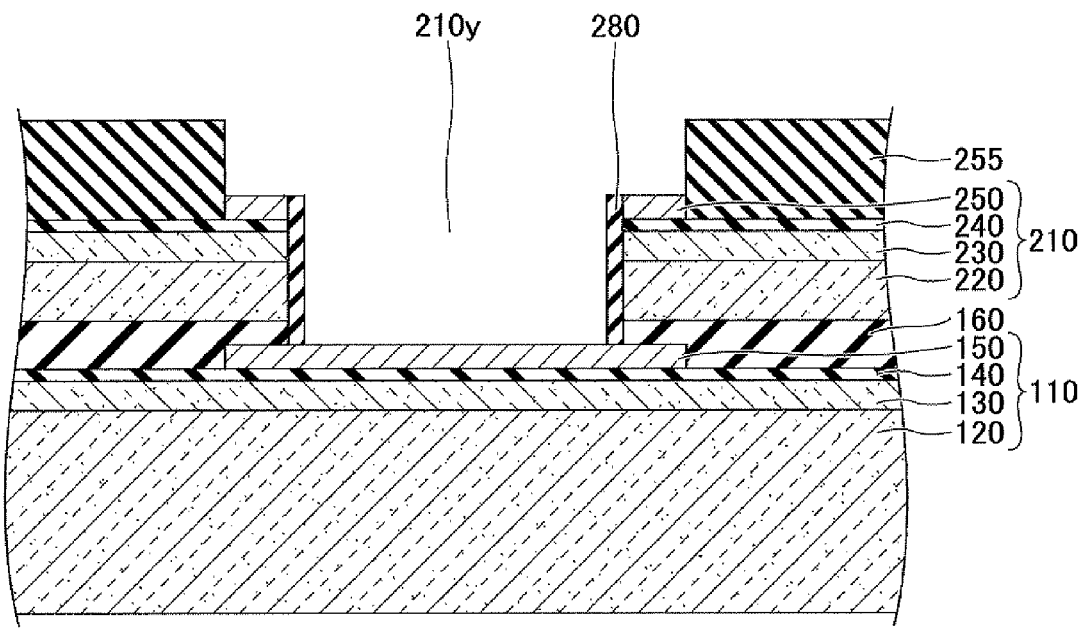
FIG. 16G illustrates a seventh process of the manufacturing process flow of the semiconductor device according to the first modification of the seventh embodiment of the present invention.
Figure 16H:
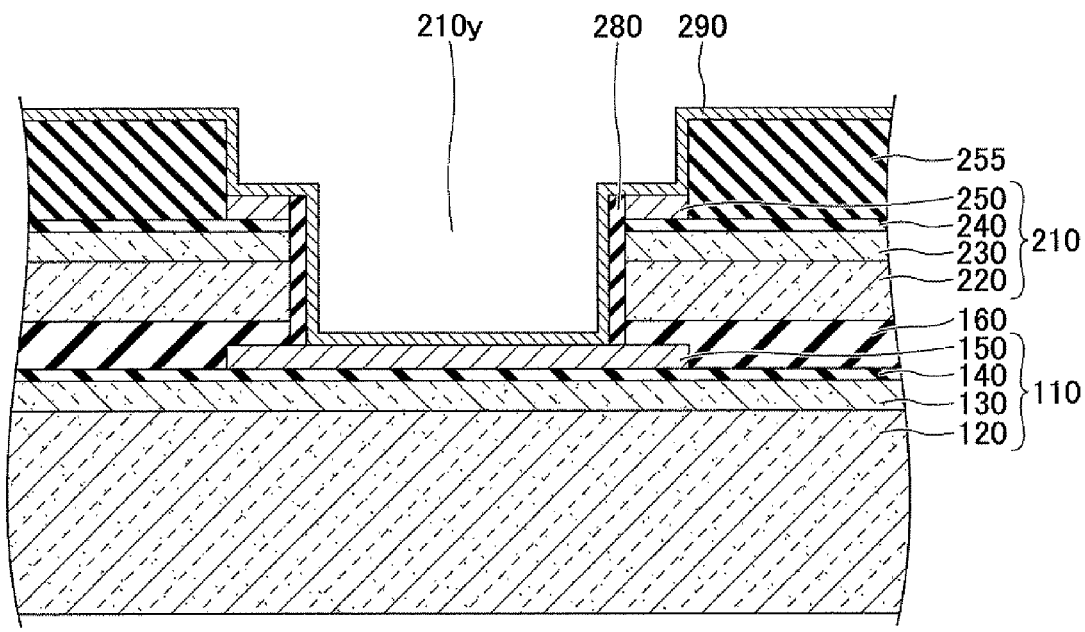
FIG. 16H illustrates an eighth process of the manufacturing process flow of the semiconductor device according to the first modification of the seventh embodiment of the present invention.

Next in a process shown in FIG. 16F, a resist film (not shown) is formed on the resin layer 255 of FIG. 16E. Then, an opening (not shown) is formed in the resist film, and a part of the resin layer 255 exposed inside the opening of the resist film to thereby form an opening 255x. Subsequently, the resist film is removed. With this process, the electrode pad 250 is exposed inside the opening 255x. Next in a process shown in FIG. 16G, the insulating layer 280 is formed in the same manner as in the process of FIG. 15M, and then the insulating layer 280 is removed, except for that formed on the wall surface of the via hole 210y in the same manner as in the process of FIG. 15M. Next in a process shown in FIG. 16H, the metal layer 290 is formed in the same manner as in the process of FIG. 15O.

Figure 16I:
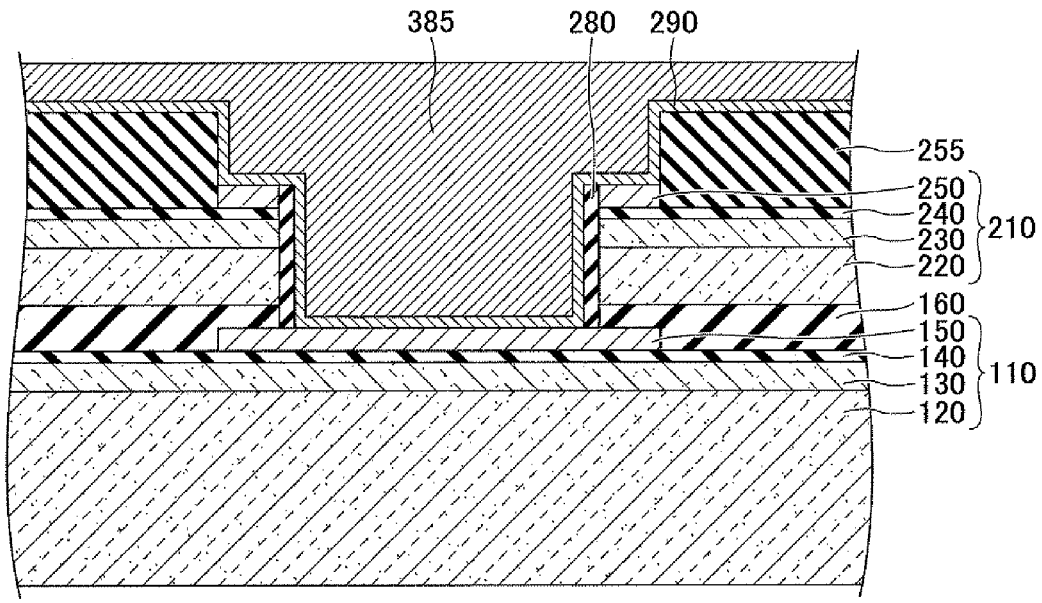
FIG. 16I illustrates a ninth process of the manufacturing process flow of the semiconductor device according to the first modification of the seventh embodiment of the present invention.

Next in a process shown in FIG. 16I, a metal layer 385 is formed on the metal layer 290. The metal layer 385 is formed, for example, by growing a plating film by precipitation with use of electrolytic plating, in which the metal layer 290 is used as a feeder layer. The plating film forming the metal layer 380 is, for example, a Cu plating film. Next in a process shown in FIG. 16J, the metal layers 290 and 385 formed on the resin layer 255 are removed. The metal layers 290 and 385 may be removed by, for example, CMP. The surface of the resin layer and the surfaces of the metal layers 290 and 385 are substantially flush with each other.

Figure 16J:
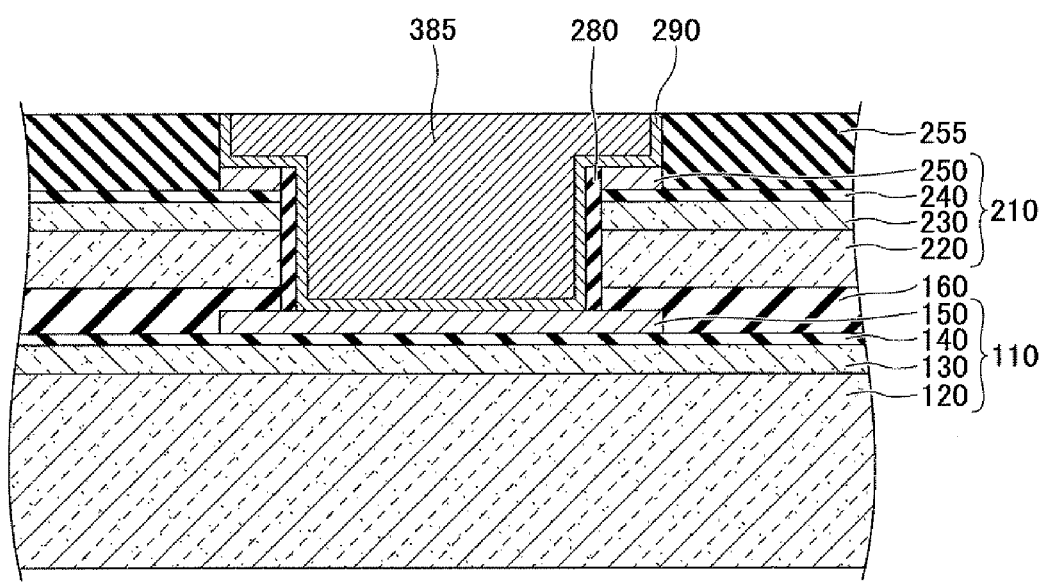
FIG. 16J illustrates a tenth process of the manufacturing process flow of the semiconductor device according to the first modification of the seventh embodiment of the present invention.

Next, after a resin layer is formed on the structure of FIG. 16J, the processes of FIGS. 16A to 16J are repeated to thereby dispose the semiconductor chips 310 and 410 one above the other. Then, after the external connection terminals 910 are formed by a well-recognized method in the same manner as in the process of FIG. 15W, the thus formed structure is cut into individual pieces using a dicing blade or the like to thereby manufacture a semiconductor device corresponding to FIG.

1. Note that the processes of FIGS. 16E to 16J are replaced by the processes of FIGS. 15J to 15U.

Thus, according to the first modification of the seventh embodiment, the same effect as in the seventh embodiment can be achieved; however, the following effect is also obtained. That is, plural semiconductor chips whose thicknesses are reduced in advance are mounted on a semiconductor substrate, and the main surface and the lateral side of each semiconductor chip are sealed by a resin layer. This eliminates the need for a support, and it is therefore possible to simplify the manufacturing process.

Second Modification of Seventh Embodiment

A second modification of the seventh embodiment describes an example in which plural semiconductor chips whose thicknesses are reduced in advance are mounted on a semiconductor substrate without using a support, and on the semiconductor substrate, the lateral side of each semiconductor chip is sealed by a resin layer using a method different from that described in the first modification of the seventh embodiment. Note that in the second modification of the seventh embodiment, the explanations of components which are common to those of the seventh embodiment described above are omitted.

FIGS. 17A to 17D illustrate processes of a manufacturing process flow of a semiconductor device according to the second modification of the seventh embodiment.

Figure 17A:
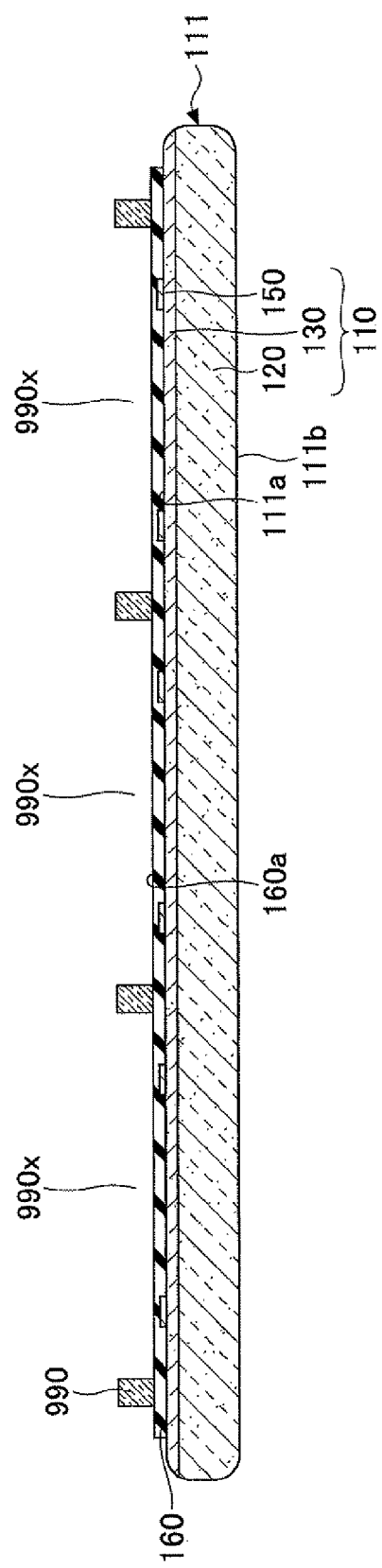
FIG. 17A illustrates a first process of a manufacturing process flow of a semiconductor device according to a second modification of the seventh embodiment of the present invention.

First in a process shown in FIG. 17A, the semiconductor substrate 111 having the resin layer 160 formed on its main surface 111a side is prepared in the same manner as in the process of FIG. 15F. Then, a frame member 990 is bonded to the main surface 111a of the semiconductor substrate 111 via the resin layer 160. The frame member 990 is formed, using a member having a circular planar shape, in such a manner as to, for example, have plural openings 990x large enough to allow the semiconductor chips 210 to be inserted. The frame member 990 has a thickness nearly equal to that of each semiconductor chip 210. The frame member 990 may be made of silicon or glass, for example.

Figure 17B:
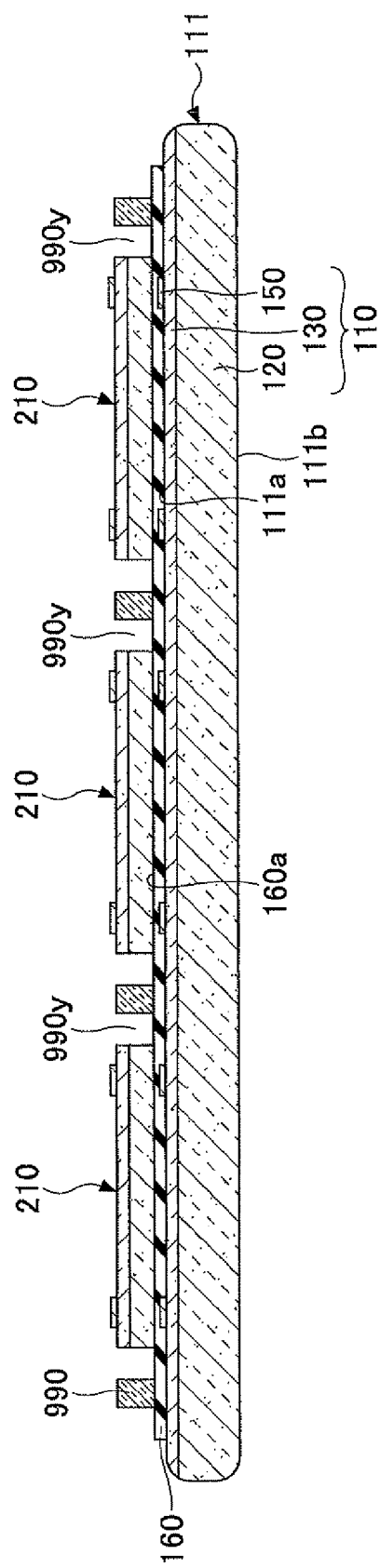
FIG. 17B illustrates a second process of the manufacturing process flow of the semiconductor device according to the second modification of the seventh embodiment of the present invention.

After a process similar to that of FIG. 16A is performed, in a process shown in FIG. 17B, the semiconductor chips 210 are bonded to the main surface 111a of the semiconductor substrate 111 via the resin layer 160 in such a manner as to respectively fit into a different one of the openings 990x of the frame member 990, which is bonded to the main surface 111a of the semiconductor substrate 111. Specifically, first, the semiconductor chips 210 are aligned in the same manner as in the process of FIG. 15G so that the back surface of each semiconductor chip 210 comes in contact with the resin layer 160 formed on the main surface 111a of the semiconductor substrate 111. Next in the same manner as in the process of FIG. 15G, heat and pressure are applied so that the back surfaces of the semiconductor chips 210 and the surface 160a of the resin layer 160 are press-bonded to each other. Herewith, the resin layer 160 becomes hardened, and the semiconductor chips 210 are bonded to the main surface 111a side of the semiconductor substrate 111. In addition, a gap 990y having a frame-like planar shape is formed between the lateral side of each semiconductor chip 210 and the opening 990x of each frame member 990.

Figure 17C:
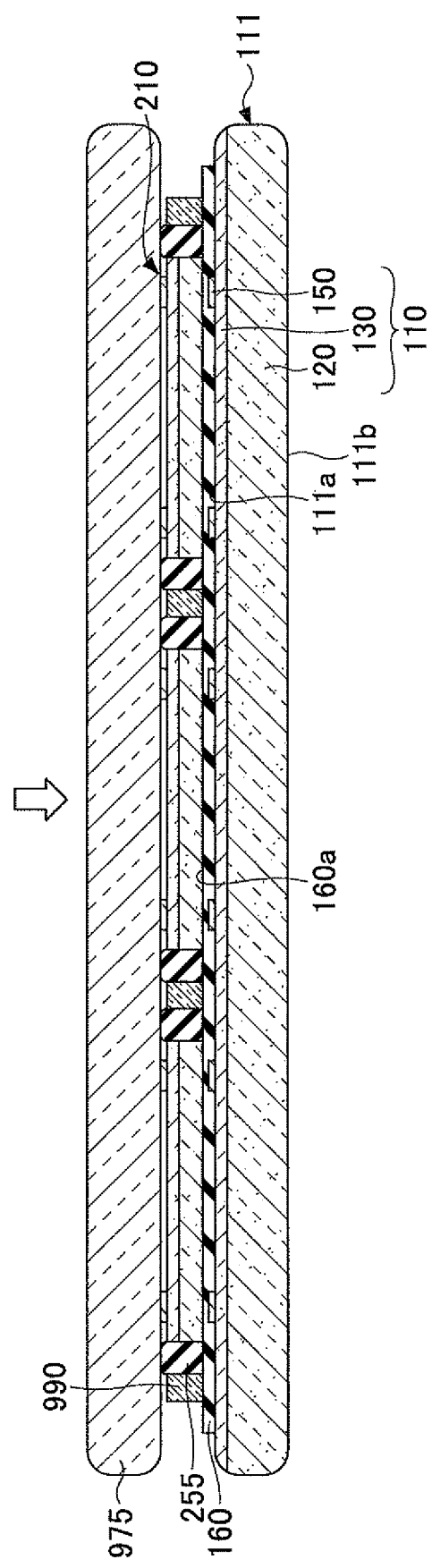
FIG. 17C illustrates a third process of the manufacturing process flow of the semiconductor device according to the second modification of the seventh embodiment of the present invention.

Next in a process shown in FIG. 17C, the resin layers 255 are formed on the surface 160a of the resin layer 160 so as to seal the lateral sides of each semiconductor chip 210. Specifically, a resin to form the resin layers 225 is supplied in the gaps 990y using a dispenser, for example. Then, while being pressed by a pressing member 975 made of, for example, glass toward the semiconductor substrate 111 side, the supplied resin is heated at a predetermined temperature to be hardened. Subsequently, the pressing member 975 is removed.

Note that it may be considered to, without the frame member 990, apply the resin to a gap formed between the lateral sides of two adjacent semiconductor chips 210 using a dispenser or the like; however, the resin applied to the outer edge of the resin layer 160 may droop down and therefore the resin layers may not be formed in a desired shape. Accordingly, it is preferable to use the frame member 990. Note however that a ring-like frame member which is disposed only at the outer edge of the surface 160a of the resin layer 160 may be used, instead of the frame member 990 having the openings 990x. That is, a ring-like frame member for surrounding all the semiconductor chips 210 may be used.

Figure 17D:
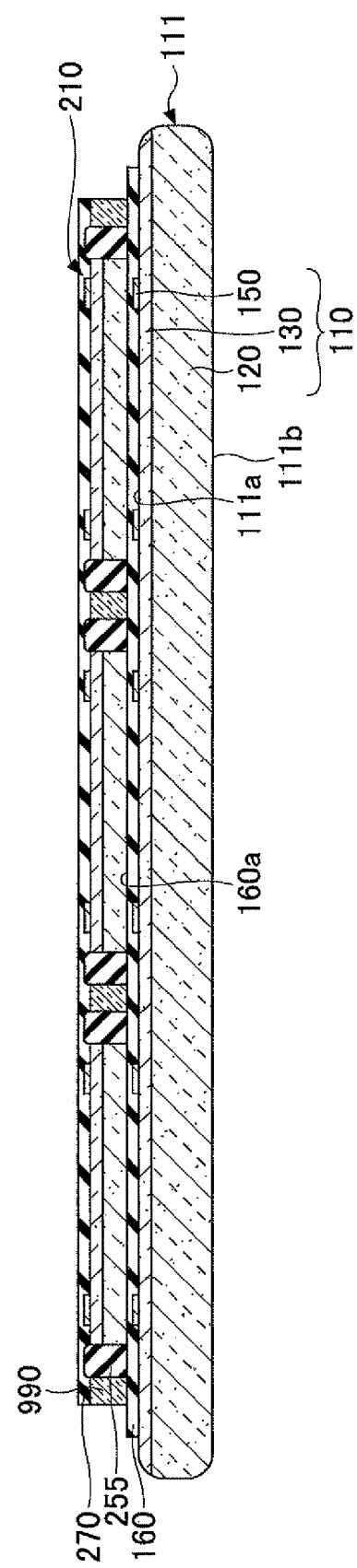
FIG. 17D illustrates a fourth process of the manufacturing process flow of the semiconductor device according to the second modification of the seventh embodiment of the present invention.

Next in a process shown in FIG. 17D, the photosensitive resist film 270 is formed in such a manner as to cover the main surface of each semiconductor chip 210, the top surface of the resin layer 255 and the top surface of the frame member 990. The resist film 270 is formed, for example, by applying a liquid resist to the main surface of each semiconductor chip 210, the top surface of the resin layer 255 and the top surface of the frame member 990. The thickness of the resist film 270 is about 10 μm, for example.

After processes similar to those of FIG. 16E to 16J are performed and a resin layer is then formed on the structure shown in FIG. 16J, the processes of FIGS. 16A to 16J are repeated to thereby dispose the semiconductor chips 310 and 410 one above the other. Then, after the external connection terminals 910 are formed by a well-recognized method in the same manner as in the process of FIG. 15W, the thus formed structure is cut into individual pieces using a dicing blade or the like to thereby manufacture a semiconductor device corresponding to FIG. 1. Note that the processes of FIGS. 16E to 16I are replaced by the processes of FIGS. 15J to 15U.

Thus, according to the second modification of the seventh embodiment, the same effect as in the seventh embodiment and the first modification of the seventh embodiment can be achieved.

Eighth Embodiment

The eighth embodiment describes an example in which electrodes of semiconductor chips disposed one above the other are electrically connected via connecting holes formed in resin layers. Note that in the eighth embodiment, the explanations of components which are common to those of the embodiment described above are omitted.

Configuration of Semiconductor Device According to Eighth Embodiment

First is described the configuration of a semiconductor device according to the eighth embodiment of the present invention. FIG. 18 is a cross-sectional view illustrating the semiconductor device according to the eighth embodiment of the present invention. With reference to FIG. 18, a semiconductor device 100A according to the eighth embodiment has the same configuration as that of the semiconductor device 100 (see FIG. 14) according to the seventh embodiment of the present invention, except that the via holes 210y, which are connecting holes, are formed in such a manner as to penetrate the resin layers 255, and the electrode pads 250 of the semiconductor chip 210 and wirings 155 of the semiconductor chip 110 are electrically connected to each other via the metal layers 380 formed inside the via holes 210y and on the resin layer 255. The wirings 155 are made of Cu, for example, and electrically connected to the electrode pads 150.

Processes for Manufacturing Semiconductor Device According to Eighth Embodiment

Next is described a manufacturing process flow of the semiconductor device according to the eighth embodiment of the present invention. FIGS. 19A to 19G illustrate the manufacturing process flow of the semiconductor device according to the eighth embodiment of the present invention.

First, after processes similar to those of FIGS. 15A to 15E according to the seventh embodiment are performed, in a process shown in FIG. 19A, the semiconductor substrate 111 is prepared in the same manner as in the process of FIG. 15F, and the resin layer 160 is formed on the main surface 111a side of the semiconductor substrate 111. Note that the FIG. 19A is different from FIG. 15F in that the wirings 155 are shown. The wirings 155 are made of Cu, for example, and electrically connected to the electrode pads 150.

Figure 19B:
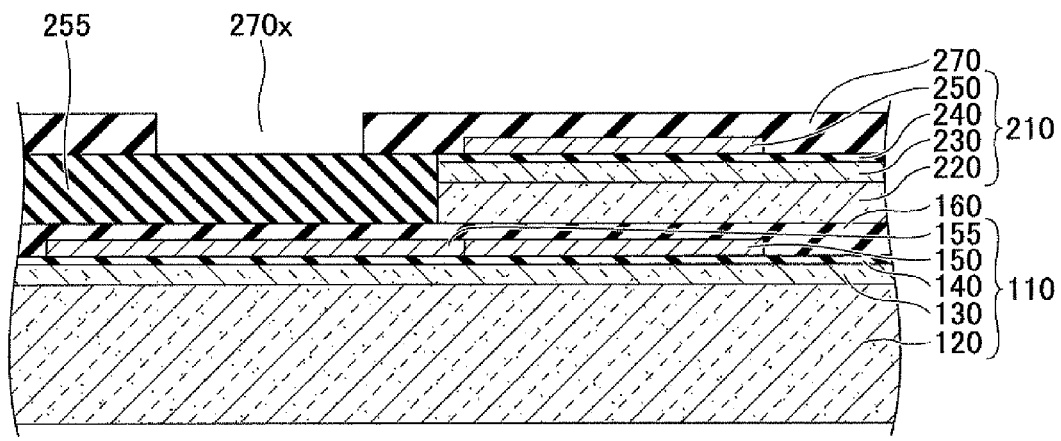
FIG. 19B illustrates a second process of the manufacturing process flow of the semiconductor device according to the eighth embodiment of the present invention.

Next, after processes similar to those of FIGS. 15G to 15I according to the seventh embodiment are performed, in a process shown in FIG. 19B, the resist film 270 of FIG. 15I is exposed via a predetermined mask, and the exposed resist film 270 is subsequently developed, thereby forming an opening 270x in the resist film 270. Note that in the process of FIG. 15J, the opening 270x is formed on the electrode pad 250; however, in this process, the opening 270x is formed on the wiring 155 of the semiconductor substrate 111. Note that for convenience of explanation, FIGS. 19B to 19G show enlarged views of a part of the structure shown in FIG. 19A (i.e., the electrode pads 150 and 250 and the wiring 155 and their vicinity).

Figure 19C:
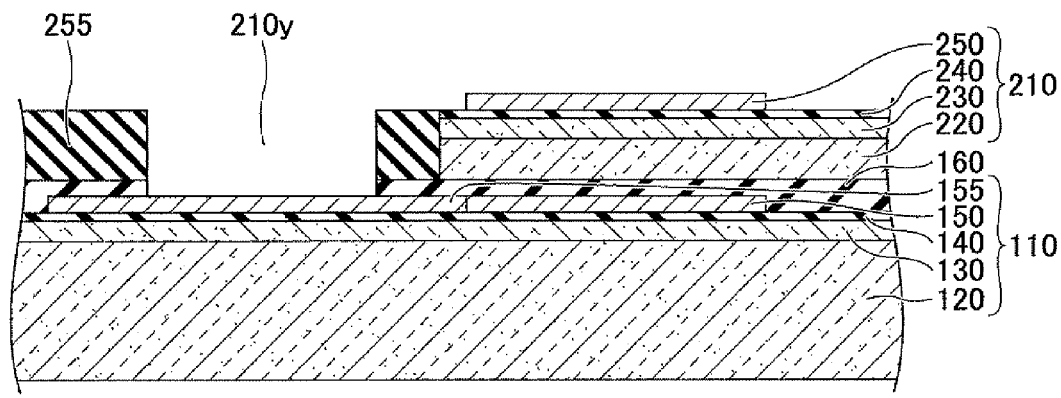
FIG. 19C illustrates a third process of the manufacturing process flow of the semiconductor device according to the eighth embodiment of the present invention.
Figure 19D:
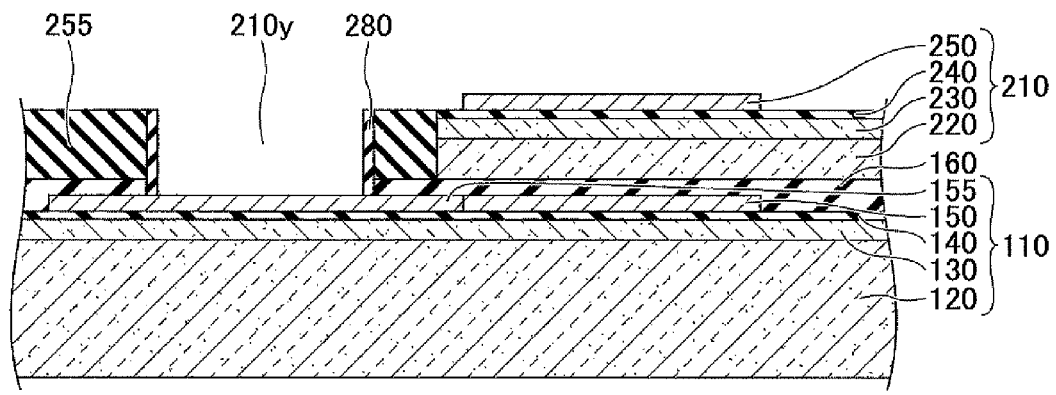
FIG. 19D illustrates a fourth process of the manufacturing process flow of the semiconductor device according to the eighth embodiment of the present invention.

Next in a process shown in FIG. 19C, the via hole 210y is formed in each semiconductor chip 210 in the same manner as in the process of FIG. 15K. Note however that in this process, the via hole 210y is formed in such a manner as to expose the top surface of the wiring 155 of the semiconductor substrate 11. Subsequently, the resist film 270 shown in FIG. 19B is removed in the same manner as in the process of FIG. 15L. Next in a process shown in FIG. 19D, the insulating layer 280 is formed in the same manner as in the process of FIG. 15L, and then, the insulating layer 280 is removed, except for that formed on the wall surface of the via hole 210y, in the same manner as in the process of 15N.

Figure 19E:
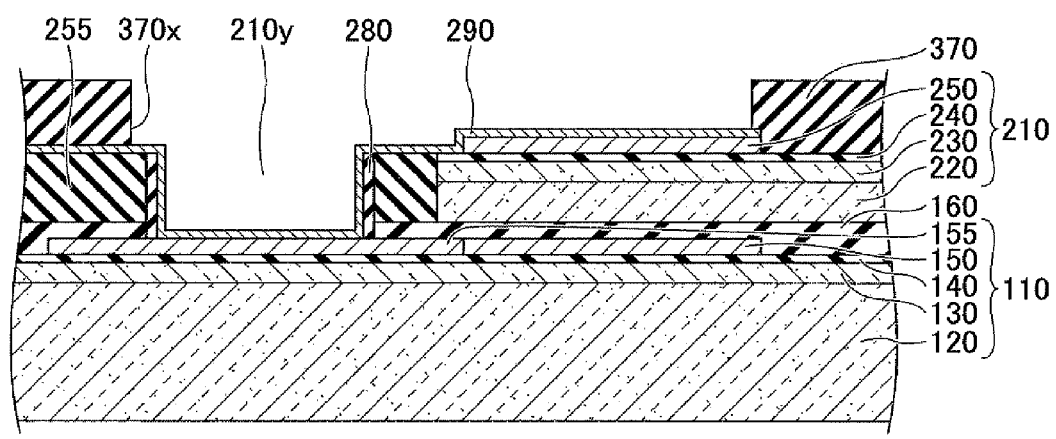
FIG. 19E illustrates a fifth process of the manufacturing process flow of the semiconductor device according to the eighth embodiment of the present invention.

Next in a process shown in FIG. 19E, the metal layer 290 is formed in the same manner as in the process of FIG. 15O. Then, the resist film 370 having the opening 370x which exposes the region including the via hole 210y and the electrode pad 250 is formed in the same manner as in the processes of FIGS. 15P and 15Q. Next in a process shown in FIG. 19F, the metal layer 380 is formed inside the via hole 210y and on a part of the opening 370x shown in FIG. 19E, in the same manner as in the process of FIG. 15R.

Figure 19F:
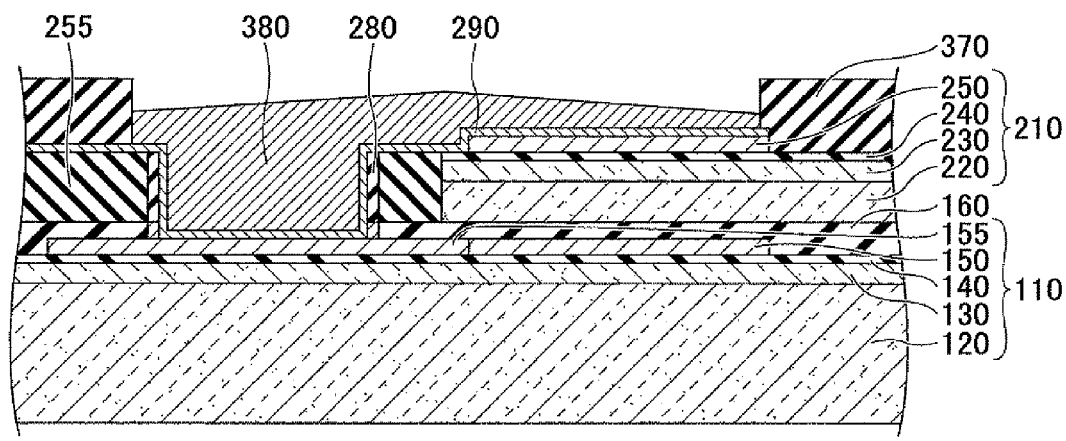
FIG. 19F illustrates a sixth process of the manufacturing process flow of the semiconductor device according to the eighth embodiment of the present invention.
Figure 19G:
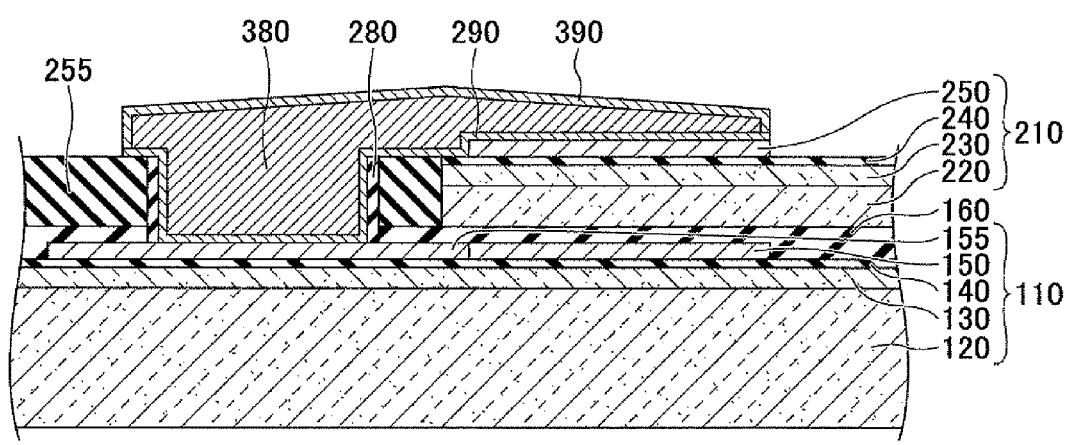
FIG. 19G illustrates a seventh process of the manufacturing process flow of the semiconductor device according to the eighth embodiment of the present invention.

Next in a process shown in FIG. 19G, after the resist film 370 of FIG. 19F is removed, a part of the metal layer 290 which is not covered by the metal layer 380 is removed in the same manner as in the process of FIG. 15T. Then, the metal layer 390 is formed in such a manner as to cover the metal layer 380 in the same manner as in the process of FIG. 15U. Next, after processes similar to those of FIGS. 15V to 15X are performed, the thus formed structure is cut into individual pieces at the cutting positions C using a dicing blade or the like to thereby manufacture the semiconductor device 100A of FIG. 18.

Figure 20:
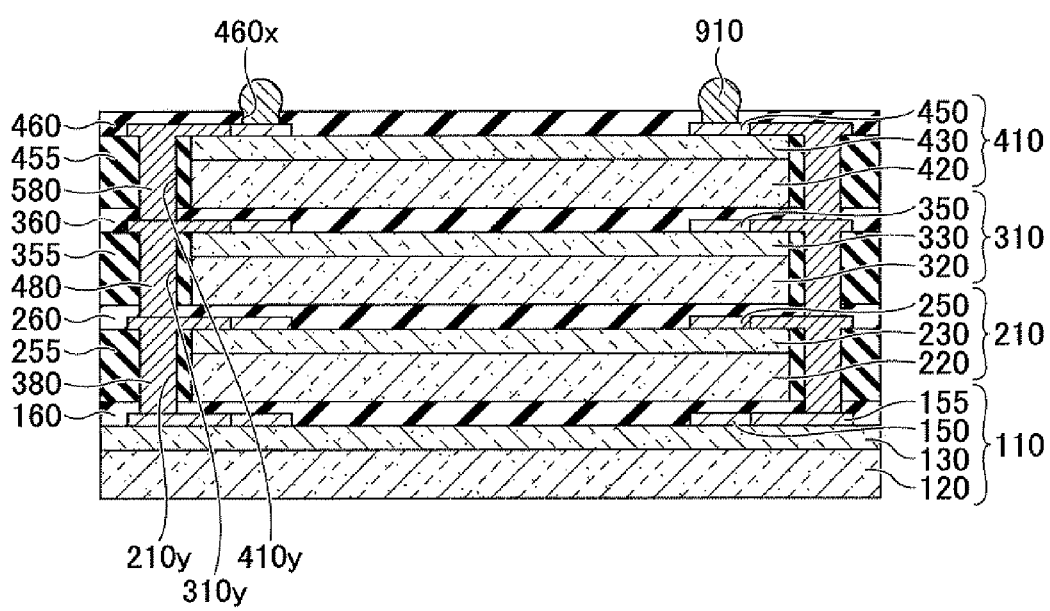
FIG. 20 is a second cross-sectional view illustrating the semiconductor device according to the eighth embodiment of the present invention.

Note that as a semiconductor device 100B shown in FIG. 20, electrical connections may be formed between the semiconductor chips 210 and 310 and between the semiconductor chips 310 and 410 via the via holes 310y and 410y formed in the resin layers 355 and 455, respectively, by performing processes similar to those of FIGS. 19B to 19G. In addition, a via hole penetrating a semiconductor chip and a via hole penetrating a resin layer may be provided together in a single layer.

According to the eighth embodiment of the present invention, the same effect as in the seventh embodiment can be achieved; however, the following effect is also obtained. That is, an electrical connection is formed between the electrodes of the semiconductor chips disposed one above the other via the via holes formed in the resin layer, and therefore, even when via holes cannot be provided in a semiconductor chip, it is possible to establish an electrical connection to an underlying semiconductor chip by bypassing the semiconductor chip. This results in an improvement in the flexibility of the wiring design.

Ninth Embodiment

Configuration of Semiconductor Device According to Ninth Embodiment

Figure 21:
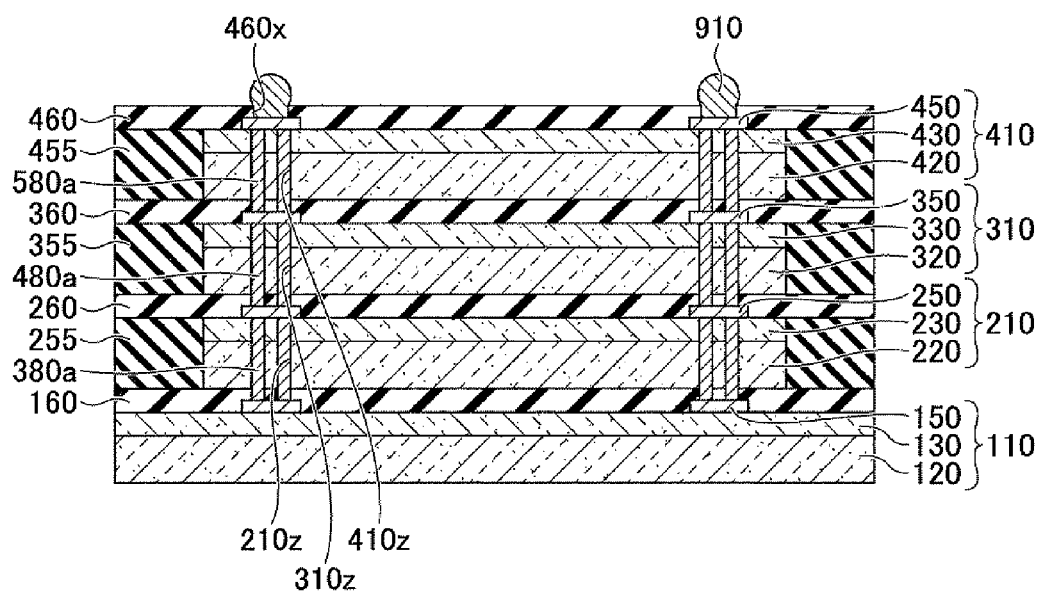
FIG. 21 is a cross-sectional view illustrating a semiconductor device according to a ninth embodiment of the present invention.

First is described the configuration of a semiconductor device according to a ninth embodiment of the present invention. FIG. 21 is a cross-sectional view illustrating the semiconductor device according to the ninth embodiment of the present invention. A semiconductor device 100C according to the ninth embodiment has the same configuration as that of the semiconductor device 100 (see FIG. 14) according to the seventh embodiment of the present invention, except that the number of via holes and metal layers connecting metal pads of vertically adjacent semiconductor chips is four, instead of one in the seventh embodiment.

In FIG. 21, the reference numerals 210z to 410z denote via holes, and the reference numerals 380a to 580a denote metal layers formed in the via holes 210z to 410z. Four via holes and four metal layers are provided for each metal pad in each semiconductor chip.

Thus, by providing plural via holes and metal layers for each metal pad, it is possible to improve the reliability of the connection between metal pads. In addition, if a metal pad is not provided for a semiconductor chip disposed immediately below, via holes and metal layers can be provided for a semiconductor chip at one or more layers below. In this system, the same electrical signal or a different electrical signal can be connected to a desired semiconductor chip. In addition, since each via hole has a smaller diameter, it is possible to reduce the time required for the process of providing the via holes and metal layers. Note that the number of via holes and metal layers provided for each metal pad may be two, three, five or more.

Processes for Manufacturing Semiconductor Device According to Ninth Embodiment

Next is described a manufacturing process flow of the semiconductor device according to the ninth embodiment of the present invention. FIGS. 22A to 22F illustrate the manufacturing process flow of the semiconductor device according to the ninth embodiment of the present invention. Note that in the ninth embodiment, the explanations of manufacturing processes similar to those of the seventh embodiment described above are omitted.

Figure 22A:
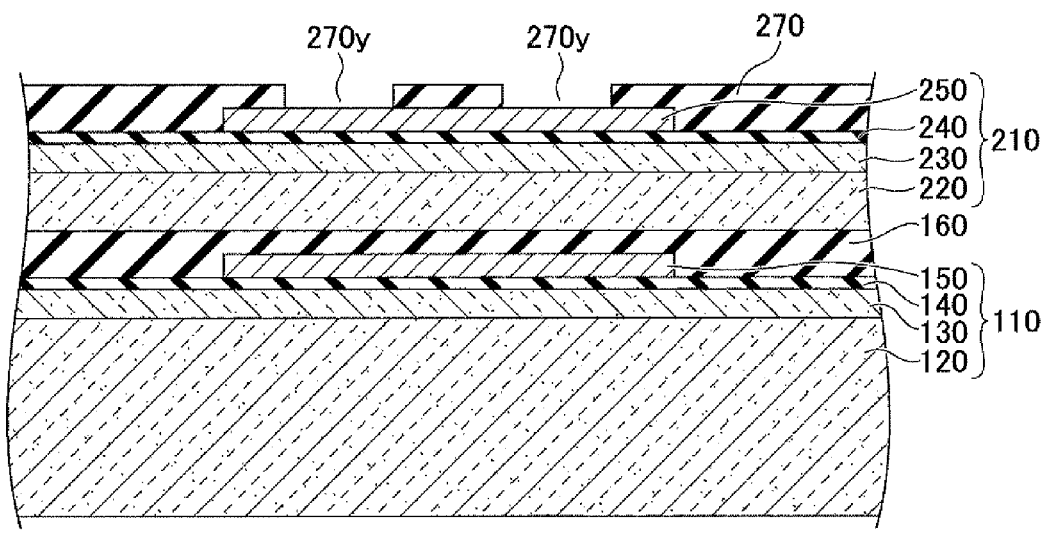
FIG. 22A illustrates a first process of a manufacturing process flow of the semiconductor device according to the ninth embodiment of the present invention.
Figure 22B:
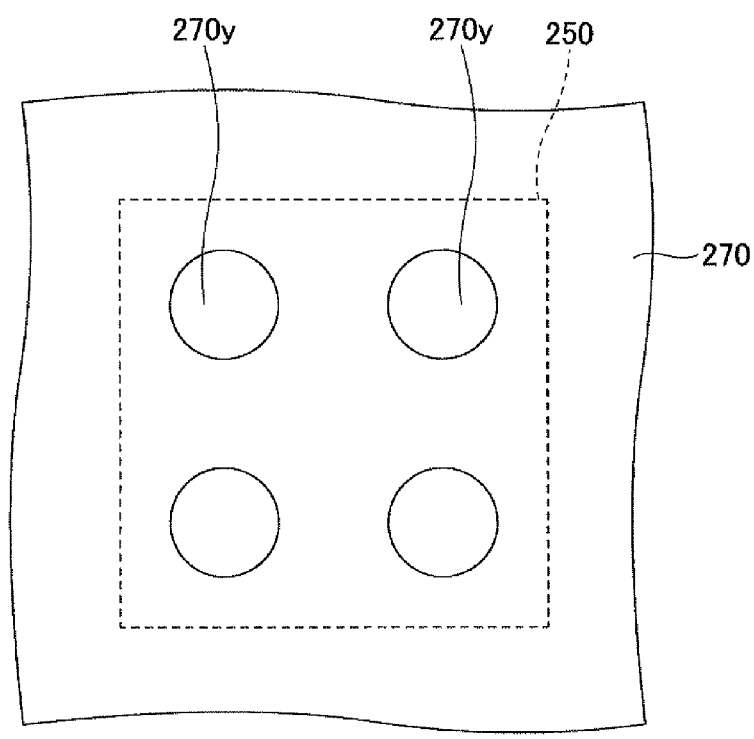
FIG. 22B illustrates a second process of the manufacturing process flow of the semiconductor device according to the ninth embodiment of the present invention.

First, processes the same as those of FIGS. 15A to 15I are performed. Next in a process shown in FIGS. 22A and 22B, the resist film 270 of FIG. 15I is exposed via a predetermined mask, and the exposed resist film 270 is subsequently developed, thereby forming openings 270y in the resist film 270. FIG. 22A is a cross-sectional view, and FIG. 22B is a plan view. Note that for convenience of explanation, FIGS. 22A to 22F show enlarged views of a part of the structure shown in FIG. 15I (i.e., the electrode pads 150 and 250 and their vicinity).

Figure 22C:
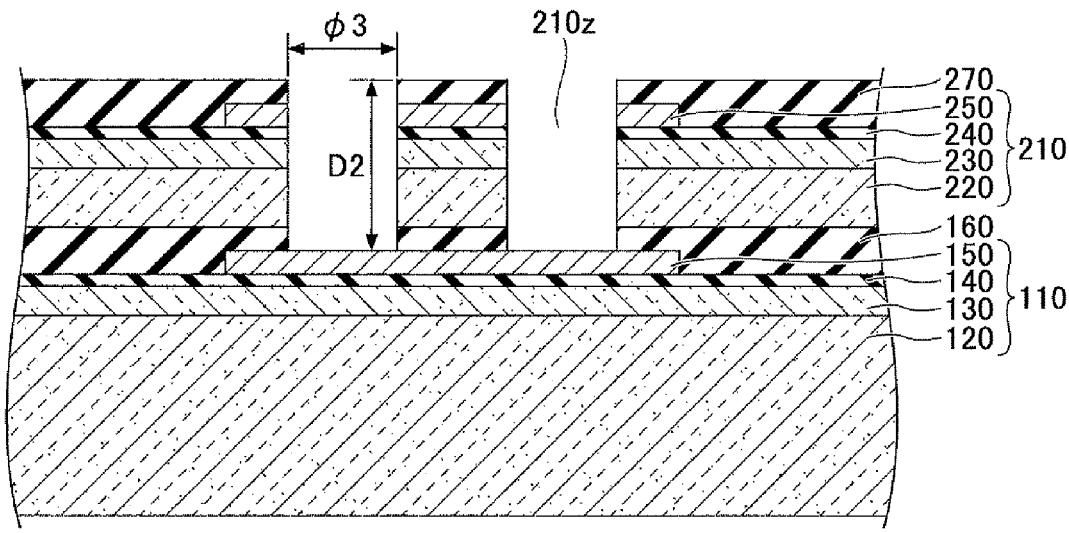
FIG. 22C illustrates a third process of the manufacturing process flow of the semiconductor device according to the ninth embodiment of the present invention.

Next in a process shown in FIG. 22C, the via holes 210z are formed in the semiconductor chip 210. The via holes 210z are formed in such a manner to penetrate the resin layer 160 and parts of the semiconductor chip 210 (the substrate body 220, the semiconductor integrated circuit 230, the insulating layer 240○ and the electrode pad 250○) corresponding to the openings 270y so that the electrode pad 150 of the semiconductor chip 110 is exposed. The via holes 210z are formed by, for example, dry etching. Each of the via holes 210z has, for example, a circular shape in a planar view, and has a diameter φ3 of, for example, 1 μm to 10 μm. Note however that the diameter φ3 of each of the via holes 210z is preferably set to a value which allows the via hole 210z to have an aspect ratio (=depth D2/diameter φ3) between 0.5 and 5 inclusive. This is because by setting the diameter φ3 of the via hole 210z to a value which allows the via hole 210z to have an aspect ratio (=depth D2/diameter φ3) between 0.5 and 5 inclusive, it is possible to achieve, for example, an improvement in the etching speed (throughput) for forming the via hole 210z and an improvement of the ease of forming the metal layer 380a in the via hole 210z.

Figure 22D:
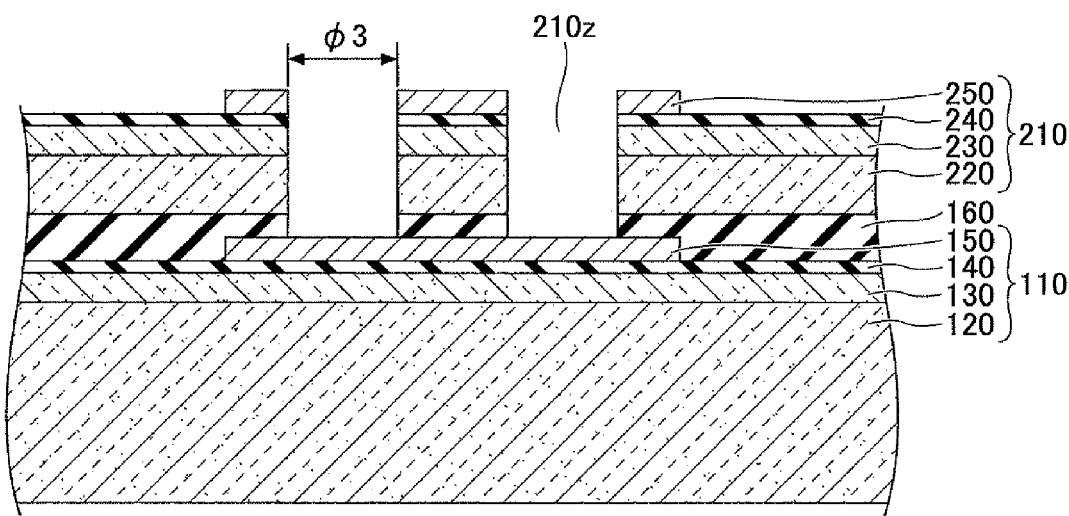
FIG. 22D illustrates a fourth process of the manufacturing process flow of the semiconductor device according to the ninth embodiment of the present invention.
Figure 22E:
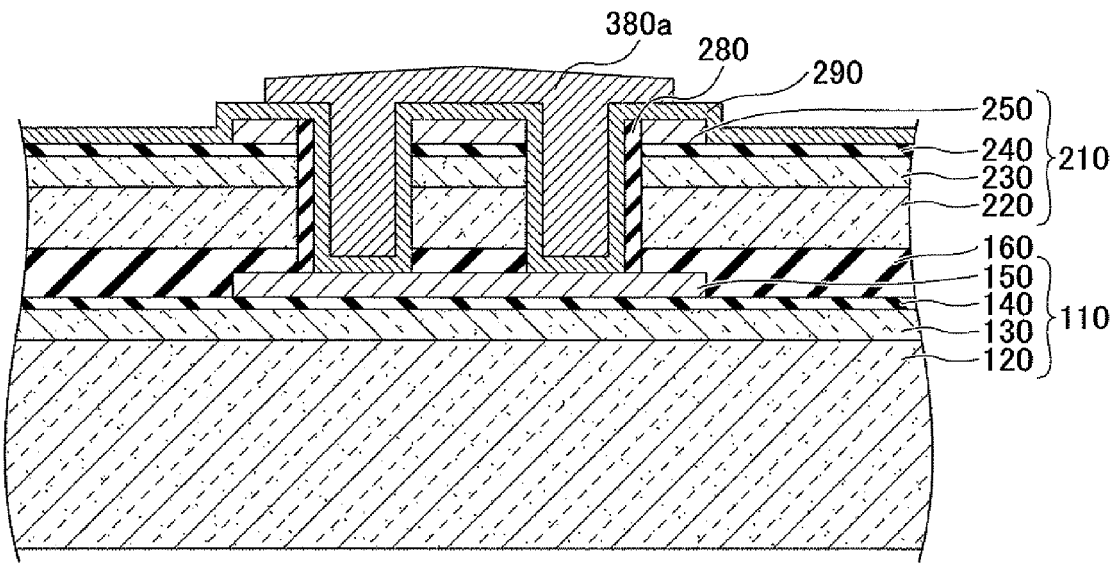
FIG. 22E illustrates a fifth process of the manufacturing process flow of the semiconductor device according to the ninth embodiment of the present invention.
Figure 22F:
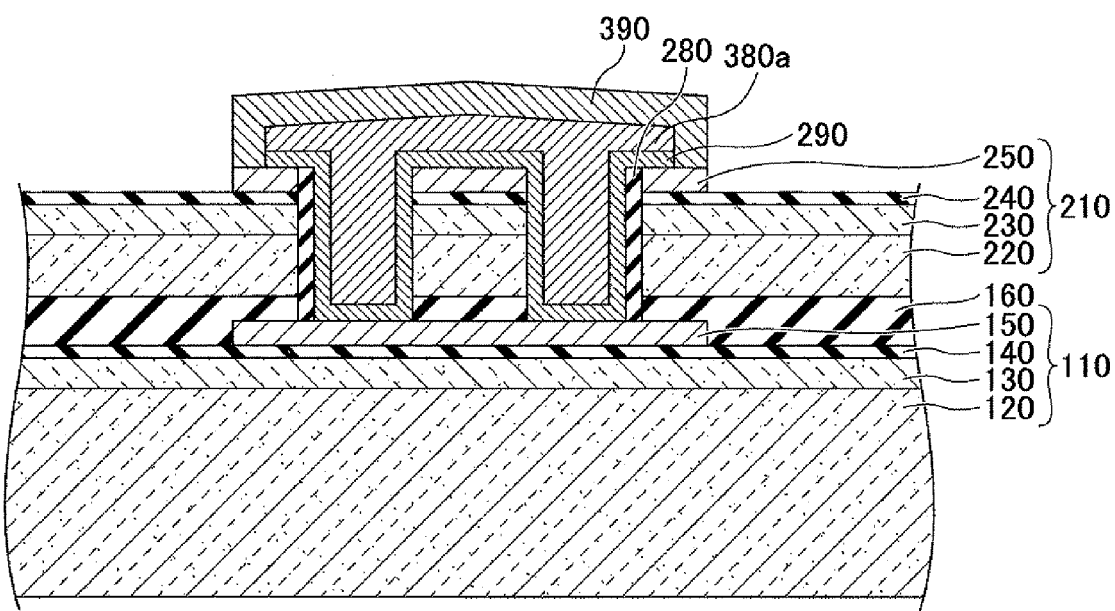
FIG. 22F illustrates a sixth process of the manufacturing process flow of the semiconductor device according to the ninth embodiment of the present invention.

Next in a process shown in FIG. 22D, the resist film 270 of FIG. 22C is removed. Then, processes the same as those of FIGS. 15M to 15S are performed, to thereby form the metal layers 380a in the via holes 210z as shown in FIG. 22E. Next, a part of the metal layer 290 which is not covered by the metal layers 380a is removed by, for example, wet etching, and then the metal layer 390 is formed in such a manner as to cover the electrode pad 250 and the metal layers 380a, as shown in FIG. 22F. The metal layer 390 is formed, for example, by forming, on the insulating layer 240, a resist film having an opening for the electrode pad 250 and the metal layers 380a. Subsequently, with use of electrolytic plating, in which the electrode pad 250 and the metal layers 380a are used as feeder layers, a plating film is grown by precipitation in such a manner as to fill the opening, and the resist film is then removed to thereby form the metal layer 390.

Subsequently, by repeating processes the same as those of the seventh embodiment, the semiconductor device 100C of FIG. 21 is manufactured.

According to the ninth embodiment of the present invention, the same effect as in the seventh embodiment can be achieved; however, the following effect is also obtained. That is, since each via hole has a smaller diameter, it is possible to reduce the time required for the process of providing the via holes and metal layers. Also, by providing plural via holes and metal layers for each metal pad, it is possible to improve the reliability of the connection between metal pads.

Tenth Embodiment

Configuration of Semiconductor Device According to Tenth Embodiment

Figure 23:
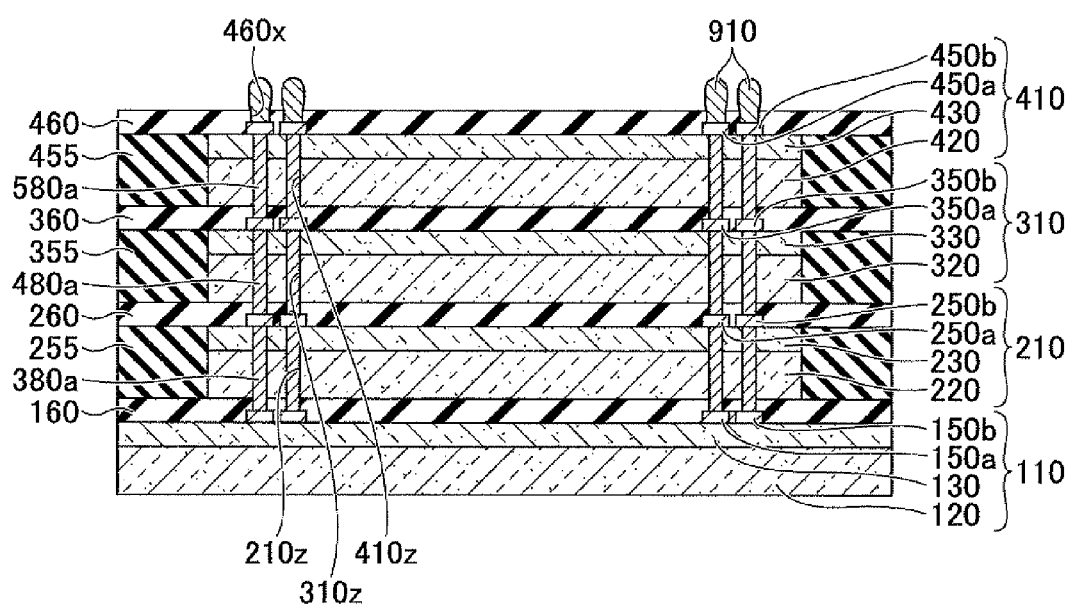
FIG. 23 is a cross-sectional view illustrating a semiconductor device according to a tenth embodiment of the present invention.

First is described the configuration of a semiconductor device according to a tenth embodiment of the present invention. FIG. 23 is a cross-sectional view illustrating a semiconductor device according to the tenth embodiment of the present invention. A semiconductor device 100D according to the tenth embodiment of the present invention has the same configuration as that of the semiconductor device 10A according to the ninth embodiment of the present invention, except that one metal pad is provided for each via hole and metal layer, instead of providing one metal pad for four via holes and four metal layers in the semiconductor device 100C according to the ninth embodiment of the present invention.

In FIG. 23, the reference numerals 150a, 150b-450a and 450b denote metal pads. One metal pad is provided for each set of a via hole and metal layer.

Thus, by providing one metal pad for each set of a via hole and metal layer, it is possible to improve the reliability of the connection between metal pads, as in the case of the ninth embodiment, when the same signal is assigned to adjacent metal pads. In addition, in the case where different signals are respectively assigned to adjacent metal pads, it is possible to improve the flexibility of the wiring design.

Processes for Manufacturing Semiconductor Device According to Tenth Embodiment

Next is described a manufacturing process flow of the semiconductor device according to the tenth embodiment of the present invention. FIGS. 24A to 24F illustrate the manufacturing process flow of the semiconductor device according to the tenth embodiment of the present invention. Note that manufacturing processes similar to those of the semiconductor devices according to the seventh and eighth embodiments of the present invention may be omitted.

Figure 24A:
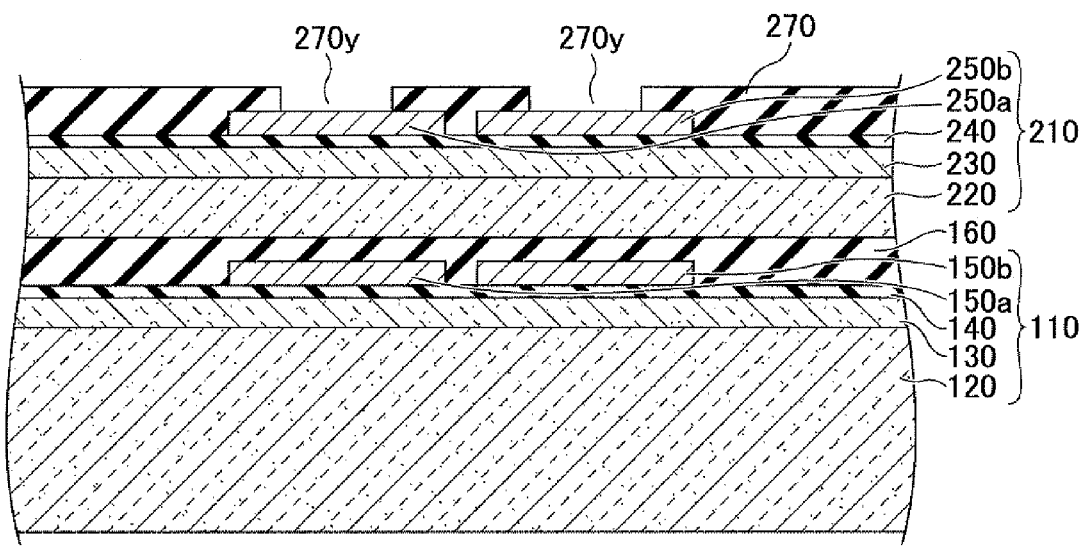
FIG. 24A illustrates a first process of a manufacturing process flow of the semiconductor device according to the tenth embodiment of the present invention.
Figure 24B:
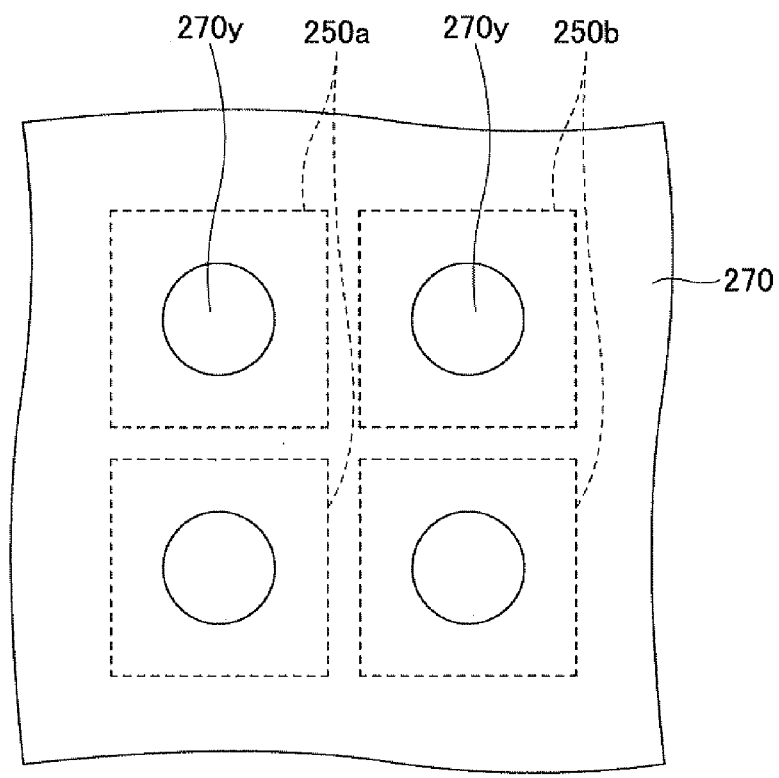
FIG. 24B illustrates a second process of the manufacturing process flow of the semiconductor device according to the tenth embodiment of the present invention.

First, processes the same as those of FIGS. 15A to 15I are performed. Next in a process shown in FIGS. 24A and 24B, the resist film 270 of FIG. 15I is exposed via a predetermined mask, and the exposed resist film 270 is subsequently developed, thereby forming openings 270y in the resist film 270. FIG. 24A is a cross-sectional view, and FIG. 24B is a plan view. Note that for convenience of explanation, FIGS. 24A to 24F show enlarged views of a part of the structure shown in FIG. 15I (i.e., the electrode pads 150 and 250 and their vicinity).

Figure 24C:
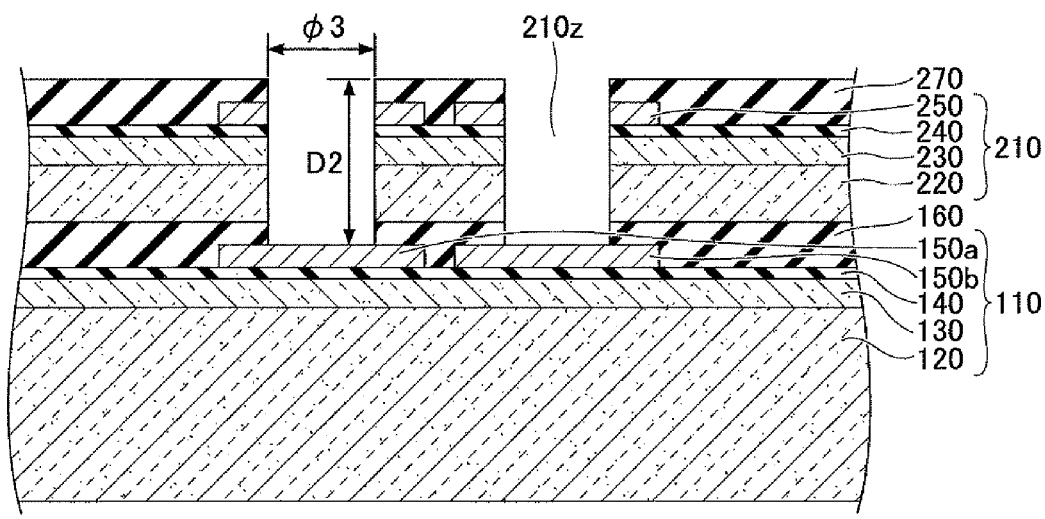
FIG. 24C illustrates a third process of the manufacturing process flow of the semiconductor device according to the tenth embodiment of the present invention.

Next in a process shown in FIG. 24C, the via holes 210z are formed in the semiconductor chip 210. The via holes 210z are formed in such a manner to penetrate the resin layer 160 and parts of the semiconductor chip 210 (the substrate body 220, the semiconductor integrated circuit 230, the insulating layer 240 and the electrode pad 250) corresponding to the openings 270y so that electrode pads 150a and 150b of the semiconductor chip 110 are exposed. The via holes 210z are formed by, for example, dry etching. Each of the via holes 210z has, for example, a circular shape in a planar view, and has the diameter φ3 of, for example, 1 μm to 10 μm. Note however that the diameter φ3 of each of the via holes 210z is preferably set to a value which allows the via hole 210z to have an aspect ratio (=depth D2/diameter φ3) between 0.5 and 5 inclusive. This is because by setting the diameter φ3 of the via hole 210z to a value which allows the via hole 210z to have an aspect ratio (=depth D2/diameter φ3) between 0.5 and 5 inclusive, it is possible to achieve, for example, an improvement in the etching speed (throughput) for forming the via hole 210z and an improvement of the ease of filling the metal layer 380b in the via hole 210z.

Figure 24D:
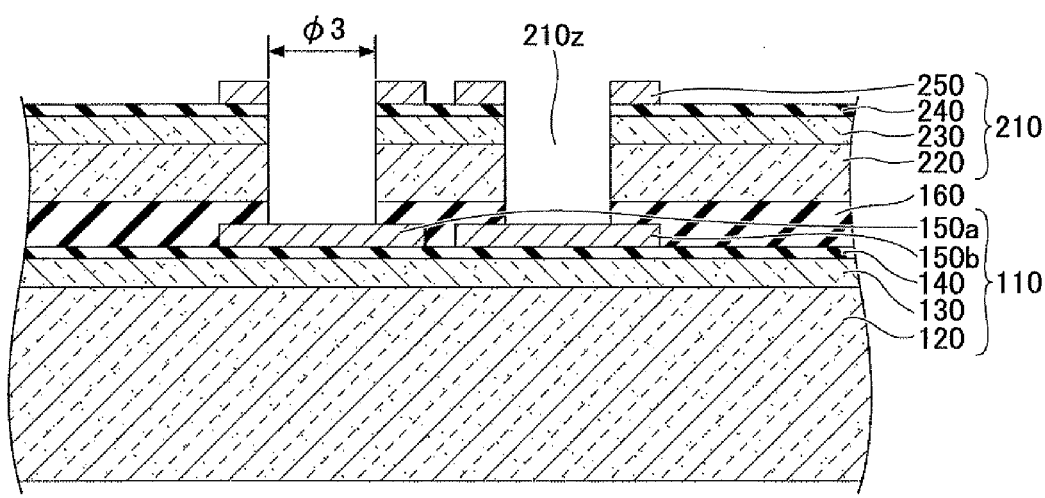
Figure 24E:
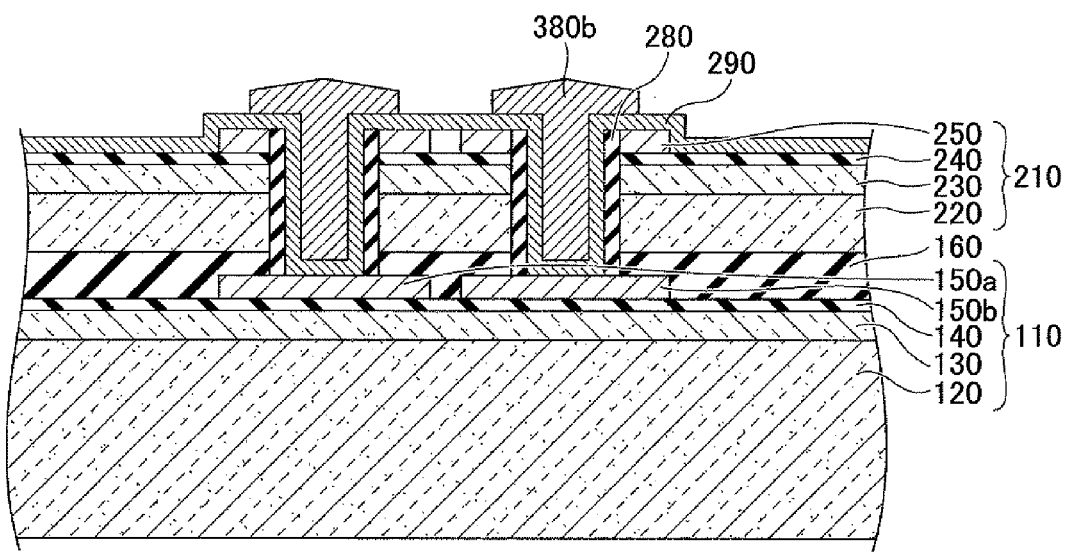
Figure 24F:
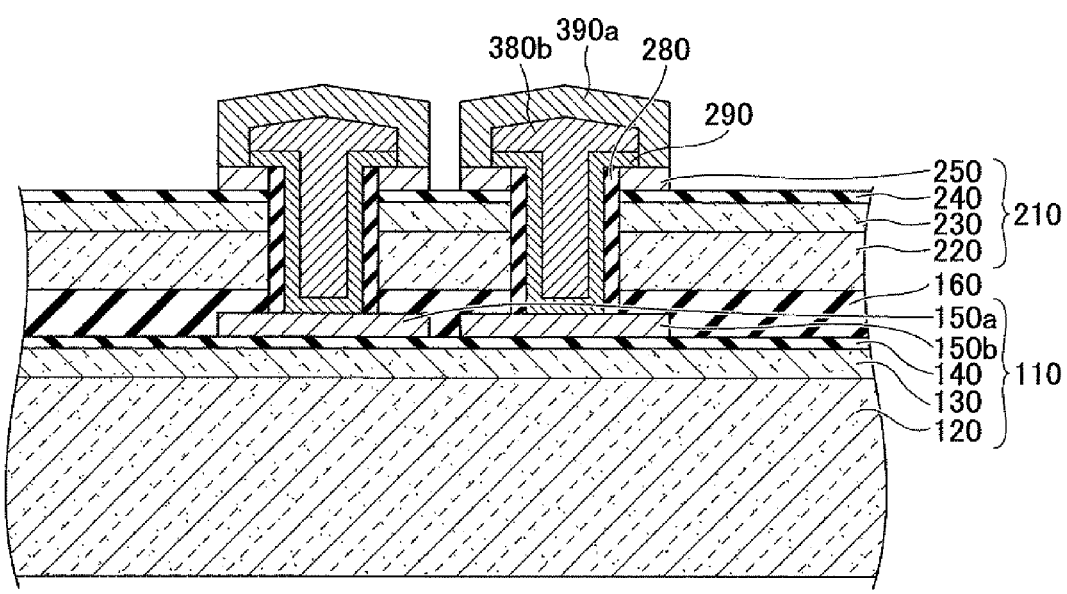

Next in a process shown in FIG. 24D, the resist film 270 of FIG. 24C is removed. Then, processes the same as those of FIGS. 15M to 15S are performed, to thereby form the metal layers 380b in the via holes 210z as shown in FIG. 24E. Next, parts of the metal layer 290 which are not covered by the metal layers 380b are removed by, for example, wet etching, and then metal layers 390a are formed in such a manner as to cover the electrode pads 250 and the metal layers 380b, as shown in FIG. 24F. The metal layers 390a are formed, for example, by forming, on the insulating layer 240, a resist film having openings for the electrode pads 250 and the metal layers 380b. Subsequently, with use of electrolytic plating, in which the electrode pads 250 and the metal layers 380b are used as feeder layers, a plating film is grown by precipitation in such a manner as to fill the openings, the resist film is then removed to thereby form the metal layers 390a.

Subsequently, by repeating processes the same as those of the seventh embodiment, the semiconductor device 100D of FIG. 23 is manufactured.

According to the tenth embodiment of the present invention, the same effect as in the seventh embodiment can be achieved; however, the following effect is also obtained. That is, in the case when the same signal is assigned to adjacent metal pads, it is possible to improve the reliability of the connection between metal pads, as in the case of the ninth embodiment. On the other hand, in the case where different signals are respectively assigned to adjacent metal pads, it is possible to improve the flexibility of the wiring design.

Eleventh Embodiment

Configuration of Semiconductor Device According to Eleventh Embodiment

Figure 25:
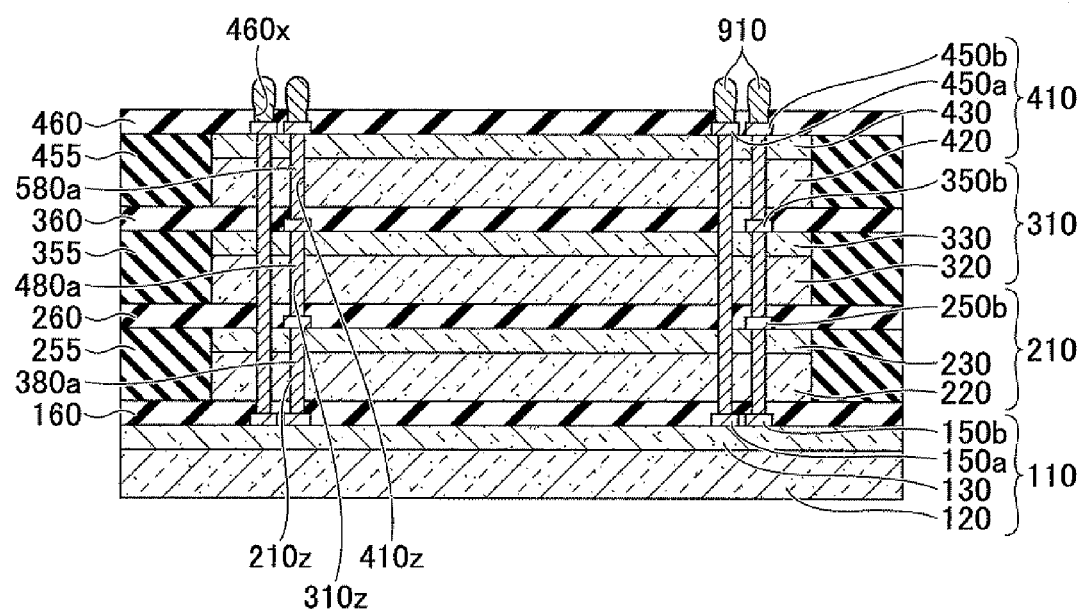

First is described the configuration of semiconductor device according to an eleventh embodiment of the present invention. FIG. 25 is a cross-sectional view illustrating a semiconductor device according to the eleventh embodiment of the present invention. A semiconductor device 100E according to the eleventh embodiment of the present invention has the same configuration as that of the semiconductor device 100D according to the tenth embodiment of the present invention, except that some of the via holes are not provided with a metal pad, and that semiconductor substrates on which metal pads are provided are directly connected to each other by via holes and metal layers, whereas all positions corresponding to via holes in every semiconductor substrate are provided with a metal pad in the semiconductor device 100D according to the tenth embodiment of the present invention.

Thus, by providing metal pads for only some of the semiconductor substrates, semiconductor substrates not adjacent to each other can be directly connected by via holes and metal layers, which results in an increase in the flexibility of the wiring design.

Processes for Manufacturing Semiconductor Device According to Eleventh Embodiment Next is described a manufacturing process flow of the semiconductor device according to the eleventh embodiment of the present invention. FIGS. 26A to 26H illustrate the manufacturing process flow of the semiconductor device according to the eleventh embodiment of the present invention. Note that manufacturing processes similar to those of the semiconductor devices according to the seventh to tenth embodiments of the present invention may be omitted.

Figure 26A:
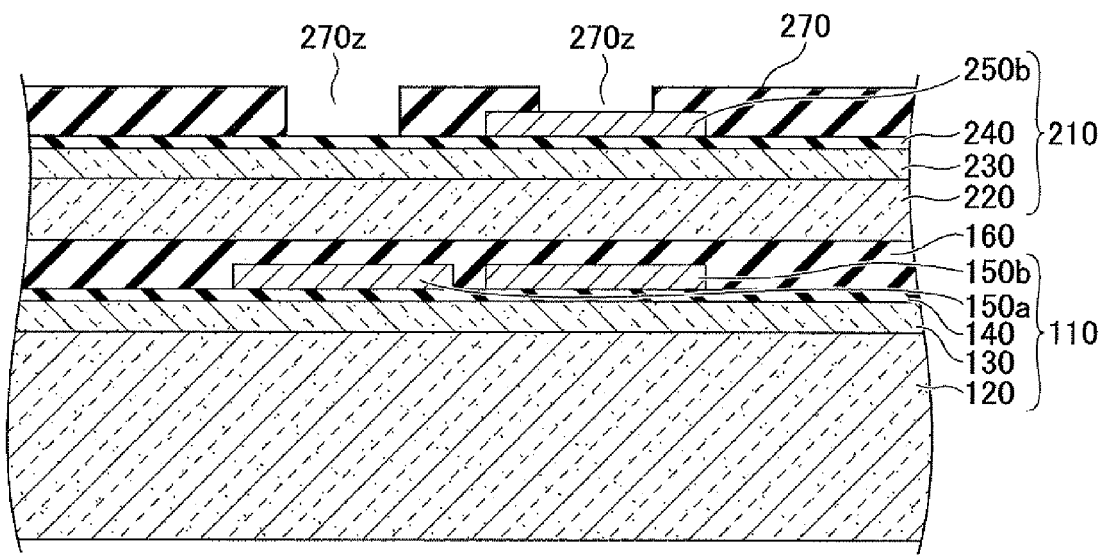
Figure 26B:
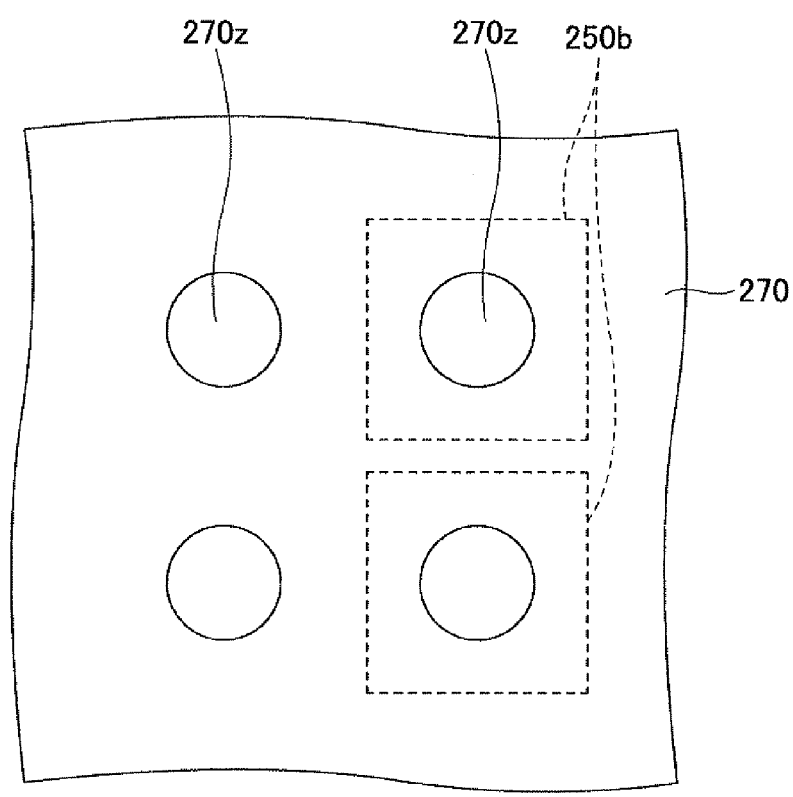

First, processes the same as those of FIGS. 15A to 15I are performed. Next in a process shown in FIGS. 26A and 26B, the resist film 270 of FIG. 15I is exposed via a predetermined mask, and the exposed resist film 270 is subsequently developed, thereby forming openings 270z in the resist film 270. FIG. 26A is a cross-sectional view, and FIG. 26B is a plan view. Note that for convenience of explanation, FIGS. 26A to 26H show enlarged views of a part of the structure shown in FIG. 15I (i.e., the electrode pads 150 and 250b and their vicinity).

Figure 26C:
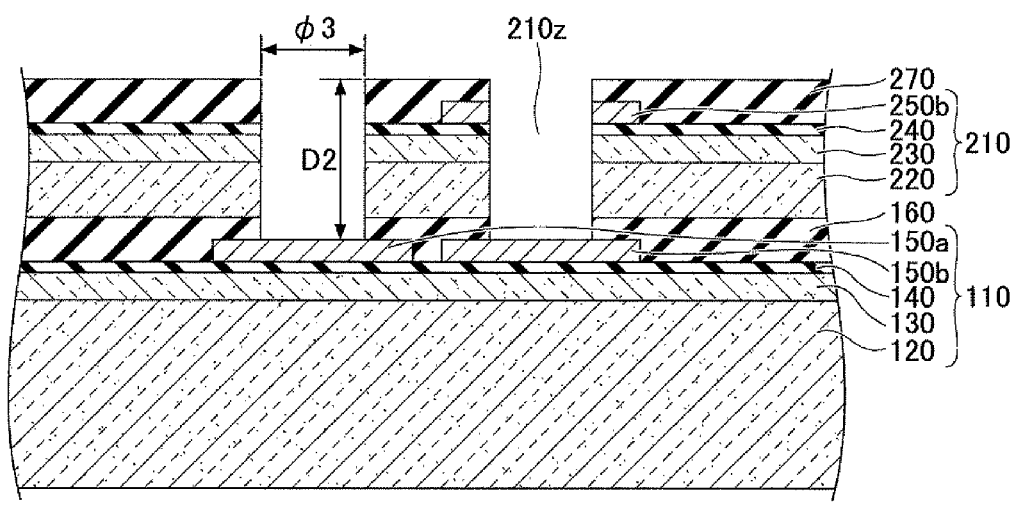

Next in a process shown in FIG. 26C, the via holes 210z are formed in the semiconductor chip 210. The via holes 21z are formed in such a manner to penetrate the resin layer 160 and parts of the semiconductor chip 210 (the substrate body 220, the semiconductor integrated circuit 230, the insulating layer 240 and the electrode pad 250b) corresponding to the openings 270z so that electrode pads 150a and 150b of the semiconductor chip 110 are exposed. The via holes 210z are formed by, for example, dry etching. Each of the via holes 210z has, for example, a circular shape in a planar view, and has the diameter φ3 of, for example, 1 μm to 10 μm. Note however that the diameter φ3 of each of the via holes 210z is preferably set to a value which allows the via hole 210z to have an aspect ratio (=depth D2/diameter φ3) between 0.5 and 5 inclusive. This is because by setting the diameter φ3 of the via hole 210z to a value which allows the via hole 210z to have an aspect ratio (=depth D2/diameter φ3) between 0.5 and 5 inclusive, it is possible to achieve, for example, an improvement in the etching speed (throughput) for forming the via hole 210z and an improvement of the ease of forming the metal layer 380b in the via hole 210z.

Figure 26D:
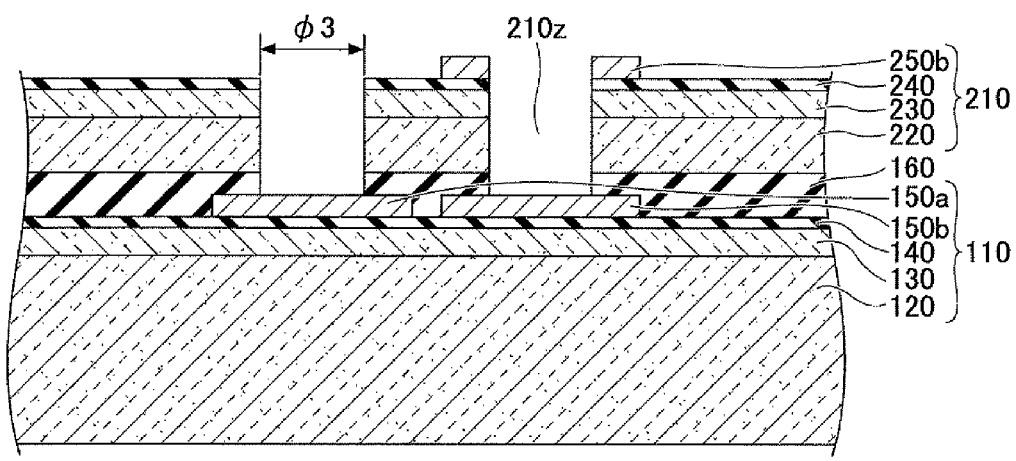
Figure 26E:
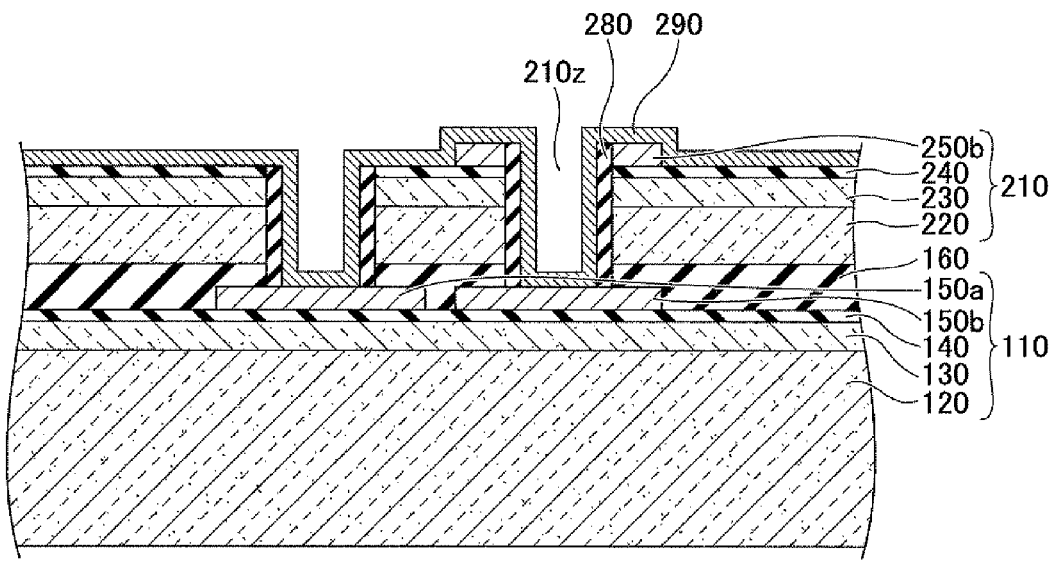

Next in a process shown in FIG. 26D, the resist film 270 of FIG. 26C is removed. Then, after processes the same as those of FIGS. 15M to 15N are performed, the metal layer 290 is formed in such a manner as to cover the top surface of the insulating layer 240, the top surface and lateral side of the electrode pad 250b, the top surface of the insulating layer 280 and the top surfaces of the electrode pads 150a and 150b exposed at the bottom of the via holes 210z. The metal layer 290 is formed by, for example, electroless plating, or may be formed by sputtering, CVD or the like. As the metal layer 290, a laminated body in which a Cu layer is disposed on a Ti layer, or a laminated body in which a Cu layer is disposed on a Ta layer, for example, may be used. In addition, a conductor which satisfies the design criteria can be used as the buried material, and W, Al, doped polysilicon, a carbon material such as a carbon nanotube, or a conductive polymer may be used in place of Cu. In the case where the electrical insulation of the insulating layer is sufficient, a combination with a buried wiring using no barrier metal layer may be chosen.

Figure 26F:
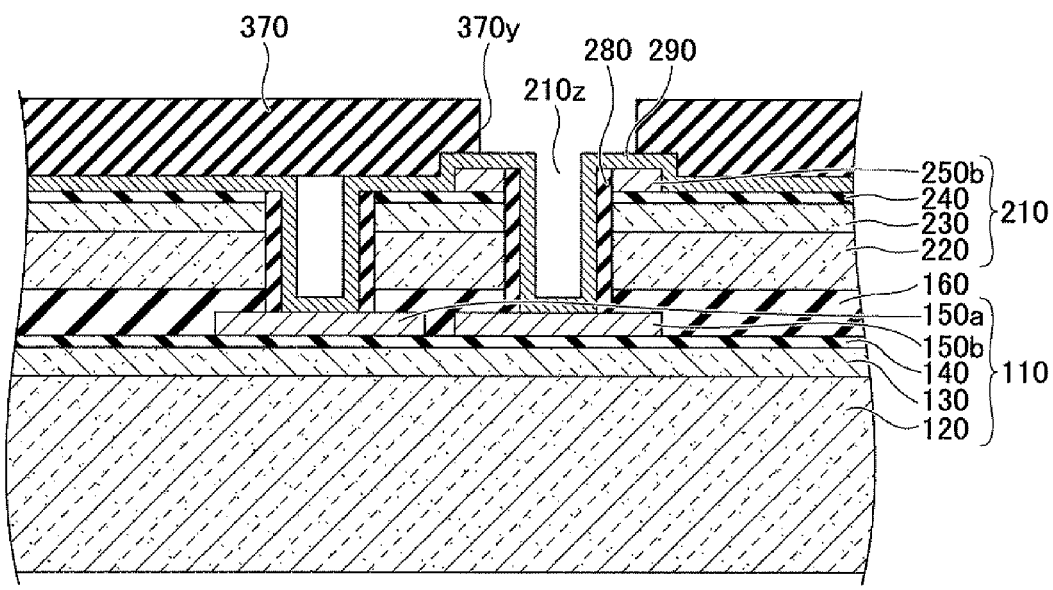

Next in a process shown in FIG. 26F, the photosensitive resist film 370 is formed in such a manner as to cover the top surface of the metal layer 290 except for the inside of the via holes 210z. The resist film 370 is formed, for example, by applying a dry film resist to the top surface of the metal layer 290. The thickness of the resist film 370 is 10 μm, for example. Then, the resist film 370 is exposed via a predetermined mask and subsequently developed, thereby forming an opening 370y in the resist film 370. The opening 370y is formed only on a via hole 210z corresponding to a section at which the electrode pad 250b has been formed.

Figure 26G:
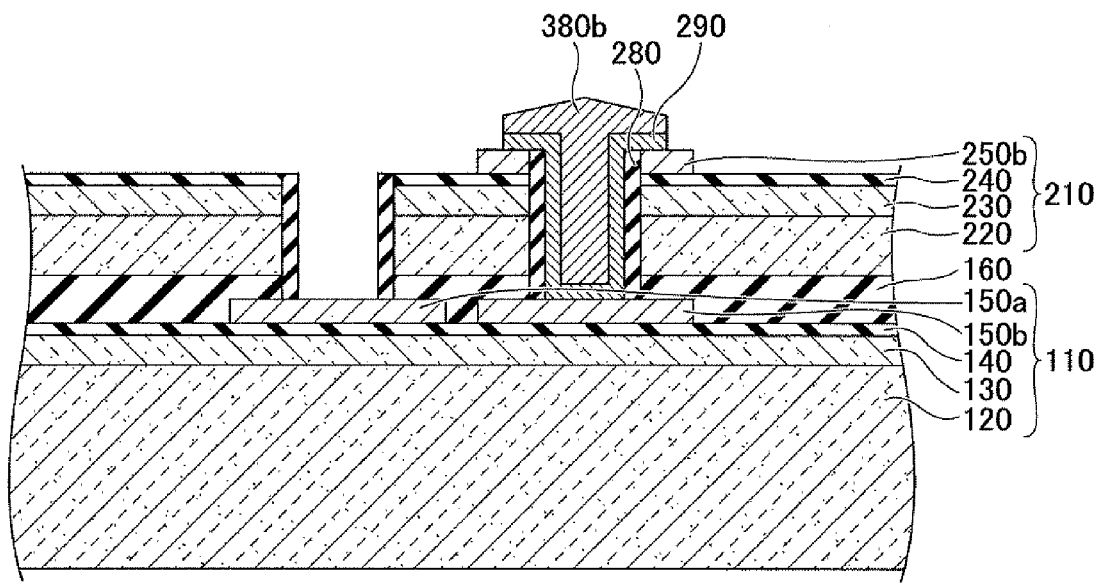
Figure 26H:
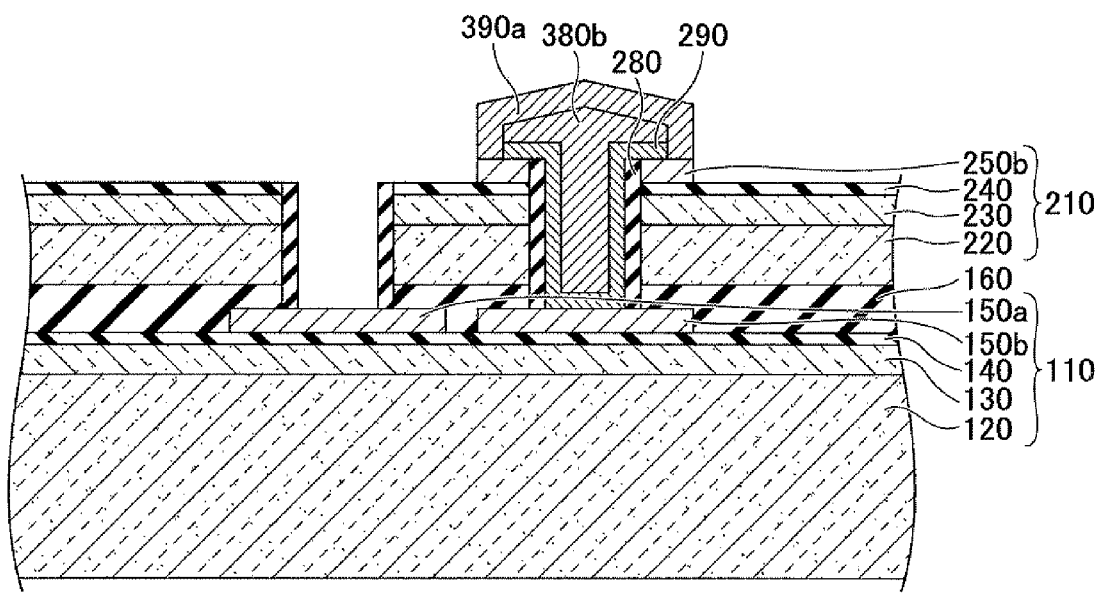

Next, in the same manner as in the processes of FIGS. 15R to 15T, a part of the metal layer 290 which is not covered by the metal layer 380b is removed as shown in FIG. 26G. Next in a process shown in FIG. 26H, the metal layer 390a is formed in such a manner as to cover the electrode pad 250b and the metal layer 380b. The metal layer 390a is formed, for example, by forming, on the insulating layer 240, a resist film having an opening for the electrode pad 250b and the metal layer 380b. Subsequently, with use of electrolytic plating, in which the electrode pad 25 and the metal layer 38b are used as feeder layers, a plating film is grown by precipitation in such a manner as to fill the opening, and the resist film is then removed to thereby form the metal layer 39a.

Subsequently, by repeating processes the same as those of the seventh embodiment, the semiconductor device 100E of FIG. 25 is manufactured. Note that via holes with no metal-layer filling are filled with a metal layer in the same manner as in the seventh embodiment after a semiconductor chip having electrode pads is disposed thereon.

Note that positions to be and not to be provided with a metal pad can be decided arbitrarily, and it is not limited to the case illustrated in FIG. 25.

According to the eleventh embodiment of the present invention, the same effect as in the seventh embodiment can be achieved; however, the following effect is also obtained. That is, by not providing metal pads for some of the via holes in all the semiconductor chips, semiconductor chips not adjacent to each other can be directly connected by via holes and metal layers, which results in the flexibility of the wiring design.

Twelfth Embodiment

The seventh to eleventh embodiments illustrate and describe methods of manufacturing a semiconductor device for disposing semiconductor chips one above the other over a semiconductor substrate and connecting semiconductor chips, each of which constitutes a different semiconductor chip, in such a manner as to enable signal transmission. However, not all the layers to be disposed one above the other have to be a semiconductor chip, and a structure layer having no semiconductor chip may also be included. Accordingly, a twelfth embodiment of the present invention illustrates and describes a method of manufacturing a semiconductor device including a structure layer having no semiconductor chip. Here, the structure layer means a set of layers having no semiconductor chip, which set includes a silicon substrate, a metal layer, an insulating layer and the like.

Configuration of Semiconductor Device According to Fifth Embodiment

Figure 27:
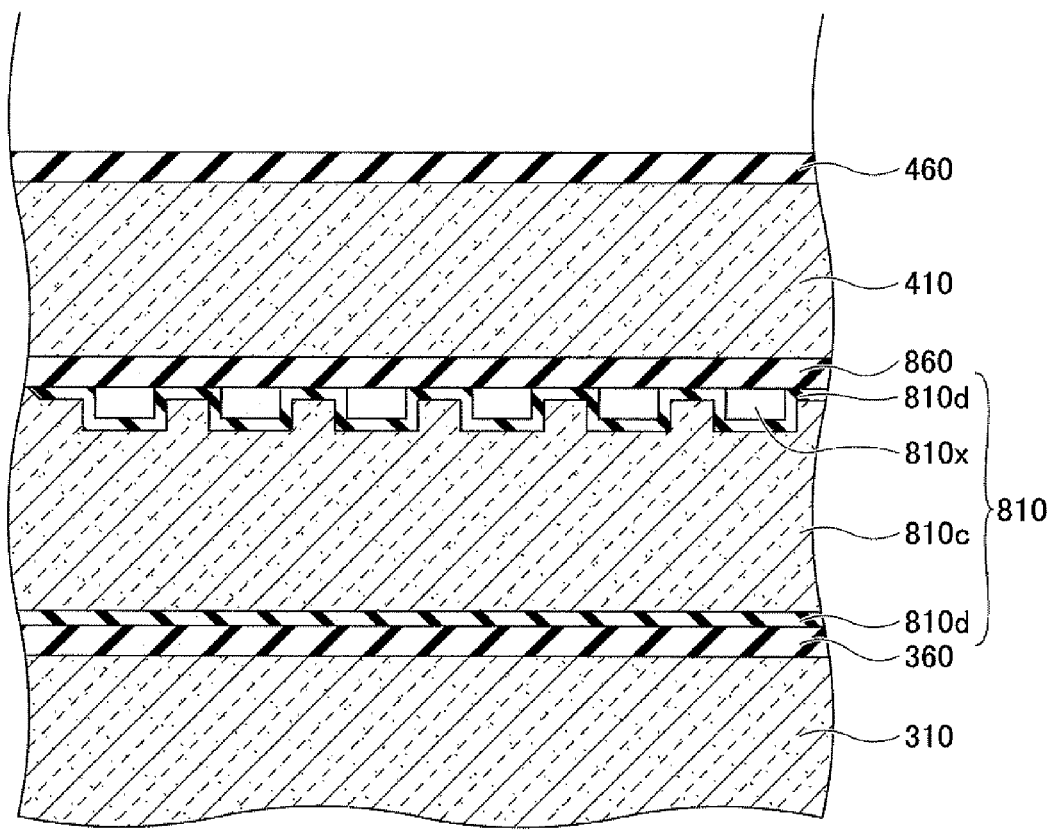

First is described the configuration of a semiconductor device according to the twelfth embodiment of the present invention. FIG. 27 is a cross-sectional view illustrating the semiconductor device according to the twelfth embodiment of the present invention. A semiconductor device 100F according to the twelfth embodiment of the present invention has the same configuration as that of the semiconductor device 100 (see FIG. 14) according to the seventh embodiment of the present invention, except that a structure layer 810 and a resin layer 860 are provided between the resin layer 360 and the semiconductor chip 410 of the semiconductor device 100.

In the semiconductor device 100F of FIG. 27, the structure layer 810 is disposed on the semiconductor chip 310 via the resin layer 360, and the semiconductor chip 410 is disposed on the structure layer 810 via the resin layer 860. The structure layer 810 is provided with, for example, via holes (not shown) and metal layers (not shown) for electrically connecting the semiconductor chips 310 and 410. The resin layer 860 may be made of the same material as that of the resin layer 160 or the like.

The structure layer 810 includes a silicon substrate 810c having no semiconductor chip, an insulating film 810d and grooves 810x. The grooves 810x are provided, in the silicon substrate 810c, on the semiconductor chip 410 side, and the insulating film 810d made, for example, of $Si_3N_4$ or $SiO_2$ is formed on the surface of the silicon substrate 810c including the grooves 810x. The silicon substrate 810c is insulated from the adjacent semiconductor chip 410 by the insulating film 810d. In the grooves 810x, a cooling medium, such as water and ethanol, is supplied, and the grooves 810x function as refrigerant flow paths. The shape and positions of the grooves 810x may be determined arbitrarily.

Thus, layers to be disposed in the semiconductor device are not limited to semiconductor chips, and a structure layer with no semiconductor chip may also be included. By including, for example, a silicon substrate having refrigerant flow paths in the structure layer to be disposed in the semiconductor device, it is possible to cause the semiconductor device to have a cooling function for transferring heat generated by semiconductor chips. It is especially effective if the structure layer having a cooling function is provided adjacent to a semiconductor chip including a device generating a large amount of heat, such as a CPU. Note that the semiconductor device may include plural structure layers having no semiconductor chips.

Processes for Manufacturing Semiconductor Device According To Twelfth Embodiment Next is described a manufacturing process flow of the semiconductor device according to the twelfth embodiment of the present invention.

First, the structure layer 810 is prepared. Specifically, the silicon substrate 810c is processed to have a predetermined outer diameter, and the grooves 810x are formed on one surface of the silicon substrate 810c. The grooves 810x are formed by, for example, BRIE (Deep Reactive Ion Etching). Then, the insulating film 810d is formed on the surface of the silicon substrate 810c, on which surface the grooves 810x have been formed. The insulating film 810d is formed by, for example, plasma CVD. According to these processes, the structure layer 810 is completed.

Next, in processes the same as those of FIGS. 15A to 15X, the semiconductor chips 110-310, the resin layer 360, the structure layer 810, the resin layer 860 and the semiconductor chip 410 are sequentially disposed one above the other, and then via holes, metal layers and the like are formed, to thereby complete the semiconductor device 100F.

Thus, the above illustrates and describes the method of manufacturing the semiconductor device having a structure layer which includes a silicon substrate having no semiconductor chips; however, the structure layer may include, in addition to the silicon substrate having no semiconductor chips, a metal layer made of Cu or the like and an insulating layer made of an epoxy resin, or may have a structure having a MEMS device. Examples of such a MEMS device include pressure sensors and acceleration sensors.

According to the twelfth embodiment of the present invention, the same effect as in the seventh embodiment can be achieved; however, the following effect is also obtained. That is, by providing the structure layer having no semiconductor chips in the semiconductor device, it is possible to achieve, for example, a cooling function for transferring heat generated by semiconductor chips.

Thus, the preferred embodiments of the present invention and their modifications have been described in detail; however, it should be understood that the present invention is not limited to the above-described particular embodiments and their modifications and various changes and modification may be made to the particular embodiments without departing from the scope of the present invention.

For example, in each of the embodiments, the description is given with an example of using semiconductor substrates (silicon wafers) having a circular shape in a planar view;

however, the shape of the semiconductor substrates is not limited to a circular shape, and may be a panel shape, such as a rectangular shape in a planar view.

In addition, a substrate including a structure layer having no semiconductor chip may be used instead of a semiconductor substrate on which semiconductor chips are disposed one above the other.

In addition, the material of the substrates on which the semiconductor integrated circuits are formed is not limited to silicon, and may be germanium or sapphire, for example.

In addition, in each of the seventh to twelfth embodiments above, the description is given with an example of connecting layered semiconductor chips by an electrical signal via metal layers formed in via holes; however, the connection between the layered semiconductor chips does not have to be made by an electrical signal, and may be made by a light signal. In this case, optical waveguides may be formed in the via holes in place of the metal layers.

In addition, in each of the seventh to twelfth embodiments above, the description is given with an example of forming the via holes after the formation of the electrode pads on the semiconductor chips; however, the electrode pads may be formed after the formation of the via holes. Furthermore, a process (damascene process) of grinding the top surfaces of the metal layers formed in the via holes by CMP (Chemical Mechanical Polishing) or the like may be provided.

In addition, the different connection configurations of the electrode pads and the via holes described in the above seventh to twelfth embodiments may be provided together in a single semiconductor device.

In addition, modification the same as that of the seventh embodiment may be applied to the eighth to twelfth embodiments above.

In conclusion, according to the present invention, it is possible to provide a reliable semiconductor device manufacturing method with high productivity, capable of reducing the manufacturing costs.

While the present invention has been described in reference to the foregoing embodiments, the present invention is not limited to the disclosed embodiments, but may be modified or altered within the scope of the accompanying claims.

What is claimed is:

1. A semiconductor device manufacturing method comprising:
    a first step of forming a first insulating layer on a main surface of a first semiconductor substrate, having, close to the main surface thereof, a plurality of semiconductor chips, each of which has a semiconductor integrated circuit;
    a second step of disposing semiconductor chips, each of which has a semiconductor integrated circuit on a main surface thereof, over the corresponding semiconductor chips of the first semiconductor substrate in such a manner that an opposite surface of each of the disposed semiconductor chips faces the first insulating layer while interposing the first insulating layer between the disposed semiconductor chips and the semiconductor chips of the first semiconductor substrate, the opposite surface being opposite to the main surface of the disposed semiconductor chip;
    a third step of forming, in each of the disposed semiconductor chips, a via hole from the main surface to the opposite surface of the disposed semiconductor chip to penetrate the disposed semiconductor chip; and
    a fourth step of forming a first connection part which enables the signal transmission between the disposed semiconductor chips and the corresponding semiconductor chips of the first semiconductor substrate via the via holes.

2. The semiconductor device manufacturing method as claimed in claim 1, wherein the disposed semiconductor chips are formed on a second semiconductor substrate, and the second step includes
    a step of reducing a thickness of the second semiconductor substrate and
    a step of disposing the second semiconductor substrate with the reduced thickness in such a manner that an opposite surface of the second semiconductor substrate opposes the main surface of the first semiconductor substrate with the first insulating layer interposed therebetween, the opposite surface being opposite to a main surface of the second substrate.

3. The semiconductor device manufacturing method as claimed in claim 2, further comprising a fifth step of preparing a semiconductor substrate different from the first and the second semiconductor substrates, and disposing the different semiconductor substrate on the second semiconductor substrate by performing steps similar to the second, the third and the fourth steps on the different semiconductor substrate.

4. The semiconductor device manufacturing method as claimed in claim 2, wherein in the second step, only a predetermined region of the second semiconductor substrate is reduced in thickness.

5. The semiconductor device manufacturing method as claimed in claim 4, wherein the predetermined region is a region, within the second semiconductor substrate, other than a fringe portion of the second semiconductor substrate.

6. The semiconductor device manufacturing method as claimed in claim 5, further comprising a first removing step of removing a fringe portion of the first semiconductor substrate, wherein the first removing step is performed prior to the second step.

7. The semiconductor device manufacturing method as claimed in claim 6, further comprising a second removing step of removing the fringe portion of the second semiconductor substrate, wherein the second removing step is performed prior to the second step.

8. The semiconductor device manufacturing method as claimed in claim 1, wherein the first semiconductor substrate has a substantially circular shape in a planar view.

9. The semiconductor device manufacturing method as claimed in claim 1, wherein the first connection part connects the semiconductor chips in the different layers by an electrical signal.

10. The semiconductor device manufacturing method as claimed in claim 1, wherein the first connection part connects the semiconductor chips in the different layers by a light signal.

11. The semiconductor device manufacturing method as claimed in claim 1, wherein a structure layer having no semiconductor chip is included in the disposed semiconductor chips, the structure layer being insulated from the disposed semiconductor chips.

12. The semiconductor device manufacturing method as claimed in claim 11, wherein the structure layer is one of a substrate, a metal layer and an insulating layer.

13. The semiconductor device manufacturing method as claimed in claim 11, wherein the structure layer has a function of cooling the disposed semiconductor chips.

14. The semiconductor device manufacturing method as claimed in claim 11, wherein the structure layer has a MEMS.

15. The semiconductor device manufacturing method as claimed in claim 1, wherein the disposed semiconductor chips are first singularized semiconductor chips.

16. The semiconductor device manufacturing method as claimed in claim 15, further comprising a sixth step of forming a sealing insulating layer which seals at least a part of a lateral side of each of the first singularized semiconductor chips, the sixth step being performed prior to the third step; a seventh step of forming a second insulating layer over the first singularized semiconductor chips, the seventh step being performed after the fourth step; an eighth step of preparing second singularized semiconductor chips which are different from the first singularized semiconductor chips, each of the second singularized semiconductor chips having a semiconductor integrated circuit on a main surface thereof, and disposing the second singularized semiconductor chips over the first singularized semiconductor chips in such a manner that the second insulating layer is interposed therebetween and an opposite surface of each of the second singularized semiconductor chips opposes the second insulating layer, the opposite surface being opposite to a main surface of the second singularized semiconductor chip; a ninth process of forming, in each of the second singularized semiconductor chips, a via hole which penetrates from the main surface to the opposite surface of the second singularized semiconductor chip; and a tenth process of forming a second connection part which enables the signal transmission, via the via holes, between the second singularized semiconductor chips and the first singularized semiconductor chips.

17. The semiconductor device manufacturing method as claimed in claim 16, further comprising an eleventh step of forming a via hole which penetrates the sealing insulating layer and forming a connection part which enables the signal transmission, via the via hole penetrating the sealing insulating layer, between the semiconductor chips in the different layers, wherein the eleventh step is performed in place of the third and the fourth steps, or in addition to the third and the fourth steps.

18. The semiconductor device manufacturing method as claimed in claim 16, wherein the sixth step is performed after the second process, and in the sixth step, the sealing insulating layer is formed to seal at least the lateral side of each of the first singularized semiconductor chips.

19. The semiconductor device manufacturing method as claimed in claim 16, wherein the sixth step is performed after the second step, and in the sixth step, the sealing insulating layer is formed to seal at least the lateral side of each of the first singularized semiconductor chips, by providing, at an outer edge of the first insulating layer, a frame member surrounding the first singularized semiconductor chips and supplying a resin in gaps formed between the frame member and the first singularized semiconductor chips.

20. The semiconductor device manufacturing method as claimed in claim 16, wherein the sixth process is performed prior to the second step and includes a step of temporarily fixing the main surface of each of the first singularized semiconductor chips onto a support with an adhesion layer interposed therebetween and a step of forming the sealing insulating layer which seals at least the part of the lateral side of each of the first singularized semiconductor chips temporarily fixed onto the support, and the second step includes a step of disposing the first singularized semiconductor chips over the corresponding semiconductor chips of the semiconductor substrate in such a manner that the opposite surface of each of the singularized semiconductor chips, exposed from the sealing insulating layer, opposes the first insulating layer and a step of removing the adhesion layer and the support.

* * * * *